(12) United States Patent
Takashima et al.

(10) Patent No.: US 9,214,636 B2
(45) Date of Patent: Dec. 15, 2015

(54) ORGANIC ELECTROLUMINESCENCE DEVICE

(75) Inventors: Yoriyuki Takashima, Chiba (JP); Masakazu Funahashi, Chiba (JP); Kiyoshi Ikeda, Chiba (JP); Chishio Hosokawa, Chiba (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 446 days.

(21) Appl. No.: 11/679,531

(22) Filed: Feb. 27, 2007

(65) Prior Publication Data

US 2007/0243411 A1    Oct. 18, 2007

(30) Foreign Application Priority Data

Feb. 28, 2006   (JP) .................................. 2006-053942
Nov. 17, 2006   (JP) .................................. 2006-312023

(51) Int. Cl.
| | |
|---|---|
| H01L 51/50 | (2006.01) |
| H01L 51/00 | (2006.01) |
| C09K 11/06 | (2006.01) |
| H05B 33/14 | (2006.01) |

(52) U.S. Cl.
CPC ............ *H01L 51/0058* (2013.01); *C09K 11/06* (2013.01); *H01L 51/0054* (2013.01); *H01L 51/0055* (2013.01); *H01L 51/0057* (2013.01); *H05B 33/14* (2013.01); *C09K 2211/1011* (2013.01); *C09K 2211/1014* (2013.01); *C09K 2211/1029* (2013.01); *C09K 2211/1037* (2013.01); *C09K 2211/1044* (2013.01); *C09K 2211/1048* (2013.01); *C09K 2211/1051* (2013.01); *C09K 2211/1092* (2013.01); *C09K 2211/1096* (2013.01); *H01L 51/0059* (2013.01); *H01L 51/5012* (2013.01)

(58) Field of Classification Search
None
See application file for complete search history.

(56) References Cited

U.S. PATENT DOCUMENTS

| 3,008,897 | A | 11/1961 | Burk, Jr. et al. | |
|---|---|---|---|---|
| 5,935,721 | A * | 8/1999 | Shi et al. ........................ | 428/690 |
| 7,097,917 | B1 * | 8/2006 | Fujita et al. .................... | 428/690 |
| 2002/0168544 | A1 * | 11/2002 | Fukuoka et al. ............... | 428/690 |
| 2003/0044643 | A1 | 3/2003 | Arakane et al. | |
| 2003/0054186 | A1 | 3/2003 | Miyashita et al. | |
| 2003/0224202 | A1 * | 12/2003 | Brown et al. ................... | 428/690 |
| 2004/0049754 | A1 * | 3/2004 | Liao et al. ........................ | 716/8 |
| 2005/0222417 | A1 | 10/2005 | Brown et al. | |
| 2005/0236974 | A1 | 10/2005 | Suzuki et al. | |
| 2006/0043858 | A1 | 3/2006 | Ikeda et al. | |
| 2006/0154105 | A1 | 7/2006 | Yamamoto et al. | |
| 2006/0154107 | A1 | 7/2006 | Kubota et al. | |

FOREIGN PATENT DOCUMENTS

| CN | 1523938 A | 8/2004 |
|---|---|---|
| EP | 1 357 613 A2 | 10/2003 |
| EP | 1 696 015 A1 | 8/2006 |
| JP | 3-200889 | 9/1991 |
| JP | 7-138561 | 5/1995 |
| JP | 8-012600 | 1/1996 |
| JP | 8-239655 | 9/1996 |
| JP | 10-189247 | 7/1998 |
| JP | 10-189248 | 7/1998 |
| JP | 11-12205 | 1/1999 |
| JP | 2000-178212 | 6/2000 |
| JP | 2000-186054 | 7/2000 |
| JP | 2001-118682 | 4/2001 |
| JP | 2001-351783 | 12/2001 |
| JP | 2002-43058 A | 2/2002 |
| JP | 2002-63988 | 2/2002 |
| JP | 2002-69044 | 3/2002 |
| JP | 2002-324678 | 11/2002 |
| JP | 2003-26616 | 1/2003 |
| JP | 2003-272862 | 9/2003 |
| JP | 2004-002351 | 1/2004 |
| JP | 2004-75567 | 3/2004 |
| JP | 2004-83481 | 3/2004 |
| JP | 2005-53806 | 3/2005 |
| JP | 2005-68087 | 3/2005 |
| JP | 2005-240008 | 9/2005 |
| WO | WO 02/20693 A1 | 3/2002 |
| WO | WO 02/085822 A1 | 10/2002 |
| WO | WO 2004/018587 A1 | 3/2004 |
| WO | WO 2004/020371 A1 | 3/2004 |
| WO | WO 2004/063159 A1 | 7/2004 |
| WO | WO 2005/033051 A1 | 4/2005 |
| WO | WO 2005/061656 A1 | 7/2005 |
| WO | WO 2005/115950 A1 | 12/2005 |

OTHER PUBLICATIONS

Matsunami et al., JP 2005-272803, Machine Assisted Translation.*
Hosokawa et al., JP 2002-069044, Machine Assisted Translation.*
Bruno and Svoronos, "CRC Handbook of Fundamental Spectroscopic Correlation Charts", (2005), p. 2.*
C. W. Tang, et al. "Organic Electroluminescent diodes" Appl. Phys. Lett., vol. 51, No. 12, Sep. 21, 1987, pp. 913-915.
European Search Report Issued Jan. 30, 2013 in Patent Application No. 07 737 525.1.

* cited by examiner (Continued)

*Primary Examiner* — Gregory Clark
(74) *Attorney, Agent, or Firm* — Oblon, McClelland, Maier & Neustadt, L.L.P.

(57) ABSTRACT

Provided is an organic electroluminescence device having a long lifetime and capable of emitting blue light with high luminous efficiency. The organic electroluminescence device has an organic thin film layer composed of one or multiple layers including at least a light emitting layer and interposed between a cathode and an anode. In the organic electroluminescence device, the light emitting layer contains at least one kind selected from compounds each having a specific fluoranthene structure and at least one kind selected from fused ring-containing compounds each having a specific structure.

10 Claims, No Drawings

US 9,214,636 B2

ORGANIC ELECTROLUMINESCENCE DEVICE

TECHNICAL FIELD

The present invention relates to an organic electroluminescence device containing a compound having a fluoranthene structure and a fused ring-containing compound, and in particular, an organic electroluminescence device having a long lifetime and capable of emitting blue light with high luminous efficiency by using the compound having a fluoranthene structure and the fused ring-containing compound in its light emitting layer.

BACKGROUND ART

An organic electroluminescence device (hereinafter, the term "electroluminescence" is sometimes abbreviated to "EL") is a spontaneous light emitting device which utilizes the principle that a fluorescent substance emits light by energy of recombination of holes injected from an anode and electrons injected from a cathode when an electric field is applied. Since an organic EL device of the laminate type driven under a low electric voltage was reported by C. W. Tang of Eastman Kodak Company (C. W. Tang and S. A. Vanslyke, Applied Physics Letters, Volume 51, Pages 913, 1987), many studies have been conducted on the organic EL device using organic materials as the constituting materials. Tang et al. used tris(8-quinolinolato)aluminum for the light emitting layer and a triphenyldiamine derivative for the hole transporting layer. Advantages of the laminate structure include that the efficiency of hole injection into the light emitting layer can be increased, that the efficiency of forming excitons which are formed by blocking and recombining electrons injected from the cathode can be increased, and that excitons formed among the light emitting layer can be enclosed. As the device structure of the organic EL device, a two-layered structure having a hole transporting (injecting) layer and an electron transporting and light emitting layer and a three-layered structure having a hole transporting (injecting) layer, a light emitting layer and an electron transporting (injecting) layer are well known. To increase the efficiency of recombination of injected holes and electrons in the device of the laminate type structure, the structure of the device and the process for forming the device have been devised.

Further, as the light emitting material, chelate complexes such as tris(8-quinolinolato)aluminum complexes, coumarine derivatives, tetraphenylbutadiene derivatives, bisstyrylarylene derivatives and oxadiazole derivatives are known. It is reported that light in the visible region ranging from blue light to red light can be obtained by using these light emitting materials, and development of a device exhibiting color images is expected (see, for example, Patent Document 1, Patent Document 2, and Patent Document 3).

Patent Documents 4 and 5 each disclose a device using a bisanthracene derivative as a light emitting material. Bisanthracene is used as a blue light emitting material, but is insufficient because its efficiency and lifetime do not reach practical levels.

In addition, Patent Documents 6, 7, 8, and 9 each disclose a device using a symmetric pyrene derivative as a light emitting material. Such symmetric pyrene derivative is used as a blue light emitting material, but an improvement in lifetime of a device using the derivative has been requested.

Patent Documents 10, 11, 12, 13, and 14 each disclose a device using a fluoranthene derivative as a light emitting material. Such fluoranthene derivative is used as a blue light emitting material, but an improvement in lifetime of a device using the derivative has been requested.

Patent Document 1: JP-A-08-239655
Patent Document 2: JP-A-07-138561
Patent Document 3: JP-A-03-200889
Patent Document 4: U.S. Pat. No. 3,008,897
Patent Document 5: JP-A-08-12600
Patent Document 6: JP-A-2001-118682
Patent Document 7: JP-A-2002-63988
Patent Document 8: JP-A-2004-75567
Patent Document 9: JP-A-2004-83481
Patent Document 10: JP-A-2002-69044
Patent Document 11: WO 02/085822
Patent Document 12: WO 2005/033051
Patent Document 13: JP-A-10-189247
Patent Document 14: JP-A-2005-68087

DISCLOSURE OF THE INVENTION

Problems to be Solved by the Invention

The present invention has been made with a view to solving the above problems, and an object of the present invention is to provide an organic EL device having a long lifetime and capable of emitting blue light with high luminous efficiency.

Means for Solving the Problems

The inventors of the present invention have made extensive studies with a view to achieving the above object. As a result, the inventors have found that an organic EL device having an organic thin film layer composed of one or multiple layers including at least a light emitting layer and interposed between a cathode and an anode, in which the light emitting layer contains at least one kind selected from fused ring-containing compounds each represented by the following general formula (1) and at least one kind selected from compounds each having a fluoranthene structure, has a long lifetime, and can emit blue light with high luminous efficiency. Thus, the inventors have completed the present invention.

In the organic EL device according to the present invention, the light emitting layer contains at least one kind selected from fused ring-containing compounds each represented by the following general formula (1) and at least one kind selected from compounds each having a fluoranthene structure:

$$G^2 \quad (1)$$

where $G^2$ represents a fused ring-containing compound having a substituted or unsubstituted anthracene structure, a substituted or unsubstituted pyrene structure, a substituted or unsubstituted amine structure, or a substituted or unsubstituted benzene structure.

The compound having a fluoranthene structure to be used in the organic EL device of the present invention is preferably represented by the following general formula (2):

$$FL_n\text{-}G^1 \quad (2)$$

where:

FL represents a monovalent group having a fluoranthene structure, n represents an integer of 2 to 4, and multiple FL's may be identical to or different from each other; and $G^1$ represents a hydrogen atom when n represents 1, and represents, when n represents 2 or more, a substituted or unsubstituted aromatic ring group having 6 to 40 carbon atoms, a substituted or unsubstituted arylamino group having 6 to 40 carbon atoms, a substituted or unsubstituted diaminoaryl group having 6 to 60 carbon atoms, a substituted or unsubstituted triaminoaryl group having 6 to 60 carbon atoms, a substituted or unsubstituted heterocyclic group having 3 to 40 carbon atoms, a substituted or unsubstituted ethenylene group, or a single bond.

Effect of the Invention

The organic electroluminescence device of the present invention the light emitting layer of which contains at least one kind selected from fused ring-containing compounds each represented by the general formula (1) described below and at least one kind selected from compounds each having a fluoranthene structure has a long lifetime, and can emit blue light with high luminous efficiency.

Further, in order that the stability of the organic EL device obtained by the present invention against, for example, temperature, humidity, or an atmosphere may be improved, the surface of the device can be provided with a protective layer, or the entirety of the device can be protected with, for example, silicone oil or a resin.

BEST MODE FOR CARRYING OUT THE INVENTION

An organic EL device of the present invention is an organic EL device having an organic thin film layer composed of one or multiple layers including at least a light emitting layer and interposed between a cathode and an anode, in which the light emitting layer contains at least one kind selected from fused ring-containing compounds each represented by the following general formula (1) and at least one kind selected from compounds each having a fluoranthene structure. The organic EL device has a long lifetime, and can emit blue light with high luminous efficiency.

The fused ring-containing compound to be used in the organic EL device of the present invention is represented by the following general formula (1):

G²                      (1)

where G² represents a fused ring-containing compound having a substituted or unsubstituted anthracene structure, a substituted or unsubstituted pyrene structure, a substituted or unsubstituted amine structure, or a substituted or unsubstituted benzene structure.

In addition, the organic EL device of the present invention contains at least one kind selected from fused ring-containing compounds each represented by the following general formula (1) and at least one kind selected from compounds each having a fluoranthene structure and each represented by the following general formula (2):

G²                      (1)

where G² represents a fused ring-containing compound having a substituted or unsubstituted anthracene structure, a substituted or unsubstituted pyrene structure, a substituted or unsubstituted amine structure, or a substituted or unsubstituted benzene structure;

$FL_n$-G¹                  (2)

where:

FL represents a monovalent group having a fluoranthene structure, n represents an integer of 2 to 4, and multiple FL's may be identical to or different from each other; and G¹ represents a substituted or unsubstituted aromatic ring group having 6 to 40 carbon atoms, a substituted or unsubstituted arylamino group having 6 to 40 carbon atoms, a substituted or unsubstituted diaminoaryl group having 6 to 60 carbon atoms, a substituted or unsubstituted triaminoaryl group having 6 to 60 carbon atoms, a substituted or unsubstituted heterocyclic group having 3 to 40 carbon atoms, a substituted or unsubstituted ethenylene group, or a single bond.

In the organic electroluminescence device of the present invention, the compound having a fluoranthene structure is preferably a compound having a structure represented by the following general formula (1b).

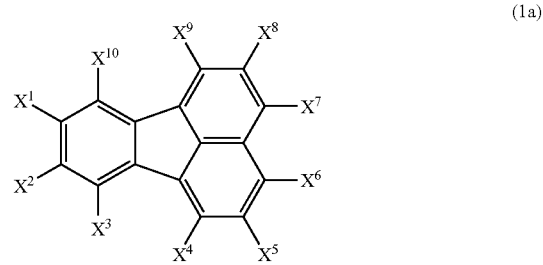

(1a)

where $X^1$ to $X^{10}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms which is not represented by the formula (1a), a substituted or unsubstituted heterocyclic group having 5 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —COOR$^{1e}$ group where R$^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —COR$^{2e}$ group where R$^{2e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —OCOR$^{3e}$ group where R$^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted-aralkyl group having 7 to 30 carbon atoms, or a substituted or unsubstituted aryl group having 6 to 30 carbon atoms, and adjacent groups or substituents of groups out of $X^1$ to $X^{16}$ may be bonded to each other to form a substituted or unsubstituted carbon ring.

It is preferable that both $X^3$ and $X^{10}$ in the above general formula (1a) do not represent hydrogen atoms.

In the organic electroluminescence device of the present invention, the compound having a fluoranthene structure is preferably a compound having a structure represented by the following general formula (1b).

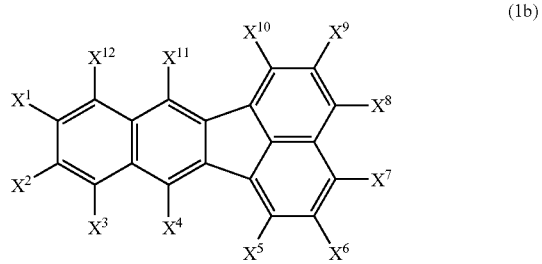

(1b)

Where $X^1$ to $X^{12}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms which is not represented by the formula (1b), a substituted or unsubstituted heterocyclic group having 5 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —$COOR^{1e}$ group where $R^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —$COR^{2e}$ group where $R^{2e}$ represents a hydrogen atom, a substituted or unsubstituted, linear, branched, or cyclic alkyl group having 1 to 30 carbon atoms, a substituted or unsubstituted linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —$OCOR^{3e}$ group where $R^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, and adjacent groups or substituents of groups out of $X^1$ to $X^{16}$ may be bonded to each other to form a substituted or unsubstituted carbon ring, Provided that: a case where both $X^4$ and $X^{11}$ in the general formula (1b) represent hydrogen atoms is excluded; and a case where the compound having a fluoranthene structure is represented by the general formula (1b) and $G^2$ in the general formula (1) represents 9,10-diphenylanthracene is excluded.

In the organic electroluminescence device of the present invention, the compound having a fluoranthene structure is preferably a compound having a structure represented by the following general formula (1c).

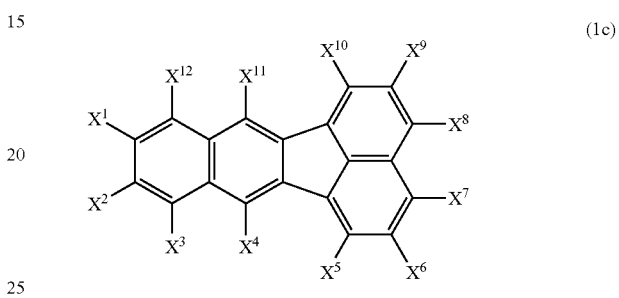

(1c)

In the general formula (1c), $X^1$ to $X^{12}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —$COOR^{1e}$ group where $R^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —$COR^{2e}$ group where $R^{2e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —$OCOR^{3e}$ group where $R^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, and adjacent groups or substituents of groups out of $X^1$ to $X^{16}$ may be bonded to each other to form a substituted or unsubstituted carbon ring, Provided that: $X^7 \neq X^8$ in the general formula (1c); and a case where both $X^4$ and $X^{11}$ in the general formula (1c) represent hydrogen atoms is excluded.

In the general formula (2), n represents 2 to 4, and FL represents a monovalent group derived from a compound having a structure represented by any one of the following general formulae (2a), (2c), and (2d).

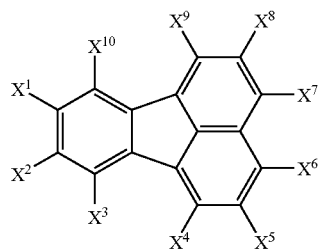

(2a)

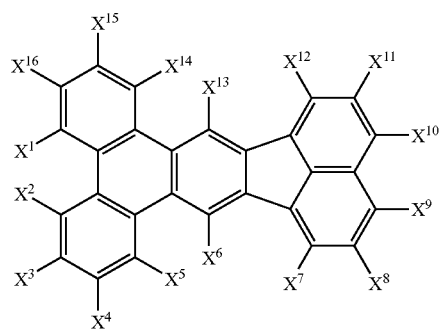

(2c)

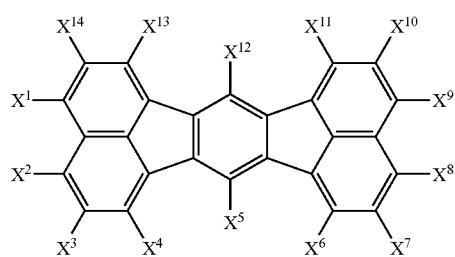

(2d)

In the general formulae (2a), (2c), and (2d), $X^1$ to $X^{16}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched; or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —$COOR^{1e}$ group where $R^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —$COR^{2e}$ group where $R^{2e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —$OCOR^{3e}$ group where $R^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, and adjacent groups or substituents of groups out of $X^1$ to $X^{16}$ may be bonded to each other to form a substituted or unsubstituted carbon ring.

In the general formula (2), n represents 2 to 4, and FL represents a monovalent group derived from a compound having a structure represented by the following general formula (2'b):

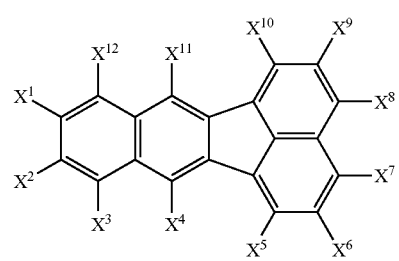

(2'b)

In the general formula (2'b), $X^1$ to $X^{12}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —COOR$^{1e}$ group where R$^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —COR$^{2e}$ group where R$^{2e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —OCOR$^{3e}$ group where R$^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, and adjacent groups or substituents of groups out of X$^1$ to X$^{16}$ may be bonded to each other to form a substituted or unsubstituted carbon ring.

Provided that a case where, in the general formula (2), n represents 2 and G$^1$ represents a linking group composed of a phenylene group, and G$^2$ in the general formula (1) represents 10,10'-bis(2-phenylphenyl)-9,9'-bianthracene is excluded.

Examples of the substituted or unsubstituted linear, branched, or cyclic alkyl group having 1 to 30 carbon atoms represented by X$^1$ to X$^{16}$ in the general formulae (1a) to (1c), (2a) to (2d) and (2'b) include, for example, a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, a 3-methylpentyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 1,2-dinitroethyl group, a 2,3-dinitro-t-butyl group, a 1,2,3-trinitropropyl group, a cyclopentyl group, a cyclohexyl group, a cyclooctyl group, and a 3,5-tetramethylcyclohexyl group.

Of those, a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 1-pentylhexyl group, a 1-butylpentyl group, a 1-heptyloctyl group, a cyclohexyl group, a cyclooctyl group, and a 3,5-tetramethylcyclohexyl group are preferable.

The substituted or unsubstituted, linear, branched, or cyclic alkoxy group having 1 to 30 carbon atoms, and the substituted or unsubstituted, linear, branched, or cyclic alkylthio group having 1 to 30 carbon atoms are a group represented by —OY$^1$ and a group represented by —SY$^2$, respectively. Specific examples of each of Y$^1$ and Y$^2$ include examples similar to those described for the alkyl group, and the same holds true for preferable examples of each of Y$^1$ and Y$^2$.

Examples of the substituted or unsubstituted linear, branched, or cyclic alkenyl group having 2 to 30 carbon atoms include a vinyl group, an allyl group, a 1-butenyl group, a 2-butenyl group, a 3-butenyl group, a 1,3-butandienyl group, a 1-methylvinyl group, a styryl group, a 2,2-diphenylvinyl group, a 1,2-diphenylvinyl group, a 1-methylallyl group, a 1,1-dimethylallyl group, a 2-methylallyl group, a 1-phenylallyl group, a 2-phenylallyl group, a 3-phenylallyl group, a 3,3-diphenylallyl group, a 1,2-dimethylallyl group, a 1-phenyl-1-butenyl group, and a 3-phenyl-1-butenyl group. A styryl group, a 2,2-diphenylvinyl group, and a 1,2-diphenylvinyl group are preferable.

The substituted or unsubstituted, linear, branched, or cyclic alkenyloxy group having 2 to 30 carbon atoms, and the substituted or unsubstituted, linear, branched, or cyclic alkenylthio group having 2 to 30 carbon atoms are a group represented by —OY$^3$ and a group represented by —SY$^4$, respectively. Specific examples of each of Y$^3$ and Y$^4$ include examples similar to those described for the alkenyl group, and the same holds true for preferable examples of each of Y$^3$ and Y$^4$.

Examples of the substituted or unsubstituted aralkyl group having 7 to 30 carbon atoms include, for example, a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

Of those, a benzyl group, a p-cyanobenzyl group, an m-cyanobenzyl group, an o-cyanobenzyl group, a 1-phenylethyl group, a 2-phenylethyl group, a 1-phenylisopropyl group, and a 2-phenylisopropyl group are preferable.

The substituted or unsubstituted aralkyloxy group having 7 to 30 carbon atoms, and the substituted or unsubstituted aralkylthio group having 7 to 30 carbon atoms are a group represented by $—OY^5$ and a group represented by $—SY^6$, respectively. Specific examples of each of $Y^5$ and $Y^6$ include examples similar to those described for the aralkyl group, and the same holds true for preferable examples of each of $Y^5$ and $Y^6$.

Examples of the substituted or unsubstituted aryl group having 6 to 20 carbon atoms, for example, include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, a 4''-t-butyl-p-terphenyl-4-yl group, an o-cumenyl group, an m-cumenyl group, a p-cumenyl group, a 2,3-xylyl group, a 3,4-xylyl group, a 2,5-xylyl group, and a mesityl group.

Of those, a phenyl group, a 1-naphthyl group, a 2-naphthyl group, a 9-phenanthryl group, a 2-biphenylyl group, a 3-biphenylyl group, a 4-biphenylyl group, a p-tolyl group, and a 3,4-xylyl group are particularly preferable.

Examples of the substituted or unsubstituted aromatic heterocyclic group represented by $X^1$ to $X^{16}$ include a 1-pyrrolyl group, a 2-pyrrolyl group, a 3-pyrrolyl group, a pyrazinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-yl group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenazinyl group, a 2-phenazinyl group, a 1-phenothiazinyl group, a 2-phenothiazinyl group, a 3-phenothiazinyl group, a 4-phenothiazinyl group, a 10-phenothiazinyl group, a 1-phenoxadinyl group, a 2-phenoxadinyl group, a 3-phenoxadinyl group, a 4-phenoxadinyl group, a 10-phenoxadinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group.

The substituted or unsubstituted, linear, branched, or cyclic aryloxy group having 6 to 20 carbon atoms, and the substituted or unsubstituted, linear, branched, or cyclic arylthio group having 6 to 20 carbon atoms are a group represented by $—OY^7$ and a group represented by $—SY^8$, respectively. Specific examples of each of $Y^7$ and $Y^8$ include examples similar to those described for the aryl group, and the same holds true for preferable examples of each of $Y^7$ and $Y^8$.

An alkylamino group and an aralkylamino group are included in the category of the substituted or unsubstituted amino group having 2 to 30 carbon atoms, and the amino group is represented by $—NQ^1Q^2$. Specific examples of $Q^1$ and $Q^2$ include examples similar to those described for the alkyl group, the aryl group, and the aralkyl group, and the same holds true for preferable examples of each of $Q^1$ and $Q^2$.

Specific examples of the substituted or unsubstituted, linear, branched, or cyclic alkyl group having 1 to 30 carbon atoms, the substituted or unsubstituted, linear, branched, or cyclic alkenyl group having 2 to 30 carbon atoms, the substituted or unsubstituted aralkyl group having 7 to 30 carbon atoms, the substituted or unsubstituted aryl group having 6 to 30 carbon atoms, or the amino group represented by any one of $R^{1e}$, $R^{2e}$, and $R^{1e}$ in the —$COOR^{1e}$ group, the —$COR^{2e}$ group, and the —$OCOR^{3e}$ group include specific examples similar to those described above.

$X^1$ to $X^{16}$ each preferably represent a substituted or unsubstituted aryl group having 6 to 20 carbon atoms.

The compound having a fluoranthene structure to be incorporated into the organic electroluminescence device of the present invention is preferably such that, in the general formula (2), n represents 2, and two FL's are different from each other.

The compound having a fluoranthene structure to be incorporated into the organic electroluminescence device of the present invention is more preferably such that, in the general formula (2), n represents 2, and two FL's are each represented by any one of the general formulae (2a) to (2d) and (2'b), and are different from each other.

$G^1$ in the general formula (2) represents a substituted or unsubstituted aromatic ring group having 6 to 40 carbon atoms, a substituted or unsubstituted arylamino group having 6 to 40 carbon atoms, a substituted or unsubstituted diaminoaryl group having 6 to 60 carbon atoms, a substituted or unsubstituted triaminoaryl group having 6 to 60 carbon atoms, a substituted or unsubstituted heterocyclic group having 3 to 40 carbon atoms, or a substituted or unsubstituted ethenylene group. It should be noted that, when n represents 2 or more, the case where $G^1$ represents a single bond is included.

$G^1$ preferably represents a linking group composed of any one of a substituted or unsubstituted phenylene, a substituted or unsubstituted biphenylene, a substituted or unsubstituted naphthacene, a substituted or unsubstituted anthrecene, a substituted or unsubstituted ethenylene, a substituted or unsubstituted fluorene, a substituted or unsubstituted thiophene, a substituted or unsubstituted thiadiazole, a substituted or unsubstituted pyrazine, a substituted or unsubstituted amine, a substituted or unsubstituted arylamine, a substituted or unsubstituted triarylamine, a substituted or unsubstituted carbazole, a substituted or unsubstituted pyrrole, a substituted or unsubstituted thiazole, a substituted or unsubstituted benzothiazole, a substituted or unsubstituted benzothiadiazole, a substituted or unsubstituted phenanthroline, a substituted or unsubstituted quinoline, and a substituted or unsubstituted quinoxaline.

$G^1$ is preferably selected from divalent or trivalent groups having the following structures.

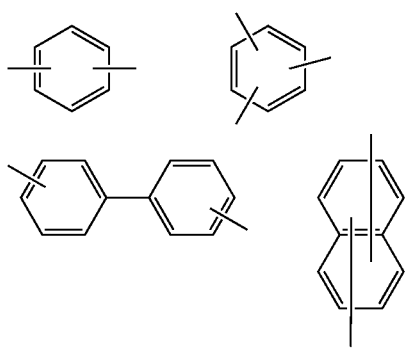

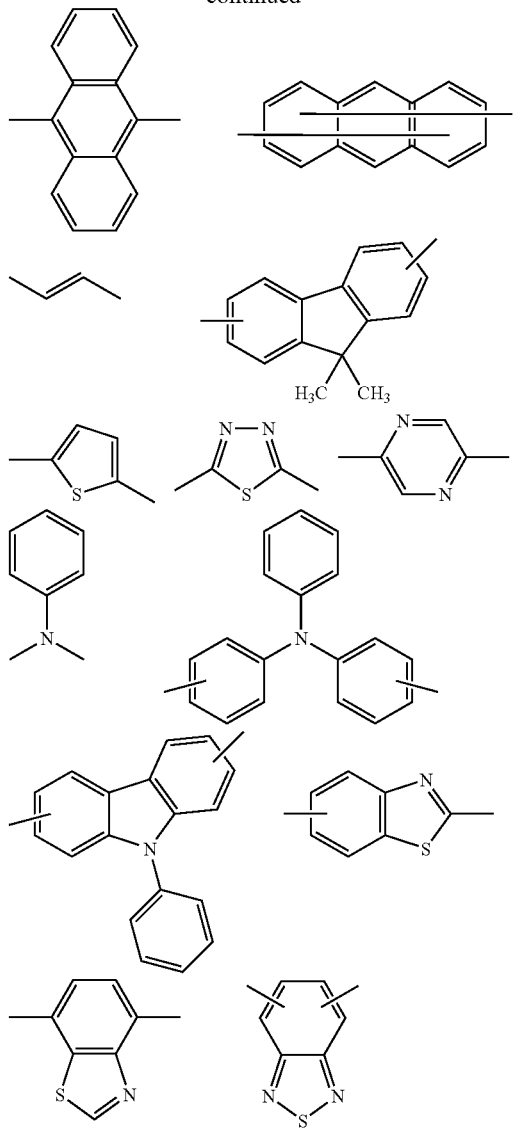

In the general formula (2), n represents 2 to 4, and FL represents a monovalent group derived from a compound having a structure represented by the following general formula (2'b).

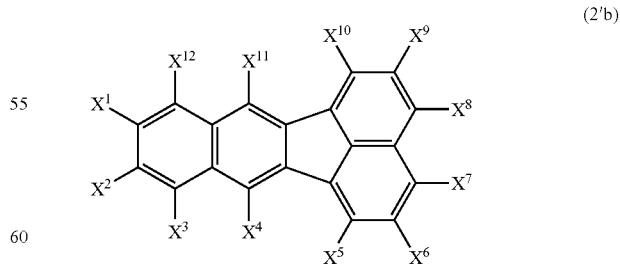

(2'b)

In the general formula (2'b), $X^1$ to $X^{12}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —COOR$^{1e}$ group (where R$^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms), a —COR$^{2e}$ group (where R$^2$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group), or a —OCOR$^{3e}$ group (where R$^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms), and adjacent groups or substituents of groups out of X$^1$ to X$^{16}$ may be bonded to each other to form a substituted or unsubstituted carbon ring.

It should be noted that multiple FL's are different from each other when n=2, and at least one FL is different from the other FL's when n=3 or 4.

In addition, specific examples of each of X$^1$ to X$^{12}$ in the general formula (2'b) are identical to those described above.

In the general formula (2), n represents 2 to 4, and FL represents a monovalent group derived from a compound having a structure represented by the following general formula (2'b).

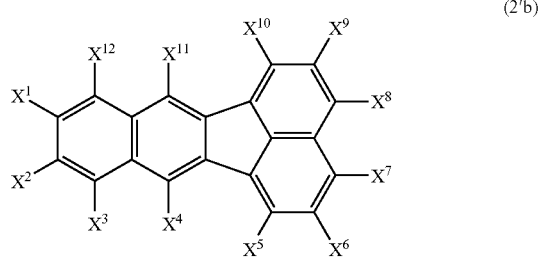

(2'b)

In the general formula (2'b), X$^1$ to X$^{12}$ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxyl group, a —COOR$^{1e}$ group (where R$^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms), a —COR$^{2e}$ group (where R$^{2e}$ represents a hydrogen atom, a substituted or unsubstituted, linear, branched, or cyclic alkyl group having 1 to 30 carbon atoms, a substituted or unsubstituted linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group), or a —OCOR$^{3e}$ group (where R$^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms), and adjacent groups or substituents of groups out of X$^1$ to X$^{16}$ may be bonded to each other to form a substituted or unsubstituted carbon ring.

It should be noted that multiple FL's are different from each other when n=2, and at least one FL is different from the other FL's when n=3 or 4. G$^1$ represents one kind selected from a single bond and groups having the following structure.

In addition, specific examples of each of X$^1$ to X$^{12}$ in the general formula (2'b) are identical to those described above.

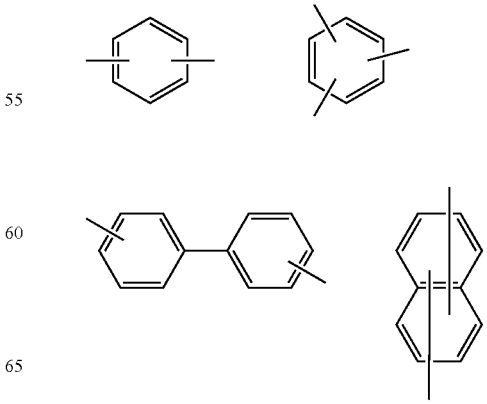

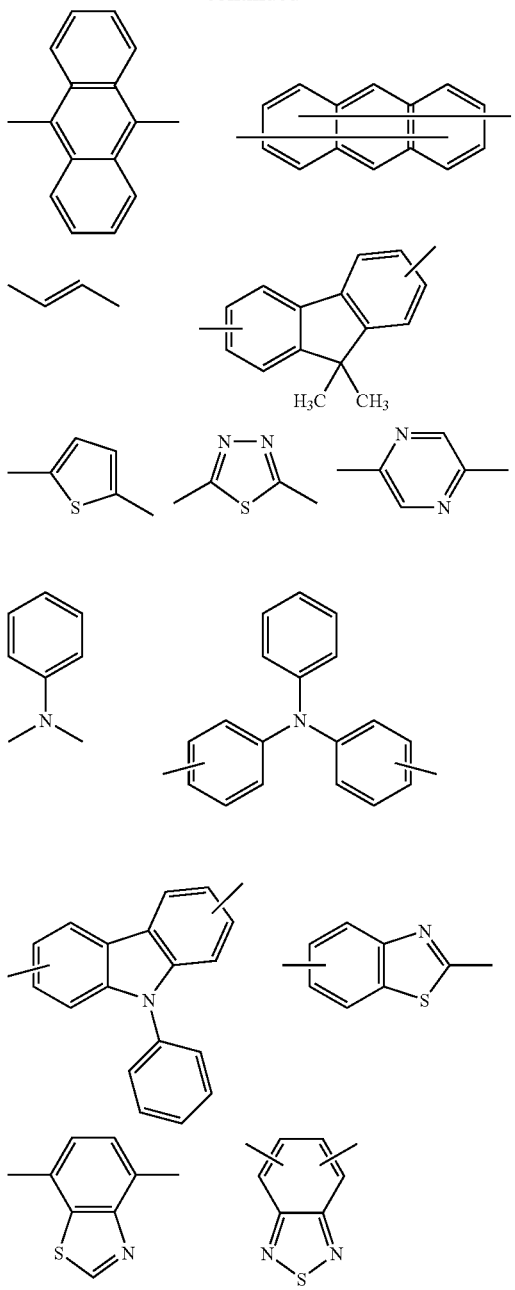

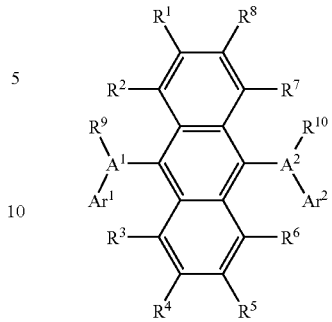

(3a)

In the general formula (3a), $A^1$ and $A^2$ each independently represent a substituted or unsubstituted fused aromatic ring group having 10 to 20 ring carbon atoms.

Examples of the substituted or unsubstituted fused aromatic ring group represented by each of $A^1$ and $A^2$ in the general formula (3a) include a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 3-methyl-2-naphthyl group, a 4-methyl-1-naphthyl group, and a 4-methyl-1-anthryl group.

Of those, a 1-naphthyl group, a 2-naphthyl group, and a 9-phenanthryl group are preferable.

In the general formula (3a), $Ar^1$ and $Ar^2$ each independently represent a hydrogen atom, or a substituted or unsubstituted aromatic ring group having 6 to 50 ring carbon atoms.

Examples of the substituted or unsubstituted aromatic ring group represented by each of $Ar^1$ and $Ar^2$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group.

Of those, a phenyl group, a 1-naphthyl group, a 2-naphthyl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, an o-tolyl group, an m-tolyl group, a p-tolyl group, and a p-t-butylphenyl group are preferable.

The fused ring-containing compound to be used as a material for the organic EL device of the present invention together with the compound having a fluoranthene structure represented by the general formula (2) is represented by the following general formula (1):

 (1)

where $G^2$ represents a fused ring-containing compound having a substituted or unsubstituted anthracene structure, a substituted or unsubstituted pyrene structure, a substituted or unsubstituted amine structure, or a substituted or unsubstituted benzene structure.

$G^2$ preferably represents the following substituted or unsubstituted anthracene structure.

In the general formula (3a), $R^1$ to $R^{10}$ each independently represent a hydrogen atom, a substituted or unsubstituted aromatic ring group having 6 to 50 ring carbon atoms, a substituted or unsubstituted aromatic heterocyclic group having 5 to 50 ring atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxyl group.

Examples of the substituted or unsubstituted aromatic ring group represented by each of $R^1$ to $R^{10}$ include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a p-(2-phenylpropyl)phenyl group, a 3-methyl-2-naphthyl group, a 4-methyl-1-naphthyl group, a 4-methyl-1-anthryl group, a 4'-methylbiphenylyl group, and a 4"-t-butyl-p-terphenyl-4-yl group.

Examples of the substituted or unsubstituted aromatic heterocyclic group represented by each of $R^1$ to $R^{10}$ include a 1-pyrolyl group, a 2-pyrolyl group, a 3-pyrolyl group, a pyradinyl group, a 2-pyridinyl group, a 3-pyridinyl group, a 4-pyridinyl group, a 1-indolyl group, a 2-indolyl group, a 3-indolyl group, a 4-indolyl group, a 5-indolyl group, a 6-indolyl group, a 7-indolyl group, a 1-isoindolyl group, a 2-isoindolyl group, a 3-isoindolyl group, a 4-isoindolyl group, a 5-isoindolyl group, a 6-isoindolyl group, a 7-isoindolyl group, a 2-furyl group, a 3-furyl group, a 2-benzofuranyl group, a 3-benzofuranyl group, a 4-benzofuranyl group, a 5-benzofuranyl group, a 6-benzofuranyl group, a 7-benzofuranyl group, a 1-isobenzofuranyl group, a 3-isobenzofuranyl group, a 4-isobenzofuranyl group, a 5-isobenzofuranyl group, a 6-isobenzofuranyl group, a 7-isobenzofuranyl group, a quinolyl group, a 3-quinolyl group, a 4-quinolyl group, a 5-quinolyl group, a 6-quinolyl group, a 7-quinolyl group, an 8-quinolyl group, a 1-isoquinolyl group, a 3-isoquinolyl group, a 4-isoquinolyl group, a 5-isoquinolyl group, a 6-isoquinolyl group, a 7-isoquinolyl group, an 8-isoquinolyl group, a 2-quinoxalinyl group, a 5-quinoxalinyl group, a 6-quinoxalinyl group, a 1-carbazolyl group, a 2-carbazolyl group, a 3-carbazolyl group, a 4-carbazolyl group, a 9-carbazolyl group, a 1-phenanthridinyl group, a 2-phenanthridinyl group, a 3-phenanthridinyl group, a 4-phenanthridinyl group, a 6-phenanthridinyl group, a 7-phenanthridinyl group, an 8-phenanthridinyl group, a 9-phenanthridinyl group, a 10-phenanthridinyl group, a 1-acridinyl group, a 2-acridinyl group, a 3-acridinyl group, a 4-acridinyl group, a 9-acridinyl group, a 1,7-phenanthrolin-2-yl group, a 1,7-phenanthrolin-3-yl group, a 1,7-phenanthrolin-4-yl group, a 1,7-phenanthrolin-5-yl group, a 1,7-phenanthrolin-6-yl group, a 1,7-phenanthrolin-8-yl group, a 1,7-phenanthrolin-9-yl group, a 1,7-phenanthrolin-10-yl group, a 1,8-phenanthrolin-2-yl group, a 1,8-phenanthrolin-3-yl group, a 1,8-phenanthrolin-4-yl group, a 1,8-phenanthrolin-5-yl group, a 1,8-phenanthrolin-6-yl group, a 1,8-phenanthrolin-7-yl group, a 1,8-phenanthrolin-9-yl group, a 1,8-phenanthrolin-10-yl group, a 1,9-phenanthrolin-2-yl group, a 1,9-phenanthrolin-3-yl group, a 1,9-phenanthrolin-4-yl group, a 1,9-phenanthrolin-5-yl group, a 1,9-phenanthrolin-6-yl group, a 1,9-phenanthrolin-7-yl group, a 1,9-phenanthrolin-8-yl group, a 1,9-phenanthrolin-10-yl group, a 1,10-phenanthrolin-2-yl group, a 1,10-phenanthrolin-3-yl group, a 1,10-phenanthrolin-4-yl group, a 1,10-phenanthrolin-5-yl group, a 2,9-phenanthrolin-1-yl group, a 2,9-phenanthrolin-3-yl group, a 2,9-phenanthrolin-4-yl group, a 2,9-phenanthrolin-5-yl group, a 2,9-phenanthrolin-6-yl group, a 2,9-phenanthrolin-7-yl group, a 2,9-phenanthrolin-8-1 group, a 2,9-phenanthrolin-10-yl group, a 2,8-phenanthrolin-1-yl group, a 2,8-phenanthrolin-3-yl group, a 2,8-phenanthrolin-4-yl group, a 2,8-phenanthrolin-5-yl group, a 2,8-phenanthrolin-6-yl group, a 2,8-phenanthrolin-7-yl group, a 2,8-phenanthrolin-9-yl group, a 2,8-phenanthrolin-10-yl group, a 2,7-phenanthrolin-1-yl group, a 2,7-phenanthrolin-3-yl group, a 2,7-phenanthrolin-4-yl group, a 2,7-phenanthrolin-5-yl group, a 2,7-phenanthrolin-6-yl group, a 2,7-phenanthrolin-8-yl group, a 2,7-phenanthrolin-9-yl group, a 2,7-phenanthrolin-10-yl group, a 1-phenadinyl group, a 2-phenadinyl group, a 1-phenothiadinyl group, a 2-phenothiadinyl group, a 3-phenothiadinyl group, a 4-phenothiadinyl group, a 10-phenothiadinyl group, a 1-phenoxadinyl group, a 2-phenoxadinyl group, a 3-phenoxadinyl group, a 4-phenoxadinyl group, a 10-phenoxadinyl group, a 2-oxazolyl group, a 4-oxazolyl group, a 5-oxazolyl group, a 2-oxadiazolyl group, a 5-oxadiazolyl group, a 3-furazanyl group, a 2-thienyl group, a 3-thienyl group, a 2-methylpyrrol-1-yl group, a 2-methylpyrrol-3-yl group, a 2-methylpyrrol-4-yl group, a 2-methylpyrrol-5-yl group, a 3-methylpyrrol-1-yl group, a 3-methylpyrrol-2-yl group, a 3-methylpyrrol-4-yl group, a 3-methylpyrrol-5-yl group, a 2-t-butylpyrrol-4-yl group, a 3-(2-phenylpropyl)pyrrol-1-yl group, a 2-methyl-1-indolyl group, a 4-methyl-1-indolyl group, a 2-methyl-3-indolyl group, a 4-methyl-3-indolyl group, a 2-t-butyl-1-indolyl group, a 4-t-butyl-1-indolyl group, a 2-t-butyl-3-indolyl group, and a 4-t-butyl-3-indolyl group Examples of the substituted or unsubstituted alkyl group represented by each of $R^1$ to $R^{10}$ include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, and a 1,2,3-trinitropropyl group.

Examples of the substituted or unsubstituted cycloalkyl group represented by each of $R^1$ to $R^{10}$ include, for example, a cyclopropyl group, a cyclobutyl group, a cyclopentyl group, a cyclohexyl group, a 4-methylcyclohexyl group, a 1-adamantyl group, a 2-adamantyl group, a 1-norbornyl group, and a 2-norbornyl group.

The substituted or unsubstituted alkoxy group represented by any one of $R^1$ to $R^{10}$ is a group represented by —OY.

Examples of Y include examples similar to those described for the substituted or unsubstituted alkyl group represented by any one of $R^1$ to $R^{10}$.

Examples of the substituted or unsubstituted aralkyl group represented by each of $R^1$ to $R^{10}$ include a benzyl group, a 1-phenylethyl group, a 2-phenylethyl group, a 1-phenylisopropyl group, a 2-phenylisopropyl group, a phenyl-t-butyl group, an α-naphthylmethyl group, a 1-α-naphthylethyl group, a 2-α-naphthylethyl group, a 1-α-naphthylisopropyl group, a 2-α-naphthylisopropyl group, a β-naphthylmethyl group, a 1-β-naphthylethyl group, a 2-β-naphthylethyl group, a 1-β-naphthylisopropyl group, a 2-β-naphthylisopropyl group, a 1-pyrrolylmethyl group, a 2-(1-pyrrolyl)ethyl group, a p-methylbenzyl group, an m-methylbenzyl group, an o-methylbenzyl group, a p-chlorobenzyl group, an m-chlorobenzyl group, an o-chlorobenzyl group, a p-bromobenzyl group, an m-bromobenzyl group, an o-bromobenzyl group, a p-iodobenzyl group, an m-iodobenzyl group, an o-iodobenzyl group, a p-hydroxybenzyl group, an m-hydroxybenzyl group, an o-hydroxybenzyl group, a p-aminobenzyl group, an m-aminobenzyl group, an o-aminobenzyl group, a p-nitrobenzyl group, an m-nitrobenzyl group, an o-nitrobenzyl group, a p-cyanobenzyl group, an m-cyanobenzyl group, an o-cyanobenzyl group, a 1-hydroxy-2-phenylisopropyl group, and a 1-chloro-2-phenylisopropyl group.

The substituted or unsubstituted aryloxy group, and the substituted or unsubstituted arylthio group each represented by any one of $R^1$ to $R^{10}$ are represented by —OY' and —SY", respectively. Examples of each of Y' and Y" include examples similar to those described for the substituted or unsubstituted aromatic ring group represented by any one of $R^1$ to $R^{10}$, and the substituted or unsubstituted aromatic heterocyclic group represented by any one of $R^1$ to $R^{10}$.

The substituted or unsubstituted alkoxycarbonyl group represented by any one of $R^1$ to $R^{10}$ is represented by —COOZ. Examples of Z include examples similar to those described for the substituted or unsubstituted alkyl group represented by any one of $R^1$ to $R^{10}$.

Examples of the halogen atom represented by any one of $R^1$ to $R^{10}$ include fluorine, chlorine, bromine, and iodine. Of those, a fluorine atom is preferable.

Examples of the substituent of each group represented by $Ar^1$ and $Ar^2$ and $R^1$ to $R^{10}$ include a halogen atom, a hydroxyl group, a nitro group, a cyano group, an alkyl group, an aryl group, a cycloalkyl group, an alkoxy group, an aromatic heterocyclic group, an aralkyl group, an aryloxy group, an arylthio group, an alkoxycarbonyl group, and a carboxyl group.

The number of each of $Ar^1$, $Ar^2$, $R^9$, and $R^{10}$ may be two or more, and adjacent groups may form a saturated or unsaturated cyclic structure.

$G^2$ described above preferably represents a compound having a structure represented by the following general formula (3a"):

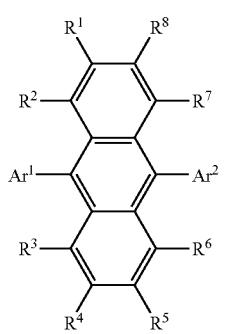

Where: $Ar^1$ and $Ar^2$ each independently represent a substituted or unsubstituted aromatic ring group having 10 to 30 ring carbon atoms except an anthracene residue; and $R^1$ to $R^8$ each independently represent a hydrogen atom, a substituted or unsubstituted aromatic ring group having 6 to 50 ring carbon atoms, a substituted or unsubstituted aromatic heterocyclic group having 5 to 50 ring atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxyl group.

Examples of the aromatic ring group having 10 to 30 ring carbon atoms represented by each of $Ar^1$ and $Ar^2$ in the general formula (3a") (except an anthracene residue) include: a substituted or unsubstituted α-naphthyl group and a substituted or unsubstituted β-naphthyl group; a substituted or unsubstituted phenanthrenyl group; a substituted or unsubstituted chrysenyl group; a substituted or unsubstituted tetracenyl group; a substituted or unsubstituted pyrenyl group; a substituted or unsubstituted phenylnaphthyl group; a substituted or unsubstituted naphthylnaphthyl group; a substituted or unsubstituted naphthylphenyl group; a substituted or unsubstituted phenylpyrenyl group; a substituted or unsubstituted pyrenylphenyl group; a substituted or unsubstituted naphthylnaphthylnaphthyl group; a substituted or unsubstituted naphthylnaphthylphenyl group; a substituted or unsubstituted naphthylphenylphenyl group; a substituted or unsubstituted naphthylphenylnaphthyl group; a substituted or unsubstituted phenylnaphthylnaphthyl group; a substituted or unsubstituted phenylnaphthylphenyl group; and a substituted or unsubstituted phenylphenylnaphthyl group. Of those, a substituted or unsubstituted α-naphthyl group, a substituted or unsubstituted β-naphthyl group, a substituted or unsubstituted phenylnaphthyl group, a substituted or unsubstituted naphthylnaphthyl group, or a substituted or unsubstituted naphthylphenyl group is preferable.

In the general formula (3a"), the unsubstituted aromatic ring group having 10 to 30 ring carbon atoms is preferably an aromatic residue containing a naphthalene residue.

Specific examples of each of the substituted or unsubstituted aromatic ring group having 6 to 50 ring carbon atoms, the substituted or unsubstituted aromatic heterocyclic group having 5 to 50 ring atoms, the substituted or unsubstituted alkyl group having 1 to 50 carbon atoms, the substituted or unsubstituted cycloalkyl group, the substituted or unsubstituted alkoxy group having 1 to 50 carbon atoms, the substituted or unsubstituted aralkyl group having 6 to 50 carbon atoms, the substituted or unsubstituted aryloxy group having 5 to 50 ring atoms, the substituted or unsubstituted arylthio group having 5 to 50 ring atoms, the substituted or unsubstituted alkoxycarbonyl group having 1 to 50 carbon atoms, and the substituted or unsubstituted silyl group each represented by any one of $R^1$ to $R^8$ in the general formula (3a") include examples similar to those described above.

$G^2$ preferably represents a compound having a structure represented by the following general formula (3a'):

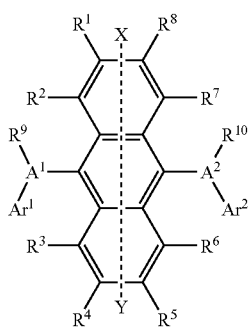

(3a')

Where: $A^1$ and $A^2$ each independently represent a hydrogen atom, or a substituted or unsubstituted aromatic ring group having 6 to 50 ring carbon atoms;

$R^1$ to $R^{10}$ each independently represent a hydrogen atom, a substituted or unsubstituted aromatic ring group having 6 to 50 ring carbon atoms, a substituted or unsubstituted aromatic heterocyclic group having 5 to 50 ring atoms, a substituted or unsubstituted alkyl group having 1 to 50 carbon atoms, a substituted or unsubstituted cycloalkyl group, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxyl group; and the number of each of $Ar^1$, $Ar^2$, $R^9$, and $R^{10}$ may be two or more, and adjacent groups may form a saturated or unsaturated cyclic structure, Provided that a case where, in the general formula (3a'), groups symmetrical with respect to an X—Y axis shown on central anthracene are bonded to 9- and 10-positions of the anthracene is excluded.

Specific examples of $A^1$ and $A^2$ and $R^1$ to $R^{10}$ include examples similar to those described in the general formula (3a).

The fused ring-containing compound as $G^2$ represented by the general formula (1) preferably has the following substituted or unsubstituted pyrene structure.

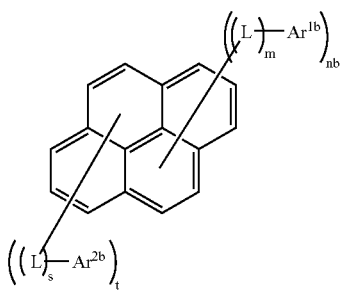

(3b)

In the general formula (3b), $Ar^{1b}$ and $Ar^{2b}$ each represent a substituted or unsubstituted aromatic group having 6 to 50 ring carbon atoms.

Examples of the aromatic group include a phenyl group, a 1-naphthyl group, a 2-naphthyl group, a 1-anthryl group, a 2-anthryl group, a 9-anthryl group, a 9-(10-phenyl)anthryl group, a 9-(10-naphthyl-1-yl)anthryl group, a 9-(10-naphthyl-2-yl)anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group, an m-terphenyl-2-yl group, an o-tolyl group, an m-tolyl group, a p-tolyl group, a p-t-butylphenyl group, a 3-methyl-2-naphthyl group, a 4-methyl-1-naphthyl group, and a 4-methyl-1-anthryl group.

Preferable examples of the aromatic group among those examples include a phenyl group, a 1-naphthyl group, a 2-naphthyl group, a 9-(10-phenyl)anthryl group, a 9-(10-naphthyl-1-yl)anthryl group, a 9-(10-naphthyl-2-yl)anthryl group, a 9-phenanthryl group, a 1-pyrenyl group, a 2-pyrenyl group, a 4-pyrenyl group, a 2-biphenylyl group, a 3-biphenylyl group, a 4-biphenylyl group, an o-tolyl group, an m-tolyl group, a p-tolyl group, and a p-t-butylphenyl group.

In addition, the aromatic group may be additionally substituted by a substituent, and examples of the substituent include: an alkyl group (such as a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, a hydroxymethyl group, a 1-hydroxyethyl group, a 2-hydroxyethyl group, a 2-hydroxyisobutyl group, a 1,2-dihydroxyethyl group, a 1,3-dihydroxyisopropyl group, a 2,3-dihydroxy-t-butyl group, a 1,2,3-trihydroxypropyl group, a chloromethyl group, a 1-chloroethyl group, a 2-chloroethyl group, a 2-chloroisobutyl group, a 1,2-dichloroethyl group, a 1,3-dichloroisopropyl group, a 2,3-dichloro-t-butyl group, a 1,2,3-trichloropropyl group, a bromomethyl group, a 1-bromoethyl group, a 2-bromoethyl group, a 2-bromoisobutyl group, a 1,2-dibromoethyl group, a 1,3-dibromoisopropyl group, a 2,3-dibromo-t-butyl group, a 1,2,3-tribromopropyl group, an iodomethyl group, a 1-iodoethyl group, a 2-iodoethyl group, a 2-iodoisobutyl group, a 1,2-diiodoethyl group, a 1,3-diiodoisopropyl group, a 2,3-diiodo-t-butyl group, a 1,2,3-triiodopropyl group, an aminomethyl group, a 1-aminoethyl group, a 2-aminoethyl group, a 2-aminoisobutyl group, a 1,2-diaminoethyl group, a 1,3-diaminoisopropyl group, a 2,3-diamino-t-butyl group, a 1,2,3-triaminopropyl group, a cyanomethyl group, a 1-cyanoethyl group, a 2-cyanoethyl group, a 2-cyanoisobutyl group, a 1,2-dicyanoethyl group, a 1,3-dicyanoisopropyl group, a 2,3-dicyano-t-butyl group, a 1,2,3-tricyanopropyl group, a nitromethyl group, a 1-nitroethyl group, a 2-nitroethyl group, a 2-nitroisobutyl group, a 1,2-dinitroethyl group, a 1,3-dinitroisopropyl group, a 2,3-dinitro-t-butyl group, a 1,2,3-trinitropropyl group, a cyclopropyl group, a cyclobutyl group, a cyclopentyl group, a cyclohexyl group, a 4-methylcyclohexyl group, a 1-adamantyl group, a 2-adamantyl group, a 1-norbornyl group, or a 2-norbornyl group); an alkoxy group having 1 to 6 carbon atoms (such as an ethoxy group, a methoxy group, an i-propoxy group, an n-propoxy group, an s-butoxy group, a t-butoxy group, a pentoxy group, a hexyloxy group, a cyclopentoxy group, or a cyclohexyloxy group); an aryl group having 5 to 40 ring atoms; an amino group substituted by an aryl group having 5 to 40 ring atoms; an ester group having an aryl group having 5 to 40 ring atoms; an ester group having an alkyl group having 1 to 6 carbon atoms; a cyano group; a nitro group; and a halogen atom.

L's in the general formula (3b) each represent a substituted or unsubstituted phenylene group, a substituted or unsubstituted naphthalenylene group, a substituted or unsubstituted fluorenylene group, or a substituted or unsubstituted dibenzosilolylene group. Of those, a substituted or unsubstituted phenylene group, or a substituted or unsubstituted fluorenylene group is preferable.

In addition, examples of a substituent for each of those groups include examples similar to those described for the aromatic group.

In the general formula (3b), m represents an integer of 0 to 2, preferably 0 to 1, nb represents an integer of 1 to 4, preferably 1 to 2, s represents an integer of 0 to 2, preferably 0 to 1, and t represents an integer of 0 to 4, preferably 0 to 2; and In addition, in the general formula (2c), L or $Ar^{1b}$ is bonded to any one of 1- to 5-positions of pyrene, and L or $Ar^{2b}$ is bonded to any one of 6- to 10-positions of pyrene, Provided that, when nb+t represents an even number, $Ar^{1b}$ $Ar^{2b}$, and L's satisfy the following relationship (1) or (2):
(1) $Ar^{1b} \neq Ar^{2b}$ where $\neq$ means that groups on both sides of the symbol are different from each other in structure; or
(2) for $Ar^{1b} = Ar^{2b}$,
  (2-1) when m$\neq$s and/or nb$\neq$t, or
  (2-2) when m=s and nb=t,
    (2-2-1) in a case where L's are, or pyrene is, bonded to different bonding positions on $Ar^{1b}$ and $Ar^{2b}$, or (2-2-2) in a case where L's are, or pyrene is, bonded to the same bonding position on $Ar^{1b}$ and $Ar^{2b}$, a case where substitution positions of L's or of $Ar^{1b}$ and $Ar^{2b}$ in pyrene are 1- and 6-positions or 2- and 7-positions is excluded.

The fused ring-containing compound as $G^2$ represented by the general formula (1) preferably has the following substituted or unsubstituted amine structure.

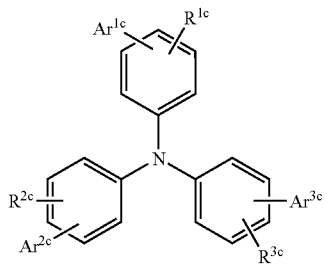

(3c)

In the general formula (3c), $Ar^{1c}$, $Ar^{2c}$, and $Ar^{3c}$ each independently represent a group having an anthracene structure, a phenanthrene structure, or a pyrene structure, and $R^{1c}$, $R^{2c}$, and $R^{3c}$ each independently represent a hydrogen atom or a substituent.

$Ar^{1c}$, $Ar^{2c}$, and $Ar^{3c}$ described above each represent preferably a substituted or unsubstituted anthrylphenyl group, an anthryl group, a phenanthrenyl group, or a pyrenyl group, more preferably an alkyl-substituted or unsubstituted anthrylphenyl group, a phenanthryl group, or a pyrenyl group, or particularly preferably a pyrenyl group or a phenanthryl group.

Examples of a substituent represented by any one of $R^{1c}$, $R^{2c}$, and $R^{3c}$ described above include: an alkyl group (having preferably 1 to 30, more preferably 1 to 20, or particularly preferably 1 to 10 carbon atoms such as a methyl, ethyl, isopropyl, t-butyl, n-octyl, n-decyl, n-hexadecyl, cyclopropyl, cyclopentyl, or cyclohexyl); an alkenyl group (having preferably 2 to 30, more preferably 2 to 20, or particularly preferably 2 to 10 carbon atoms such as a vinyl, allyl, 2-butenyl, or 3-pentenyl); an alkynyl group (having preferably 2 to 30, more preferably 2 to 20, or particularly preferably 2 to 10 carbon atoms such as a propargyl or 3-pentynyl); an aryl group (having preferably 6 to 30, more preferably 6 to 20, or particularly preferably 6 to 12 carbon atoms such as a phenyl, p-methylphenyl, naphthyl, or anthranyl); an amino group (having preferably 0 to 30, more preferably 0 to 20, or particularly preferably 0 to 10 carbon atoms such as an amino, methylamino, dimethylamino, diethylamino, dibenzylamino, diphenylamino, or ditolylamino); and an alkoxy group (having preferably 1 to 30, more preferably 1 to 20, or particularly preferably 1 to 10 carbon atoms such as a methoxy, ethoxy, butoxy, or 2-ethylhexyloxy).

The examples further include: an aryloxy group (having preferably 6 to 30, more preferably 6 to 20, or particularly preferably 6 to 12 carbon atoms such as a phenyloxy, 1-naphthyloxy, or 2-naphthyloxy); a heteroaryloxy group (having preferably 1 to 30, more preferably 1 to 20, or particularly preferably 1 to 12 carbon atoms such as a pyridyloxy, pyrazyloxy, pyrimidyloxy, or quinolyloxy); an acyl group (having preferably 1 to 30, more preferably 1 to 20, or particularly preferably 1 to 12 carbon atoms such as an acetyl, benzoyl, formyl, or pivaloyl); an alkoxycarbonyl group (having preferably 2 to 30, more preferably 2 to 20, or particularly preferably 2 to 12 carbon atoms such as a methoxycarbonyl or ethoxycarbonyl); an aryloxycarbonyl group (having preferably 7 to 30, more preferably 7 to 20, or particularly preferably 7 to 12 carbon atoms such as a phenyloxycarbonyl); an acyloxy group (having preferably 2 to 30, more preferably 2 to 20, or particularly preferably 2 to 10 carbon atoms such as an acetoxy or benzoyloxy); and an acylamino group (having preferably 2 to 30, more preferably 2 to 20, or particularly preferably 2 to 10 carbon atoms such as an acetylamino or benzoylamino).

The examples further include: an alkoxycarbonylamino group (having preferably 2 to 30, more preferably 2 to 20, or particularly preferably 2 to 12 carbon atoms such as a methoxycarbonylamino); an aryloxycarbonylamino group (having preferably 7 to 30, more preferably 7 to 20, or particularly preferably 7 to 12 carbon atoms such as a phenyloxycarbonylamino); a sulfonylamino group (having preferably 1 to 30, more preferably 1 to 20, or particularly preferably 1 to 12 carbon atoms such as a methanesulfonylamino or benzenesulfonylamino); a sulfamoyl group (having preferably 0 to 30, more preferably 0 to 20, or particularly preferably 0 to 12 carbon atoms such as a sulfamoyl, methylsulfamoyl, dimethylsulfamoyl, or phenylsulfamoyl); and a carbamoyl group (having preferably 1 to 30, more preferably 1 to 20, or particularly preferably 1 to 12 carbon atoms such as a carbamoyl, methylcarbamoyl, diethylcarbamoyl, or phenylcarbamoyl).

The examples further include: an alkylthio group (having preferably 1 to 30, more preferably 1 to 20, or particularly preferably 1 to 12 carbon atoms such as a methylthio or ethylthio); an arylthio group (having preferably 6 to 30, more preferably 6 to 20, or particularly preferably 6 to 12 carbon atoms such as a phenylthio); a heteroarylthio group (having preferably 1 to 30, more preferably 1 to 20, or particularly preferably 1 to 12 carbon atoms such as a pyridylthio, 2-benzimidazolylthio, 2-benzoxazolylthio, or 2-benzthiazolylthio); a sulfonyl group (having preferably 1 to 30, more preferably 1 to 20, or particularly preferably 1 to 12 carbon atoms such as a mesyl or tosyl); a sulfinyl group (having preferably 1 to 30, more preferably 1 to 20, or particularly preferably 1 to 12 carbon atoms such as a methanesulfinyl or benzenesulfinyl); and a ureido group (having preferably 1 to 30, more preferably 1 to 20, or particularly preferably 1 to 12 carbon atoms such as a ureido, methylureido, or phenylureido).

The examples further include: a phosphoric amide group (having preferably 1 to 30, more preferably 1 to 20, or particularly preferably 1 to 12 carbon atoms such as a diethylphosphoric amide or phenylphosphoric amide) a hydroxy group; a mercapto group; a halogen atom (such as a fluorine atom, a chlorine atom, a bromine atom, or an iodine atom); a cyano group; a sulfo group; a carboxyl group; a nitro group; a hydroxamic acid group; a sulfino group; a hydrazino group; an imino group; a heterocyclic group (having preferably 1 to 30, or more preferably 1 to 12 carbon atoms and containing, as a hetero atom, a nitrogen atom, an oxygen atom, a sulfur atom, or the like, specifically, for example, an imidazolyl, pyridyl, quinolyl, furyl, thienyl, piperidyl, morpholino, benzoxazolyl, benzimidazolyl, or benzthiazolyl); and a silyl group (having preferably 3 to 40, more preferably 3 to 30, or particularly preferably 3 to 24 carbon atoms such as a trimethylsilyl or triphenylsilyl). Each of those substituents may be additionally substituted.

$R^{1c}$, $R^{2c}$, and $R^{3c}$ described above each preferably represent an alkyl group or an aryl group.

The fused ring-containing compound as $G^2$ represented by the general formula (1) preferably has the following substituted or unsubstituted benzene structure.

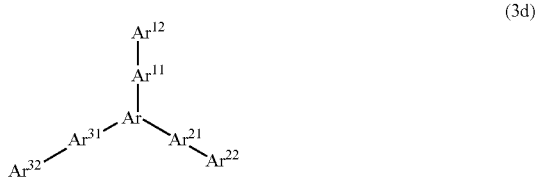

(3d)

Where $Ar^{11}$, $Ar^{21}$, and $Ar^{31}$ each represent an arylene group, $Ar^{12}$ $Ar^{22}$, and $Ar^{32}$ each independently represent a substituent or a hydrogen atom, at least one of $Ar^{11}$, $Ar^{21}$, $Ar^{31}$, $Ar^{12}$, $Ar^{22}$, and $Ar^{32}$ represents a fused ring aryl structure or a fused ring heteroaryl structure, and Ar represents an arylene group or a heteroarylene group.

The general formula (3d) will be described. $Ar^{11}$, $Ar^{21}$, and $Ar^{31}$ each represent an arylene group. The arylene group has preferably 6 to 30, more preferably 6 to 20, or still more preferably 6 to 16 carbon atoms. Examples of the arylene group include a phenylene group, a naphthylene group, an anthrylene group, a phenanthrenylene group, a pyrenylene group, a perylenylene group, a fluorenylene group, a biphenylene group, a terphenylene group, a rubrenylene group, a chrysenylene group, a triphenylenylene group, a benzoanthrylene group, a benzophenanthrenylene group, and a diphenylanthrylene group. Each of those arylene groups may additionally have a substituent.

Examples of a substituent on the arylene group include: an alkyl group (having preferably 1 to 30, more preferably 1 to 20, or particularly preferably 1 to 10 carbon atoms such as a methyl, ethyl, isopropyl, t-butyl, n-octyl, n-decyl, n-hexadecyl, cyclopropyl, cyclopentyl, or cyclohexyl); an alkenyl group (having preferably 2 to 30, more preferably 2 to 20, or particularly preferably 2 to 10 carbon atoms such as a vinyl, allyl, 2-butenyl, or 3-pentenyl); an alkynyl group (having preferably 2 to 30, more preferably 2 to 20, or particularly preferably 2 to 10 carbon atoms such as a propargyl or 3-pentynyl); an aryl group (having preferably 6 to 30, more preferably 6 to 20, or particularly preferably 6 to 12 carbon atoms such as a phenyl, p-methylphenyl, naphthyl, or anthranyl); an amino group (having preferably 0 to 30, more preferably 0 to 20, or particularly preferably 0 to 10 carbon atoms such as an amino, methylamino, dimethylamino, diethylamino, dibenzylamino, diphenylamino, or ditolylamino); an alkoxy group (having preferably 1 to 30, more preferably 1 to 20, or particularly preferably 1 to 10 carbon atoms such as a methoxy, ethoxy, butoxy, or 2-ethylhexyloxy); an aryloxy group (having preferably 6 to 30, more preferably 6 to 20, or particularly preferably 6 to 12 carbon atoms such as a phenyloxy, 1-naphthyloxy, or 2-naphthyloxy); and a heteroaryloxy group (having preferably 1 to 30, more preferably 1 to 20, or particularly preferably 1 to 12 carbon atoms such as a pyridyloxy, pyrazyloxy, pyrimidyloxy, or quinolyloxy).

The examples further include: an acyl group (having preferably 1 to 30, more preferably 1 to 20, or particularly preferably 1 to 12 carbon atoms such as an acetyl, benzoyl, formyl, or pivaloyl); an alkoxycarbonyl group (having preferably 2 to 30, more preferably 2 to 20, or particularly preferably 2 to 12 carbon atoms such as a methoxycarbonyl or ethoxycarbonyl); an aryloxycarbonyl group (having preferably 7 to 30, more preferably 7 to 20, or particularly preferably 7 to 12 carbon atoms such as a phenyloxycarbonyl); an acyloxy group (having preferably 2 to 30, more preferably 2 to 20, or particularly preferably 2 to 10 carbon atoms such as an acetoxy or benzoyloxy); an acylamino group (having preferably 2 to 30, more preferably 2 to 20, or particularly preferably 2 to 10 carbon atoms such as an acetylamino or benzoylamino); an alkoxycarbonylamino group (having preferably 2 to 30, more preferably 2 to 20, or particularly preferably 2 to 12 carbon atoms such as a methoxycarbonylamino); an aryloxycarbonylamino group (having preferably 7 to 30, more preferably 7 to 20, or particularly preferably 7 to 12 carbon atoms such as a phenyloxycarbonylamino); a sulfonylamino group (having preferably 1 to 30, more preferably 1 to 20, or particularly preferably 1 to 12 carbon atoms such as a methanesulfonylamino or benzenesulfonylamino); a sulfamoyl group (having preferably 0 to 30, more preferably 0 to 20, or particularly preferably 0 to 12 carbon atoms such as a sulfamoyl, methylsulfamoyl, dimethylsulfamoyl, or phenylsulfamoyl); a carbamoyl group (having preferably 1 to 30, more preferably 1 to 20, or particularly preferably 1 to 12 carbon atoms such as a carbamoyl, methylcarbamoyl, diethylcarbamoyl, or phenylcarbamoyl); an alkylthio group (having preferably 1 to 30, more preferably 1 to 20, or particularly preferably 1 to 12 carbon atoms such as a methylthio or ethylthio); and an arylthio group (having preferably 6 to 30, more preferably 6 to 20, or particularly preferably 6 to 12 carbon atoms such as a phenylthio).

The examples further include: a heteroarylthio group (having preferably 1 to 30, more preferably 1 to 20, or particularly preferably 1 to 12 carbon atoms such as a pyridylthio, 2-benzimidazolylthio, 2-benzoxazolylthio, or 2-benzthiazolylthio); a sulfonyl group (having preferably 1 to 30, more preferably 1 to 20, or particularly preferably 1 to 12 carbon atoms such as a mesyl or tosyl); a sulfinyl group (having preferably 1 to 30, more preferably 1 to 20, or particularly preferably 1 to 12 carbon atoms such as a methanesulfinyl or benzenesulfinyl); a ureido group (having preferably 1 to 30, more preferably 1 to 20, or particularly preferably 1 to 12 carbon atoms such as a ureido, methylureido, or phenylureido); a phosphoric amide group (having preferably 1 to 30, more preferably 1 to 20, or particularly preferably 1 to 12 carbon atoms such as a diethylphosphoric amide or phenylphosphoric amide); a hydroxy group; a mercapto group; a halogen atom (such as a fluorine atom, a chlorine atom, a bromine atom, or an iodine atom); a cyano group; a sulfo group; a carboxyl group; a nitro group; a hydroxamic acid group; a sulfino group; a hydrazino group; an imino group; a heterocyclic group (having preferably 1 to 30, or more preferably 1 to 12 carbon atoms and containing, as a hetero atom, a nitrogen atom, an oxygen atom, a sulfur atom, or the like, specifically, for example, an imidazolyl, pyridyl, quinolyl, furyl, thienyl, piperidyl, morpholino, benzoxazolyl, benzimidazolyl, benzthiazolyl, carbazolyl, or azepinyl group); and a silyl group (having preferably 3 to 40, more preferably 3 to 30, or particularly preferably 3 to 24 carbon atoms such as a trimethylsilyl or triphenylsilyl). Each of those substituents may be additionally substituted.

At least one of $Ar^{11}$, $Ar^{21}$, $Ar^{31}$, $Ar^{12}$, $Ar^{22}$, and $Ar^{32}$ described above represents a fused ring aryl structure or a fused ring heteroaryl structure. At least one of $Ar^{11}$, $Ar^{21}$, $Ar^{31}$, $Ar^{12}$, $Ar^{22}$, and $Ar^{32}$ preferably represents a fused ring aryl structure.

The fused ring aryl structure is preferably an aphthalene structure, an anthracene structure, a phenanthrene structure, a pyrene structure, or a perylene structure, more preferably a naphthalene structure, an anthracene structure, a pyrene structure, or a phenanthrene structure, still more preferably a phenanthrene structure or an aryl structure with four or more rings, or particularly preferably a pyrene structure.

The fused ring heteroaryl structure is preferably a quinoline structure, a quinoxaline structure, a quinazoline structure, an acridine structure, a phenanthridine structure, a phthalazine structure, or a phenanthroline structure, or more preferably a quinoline structure, a quinoxaline structure, a quinazoline structure, a phthalazine structure, or a phenanthroline structure.

Ar described above represents an arylene group which is trivalent (having preferably 6 to 30, more preferably 6 to 20, or still more preferably 6 to 16 carbon atoms such as a phenylene group, a naphthylene group, an anthracenylene group, a phenanthrene group, a pyrenylene group, or a triphenylene group) or a heteroarylene group (containing, as a hetero atom, preferably a nitrogen atom, a sulfur atom, or an oxygen atom, or more preferably a nitrogen atom and having preferably 2 to 30, more preferably 3 to 20, or still more preferably 3 to 16 carbon atoms such as a pyridylene group, a pyrazylene group, a thiophenylene group, a quinolylene group, a quinoxalylene group, or a triazylene group), and each of these groups may have a substituent. Examples of the substituent include those described for the substituent on $Ar^{11}$. Ar preferably represents any one of a phenylene group (benzenetolyl), a naphthylene group (naphthalenetriyl), an anthracenylene group (anthracenetriyl), a pyrenylene group (pyrenetriyl), and a triphenylene group each of which is trivalent, more preferably represents a phenylene group, or still more preferably represents an unsubstituted ($Ar^{11}$, $Ar^{21}$, and $Ar^{31}$ are each substituted) phenylene group or an alkyl-substituted phenylene group.

The fused ring-containing compound as $G^2$ represented by the general formula (1) is preferably at least one kind selected from compounds represented by the following general formulae (3'a) to (3'd).

General formula (3'a)

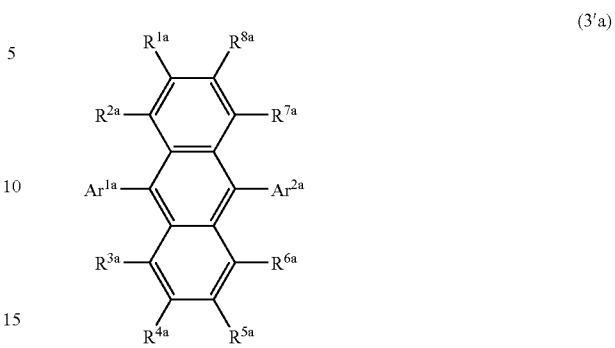

In the general formula (3'a), $Ar^{1a}$ and $Ar^{2a}$ each independently represent a group derived from a substituted or unsubstituted aromatic ring having 6 to 20 ring carbon atoms, the aromatic ring may be substituted by one or two or more substituents, the one or two or more substituents are selected from a substituted or unsubstituted aryl group having 6 to 50 ring carbon atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, and a hydroxy group, and, when the aromatic ring is substituted by two or more substituents, the substituents may be identical to or different from each other, and adjacent substituents may be bonded to each other to form a saturated or unsaturated cyclic structure; and $R^{1a}$ to $R^{8a}$ are each independently selected from a hydrogen atom, a substituted or unsubstituted aryl group having 6 to 50 ring carbon atoms, a substituted or unsubstituted heteroaryl group having 5 to 50 ring atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, and a hydroxy group.

General formula (3'b)

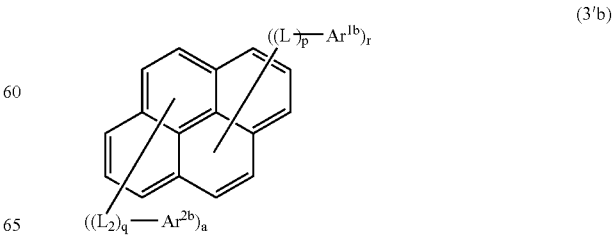

In the general formula (3'b), $Ar^{1b}$ and $Ar^{2b}$ each independently represent a substituted or unsubstituted aryl group having 6 to 50 ring carbon atoms, $L_1$ and $L_2$ are each independently selected from a substituted or unsubstituted phenylene group, a substituted or unsubstituted naphthalenylene group, a substituted or unsubstituted fluorenylene group, and a substituted or unsubstituted dibenzosilolylene group, p and q each represent an integer of 0 to 2, r represents an integer of 1 to 4, and s represents an integer of 0 to 4, and $L_1$ or $Ar^{1b}$ is bonded to any one of 1- to 5-positions of pyrene, and $L_2$ or $Ar^{2b}$ is bonded to any one of 6- to 10-positions of pyrene.

General formula (3'c)

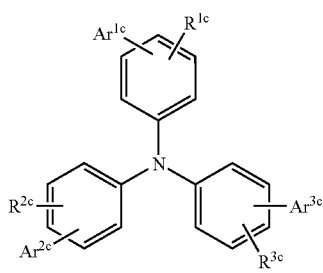

(3'c)

In the general formula (3'c), $Ar^{1c}$, $Ar^{2c}$, and $Ar^{3c}$ are each independently selected from a group having an anthracene structure, a group having a phenanthrene structure, a group having a pyrene structure, and a group having a perylene structure, and $R^{1c}$, $R^{2c}$, and $R^{3c}$ each independently represent a hydrogen atom or a substituent.

General formula (3'd)

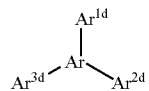

(3'd)

In the general formula (3'd), $Ar^{1d}$, $Ar^{2d}$, and $Ar^{3d}$ each independently represent an aryl group having 6 to 50 ring carbon atoms, and the aryl group may be substituted by one or two or more substituents, at least one of $Ar^{1d}$, $Ar^{2d}$, $Ar^{3d}$, and substituents possessed by these aryl groups has a fused ring aryl structure having 10 to 20 ring carbon atoms, or a fused ring heteroaryl structure having 6 to 20 ring carbon atoms, and Ar represents a trivalent group derived from an aromatic ring or from a heterocyclic aromatic ring.

Examples of the substituents in the general formulae (3'a) to (3'd) include examples similar to those described for the general formulae (3a) to (3d), and the same holds true for preferable examples of the substituents.

Specific examples of the compound having a fluoranthene structure represented by the general formula (2) to be used in the organic EL device of the present invention are shown below. However, the present invention is not limited to these exemplified compounds.

1-1

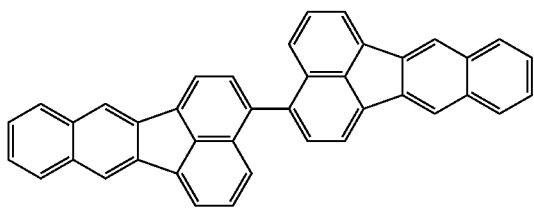

1-2

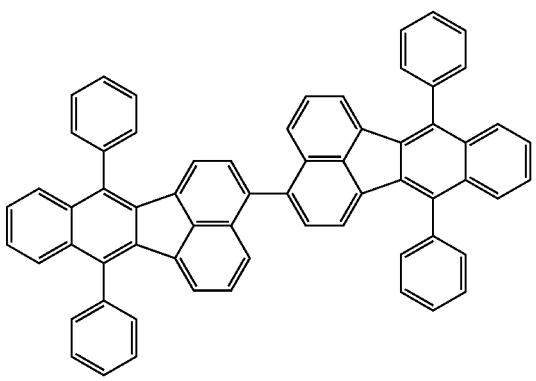

1-3

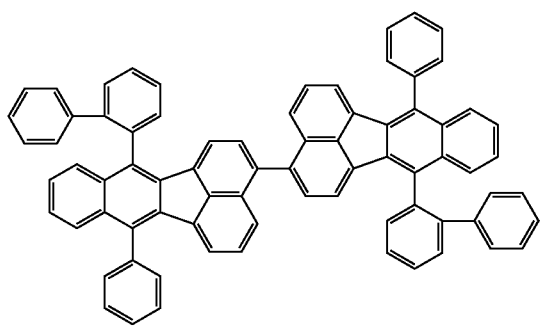

1-4

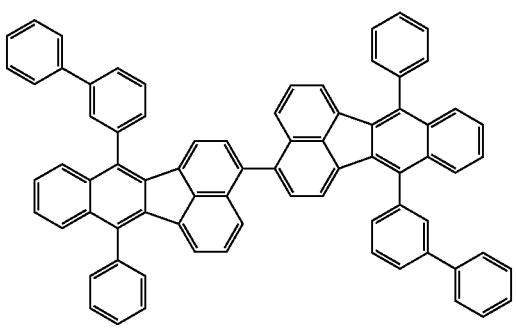

1-5
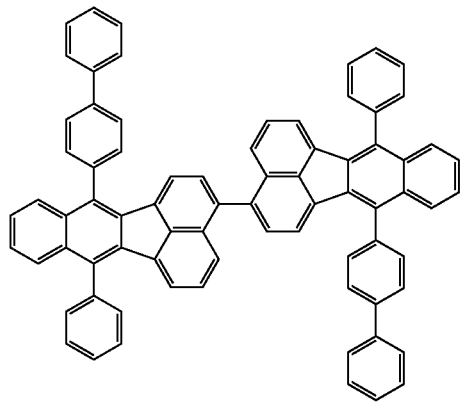
1-6
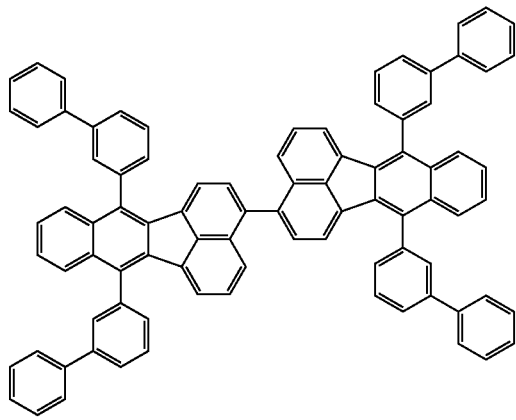
1-7
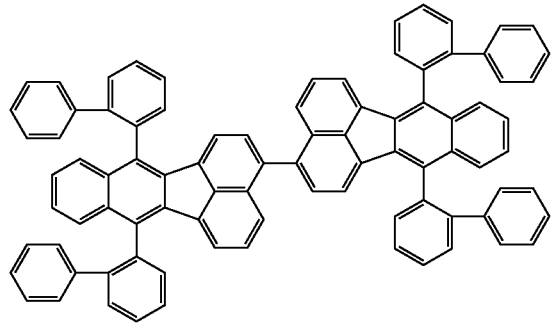
1-8
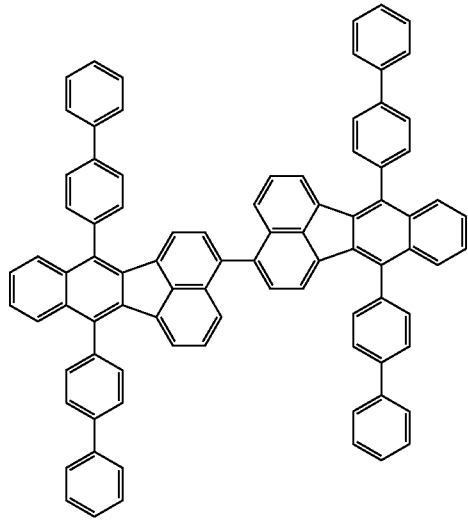
1-9
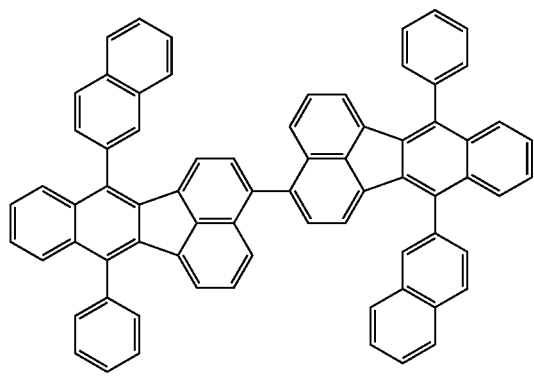
1-10
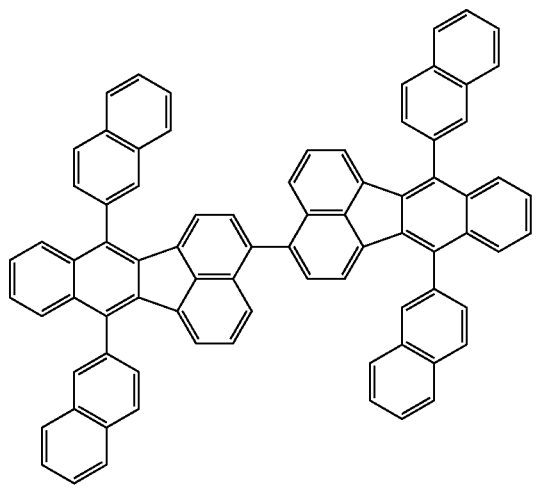

-continued
1-11
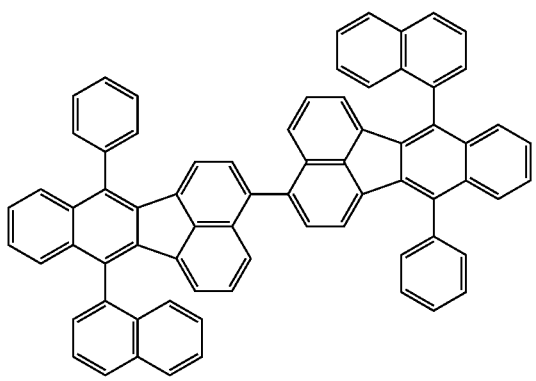
1-12
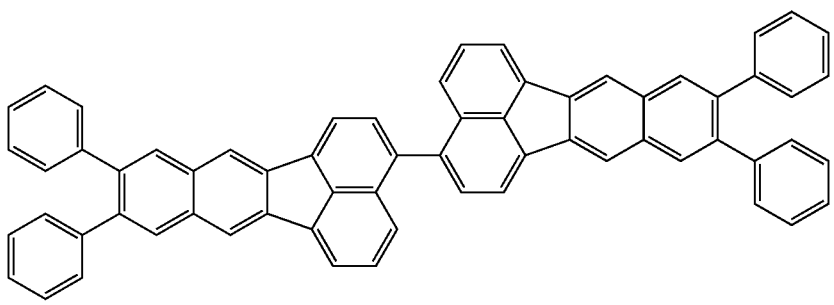
1-13
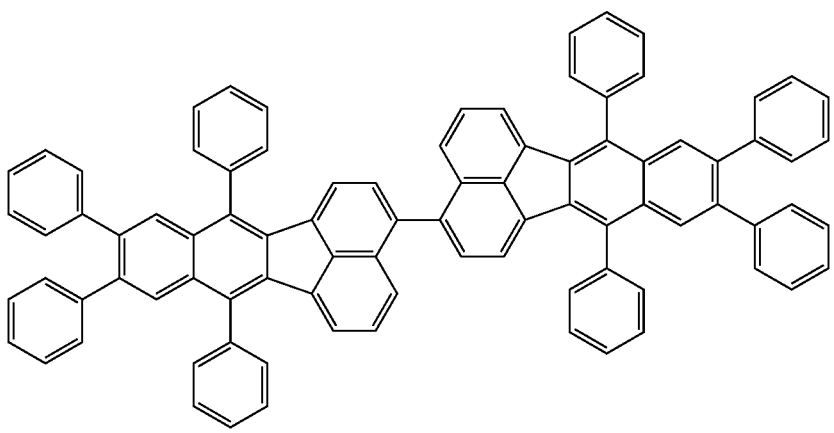
1-14
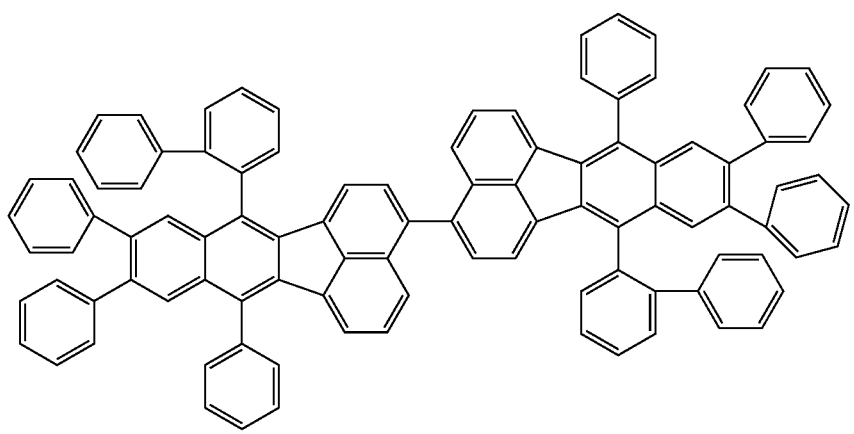

1-15
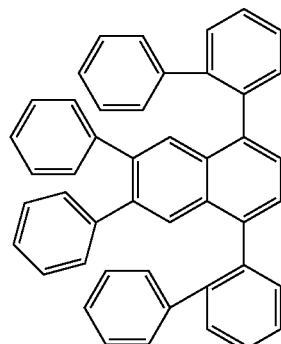 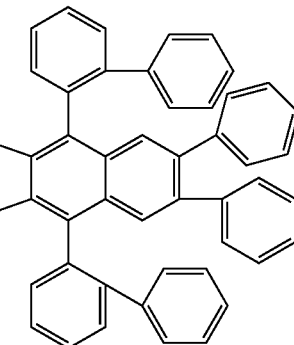
1-16
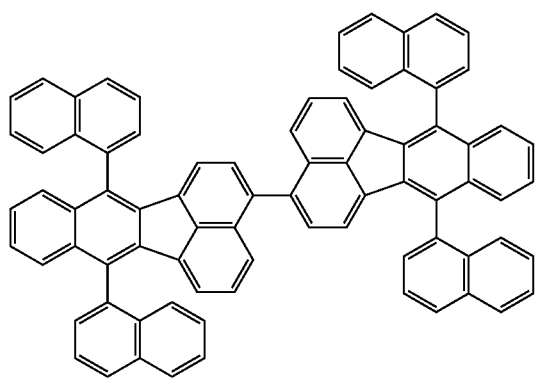
1-17
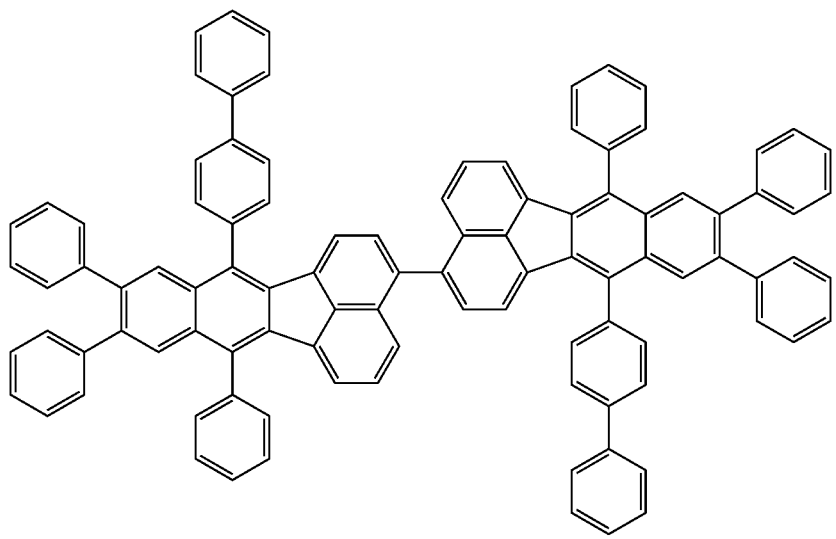

1-18
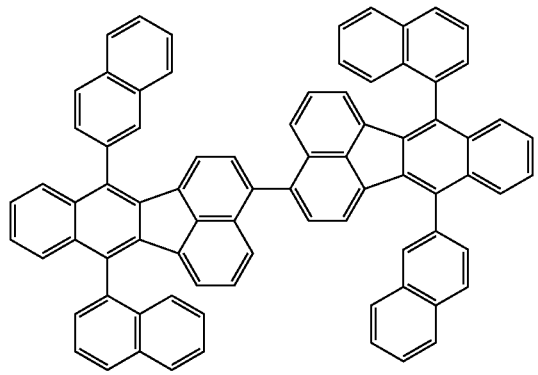
1-19
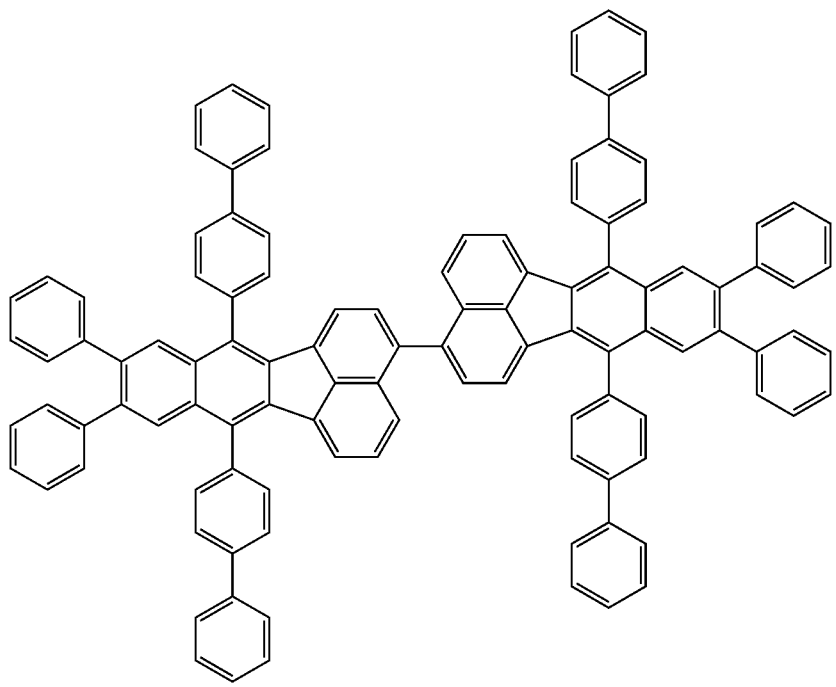
1-20
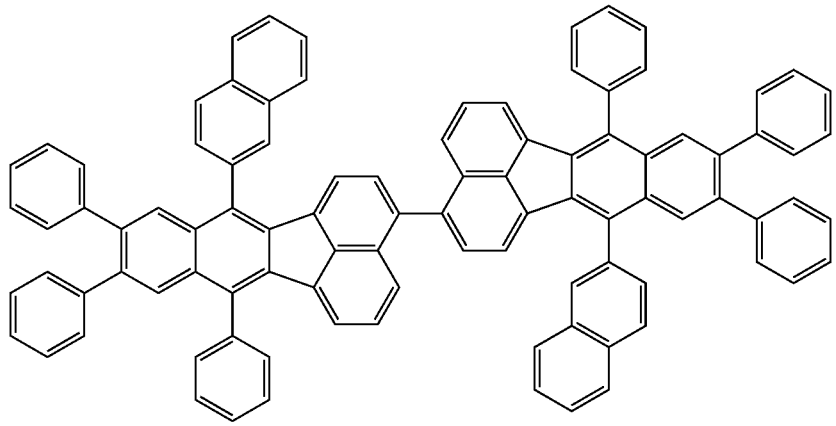

-continued
1-21
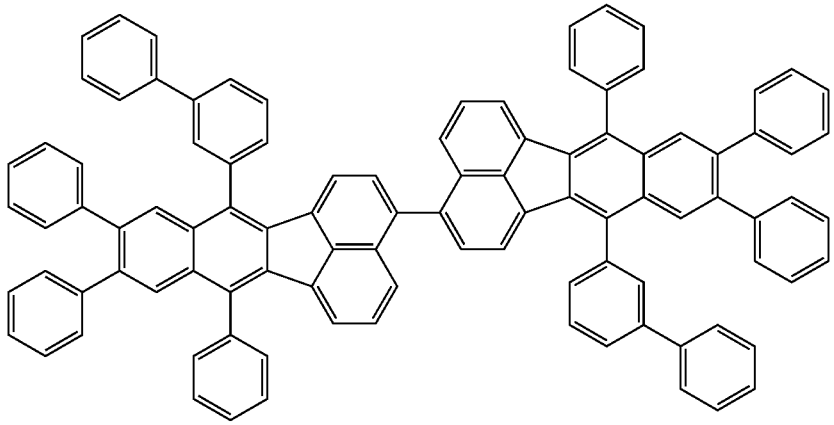
1-22
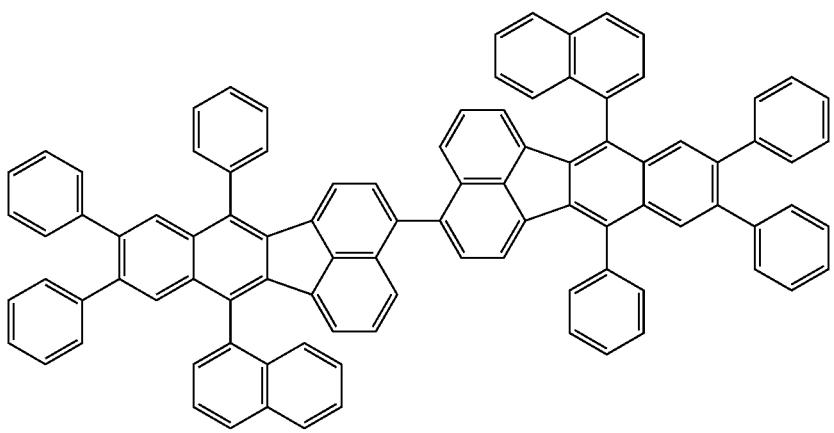
1-23
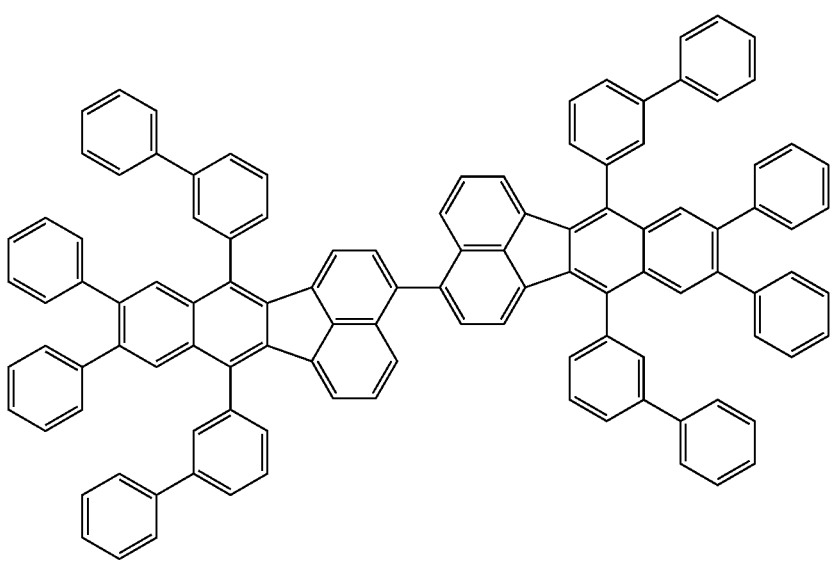

1-24
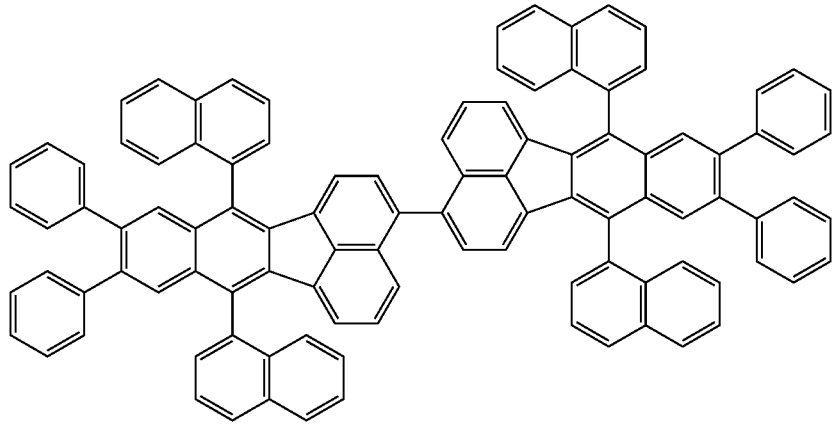
1-25
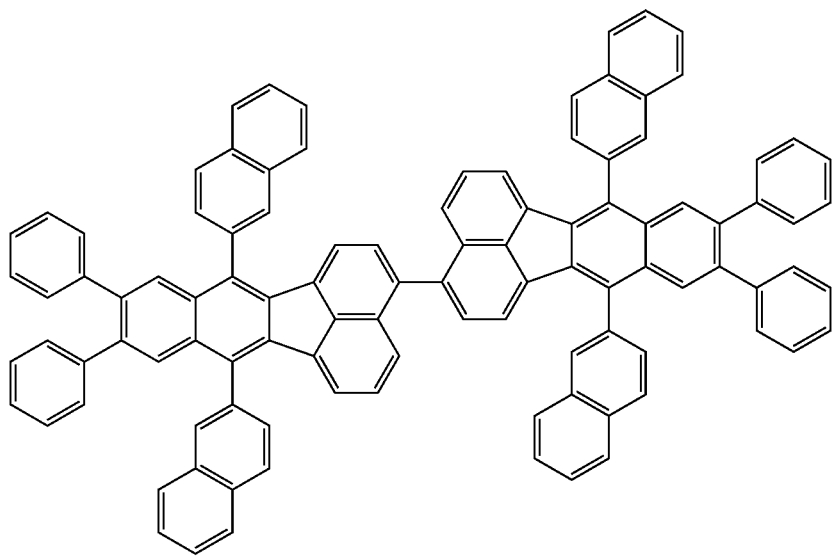
1-26
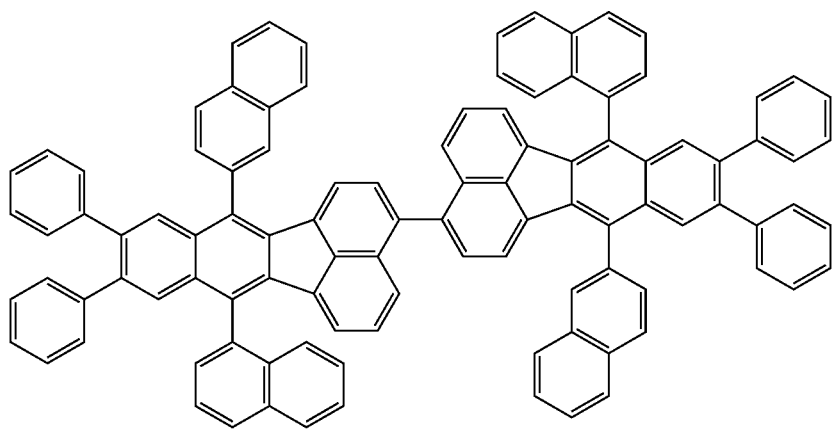

-continued
1-27
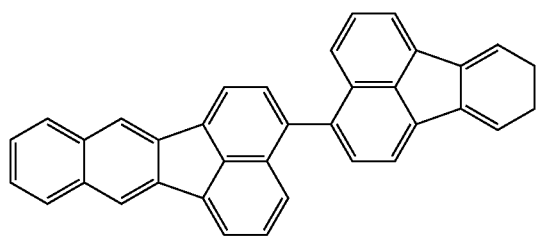
1-28
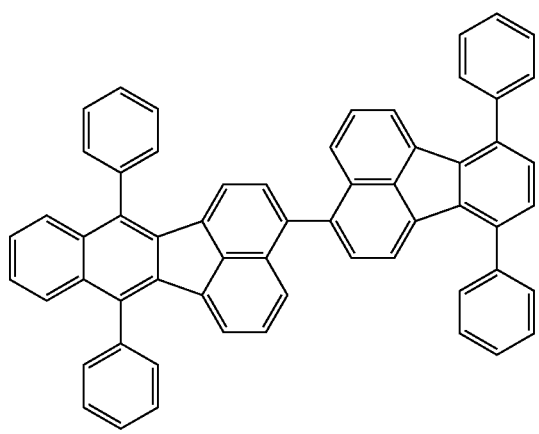
1-29
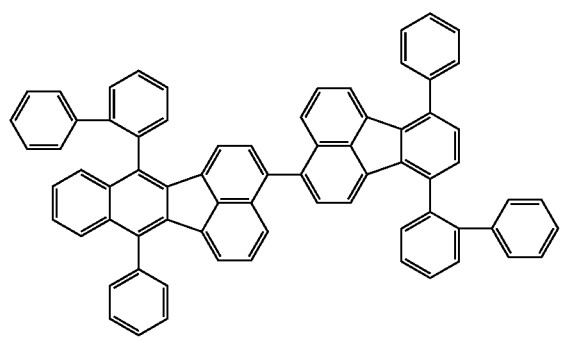
1-30
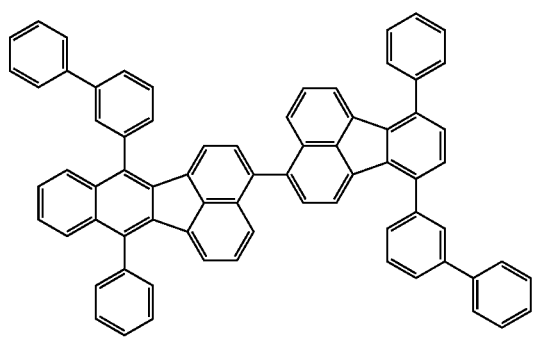
1-31
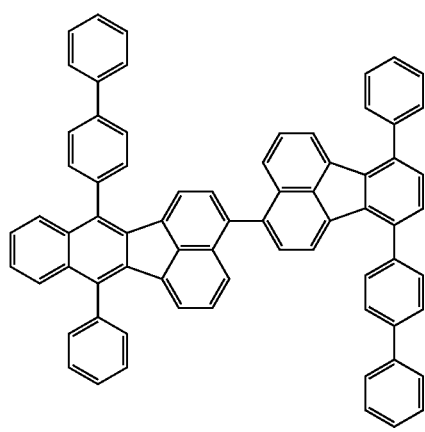
1-32
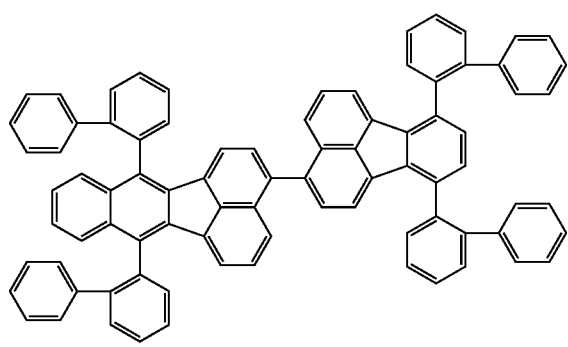

-continued
1-33 1-34
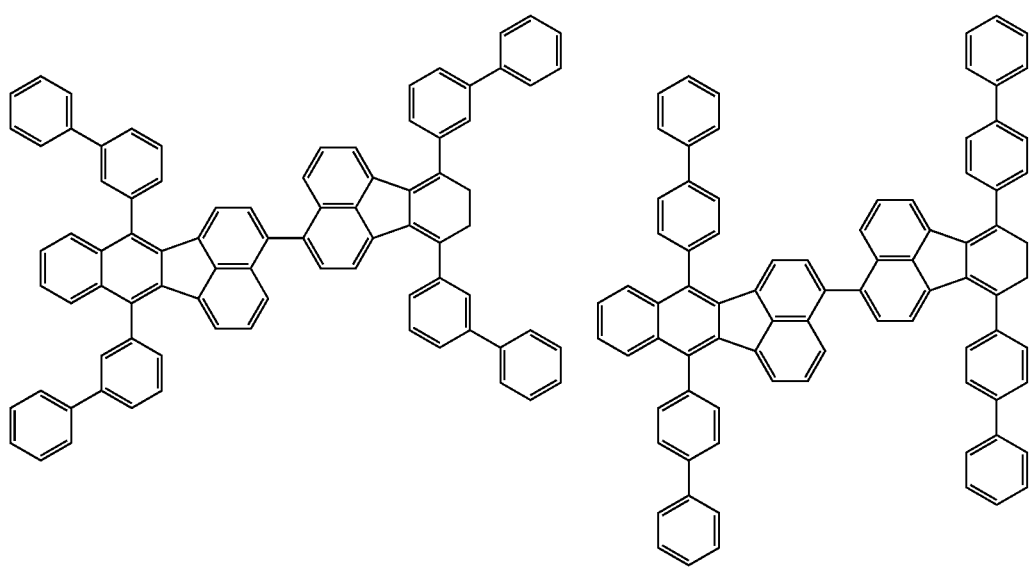
1-35 1-36
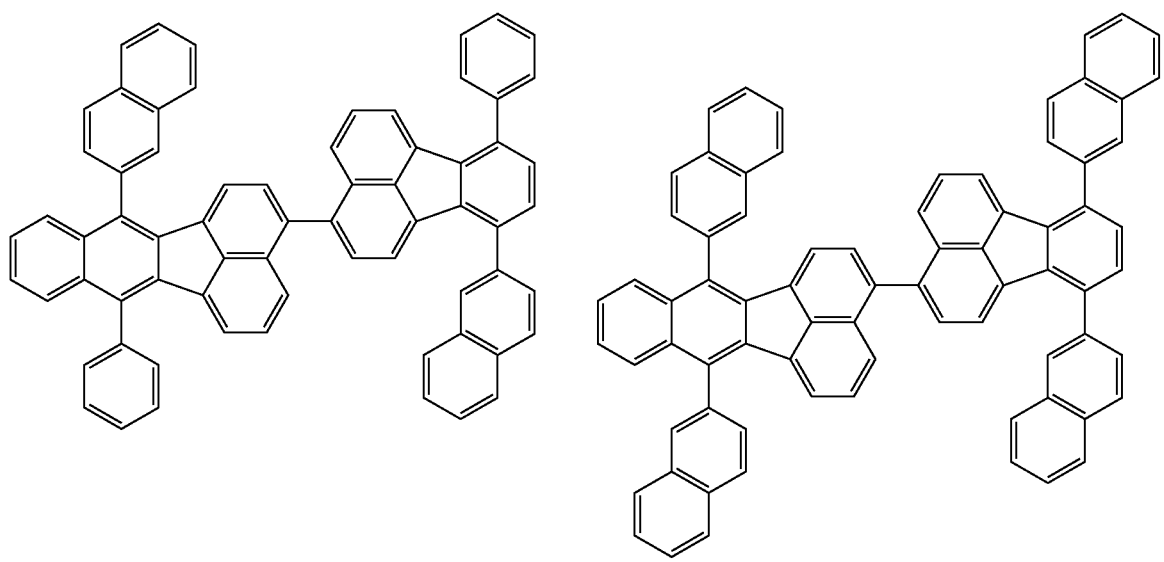
1-37 1-38
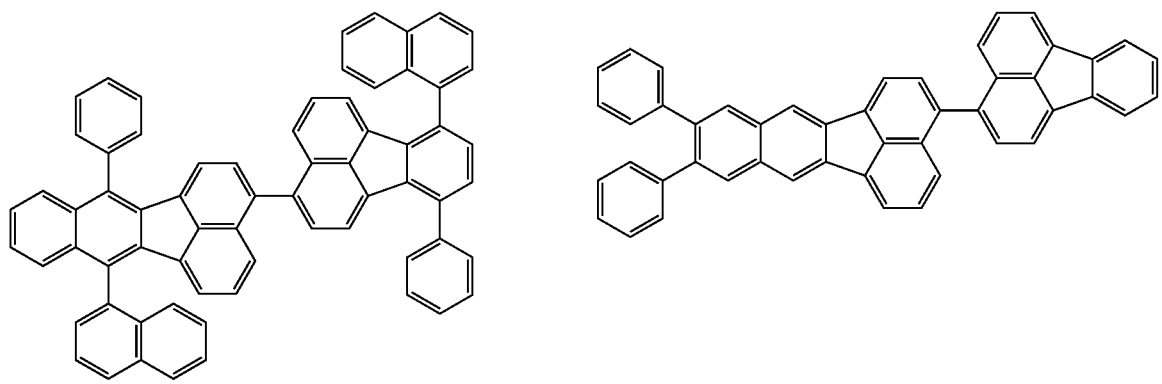

1-39
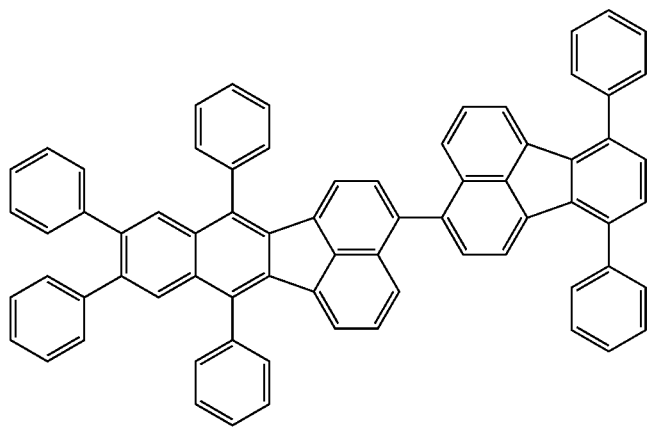
1-40
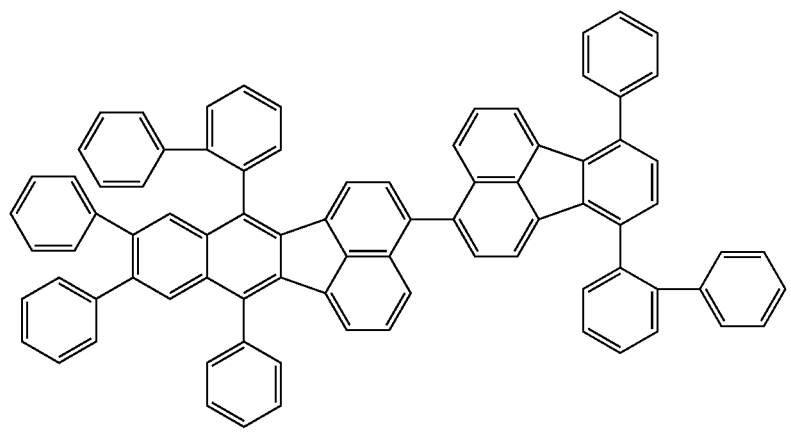
1-41
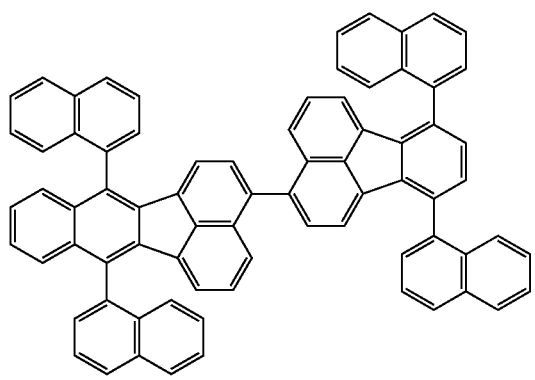
1-42
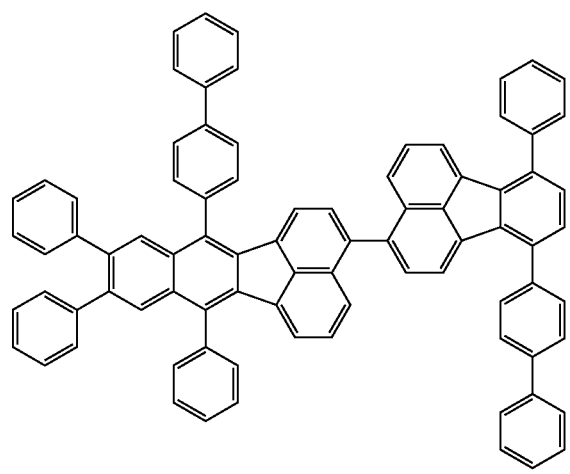

1-43
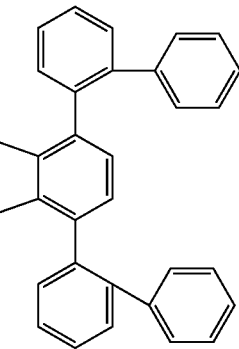
1-44
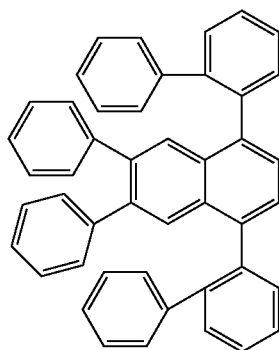
1-45
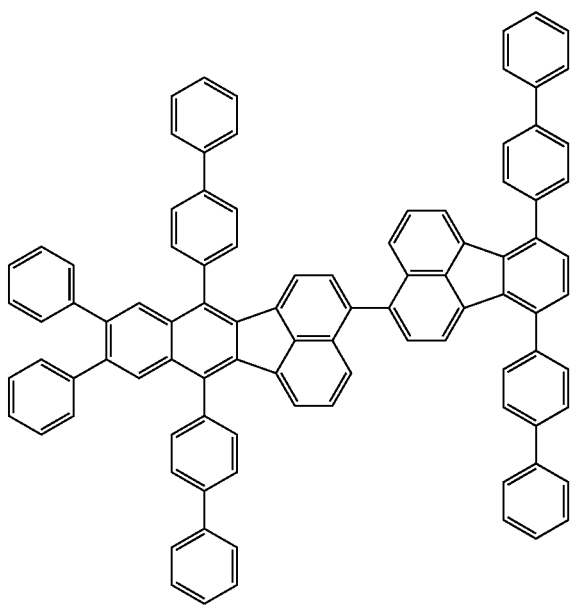
1-46
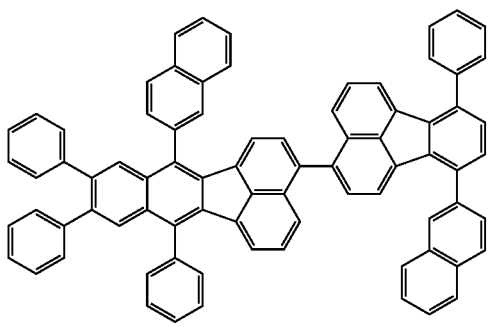
1-47
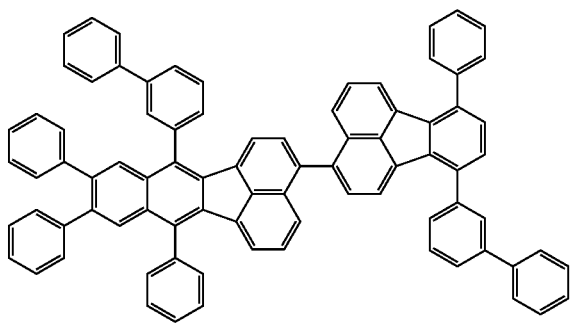

-continued
1-48
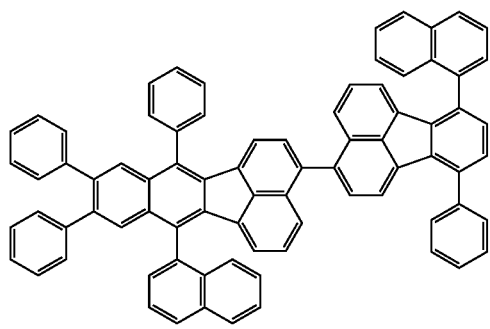
1-49
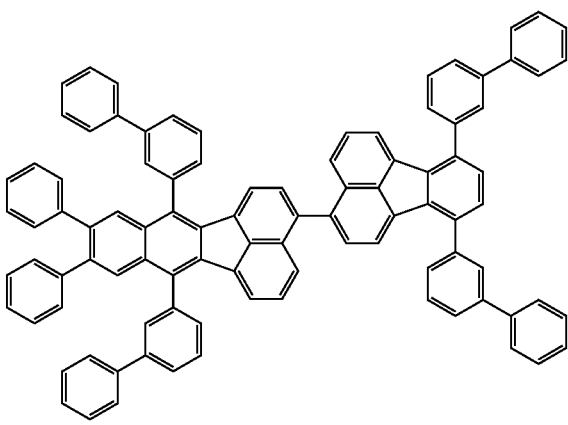
1-50
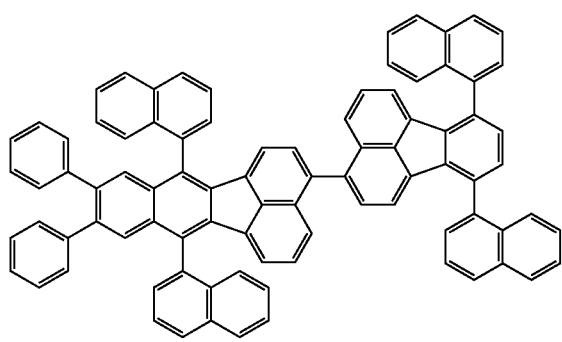
1-51
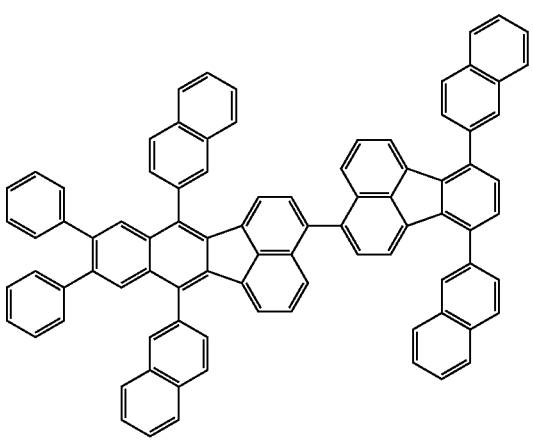
1-52
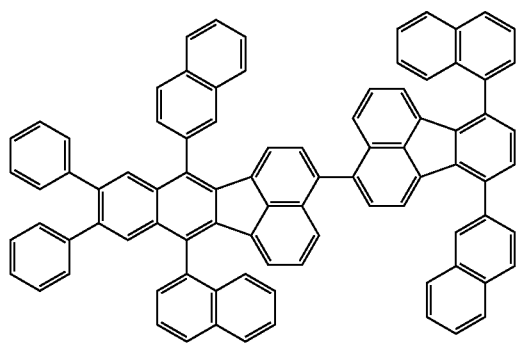
1-53
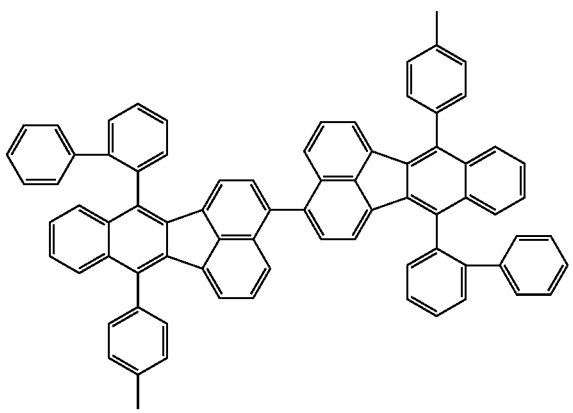
1-54
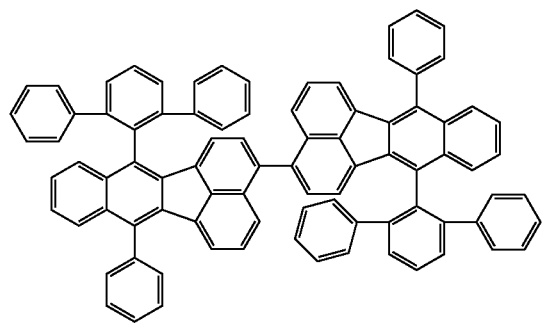
1-55
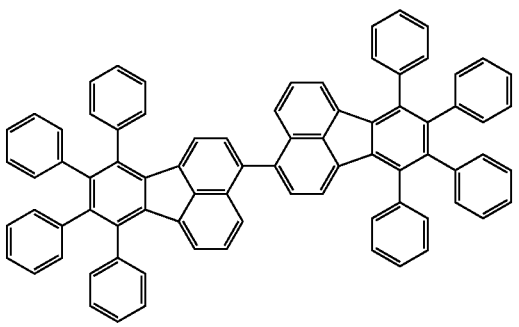

-continued
1-56
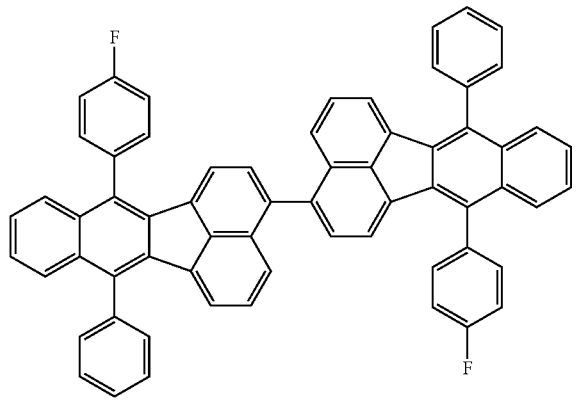
1-57
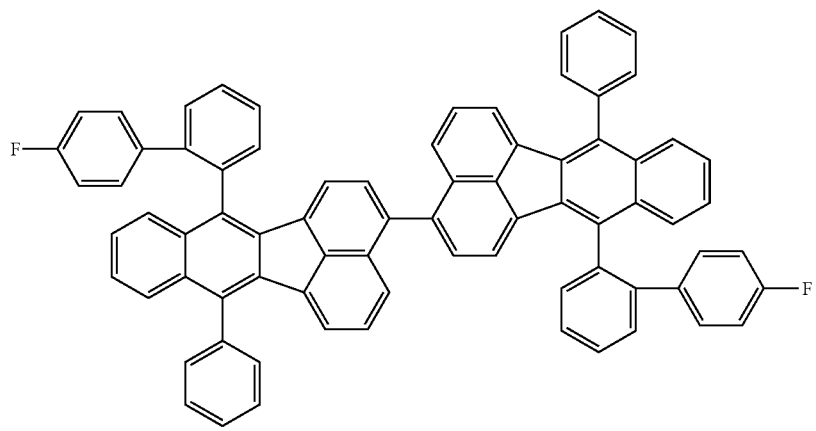
1-58 1-59
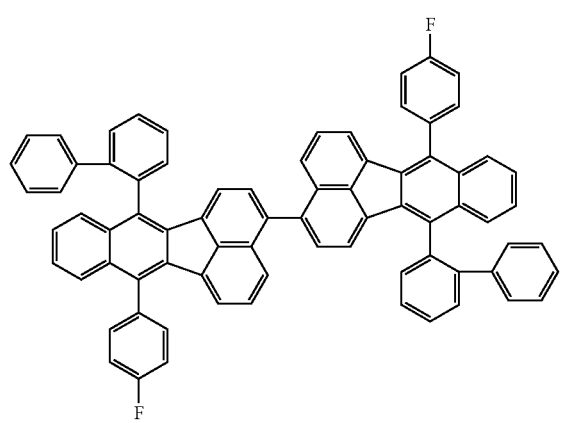

-continued
1-60
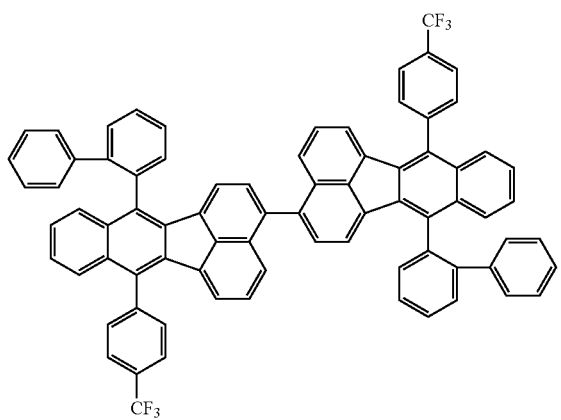
1-61
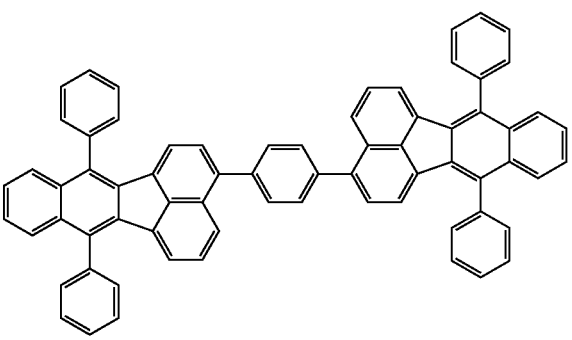
1-62
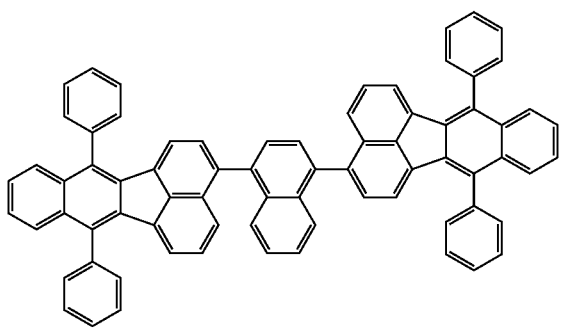
1-63
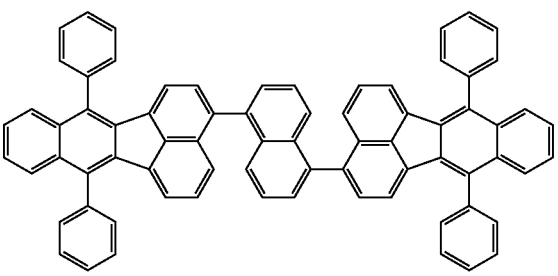
1-64
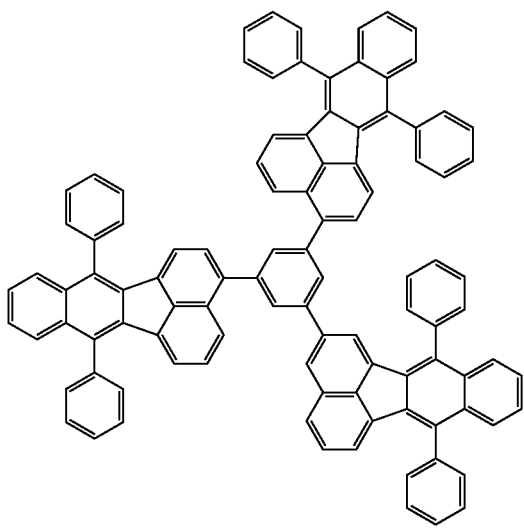
1-65
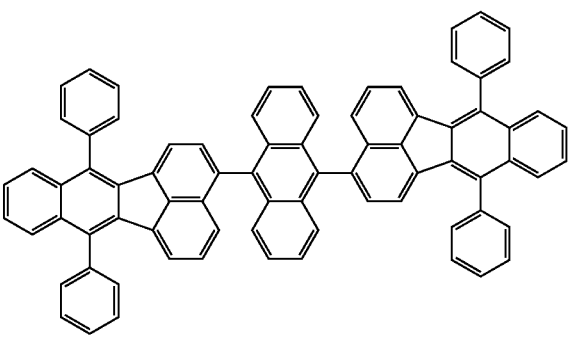

-continued
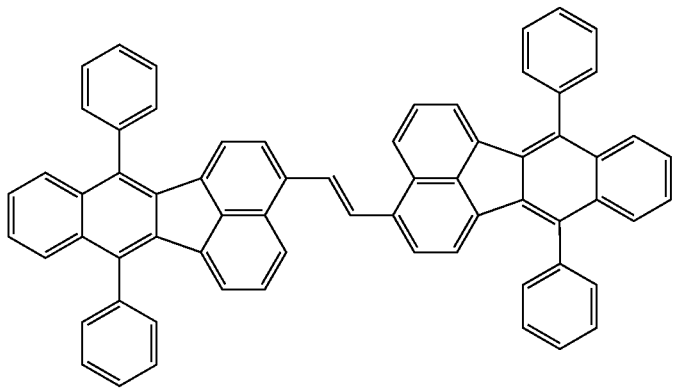
1-66
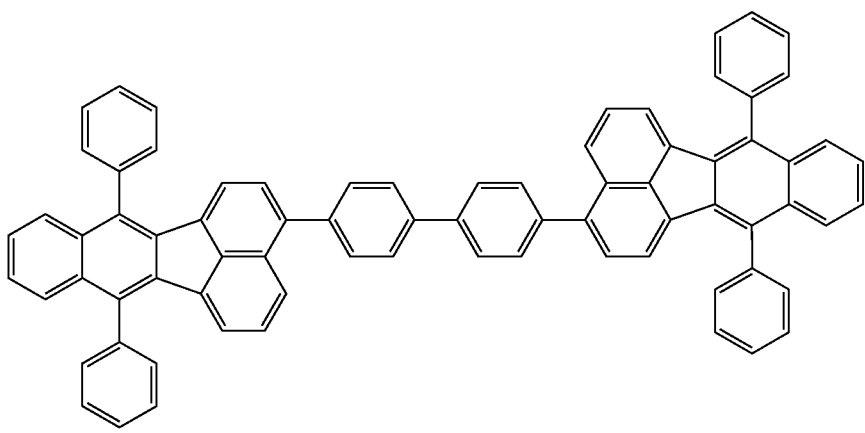
1-67
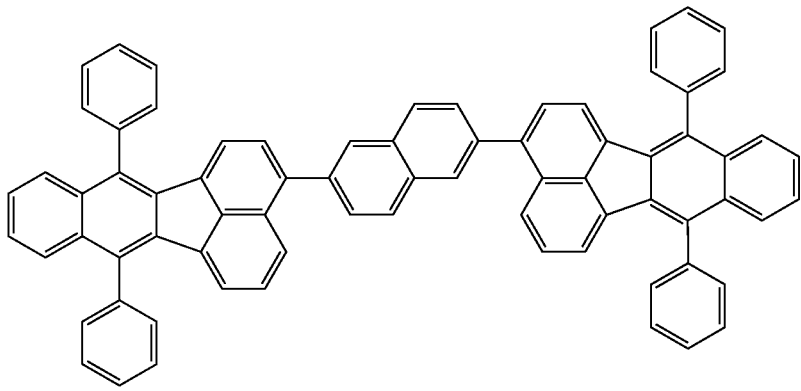
1-68
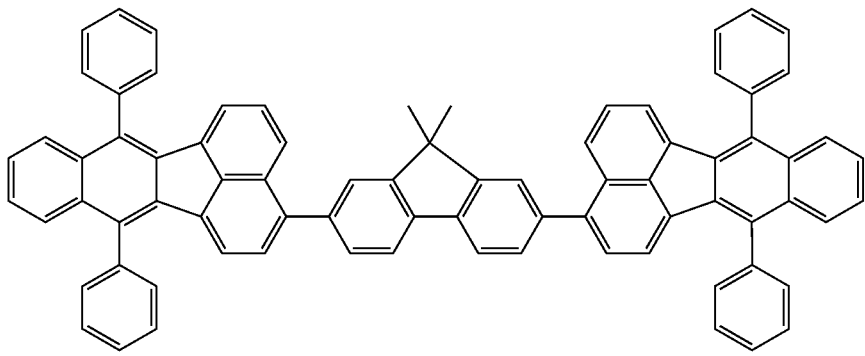
1-69

-continued
1-70
1-71
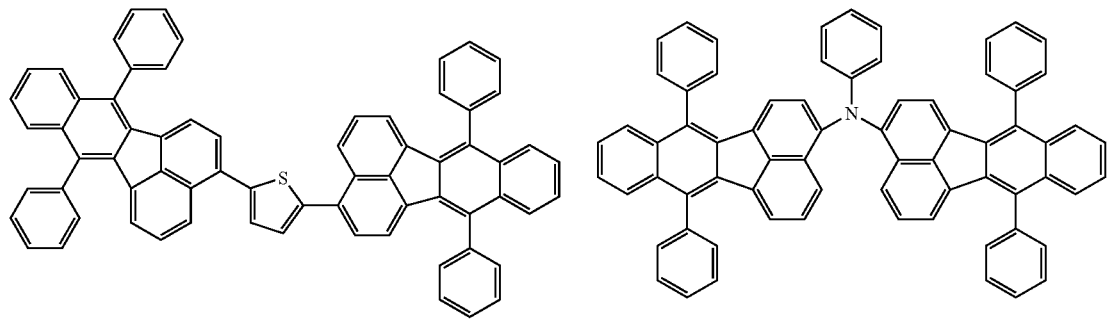
1-72
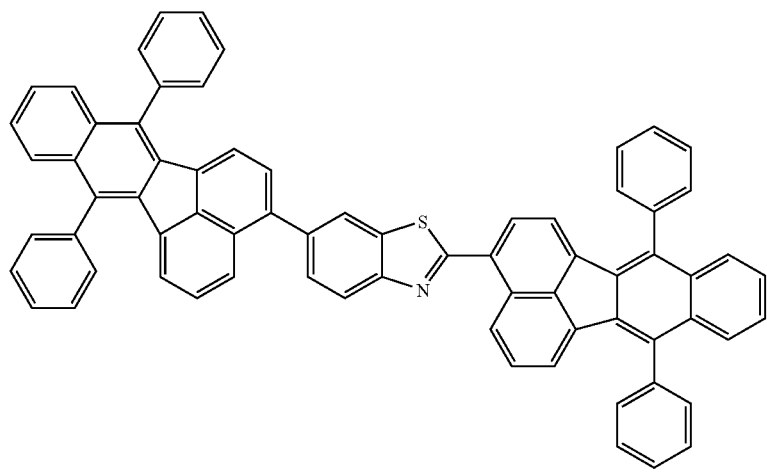
1-73
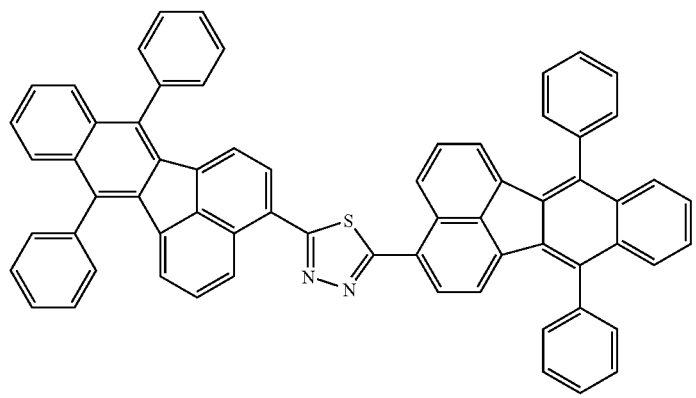

1-74
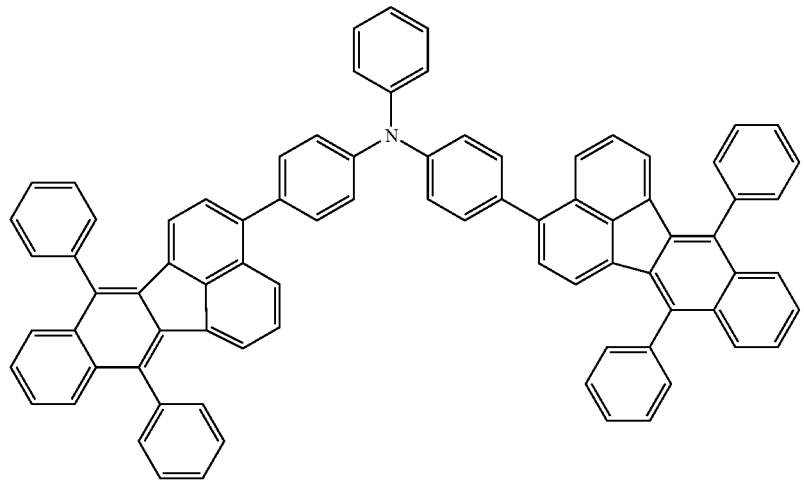
1-75 1-76
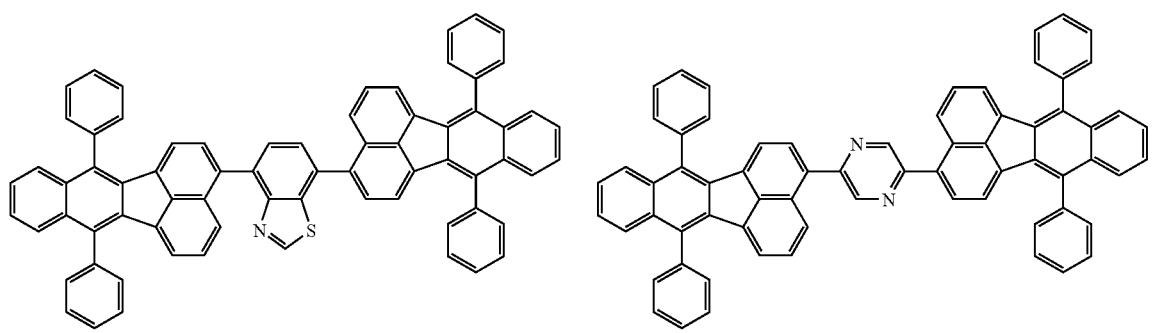
1-77
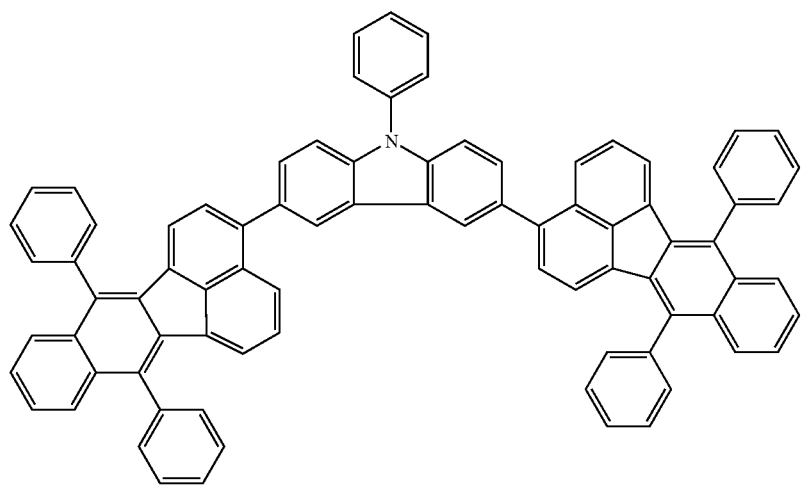

1-78
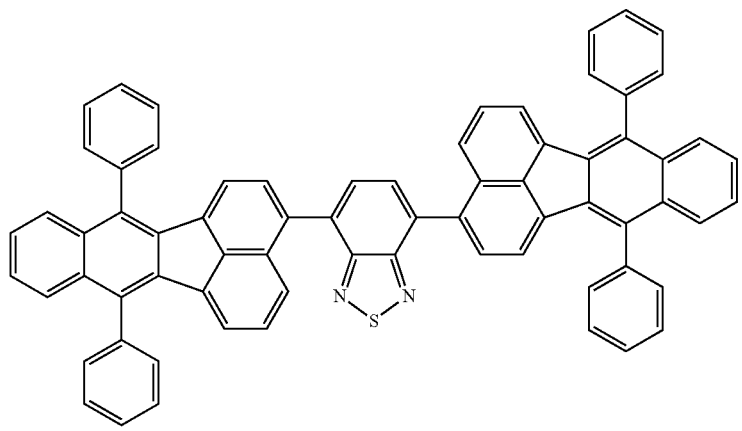
1-79
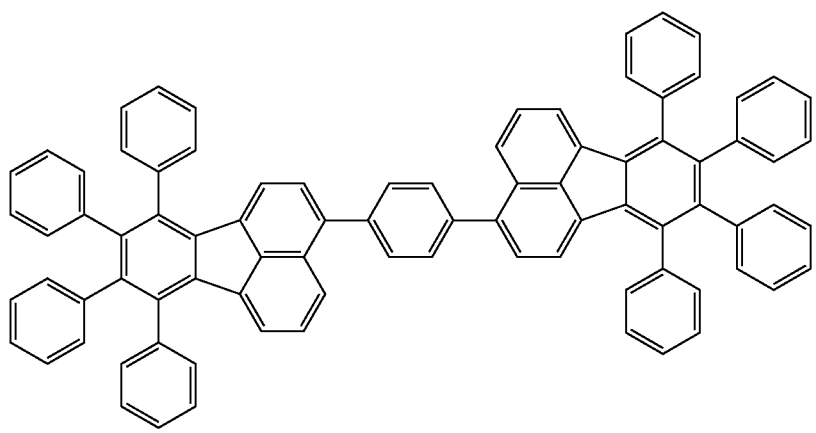
1-80
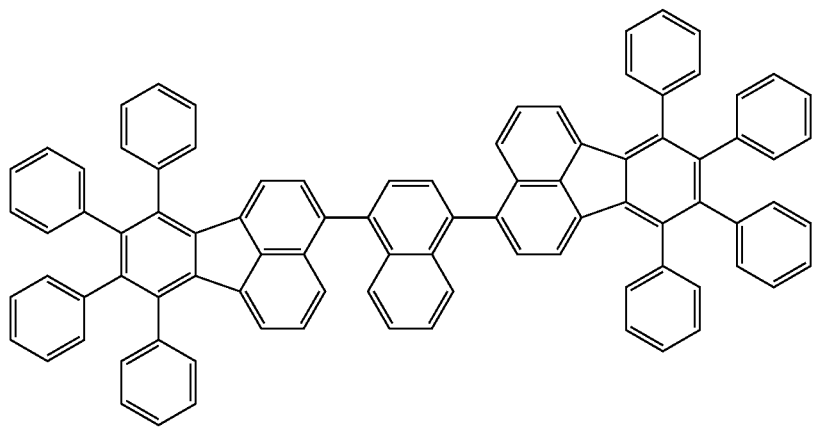

-continued
1-81
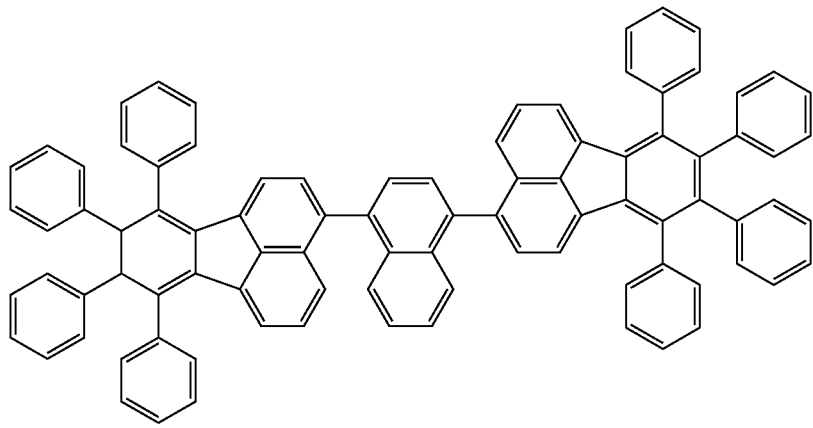
1-82
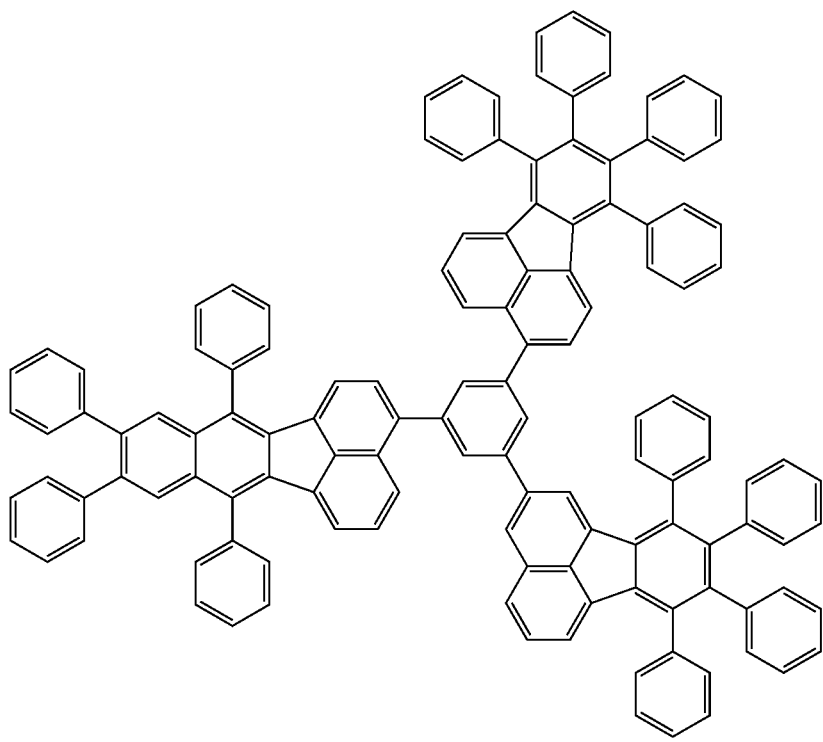
1-83
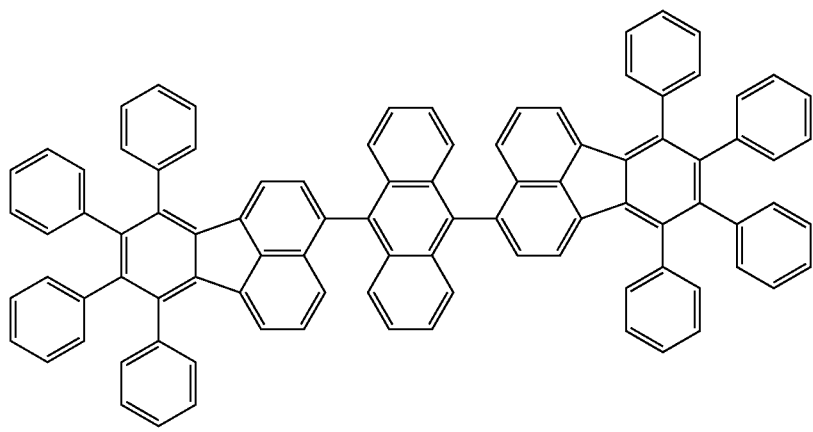

1-84
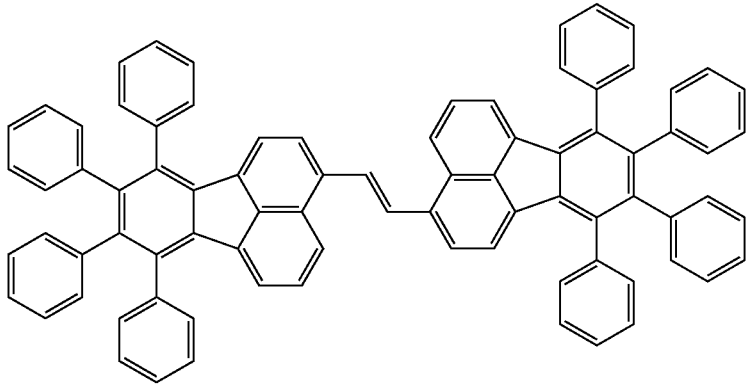
1-85
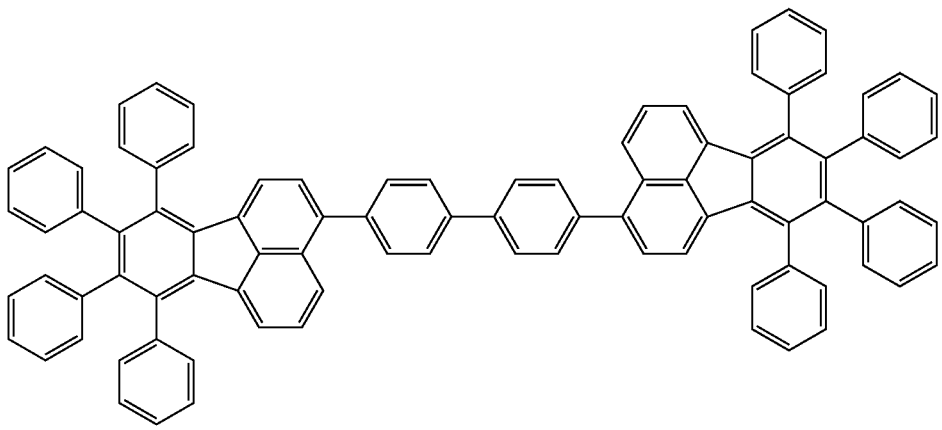
1-86
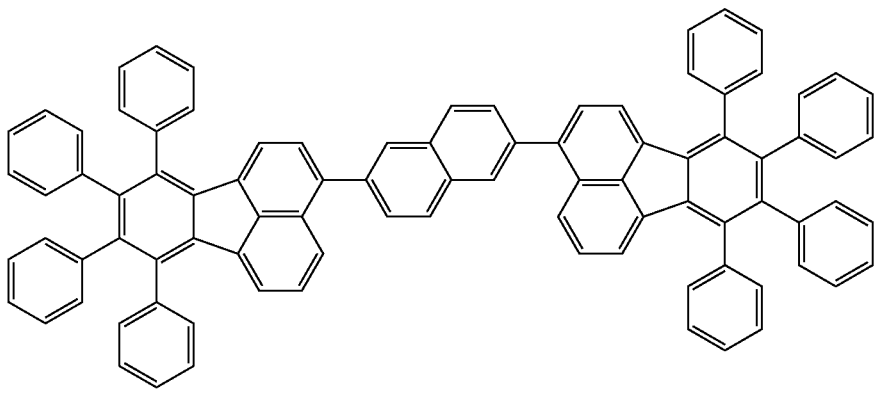
1-87
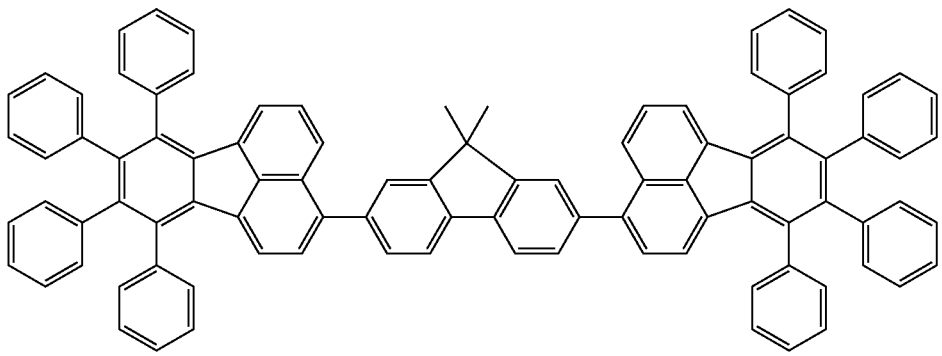

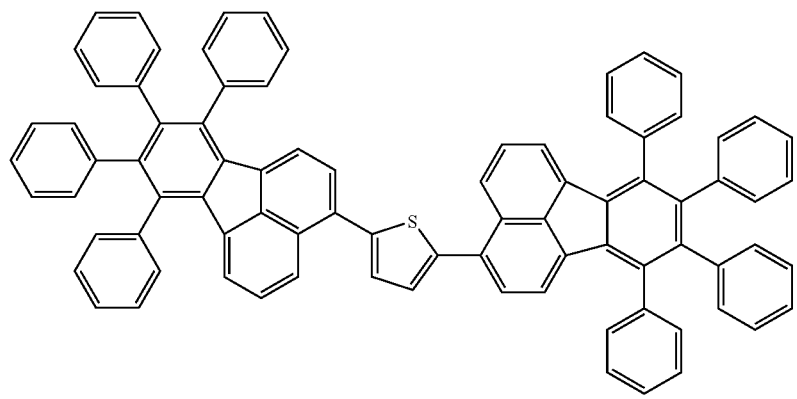
1-88
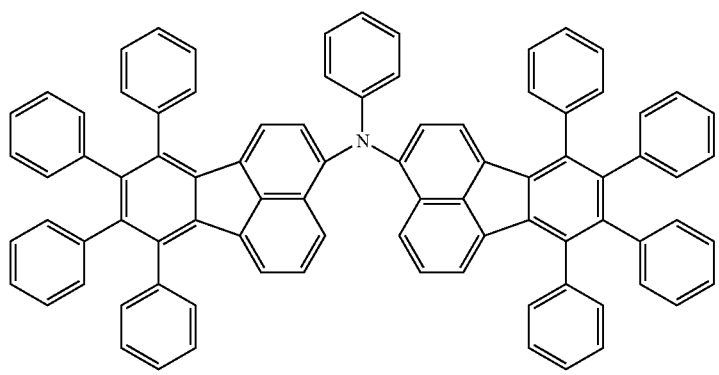
1-89
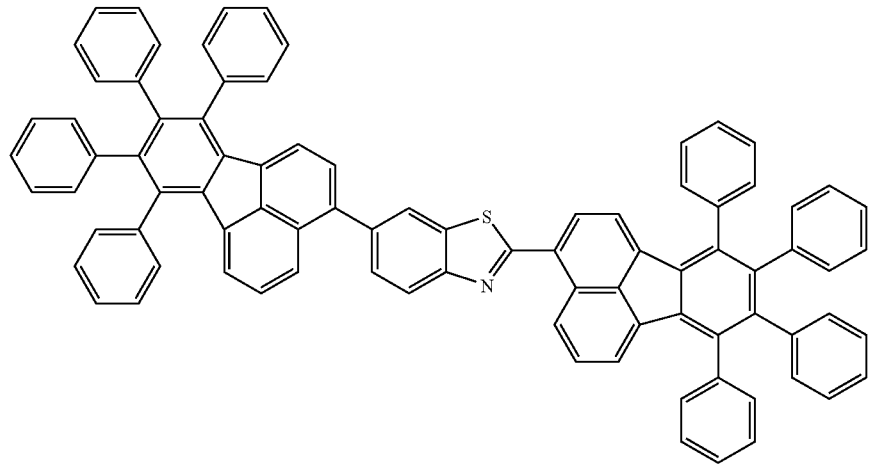
1-90
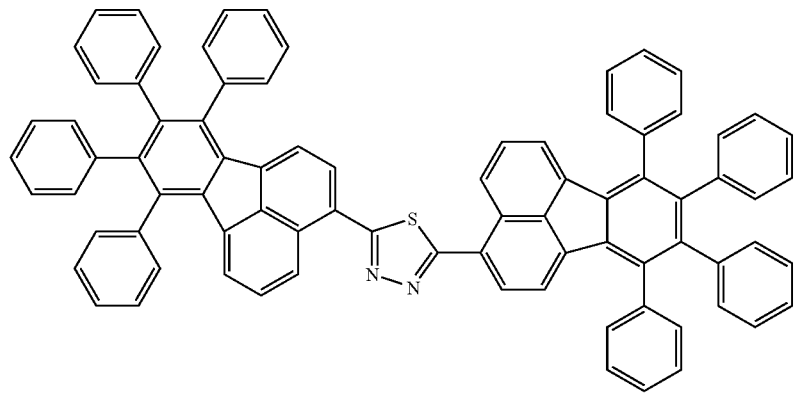
1-91

1-92
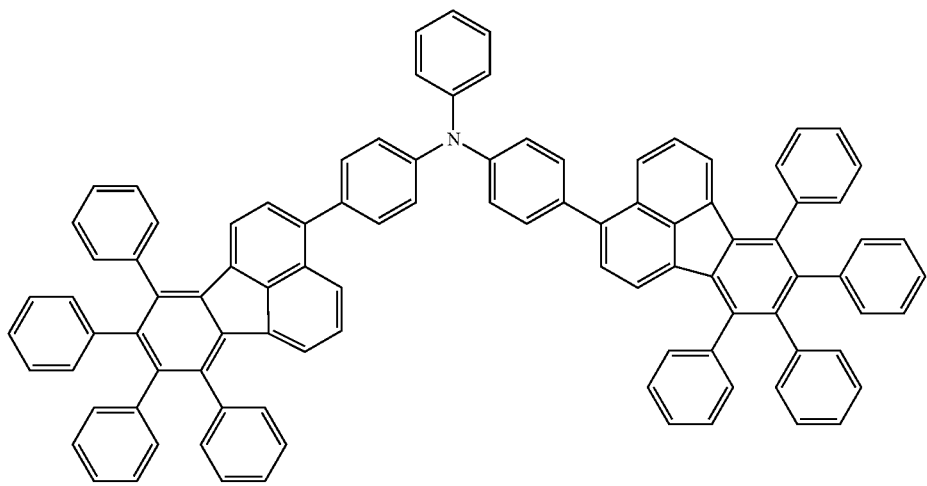
1-93
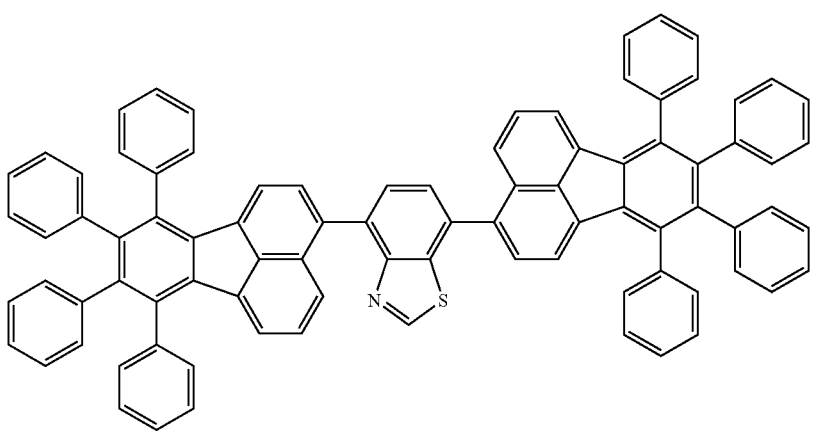
1-94
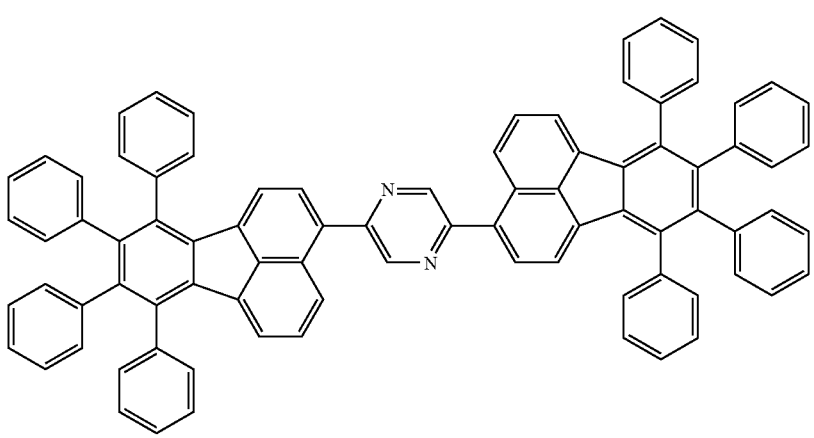

1-95
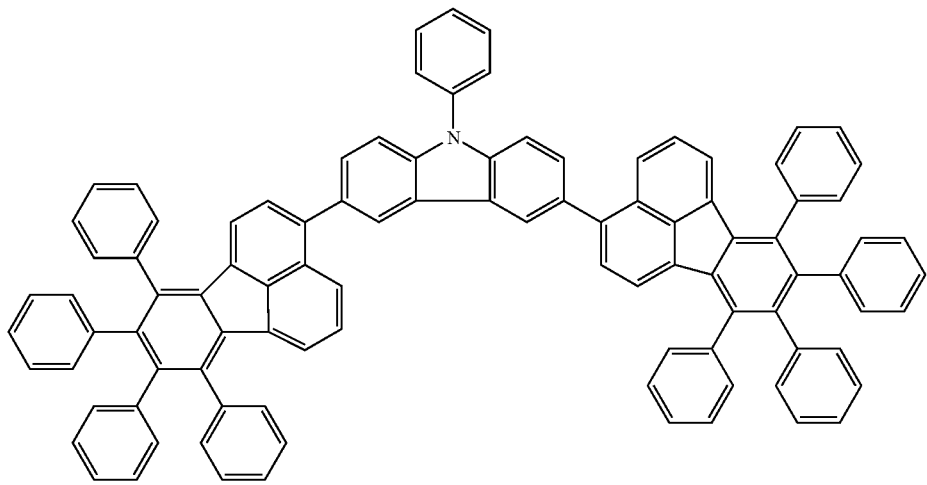
1-96
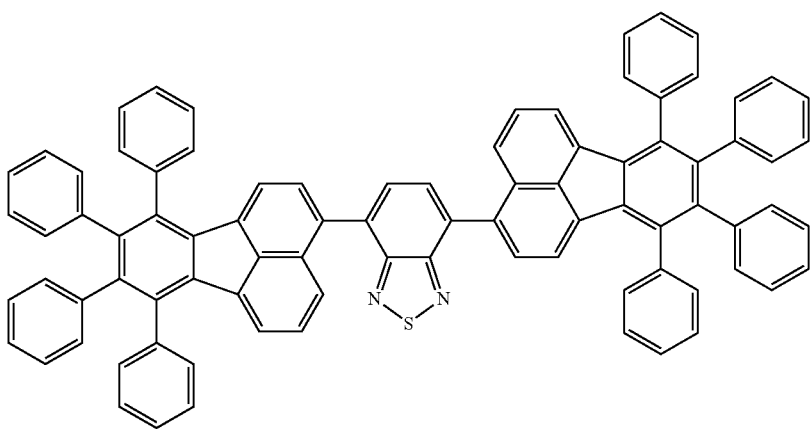
1-97
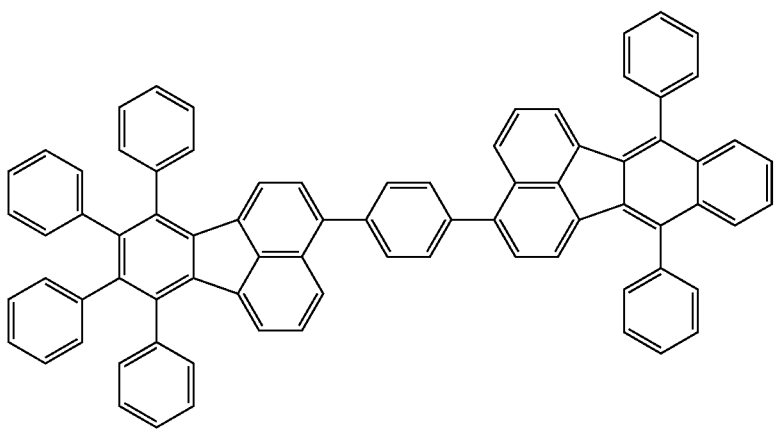

-continued
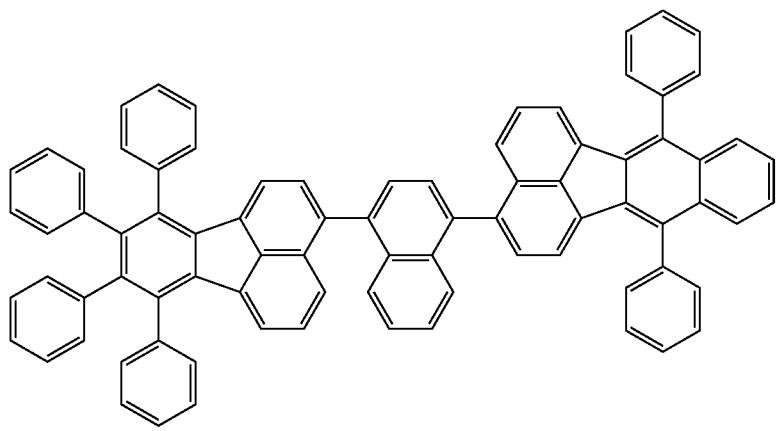
1-98
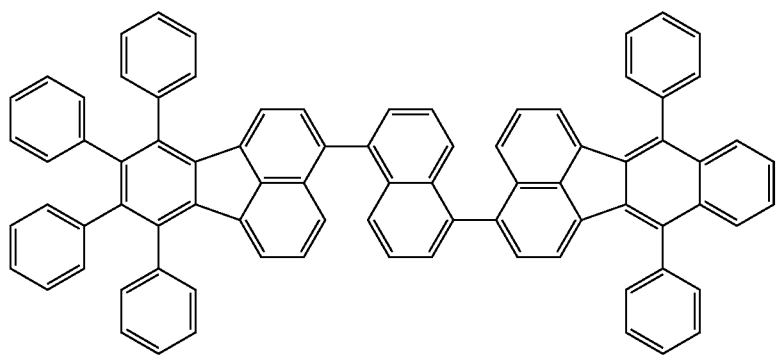
1-99
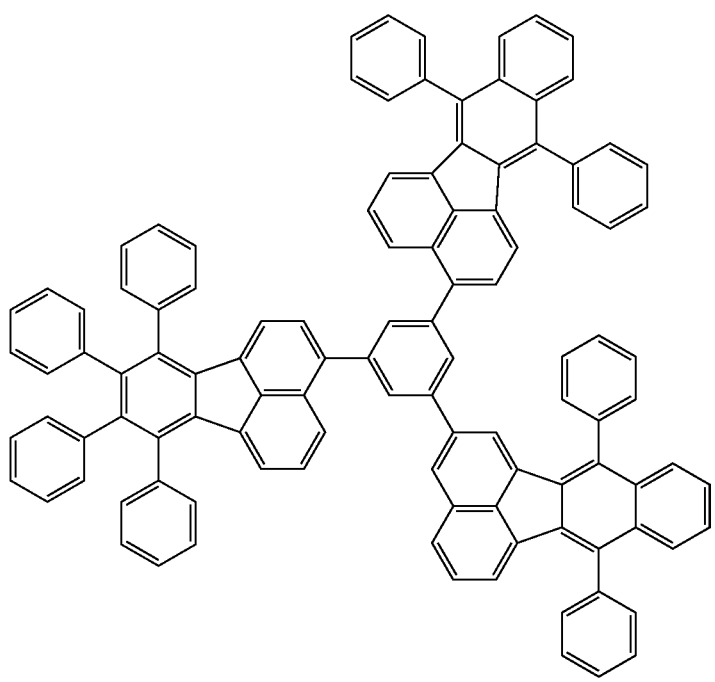
1-100

1-101
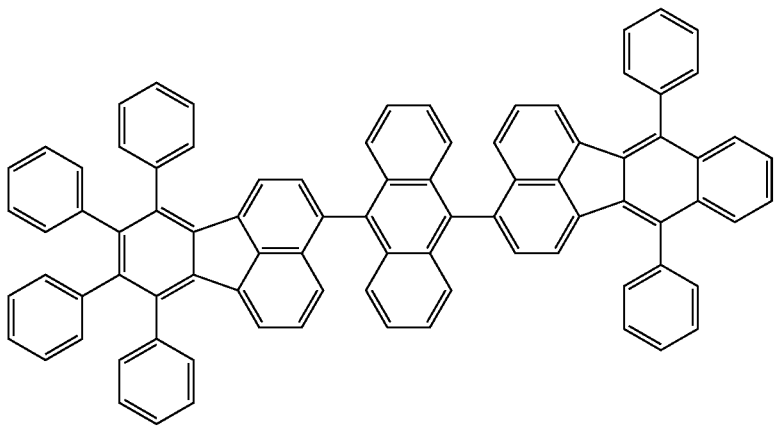
1-102
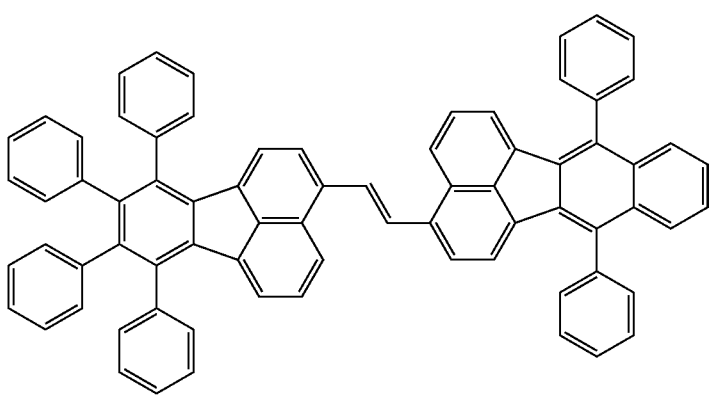
1-103
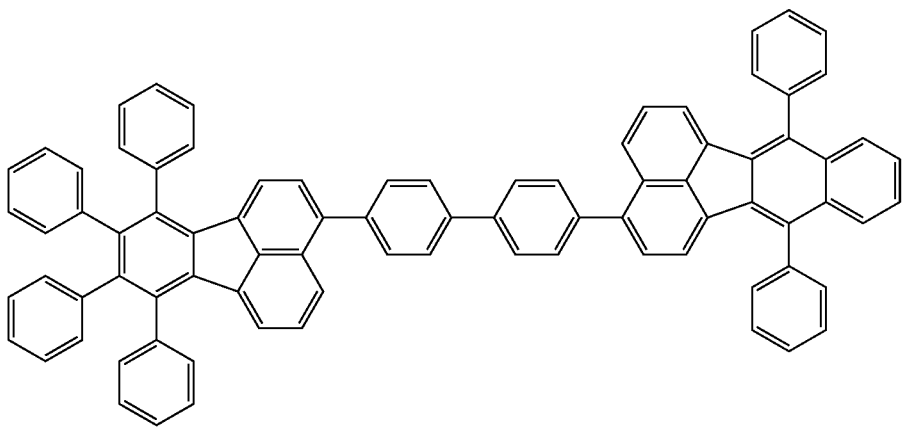
1-104
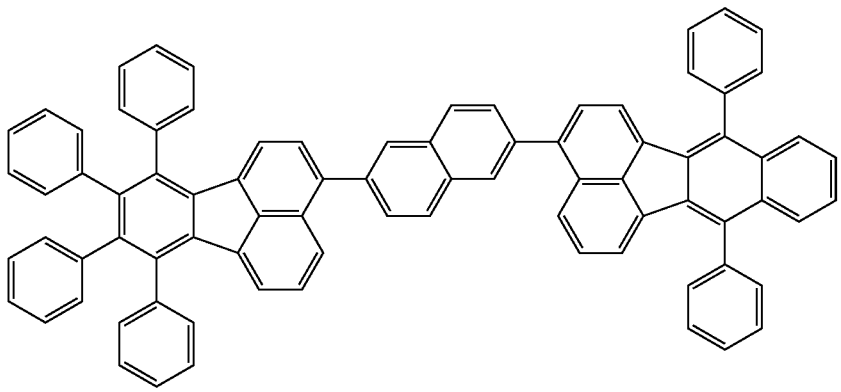

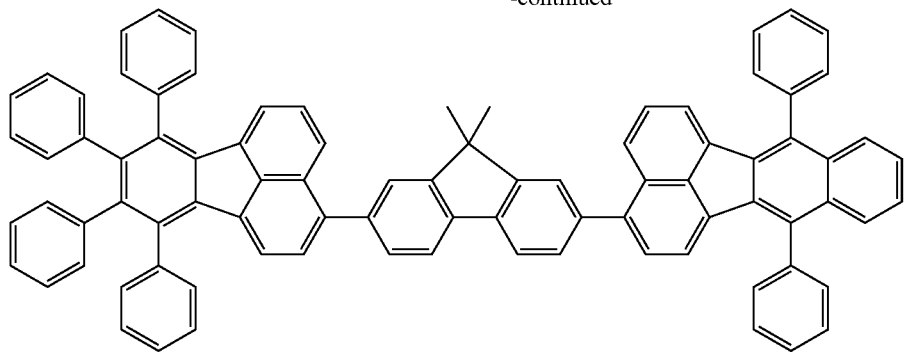
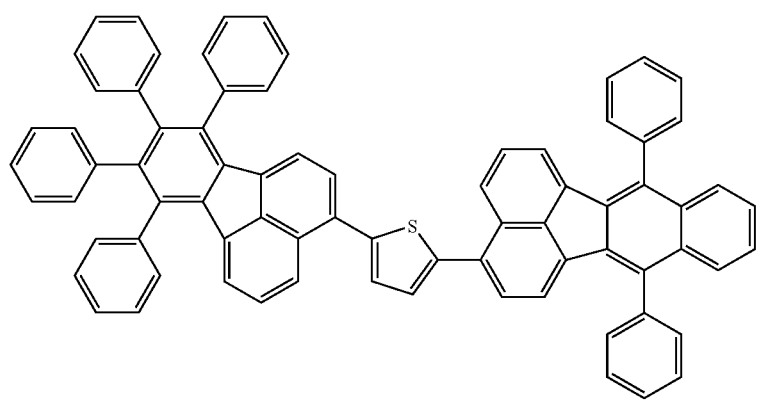
1-106
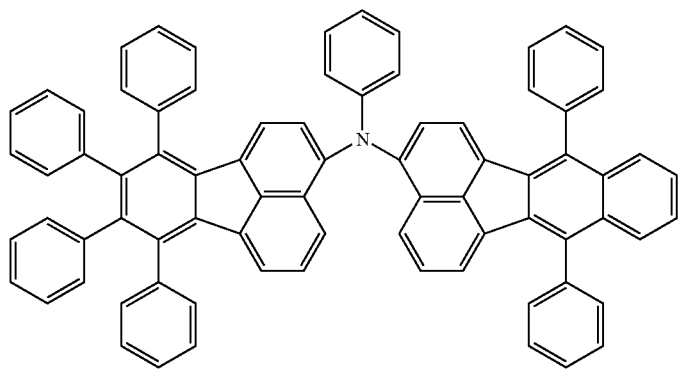
1-107
1-108
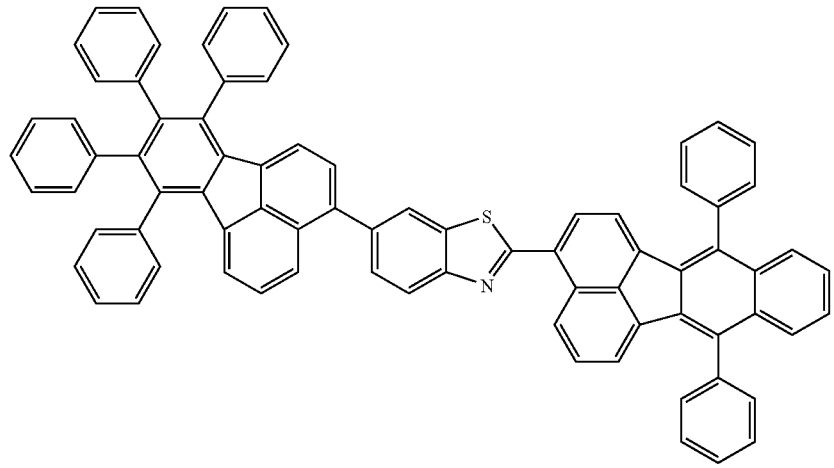

1-109
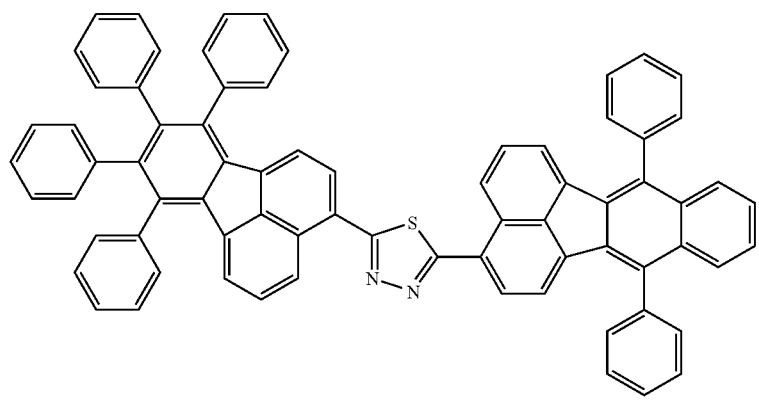
1-110
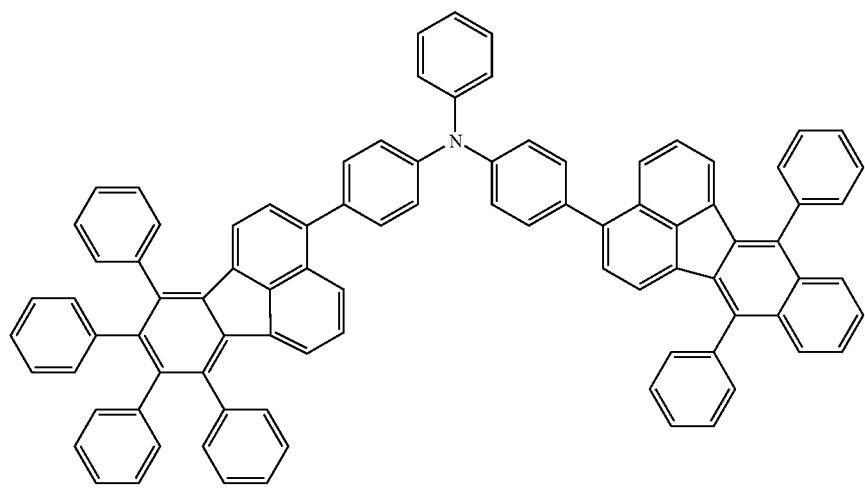
1-111
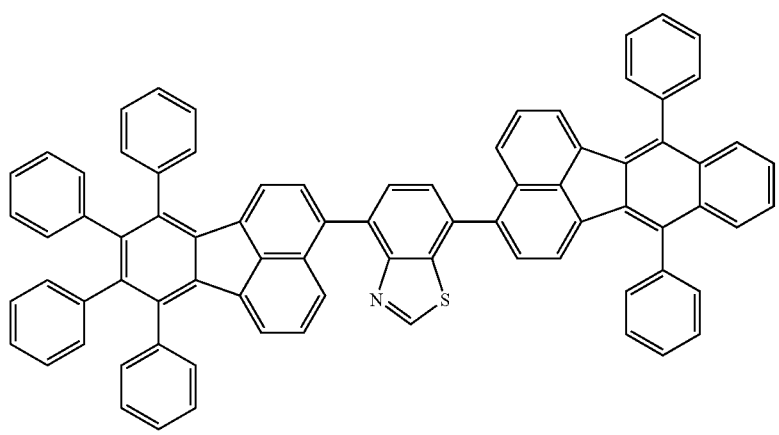

1-112
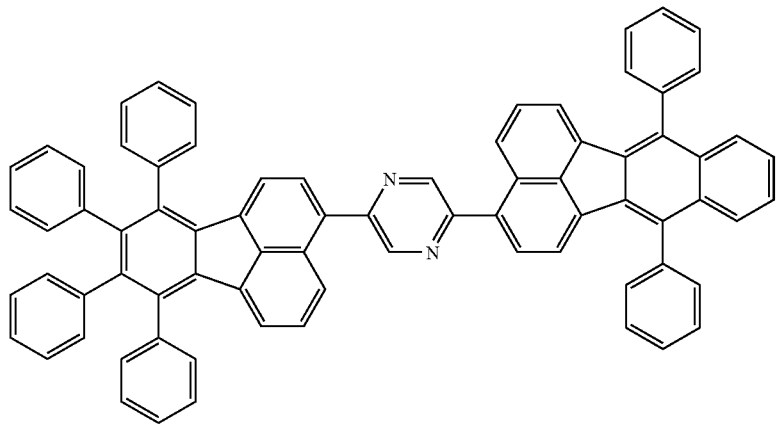
1-113
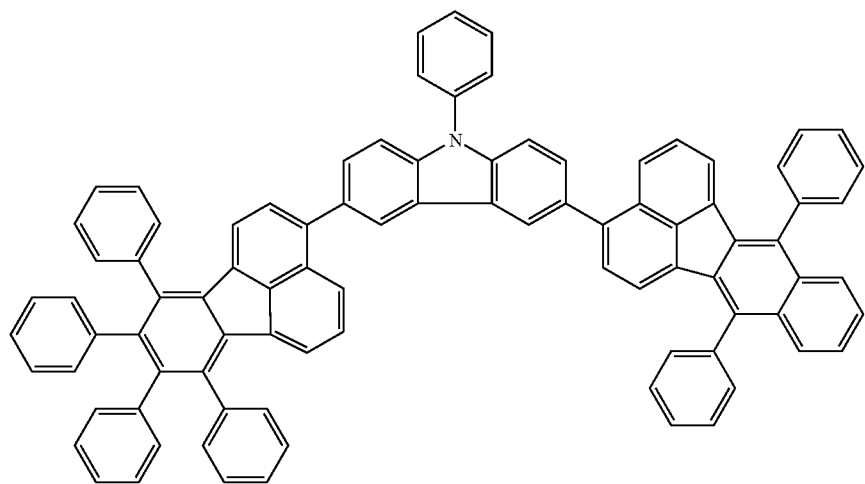
1-114
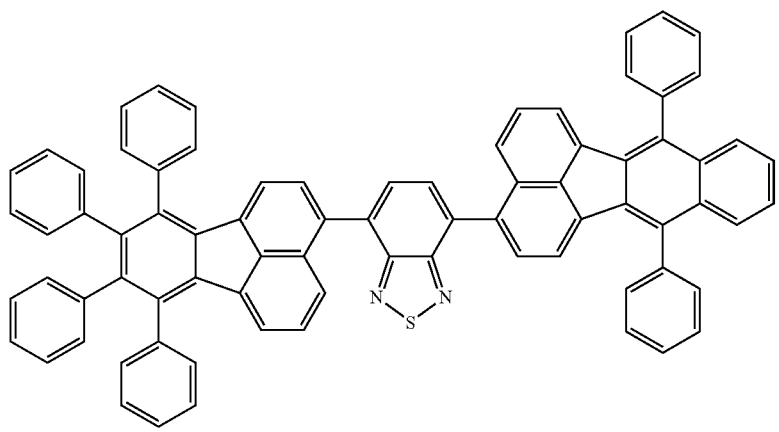

-continued
2-1
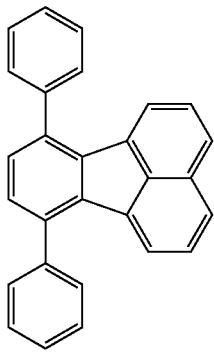
2-2
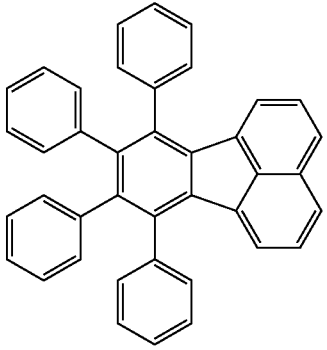
2-3
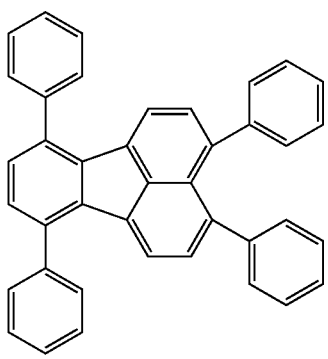
2-4
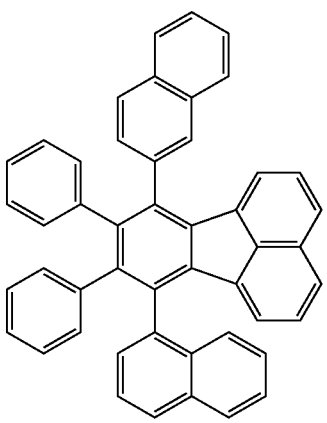
2-5
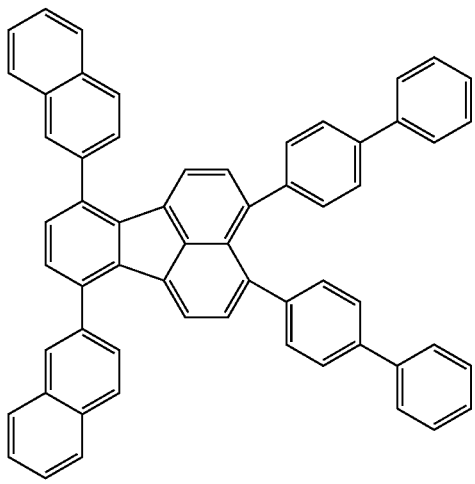
2-6
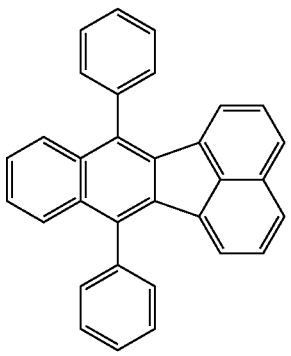
2-7
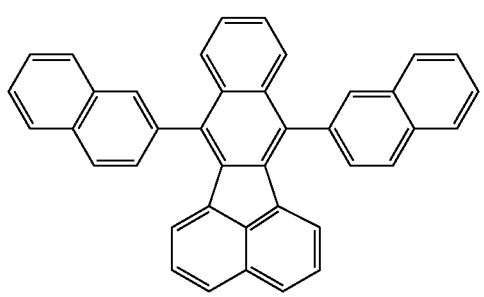
2-8
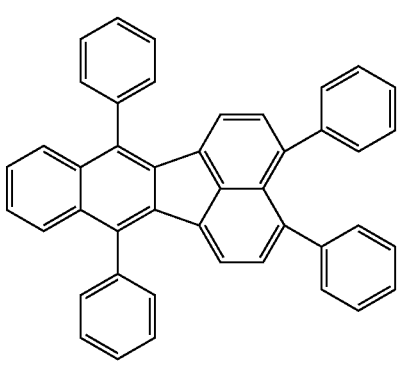

2-9 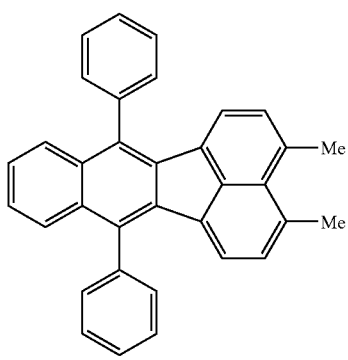 2-10 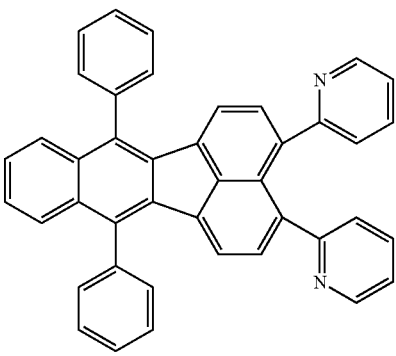
2-11 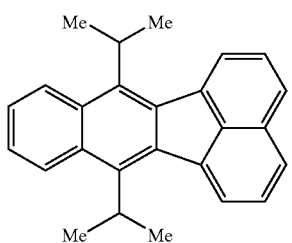 2-12 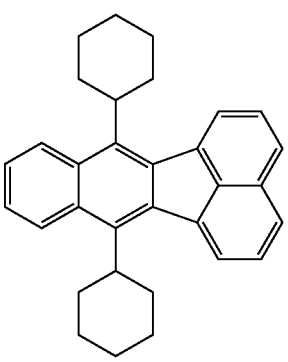
2-13 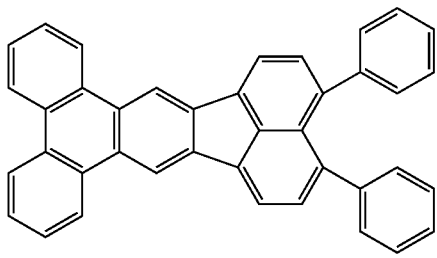 2-14 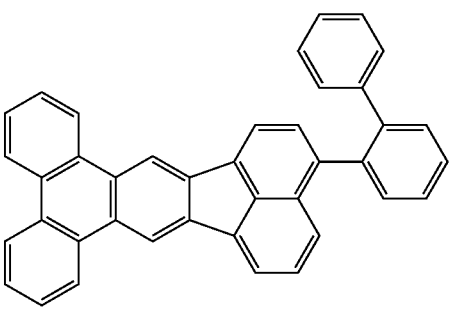
2-15 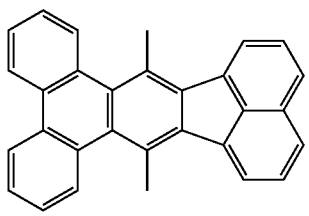 2-16 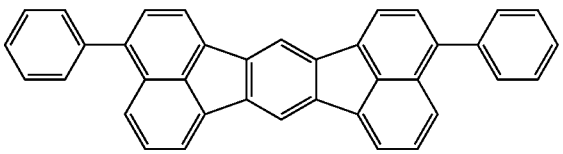
2-17 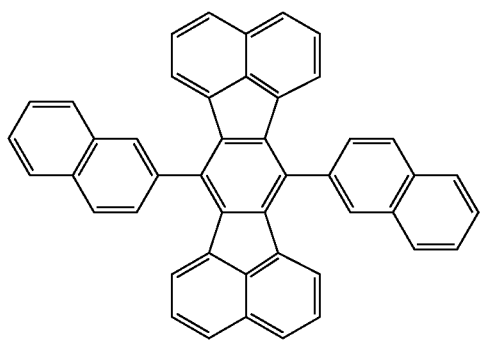 2-18 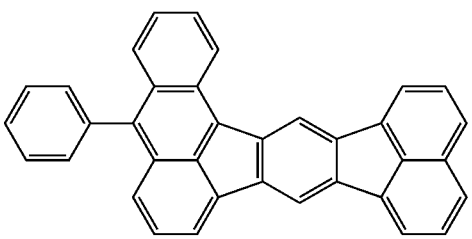

-continued
2-19
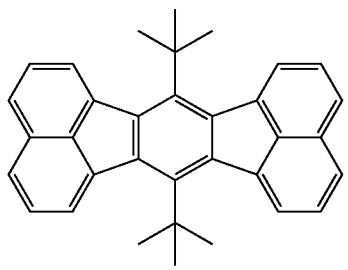
2-20
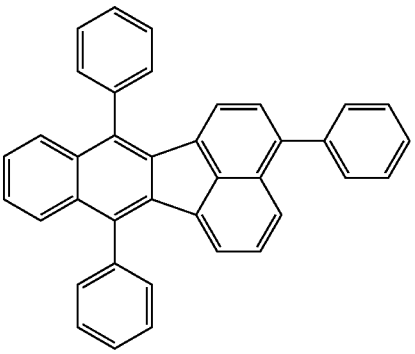
2-21
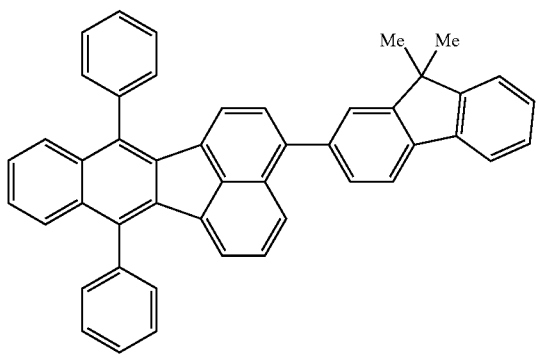
2-22
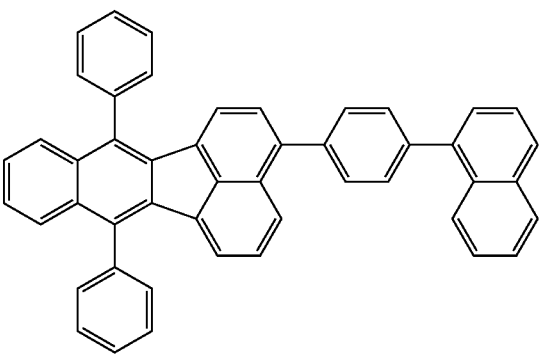
2-23
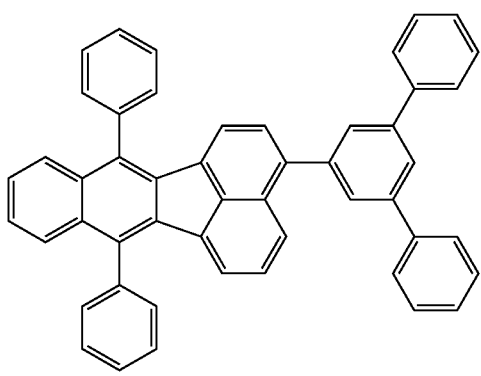
2-24
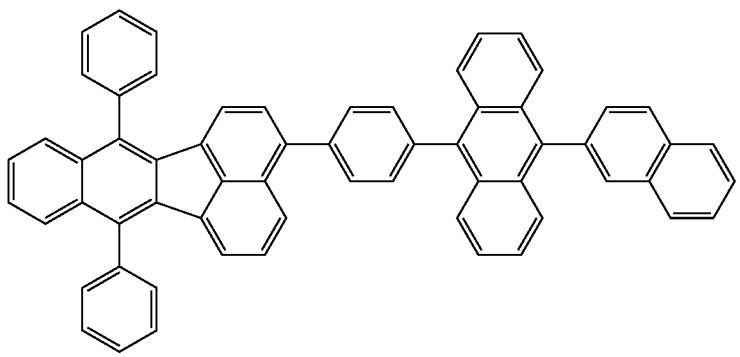

2-25 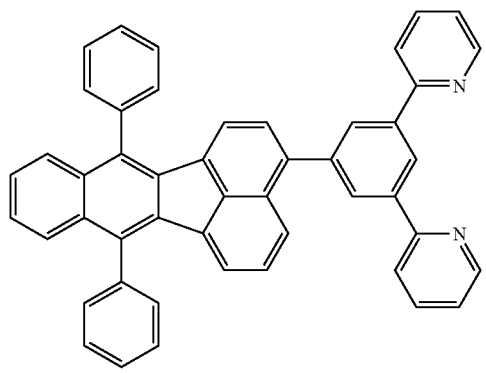
2-26 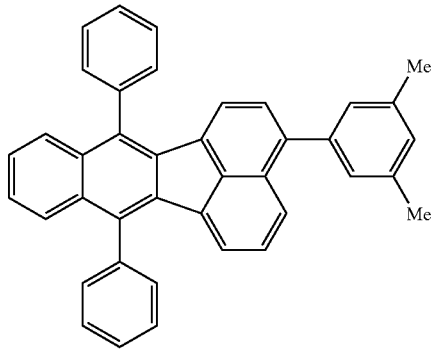
2-27 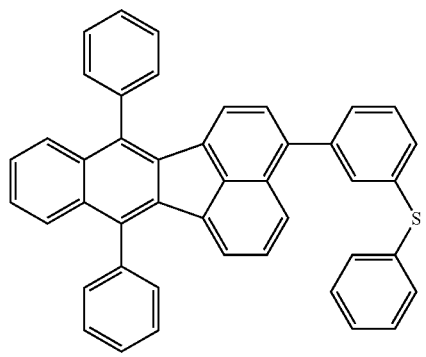
2-28 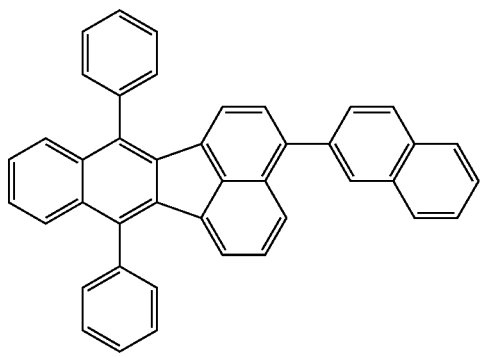
2-29 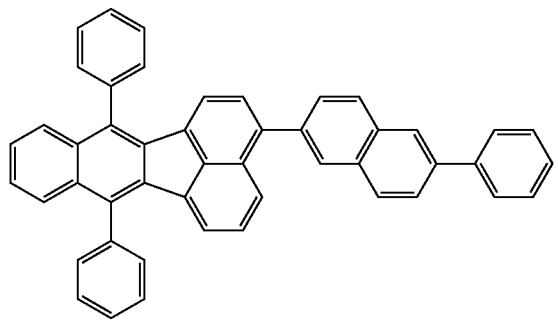
2-30 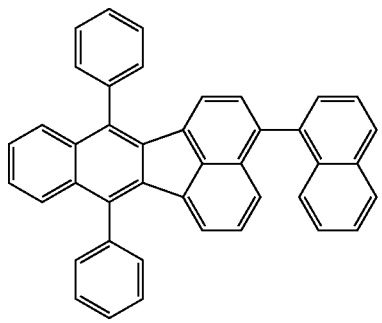
2-31 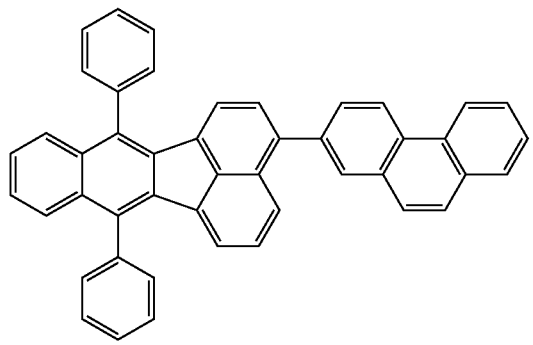
2-32 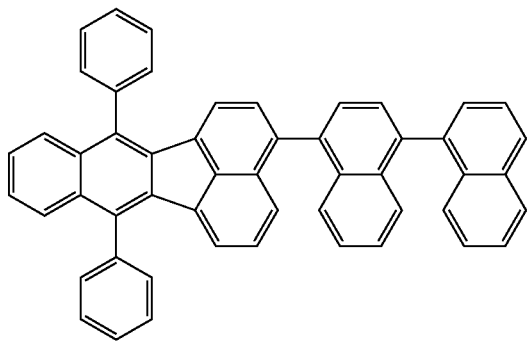

2-33
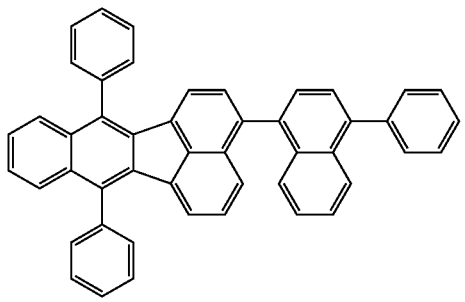
2-34
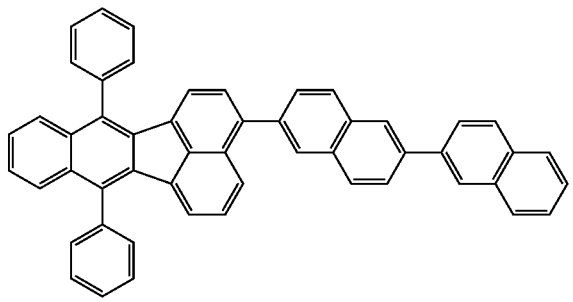
2-35
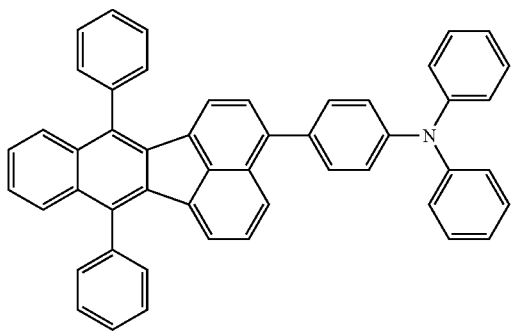
2-36
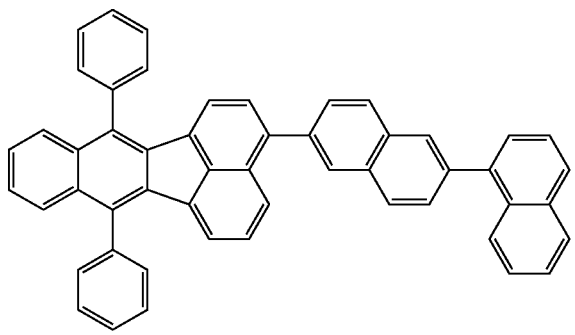
2-37
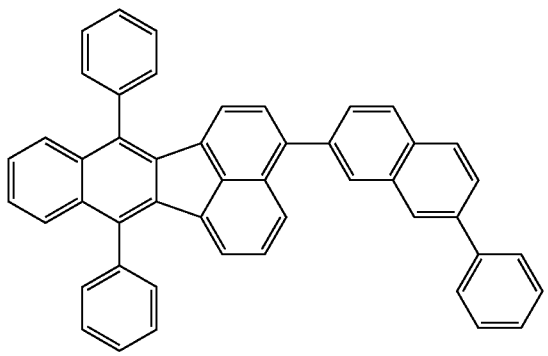
2-38
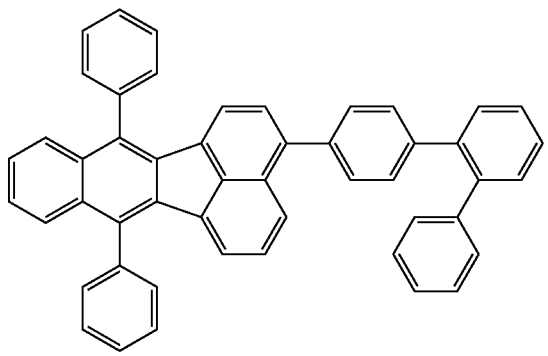
2-39
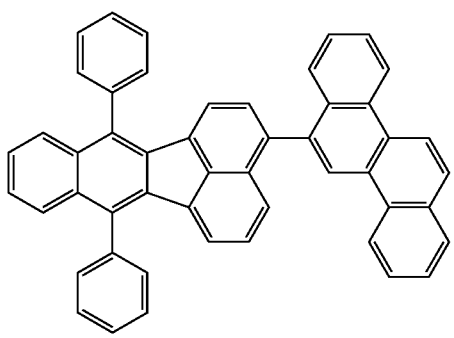
2-40
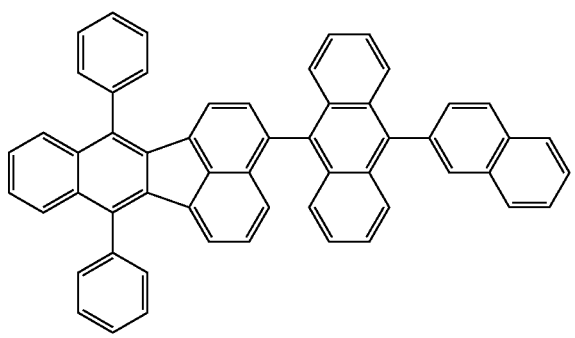

-continued
2-41
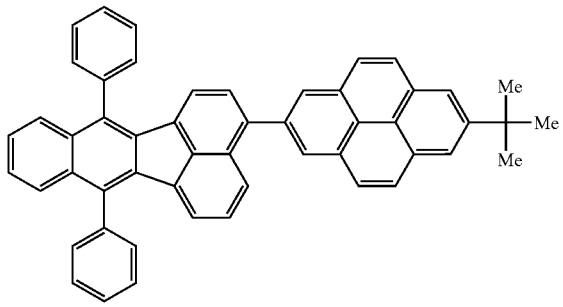
2-42
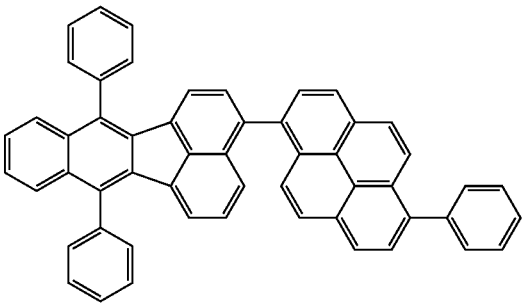
2-43
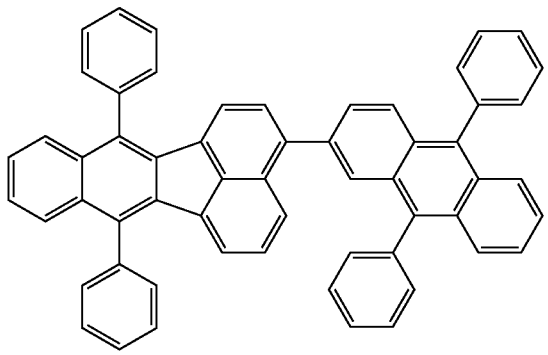
2-44
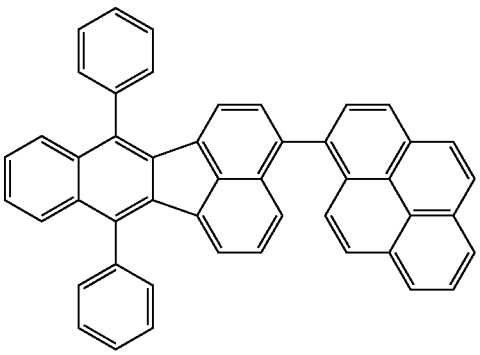
2-45
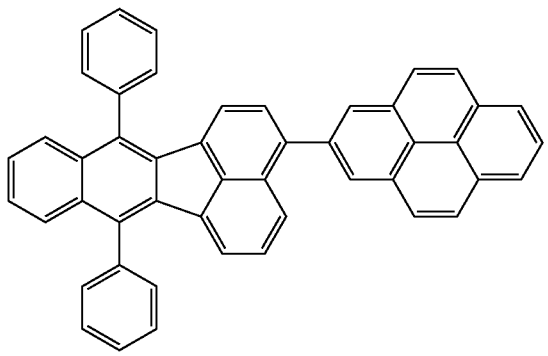
2-46
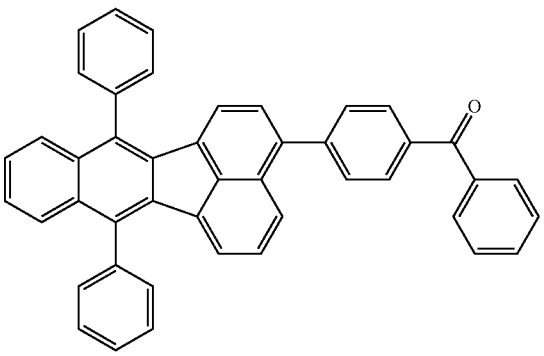
2-47
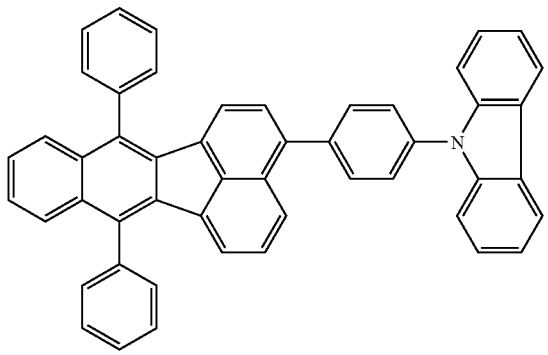
2-48
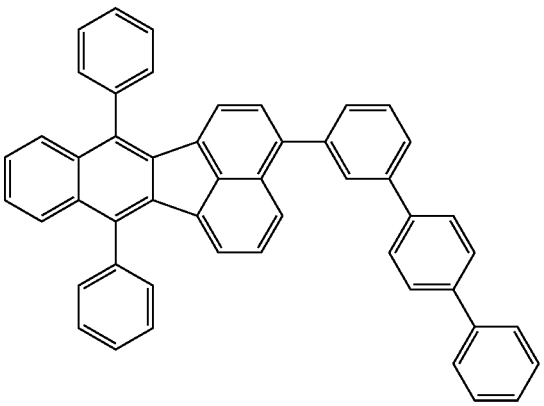

-continued
2-49
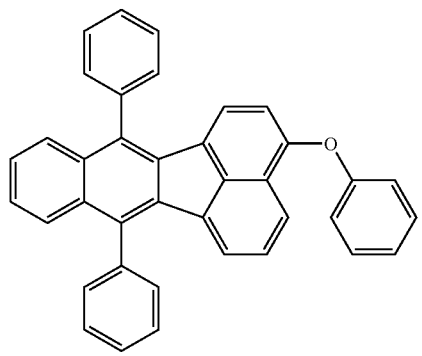
2-50
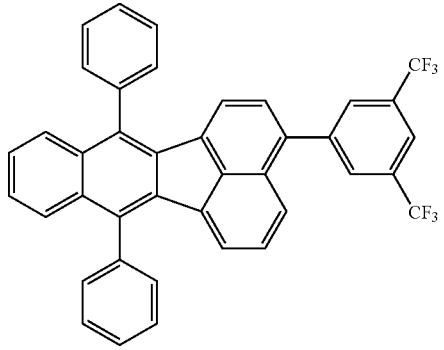
2-51
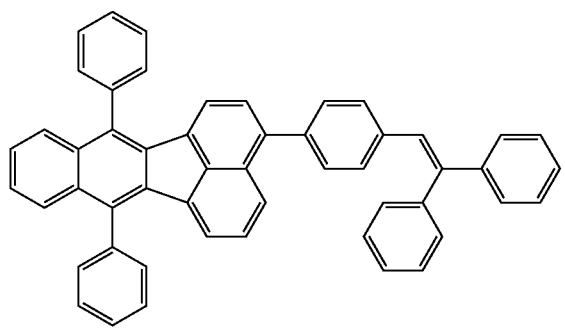
2-52
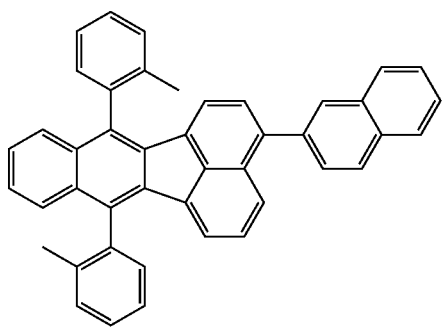
2-53
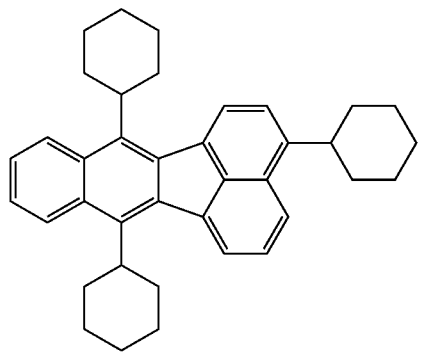
2-54
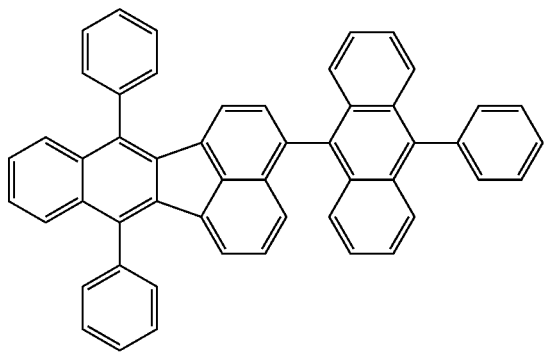
2-55
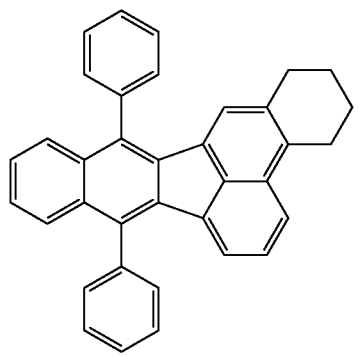
2-56
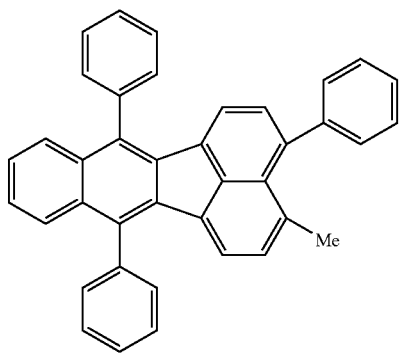

-continued
2-57
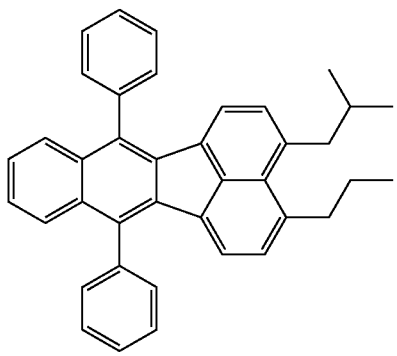
2-58
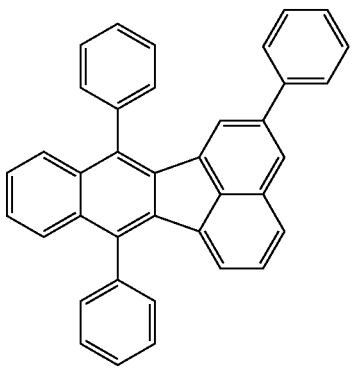
2-59
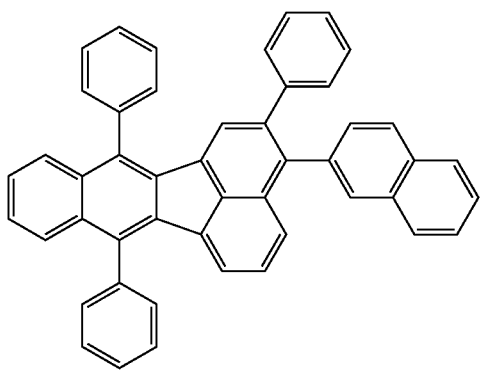
2-60
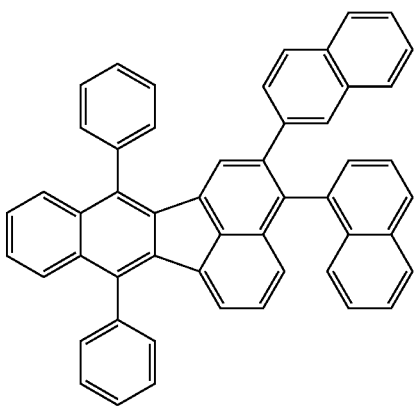
2-61
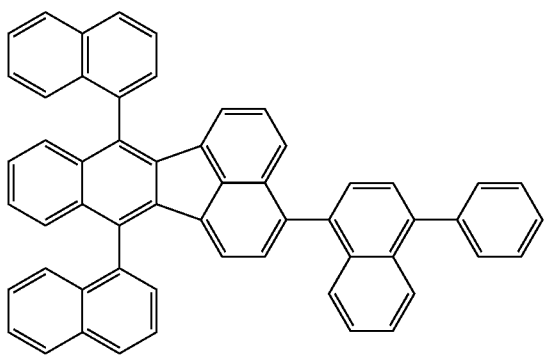
2-62
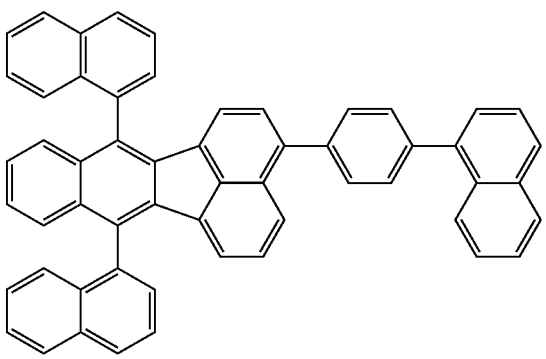
2-63
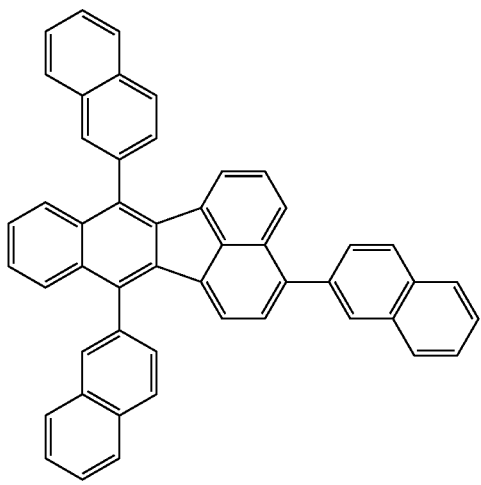
2-64
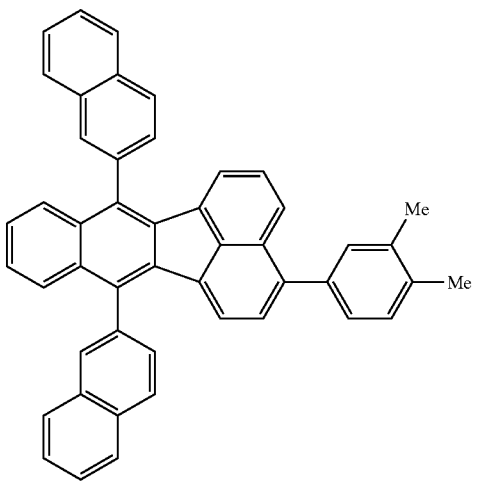

-continued
2-65
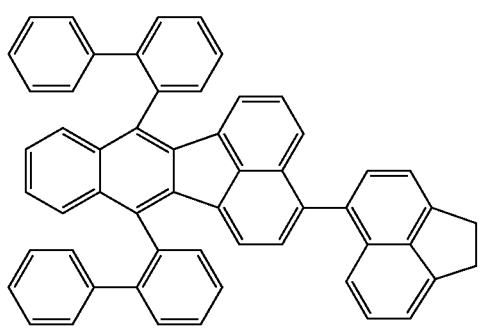
2-66
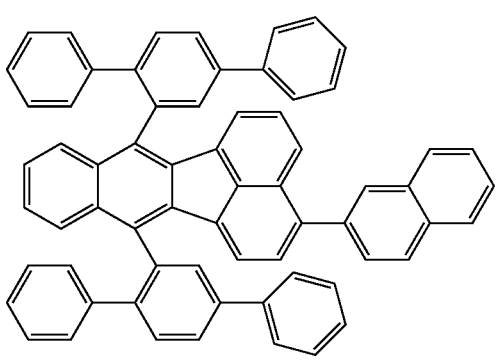
2-67
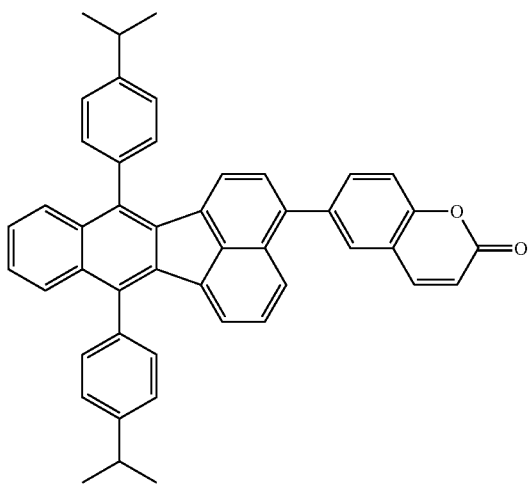
2-68
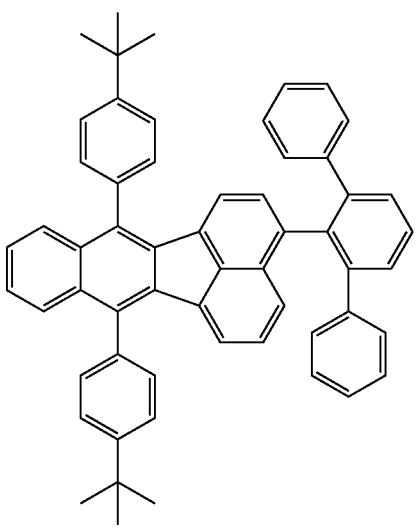
2-69
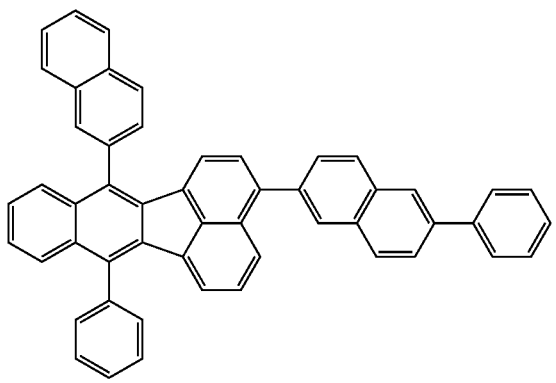
2-70
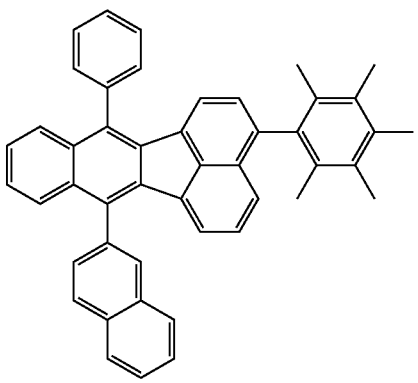
2-71
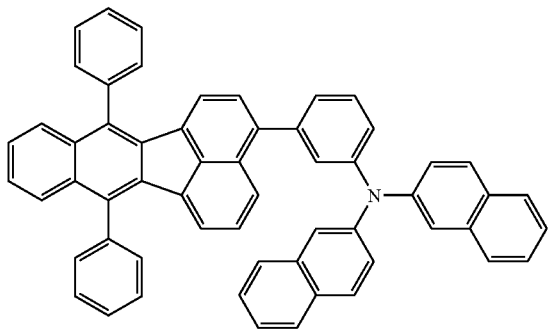
2-72
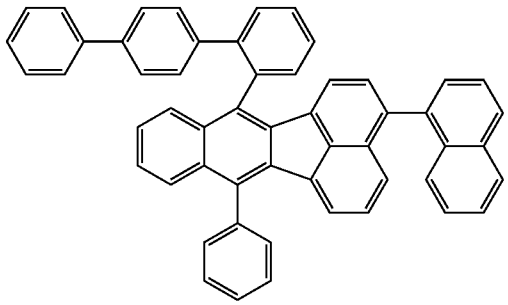

-continued
2-73
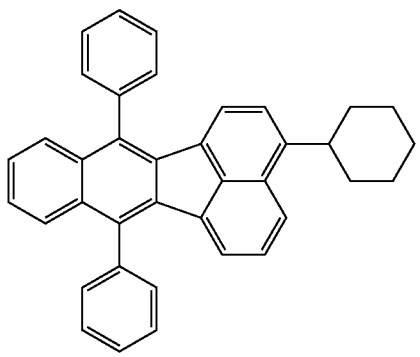
2-74
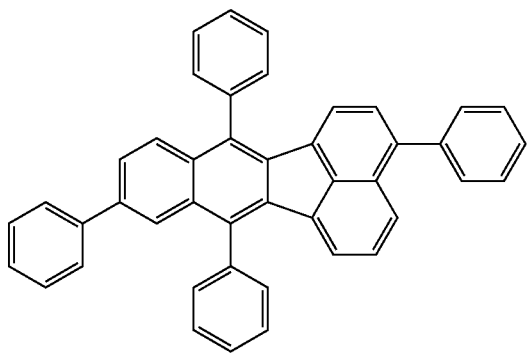
2-75
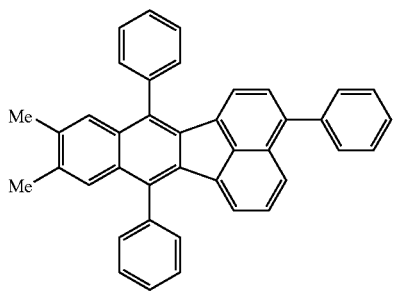
2-76
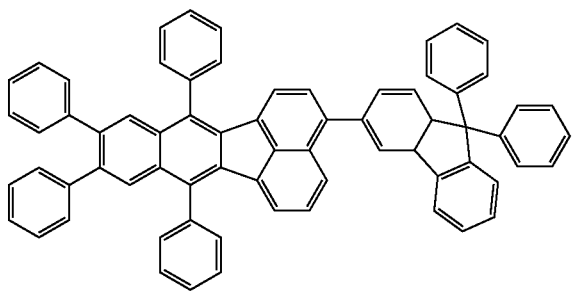
2-77
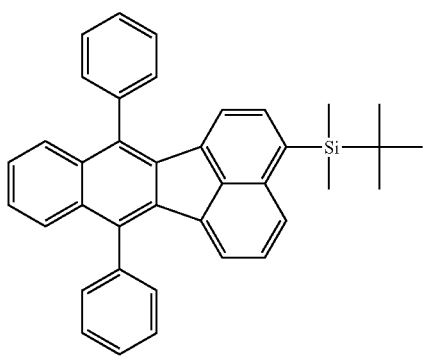
2-78
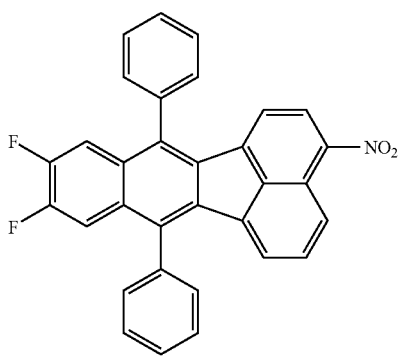
2-79
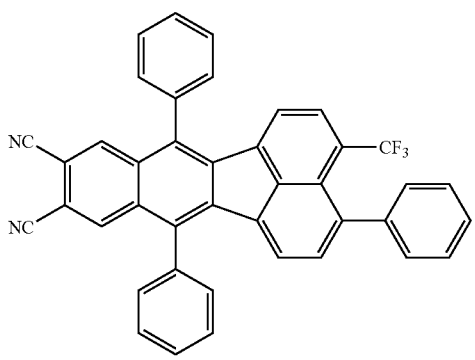
2-80
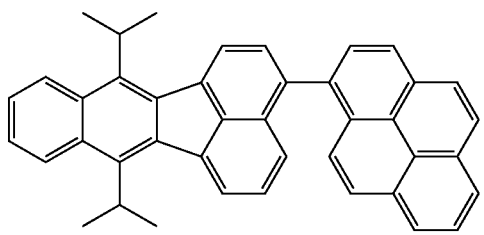

2-81
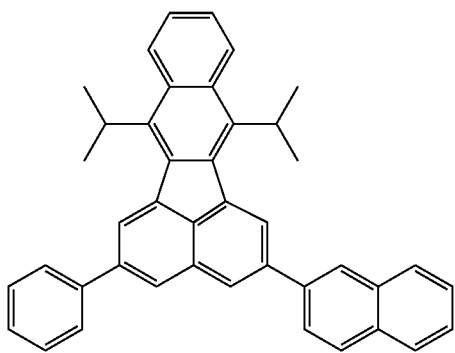
2-82
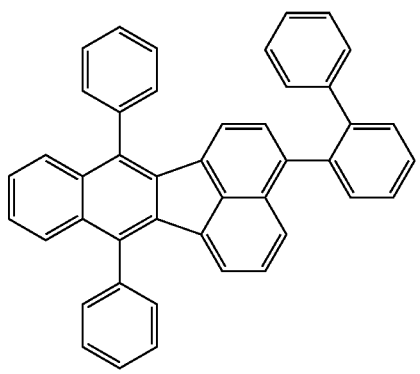
2-83
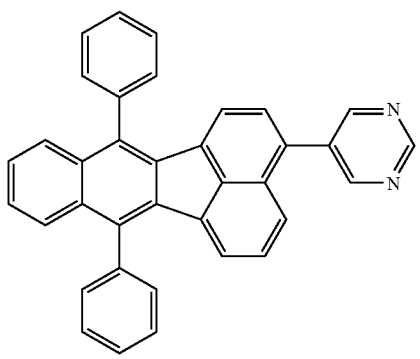
2-84
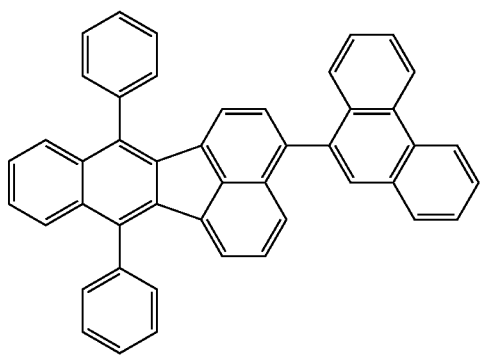
2-85
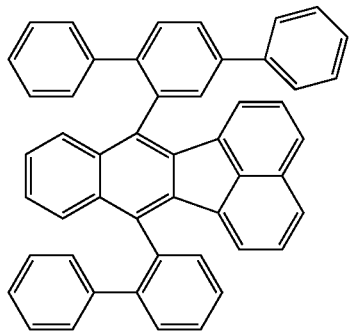
2-86
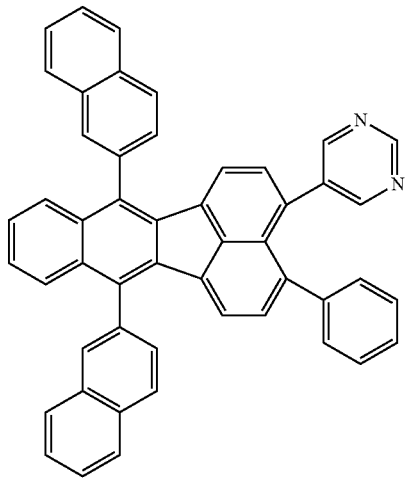
5-1
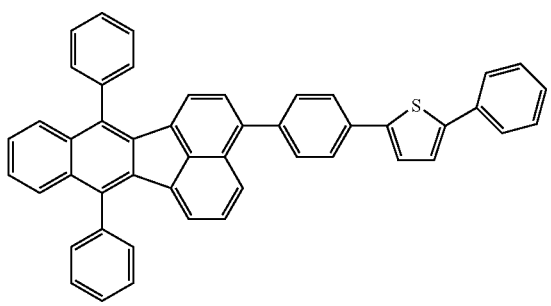
5-2
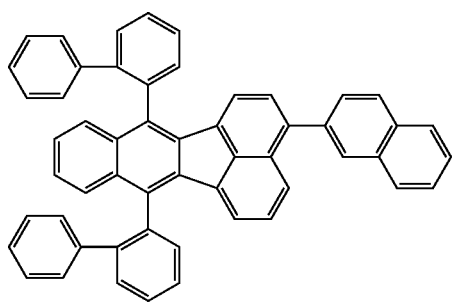

-continued
| 5-3 | 5-4 |
|---|---|
| 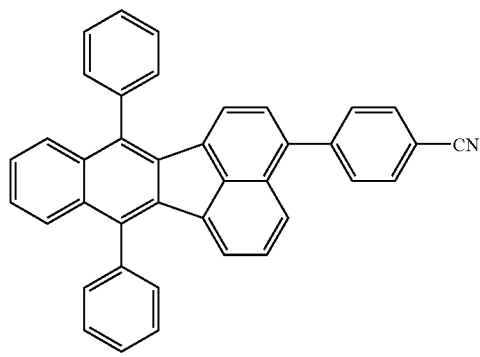 | 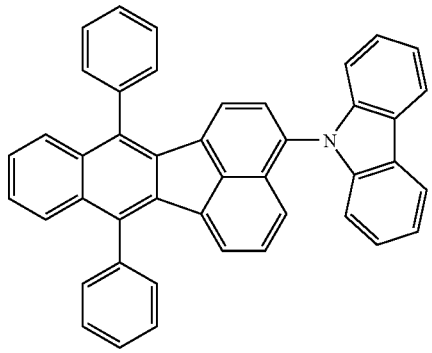 |
| 5-5 | 5-6 |
| 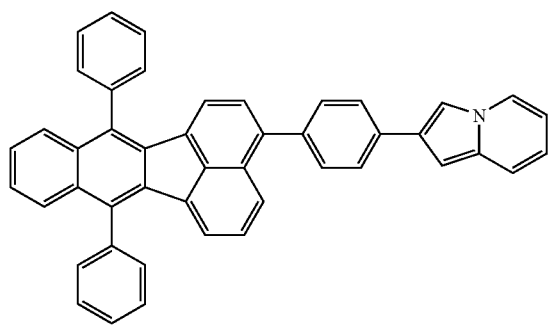 | 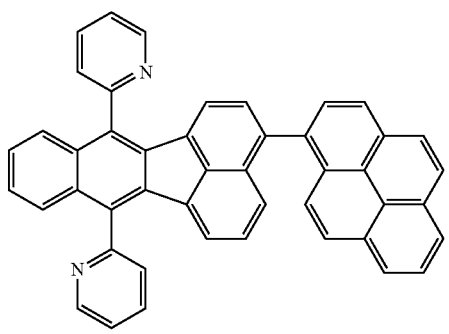 |
| 5-7 | 5-8 |
| 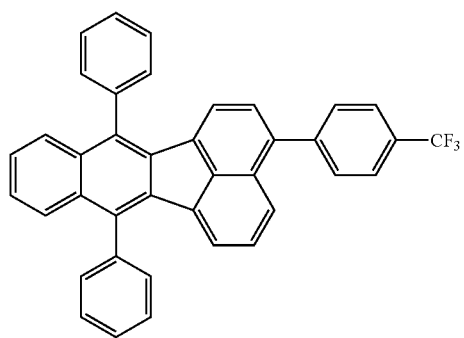 | 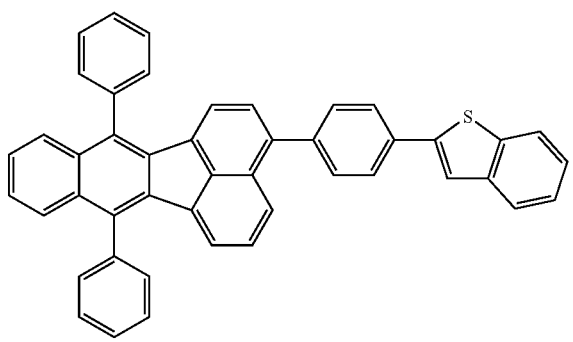 |
| 5-9 | 5-10 |
| 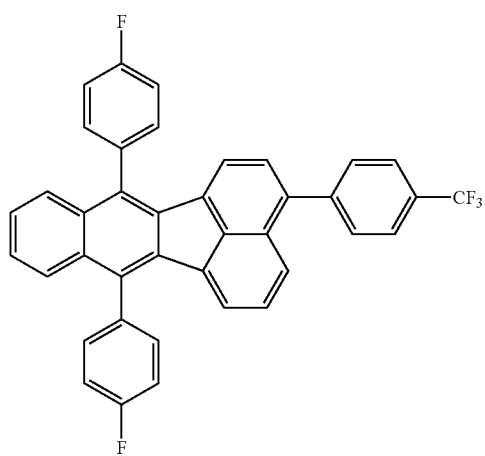 | 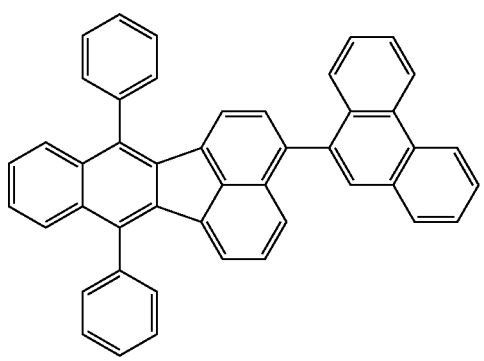 |

-continued
5-11
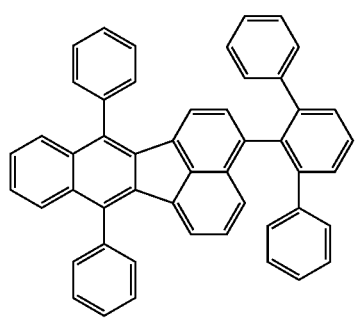
5-12
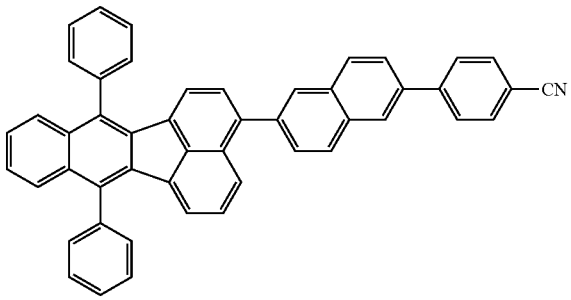
5-13
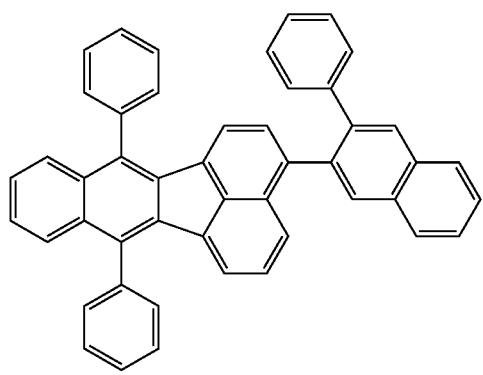
5-14
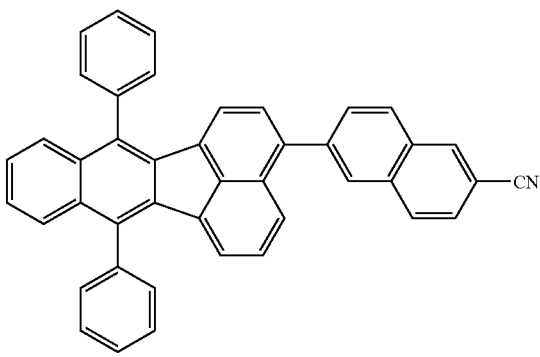
5-15
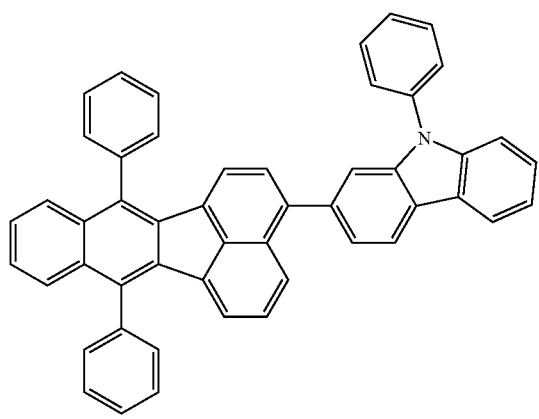
5-16
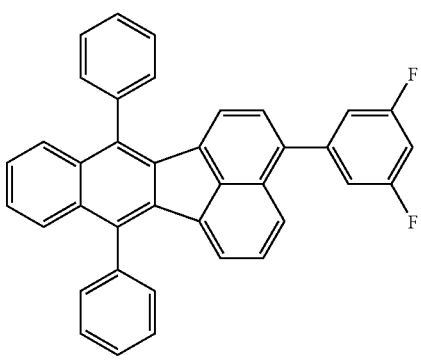
6-1
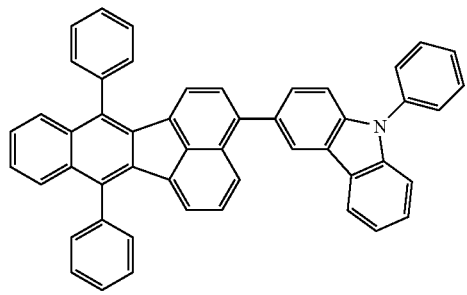
6-2
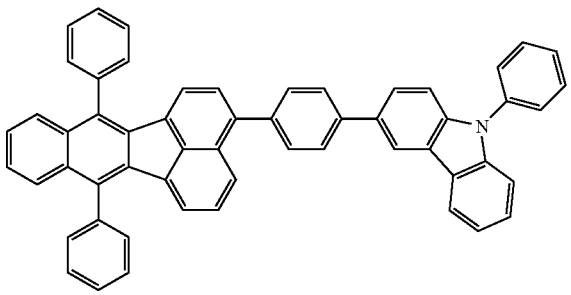

6-3
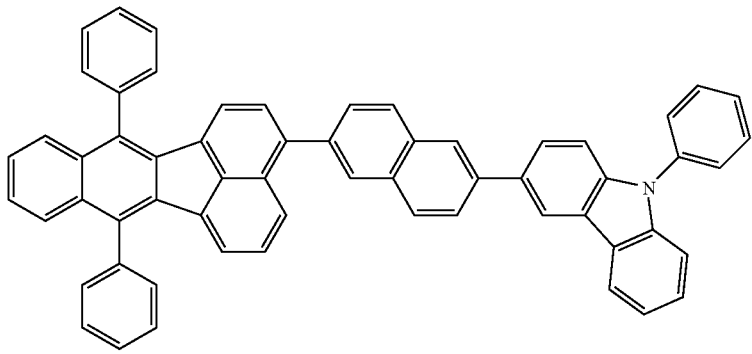
6-4
6-5
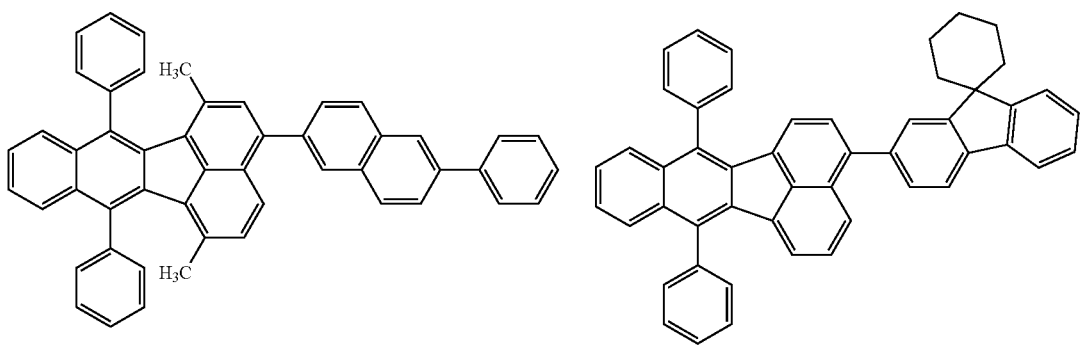
6-6
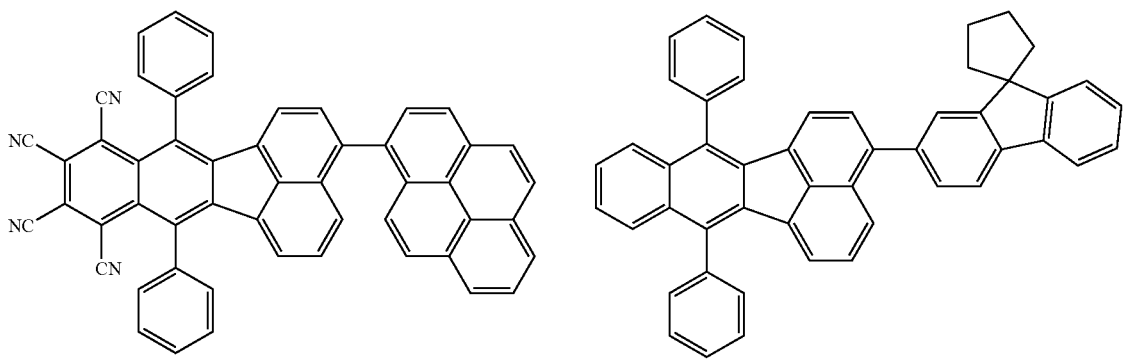
6-8
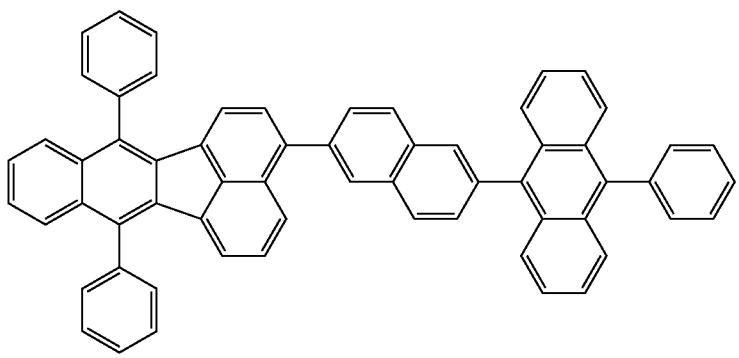

6-9
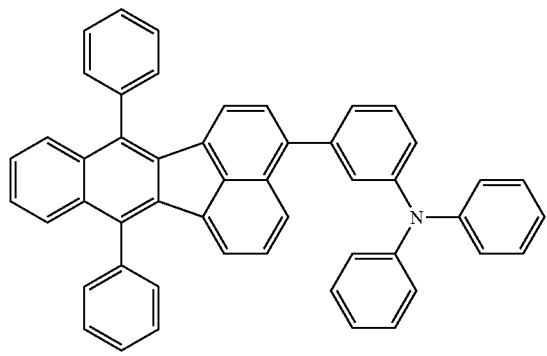
6-10
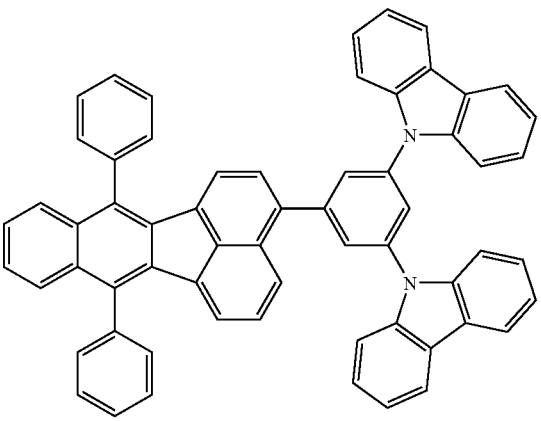
6-11
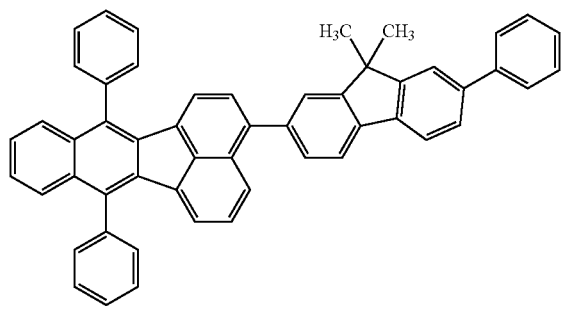
6-12
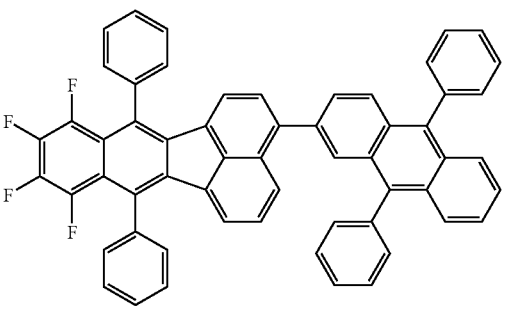
7-1
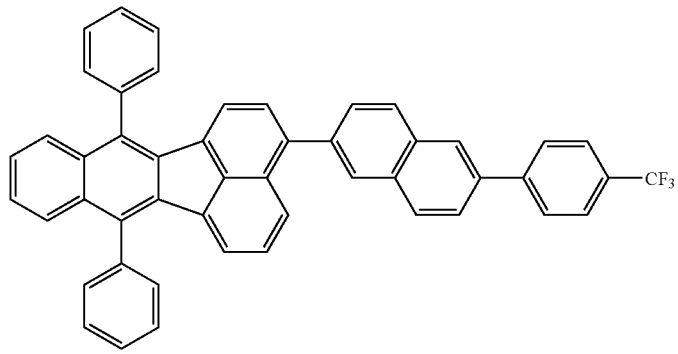
7-2
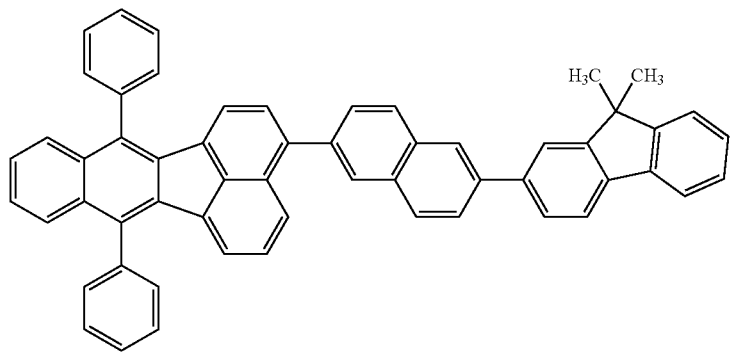

7-3
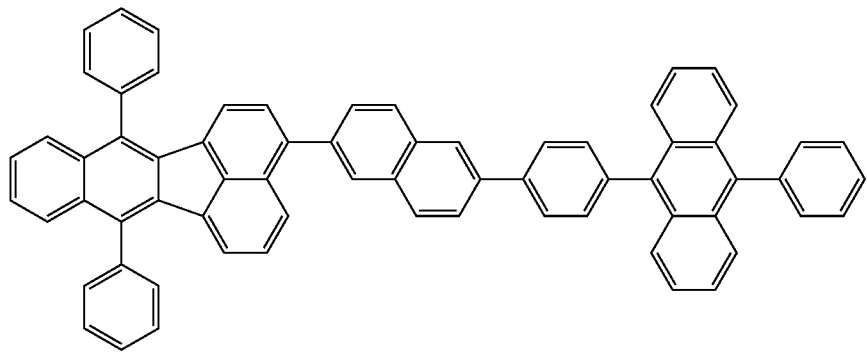
7-4
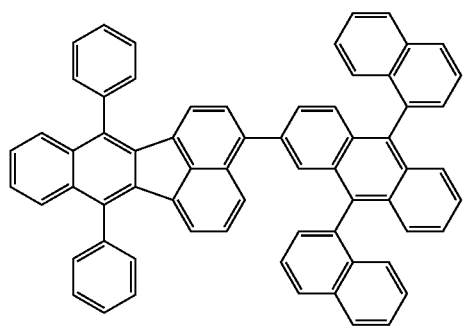
7-5
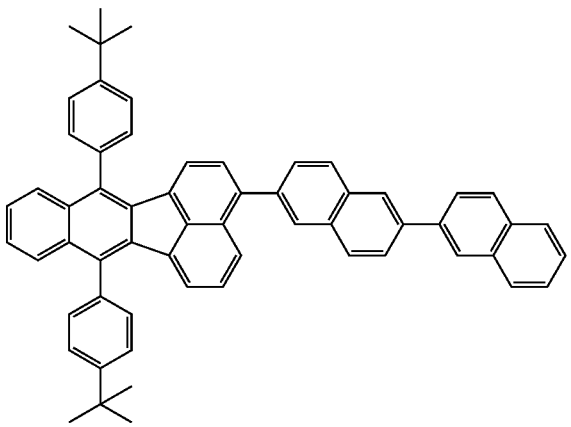
7-6
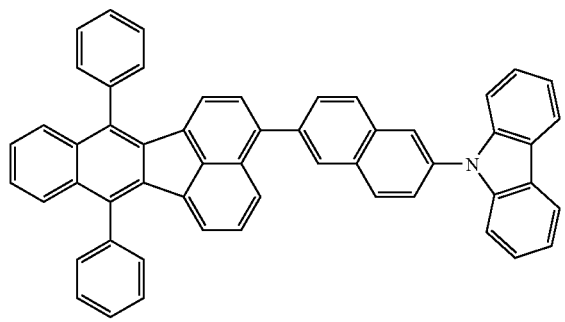
7-8
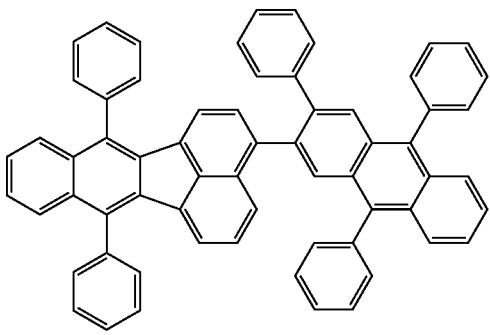
7-9
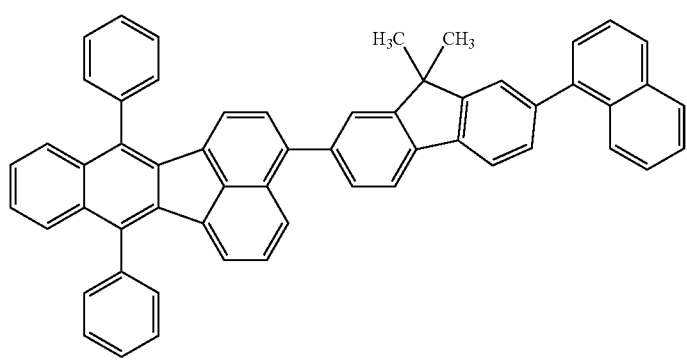

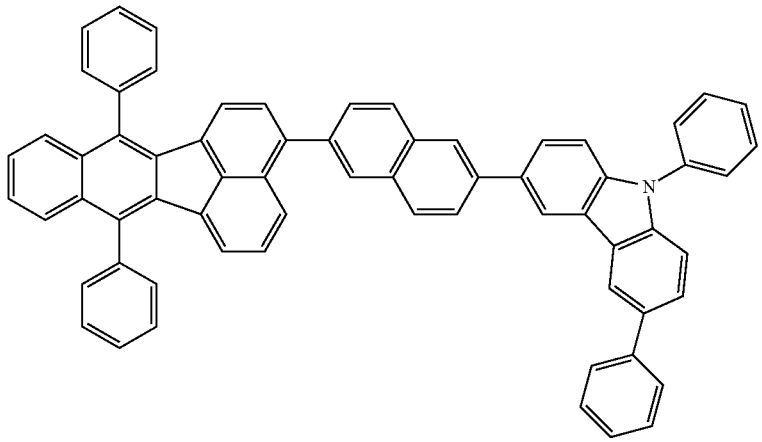

7-10

Specific examples of the anthracene derivative as $G^2$ represented by the general formula (3a) to be used in the organic EL device of the present invention include known various anthracene derivatives such as an anthracene derivative having two anthracene skeletons in any one of its molecules described in paragraphs [0043] to [0063] of Japanese Patent Application Laid-Open No. 2004-356033 and a compound having one anthracene skeleton described in p. 27 and 28 of WO 2005/061656. Representative specific examples are shown below.

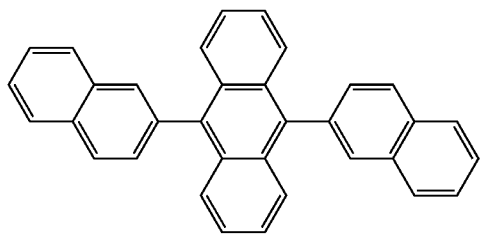

2a-1

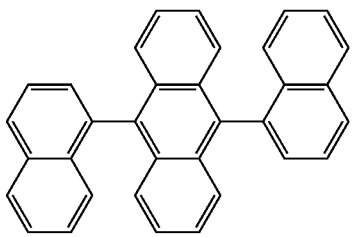

2a-2

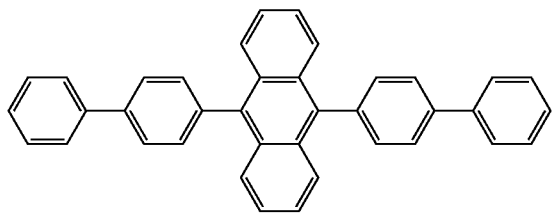

2a-3

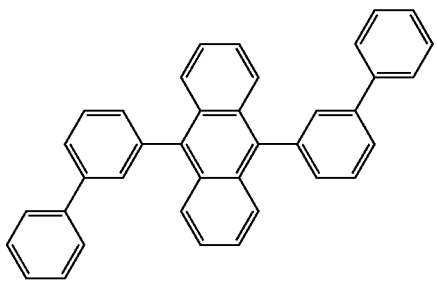

2a-4

-continued
2a-5
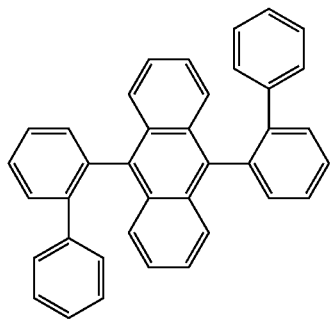
2a-6
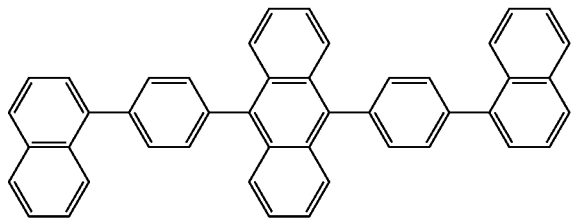
2a-7
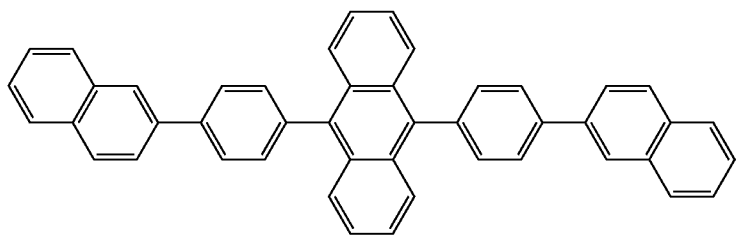
2a-8
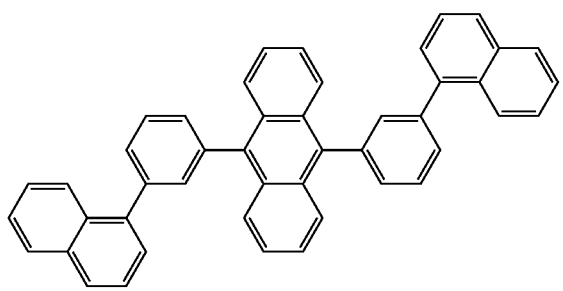
2a-9
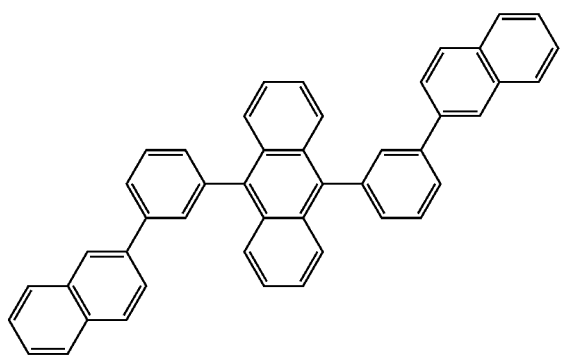
2a-10
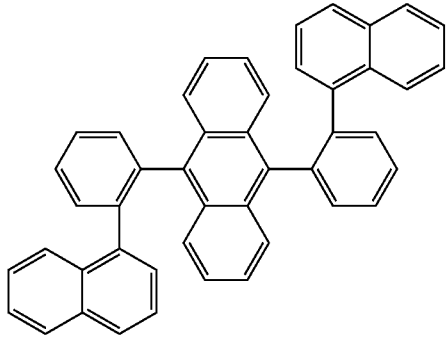
2a-11
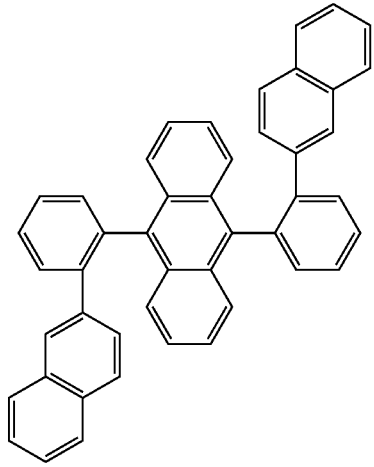

-continued
2a-12
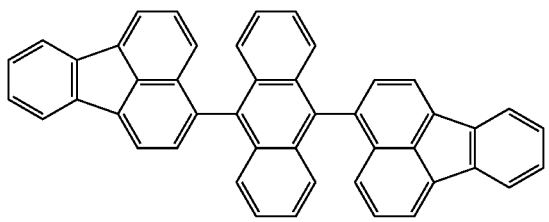
2a-13
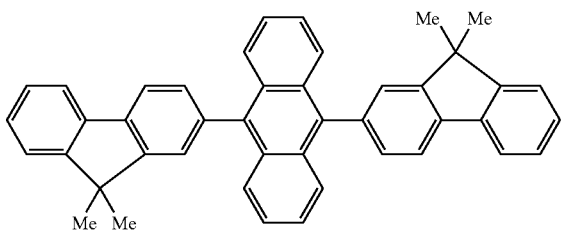
2a-14
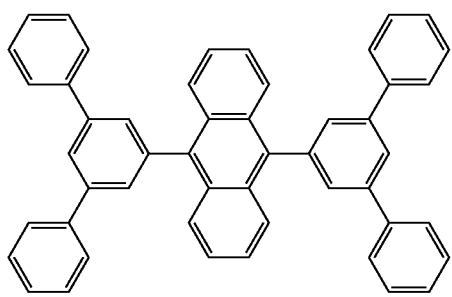
2a-15
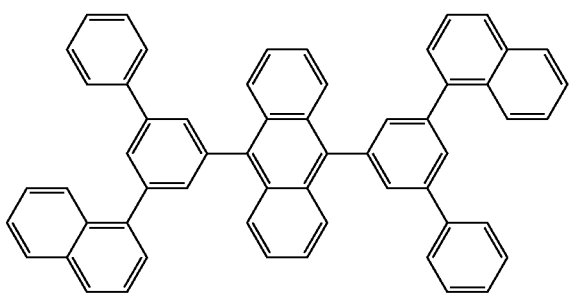
2a-16
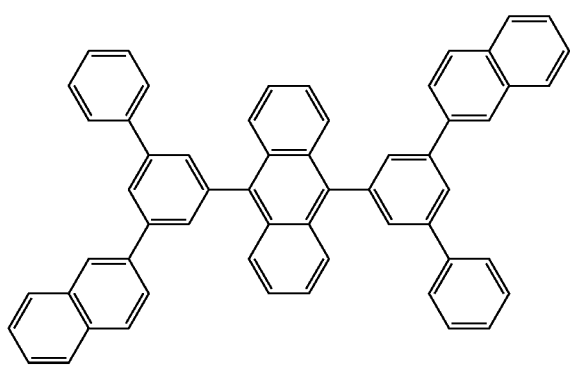
2a-17
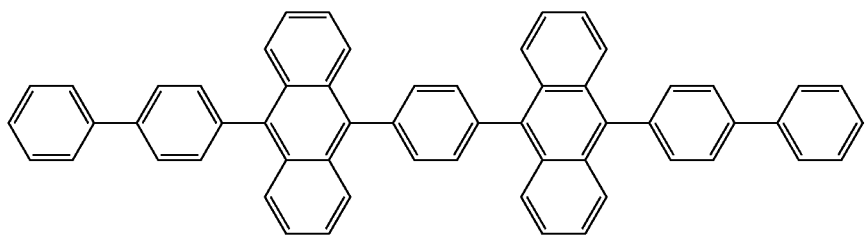
2a-18
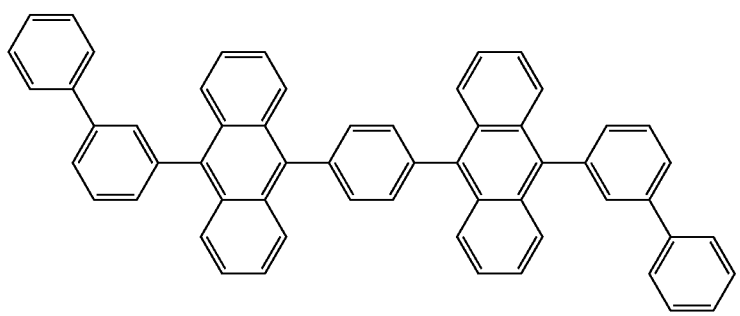

-continued
2a-19
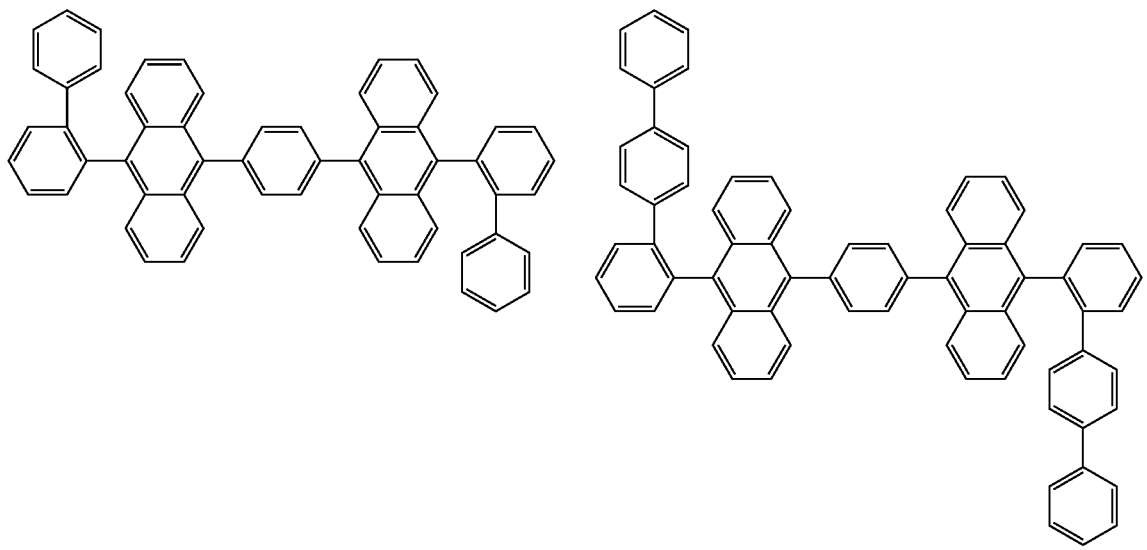
2a-20
2a-21
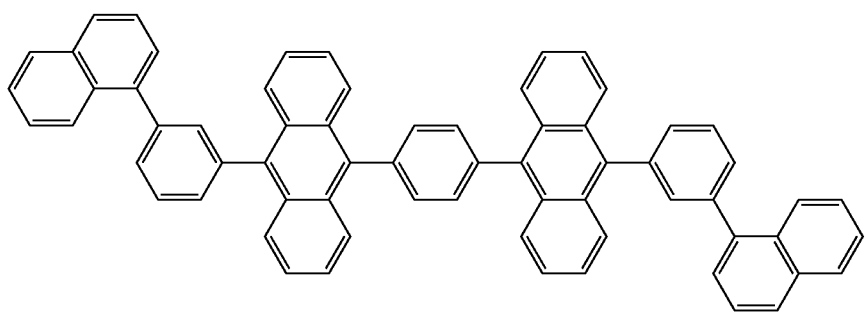
2a-22
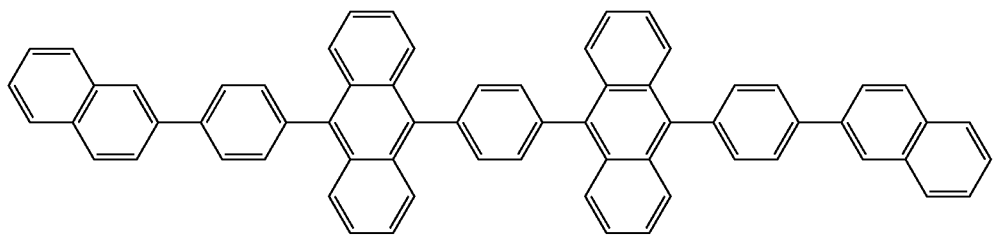
2a-23
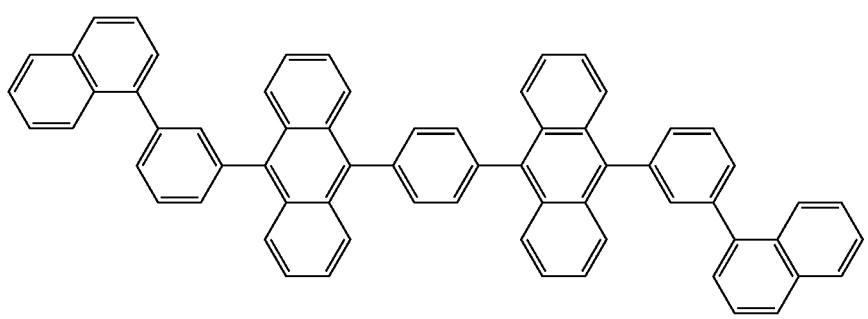
2a-24
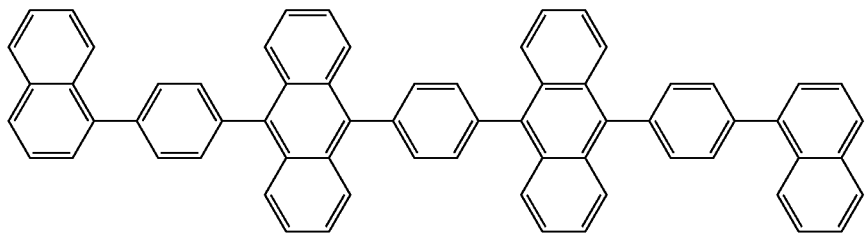

-continued
2a-25
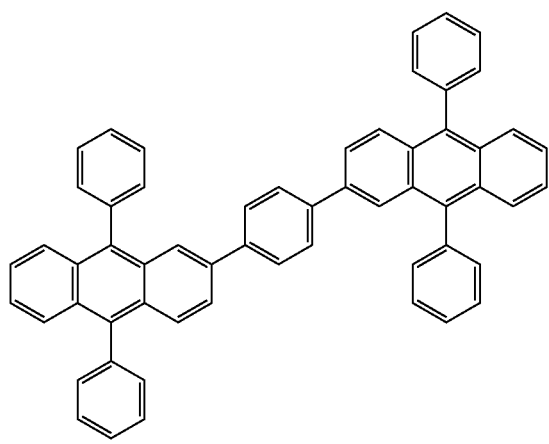
2a-26
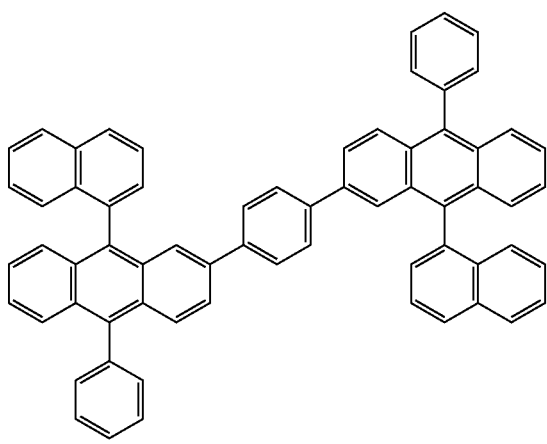
2a-27
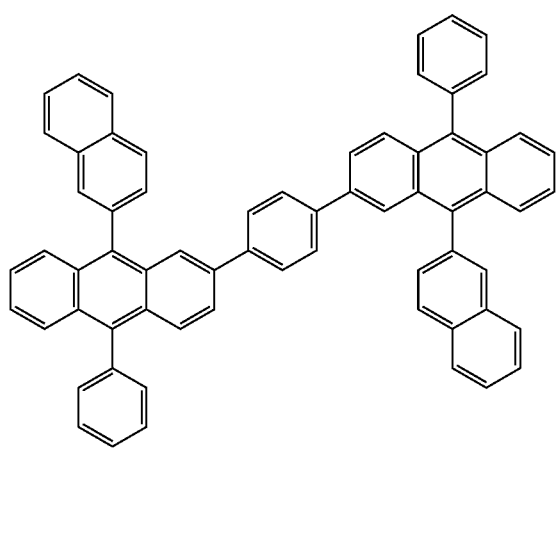
2a-28
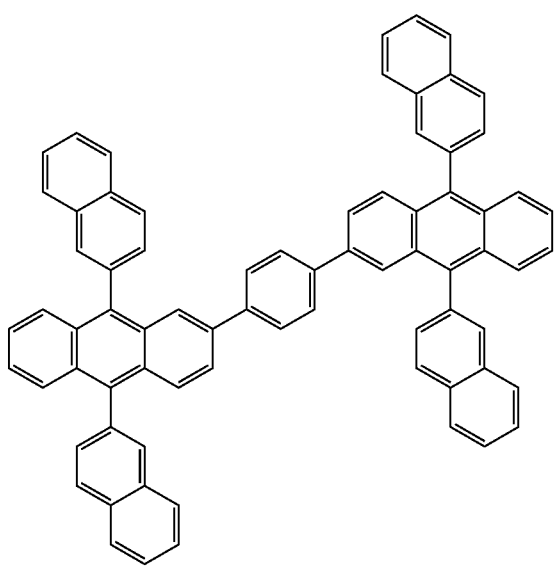
2a-29
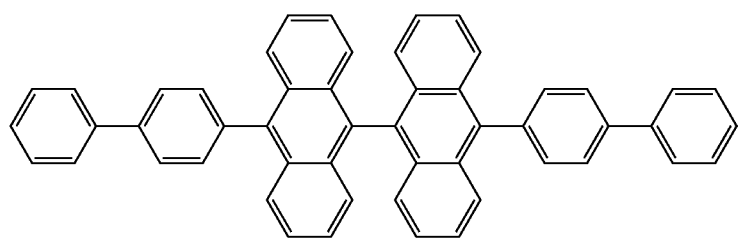
2a-30
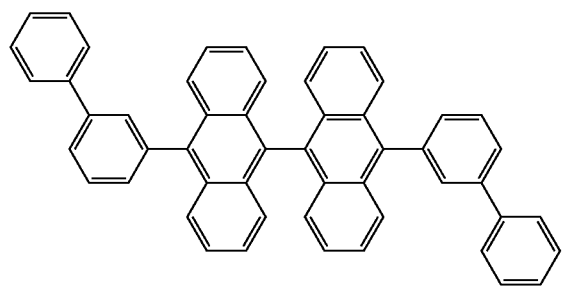
2a-31
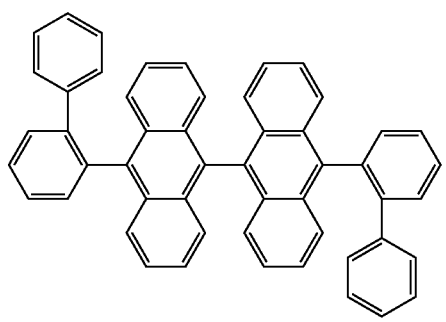

-continued
2a-32
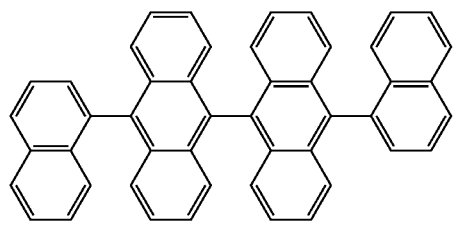
2a-33
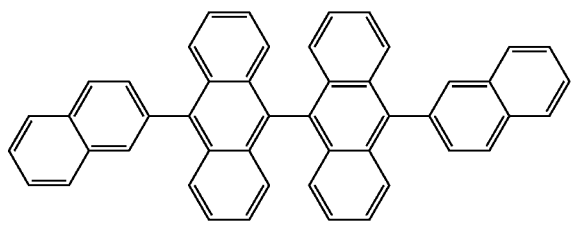
2a-34
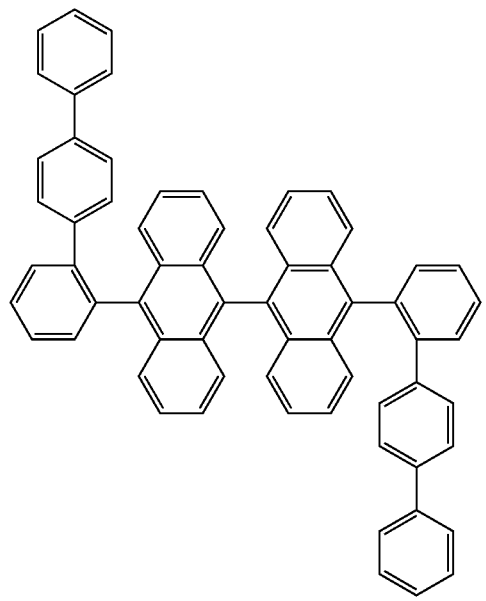
2a-35
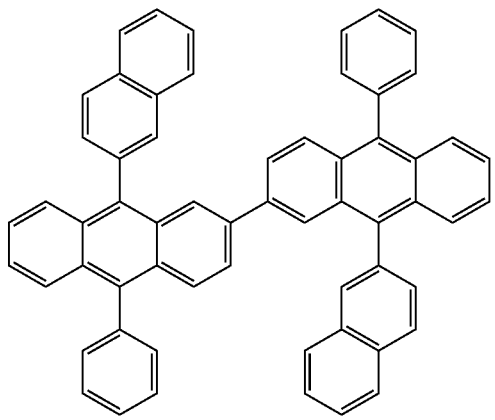
2a-36
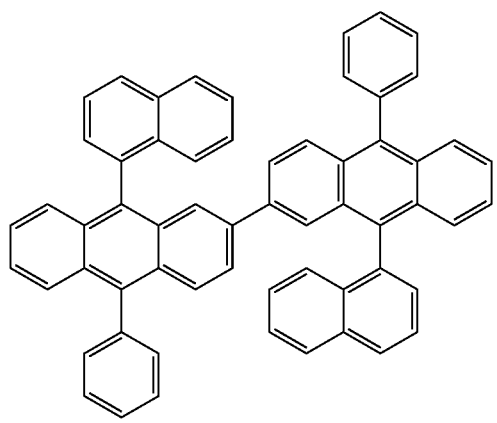
2a-37
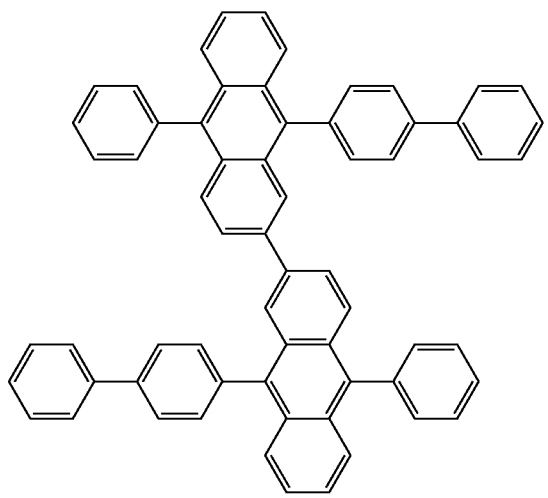

-continued
2a-38
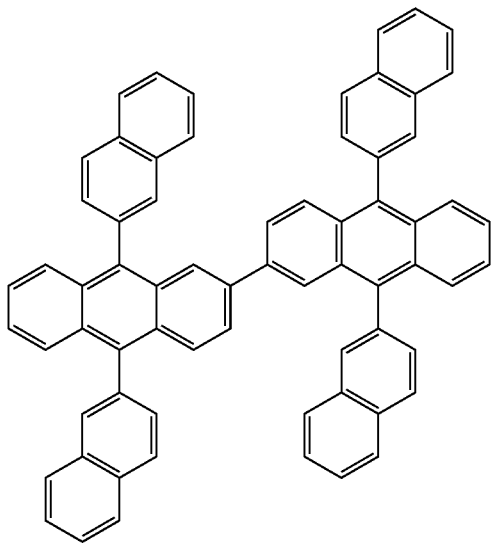
2a-39
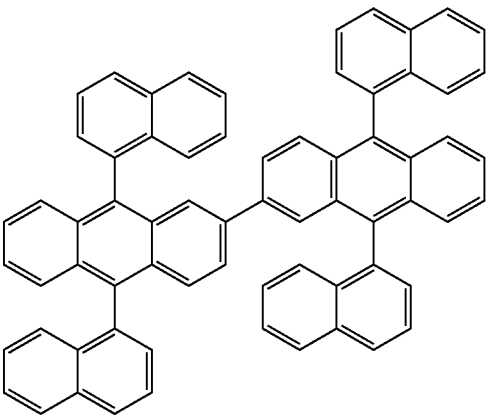
2a-40
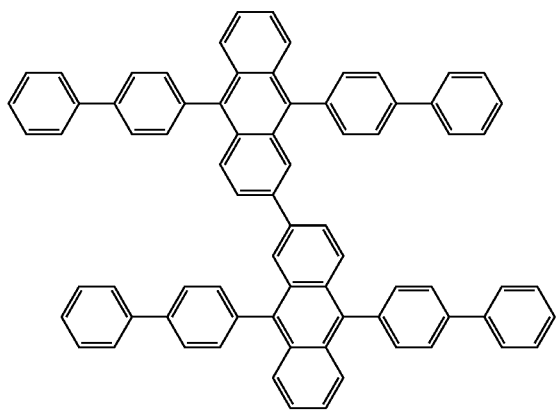
2a-41
2a-42 2a-43
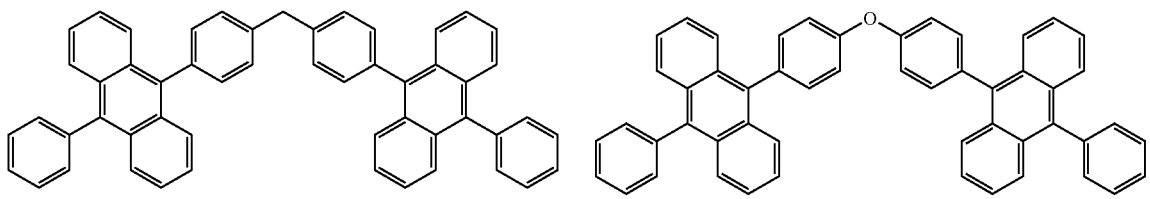
2a-44 2a-45
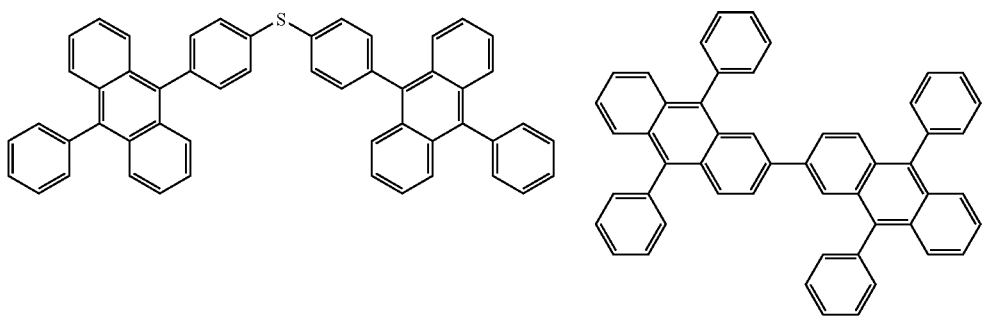

2a-46
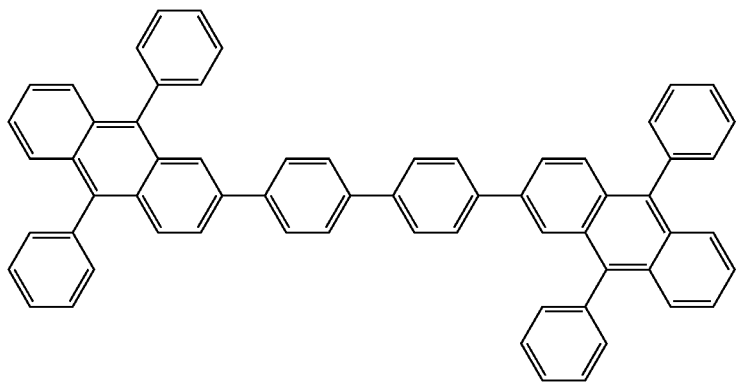
2a-47
2a-48
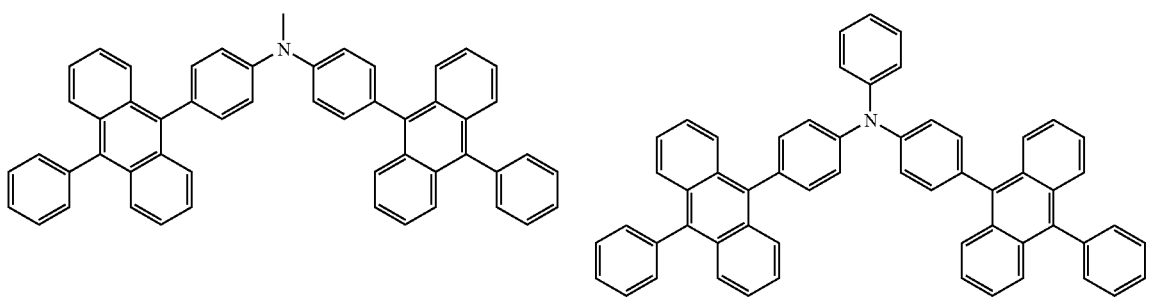
2a-49
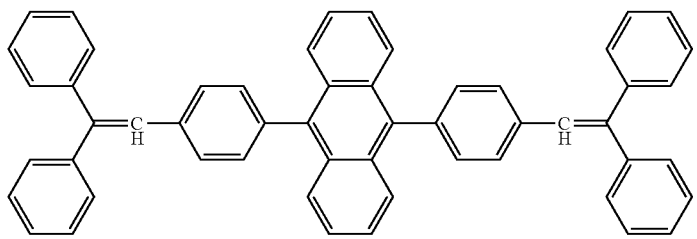
2a-50
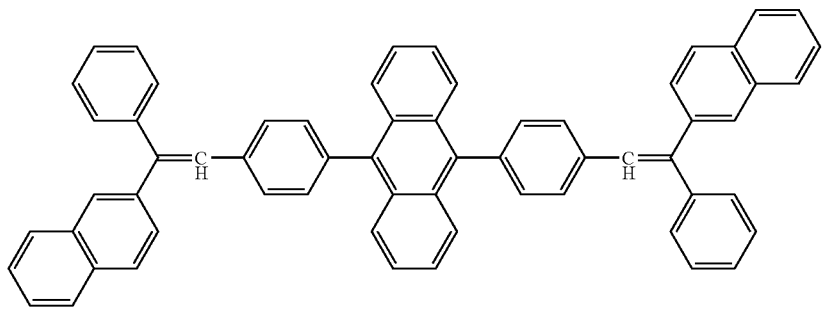

-continued
2a-51
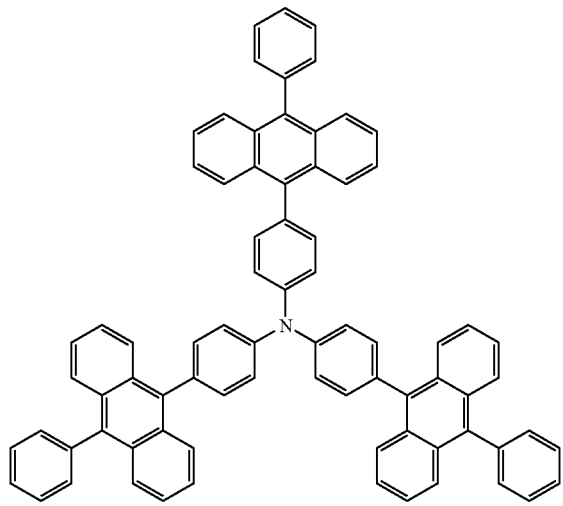
2a'-52
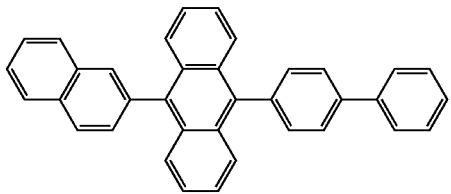
2a'-53
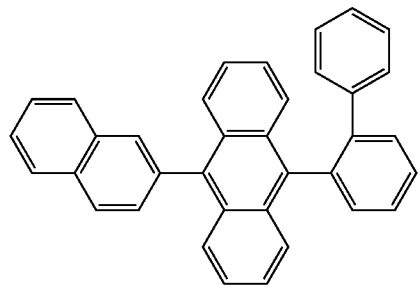
2a'-54
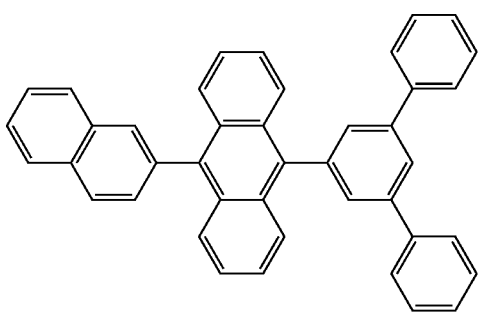
2a'-55
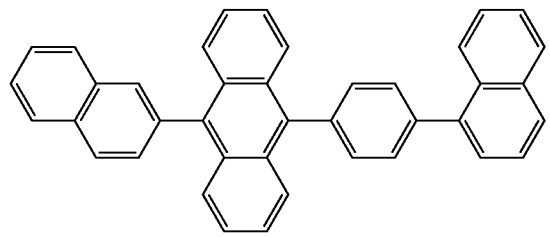
2a'-56
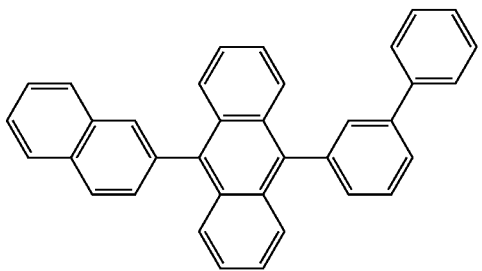
2a'-57
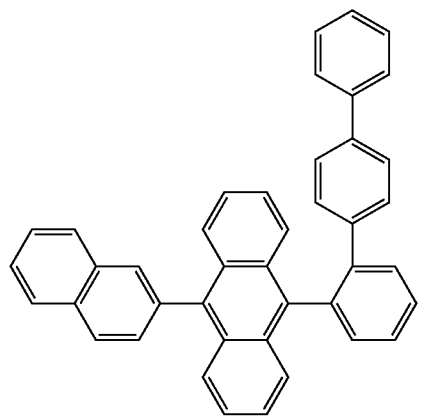
2a'-58
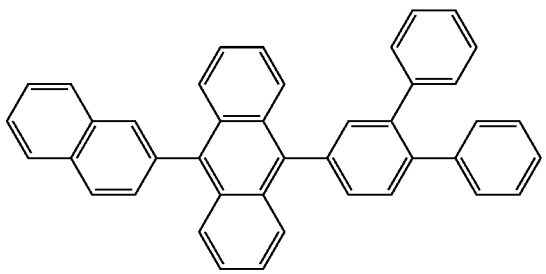

-continued
2a'-59
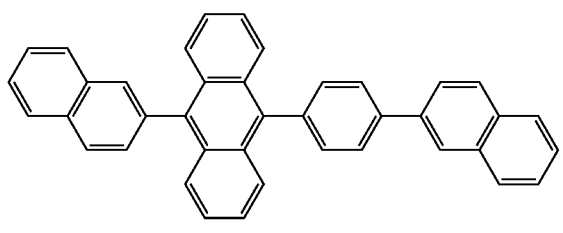
2a'-60
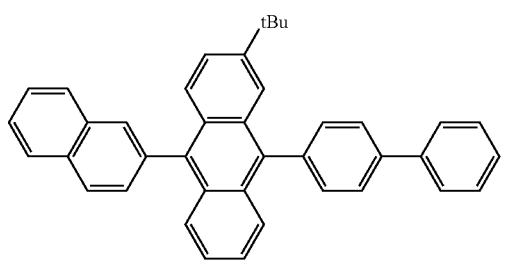
2a'-61
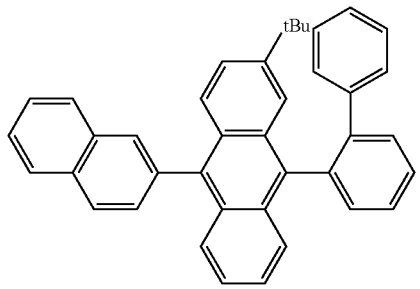
2a'-62
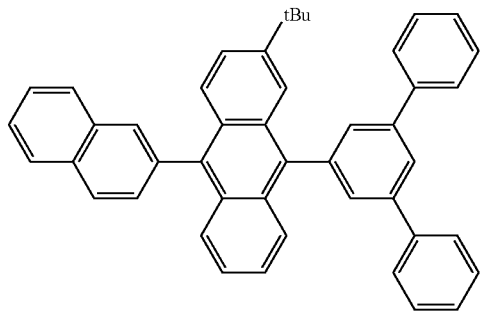
2a'-63
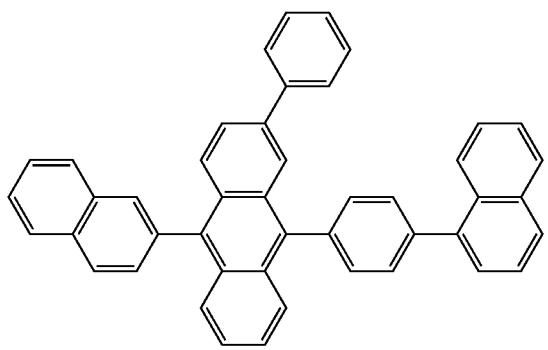
2a'-64
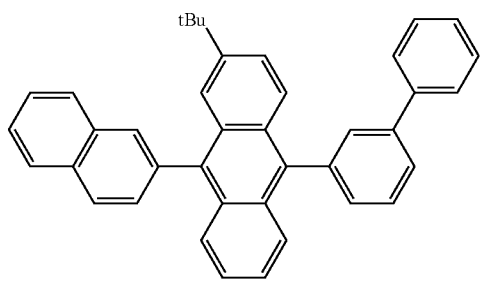
2a'-65
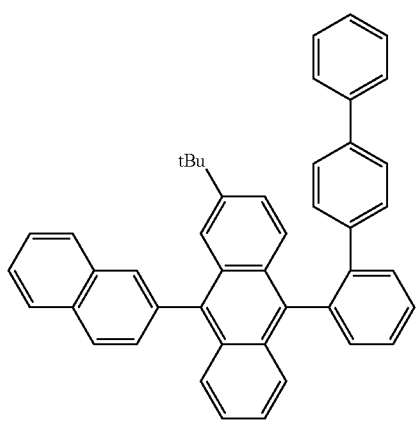
2a'-66
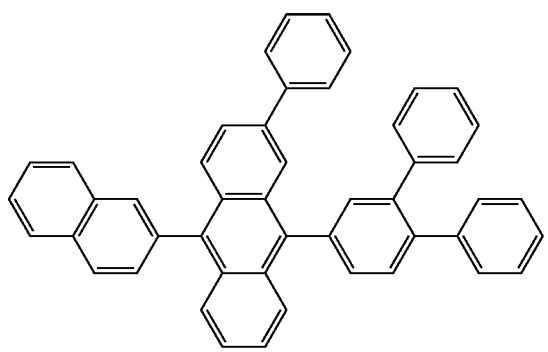

-continued
2a'-67
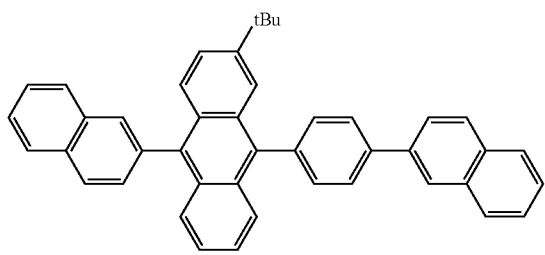
2a'-68
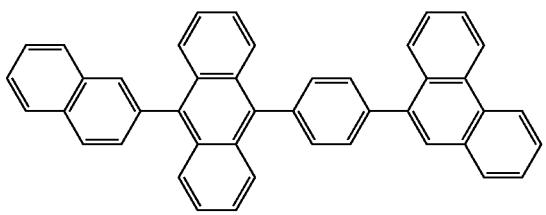
2a'-69
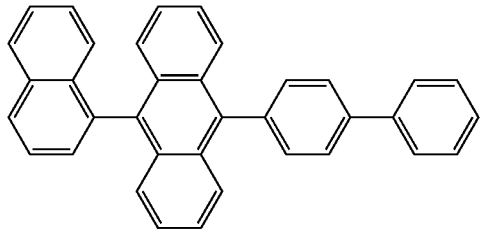
2a'-70
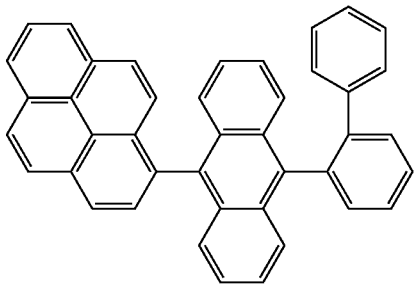
2a'-71
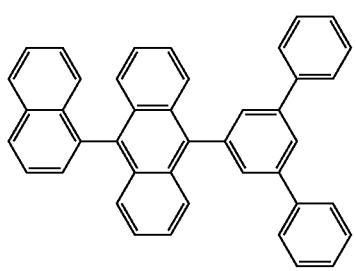
2a'-72
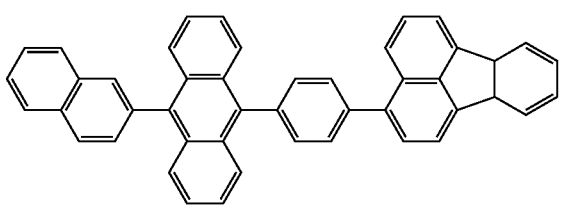
2a'-73
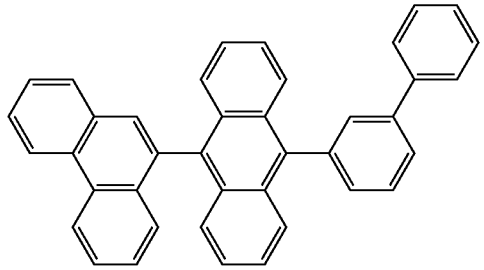
2a'-74
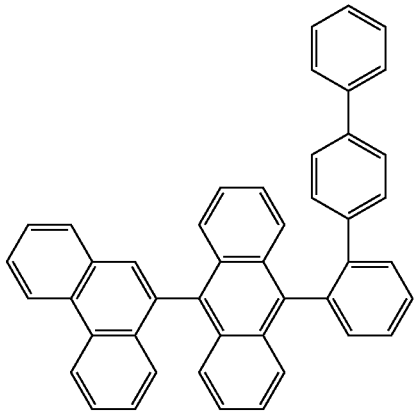
2a'-75
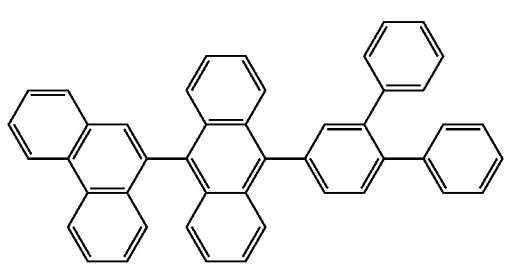
2a'-76
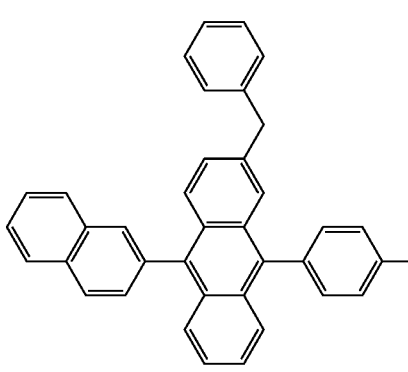

-continued
2a'-77
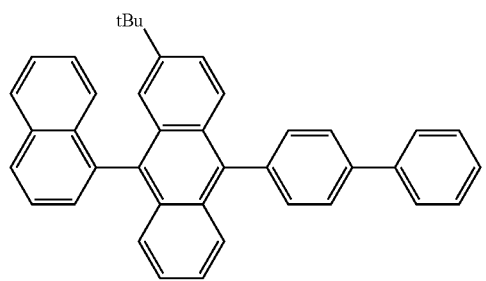
2a'-78
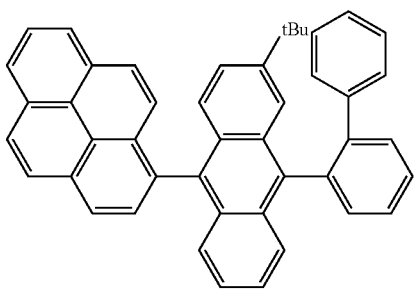
2a'-79
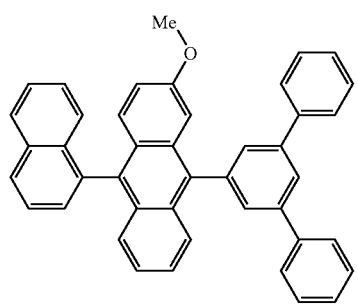
2a'-80
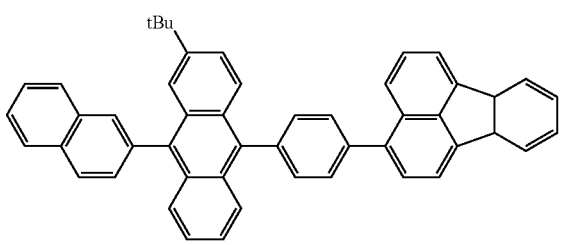
2a'-81
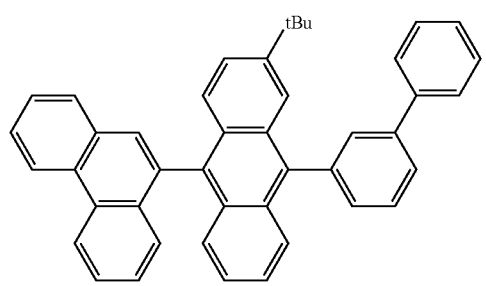
2a'-82
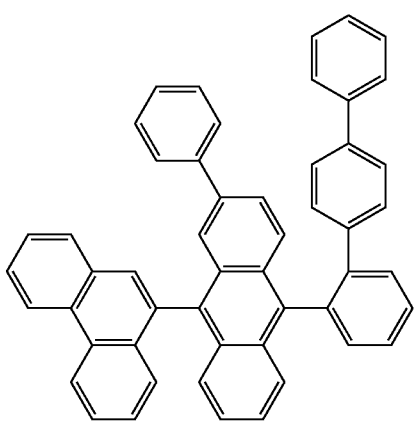
2a'-83
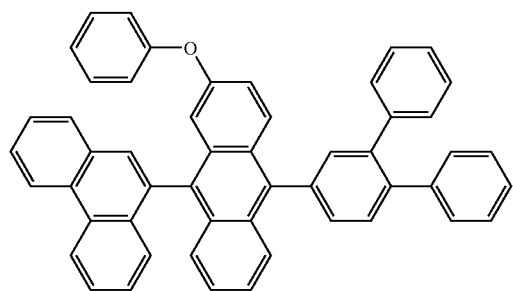
2a'-84
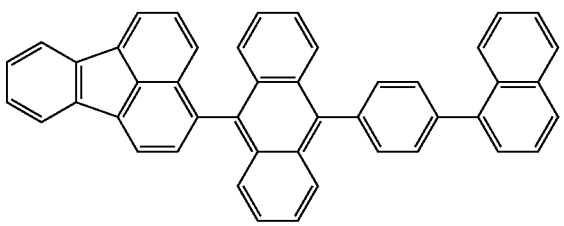

-continued
2a′-85
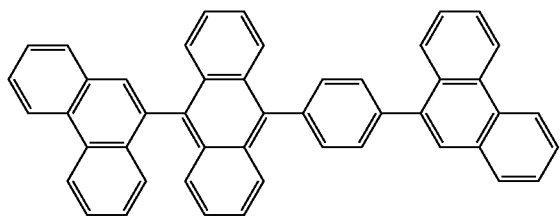
2a′-86
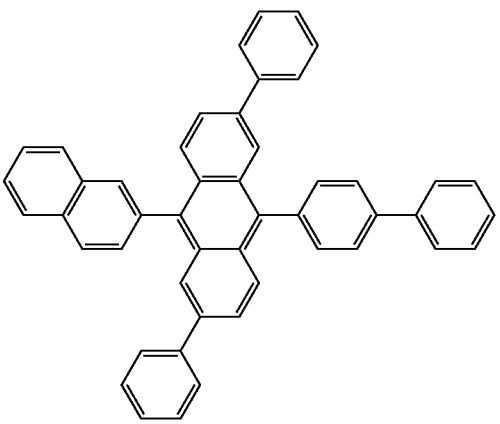
2a′-87
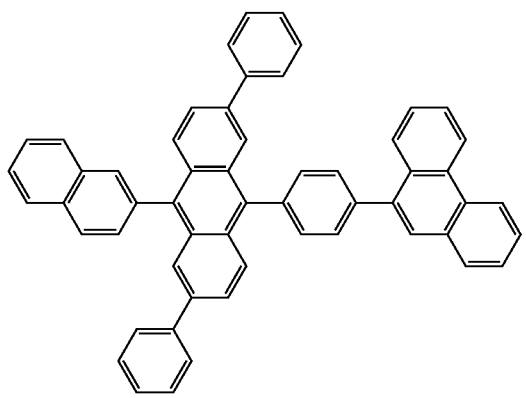
2a′-88
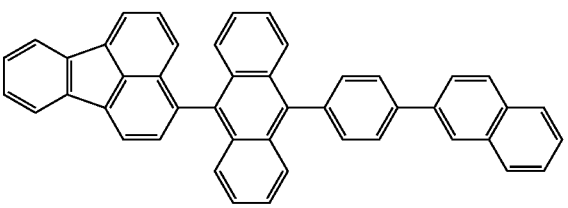
2a′-89
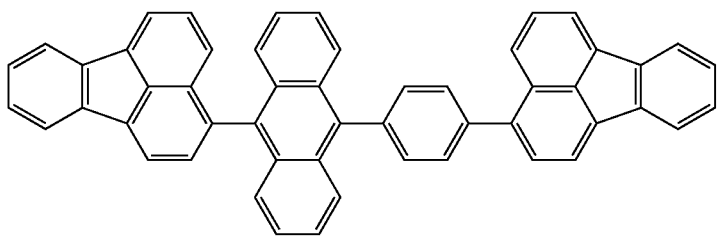
2a′-90
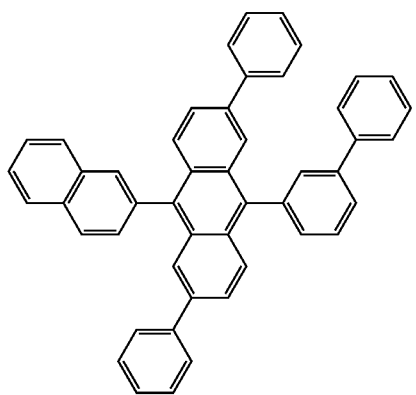
2a′-91
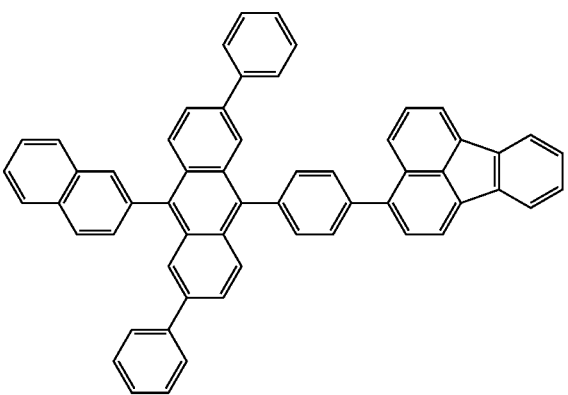

-continued
2a'-92
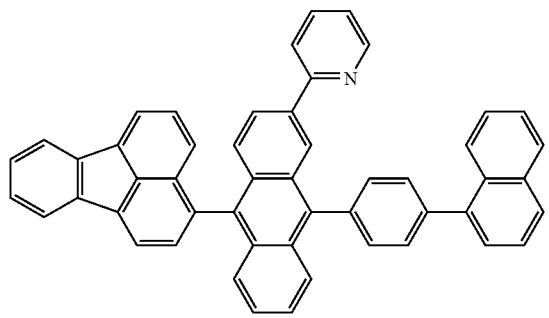
2a'-93
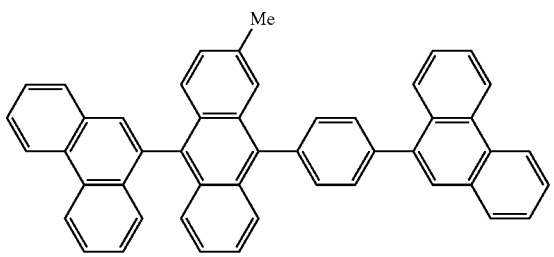
2a'-94
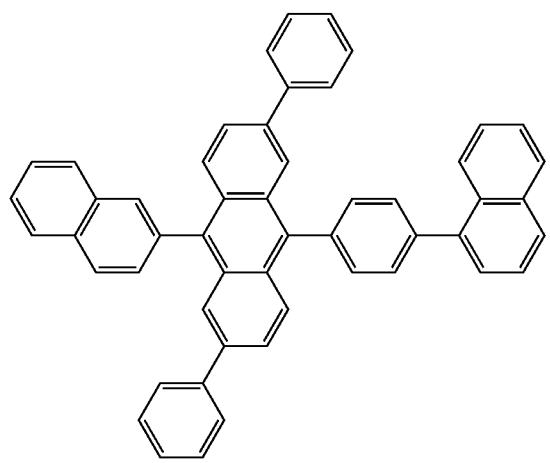
2a'-95
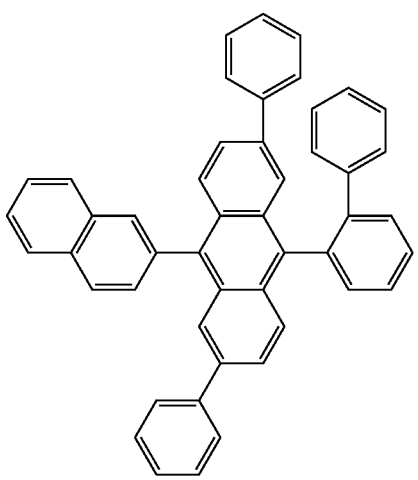
2a'-96
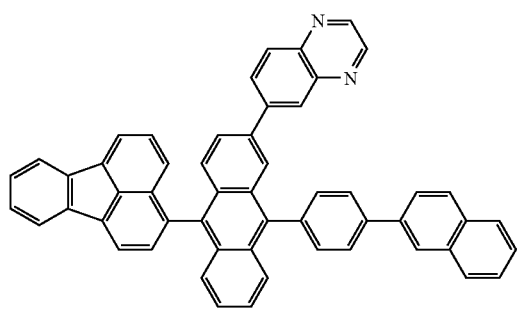
2a'-97
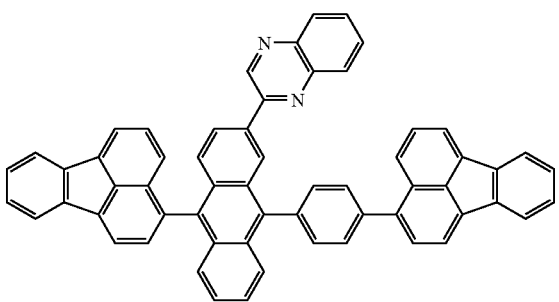
2a'-98
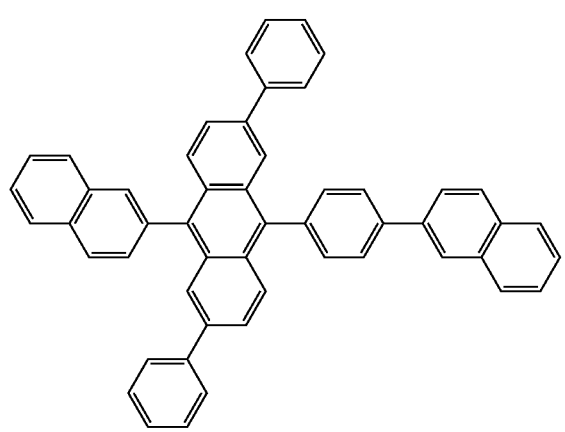
2a'-99
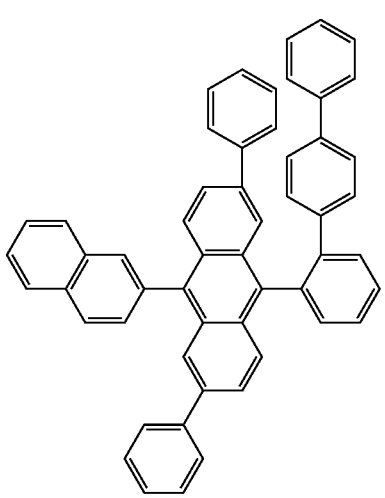

-continued
2a′-100
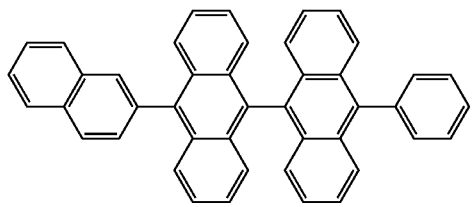
2a′-101
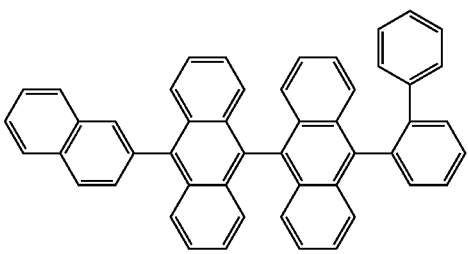
2a′-102
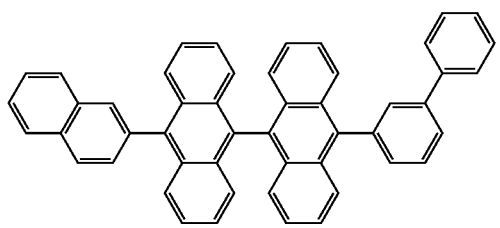
2a′-103
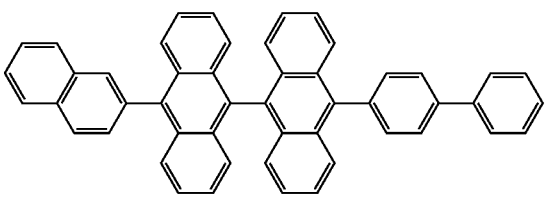
2a′-104
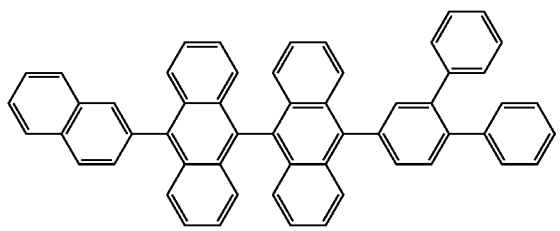
2a′-105
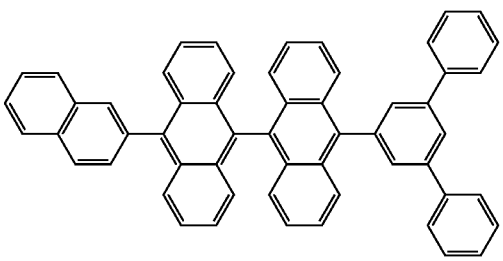
2a′-106
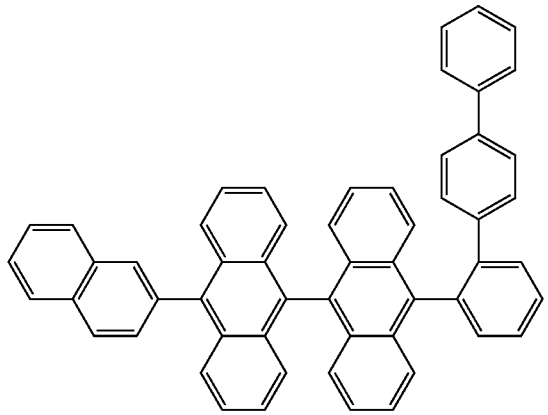
2a′-107
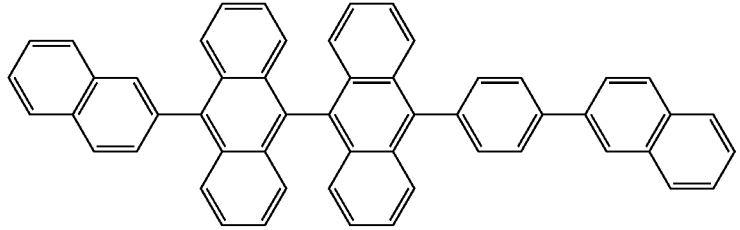
2a′-108
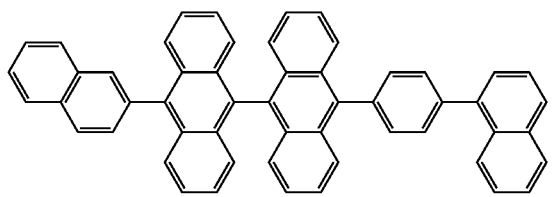
2a′-109
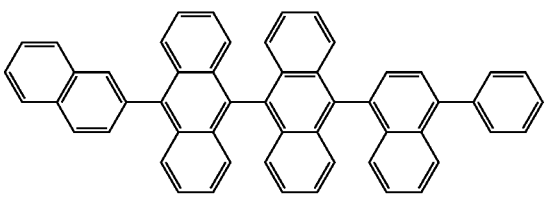

2a'-110
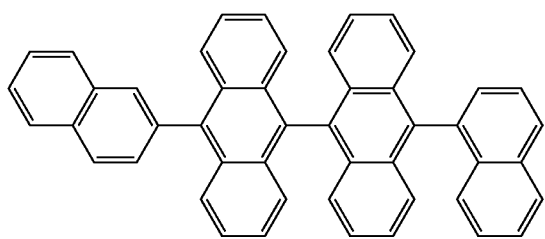
2a'-111
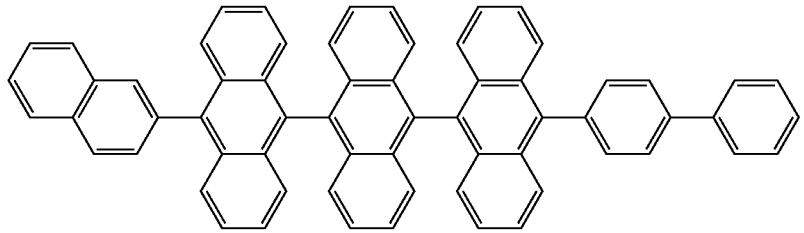
2a'-112
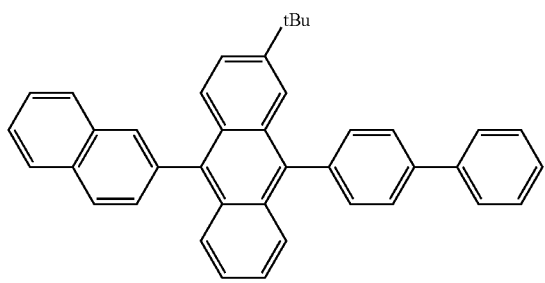
2a'-113
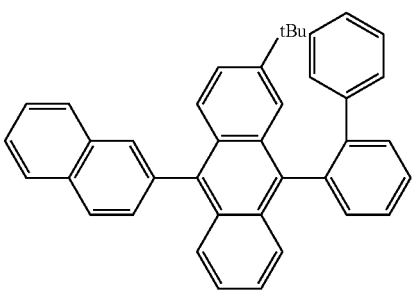
2a'-114
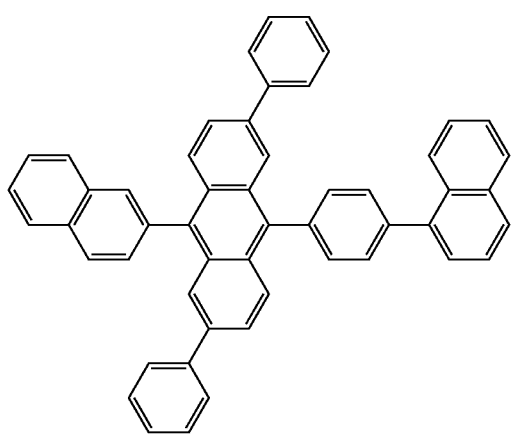
2a'-115
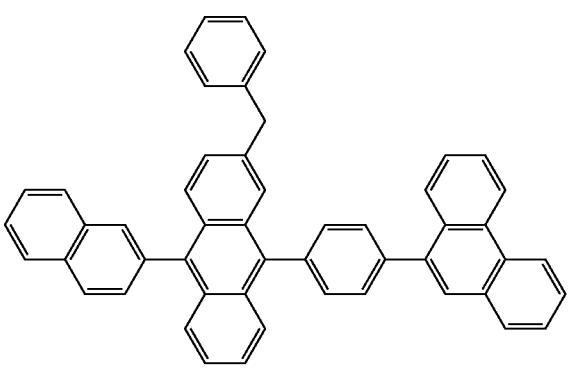
2a'-116
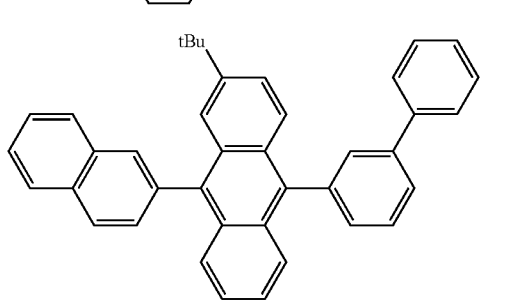
2a'-117
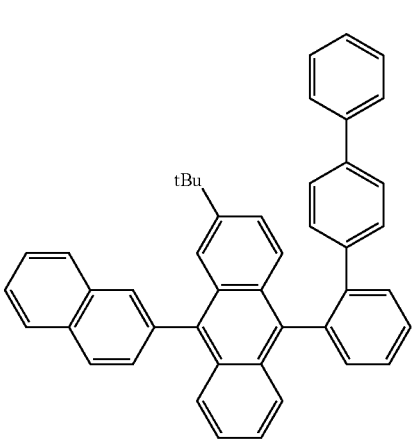

-continued
2a'-118
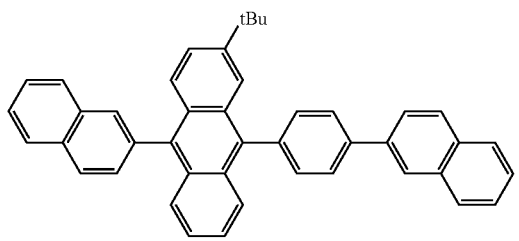
2a'-119
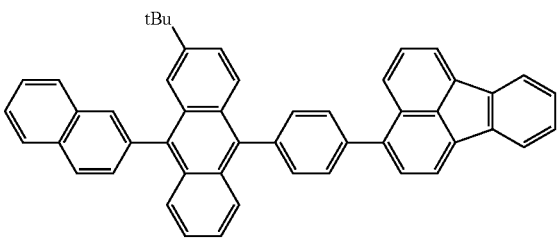
2a'-120
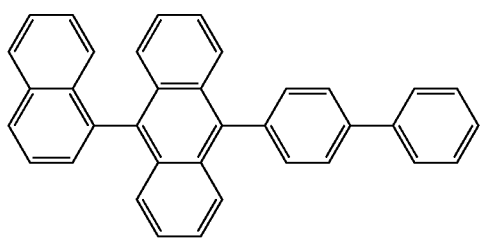
2a'-121
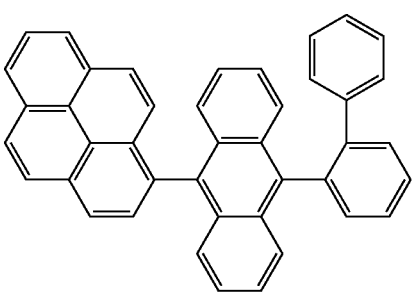
2a'-122
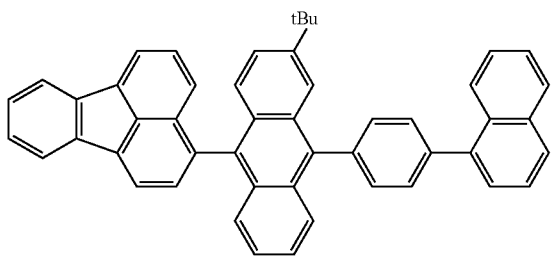
2a'-123
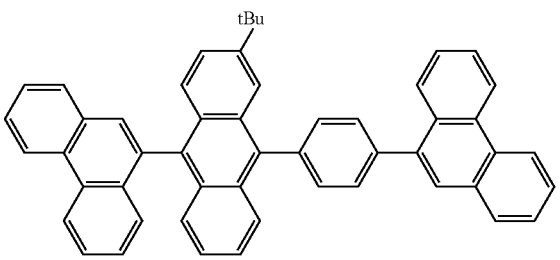
2a'-124
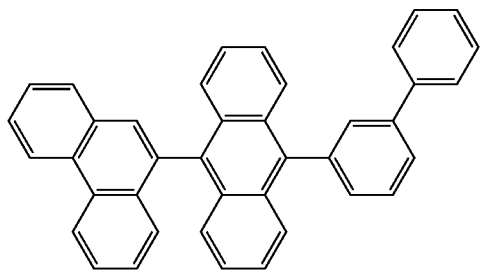
2a'-125
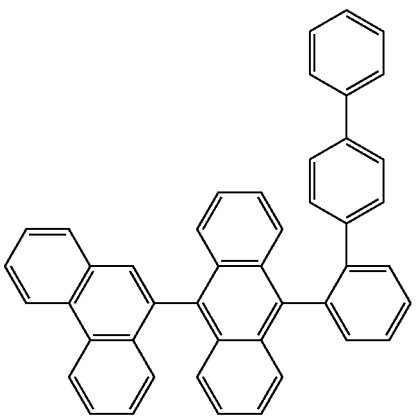
2a'-126
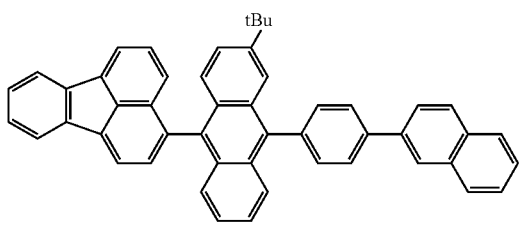
2a'-127
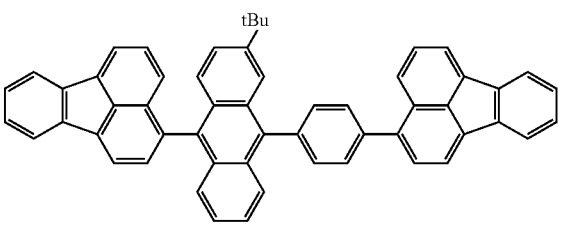

-continued
2a'-128
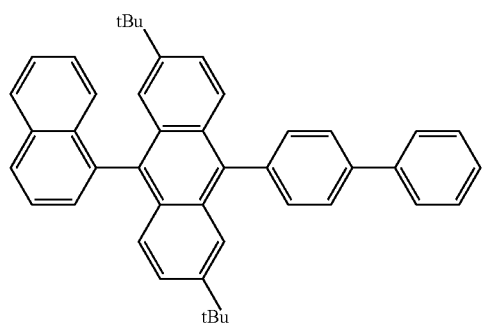
2a'-129
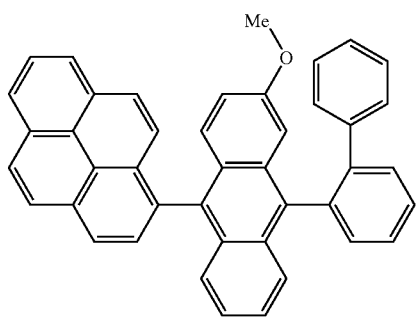
2a'-130
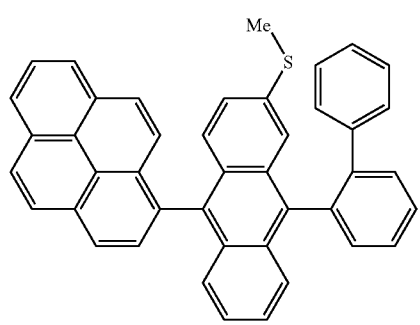
2a'-131
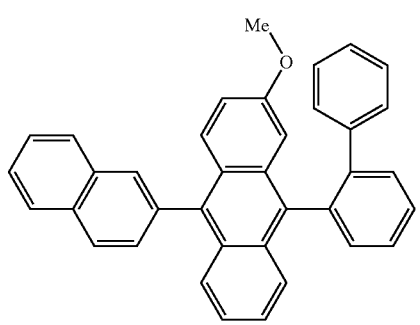
2a'-132
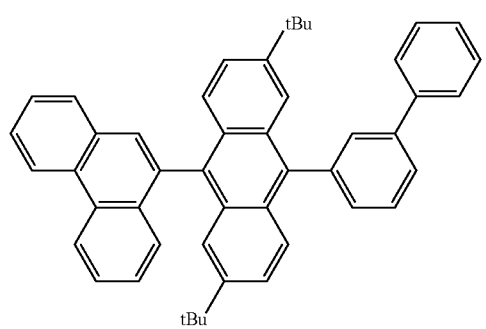
2a'-133
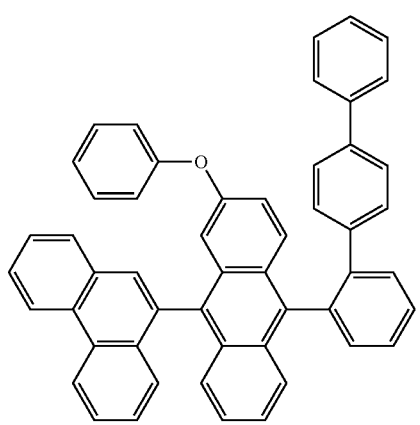
2a'-134
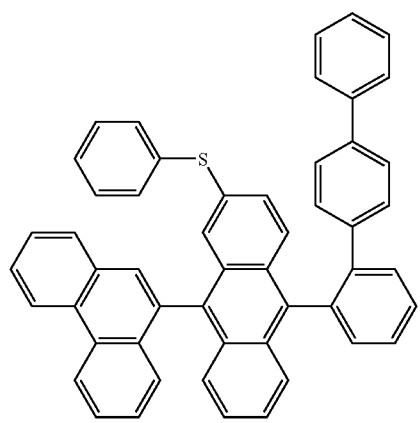
2a'-135
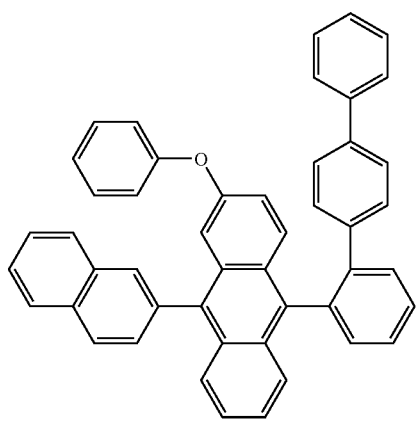

2a'-136
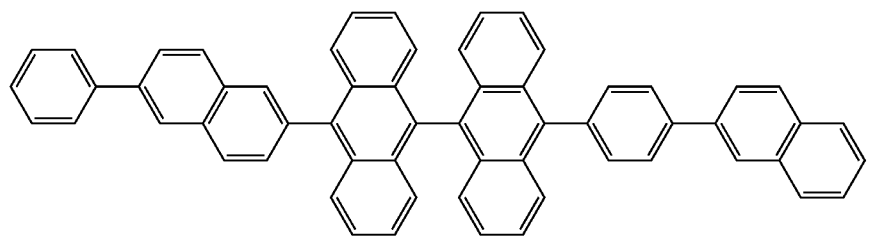
2a'-137
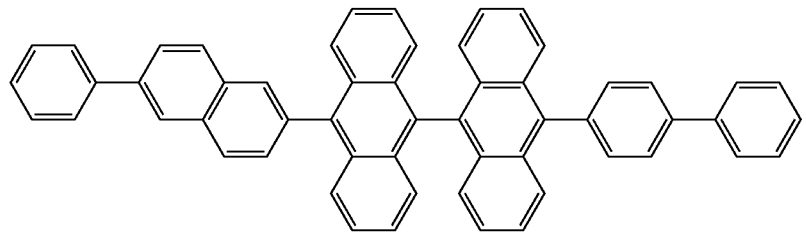
2a'-138
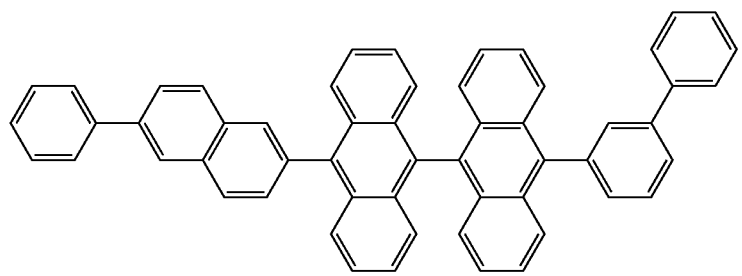
2a'-139
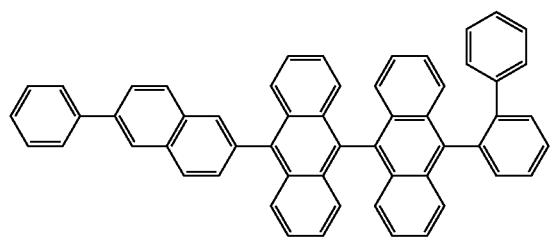
2a'-140
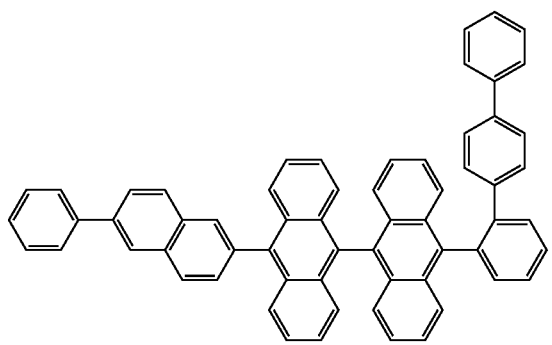
2a'-141
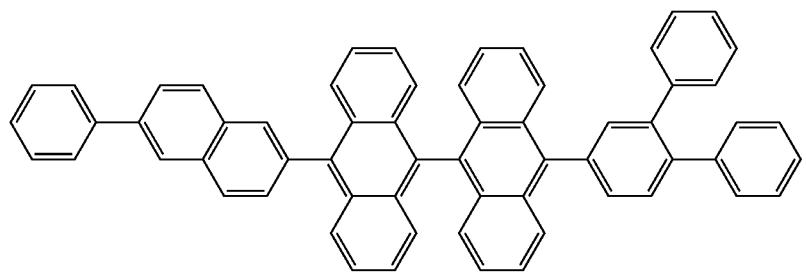

-continued

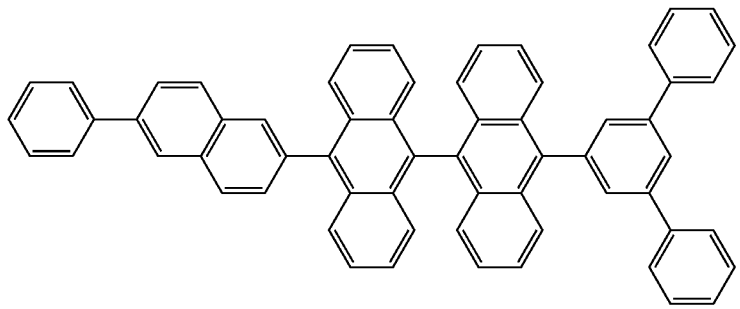

2a′-142

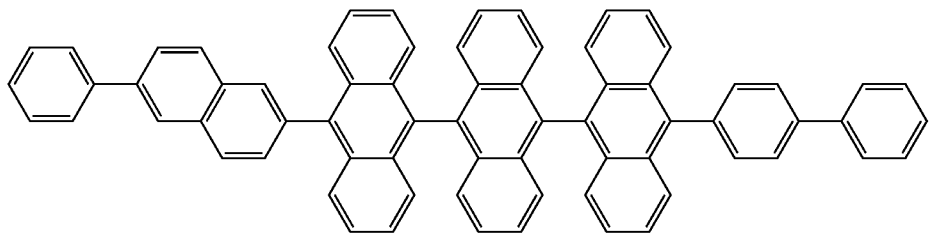

2a′-143

A known specific example of the pyrene derivative as $G^2$ represented by the general formula (3b) to be used in the organic EL device of the present invention is an asymmetric pyrene derivative described in paragraphs [0020] to [0023] of WO 2005/115950. In addition to the derivative, a symmetric pyrene derivative can also be used as a material for the organic EL device of the present invention Representative specific examples are shown below.

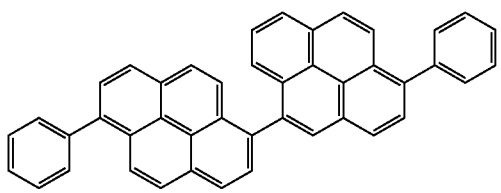

2b-1

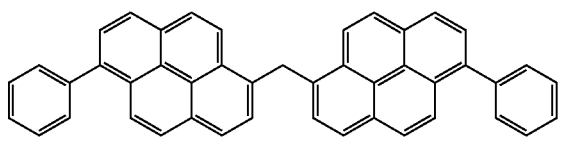

2b-2

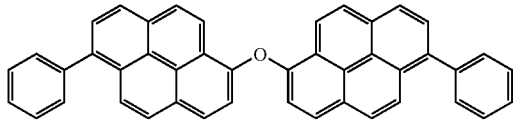

2b-3

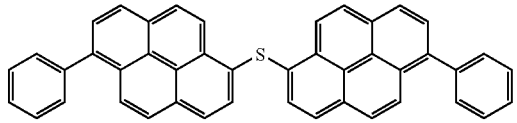

2b-4

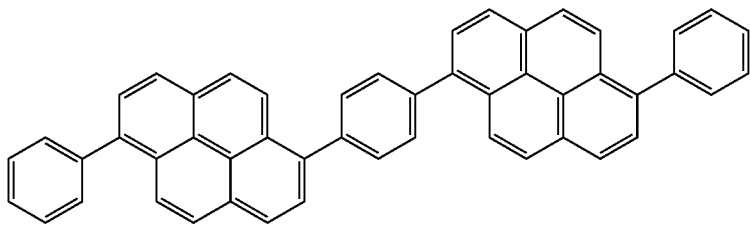

2b-5

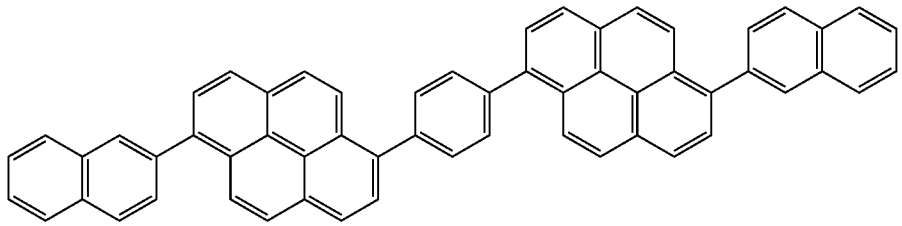

2b-6

2b-7
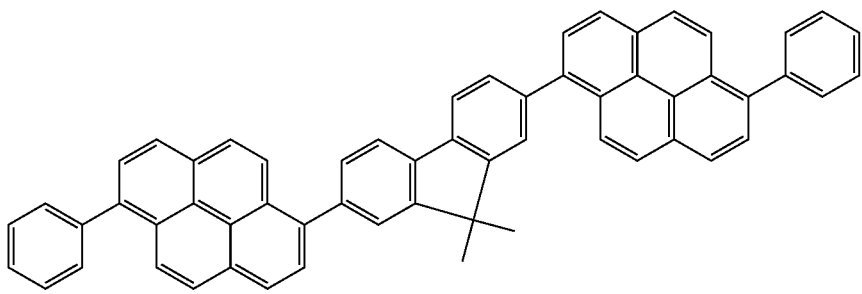
2b-8
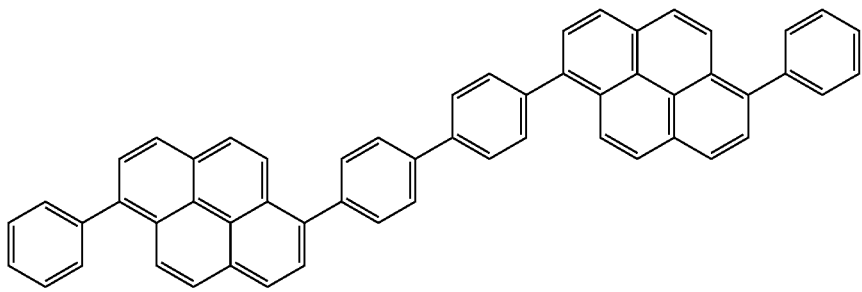
2b-9
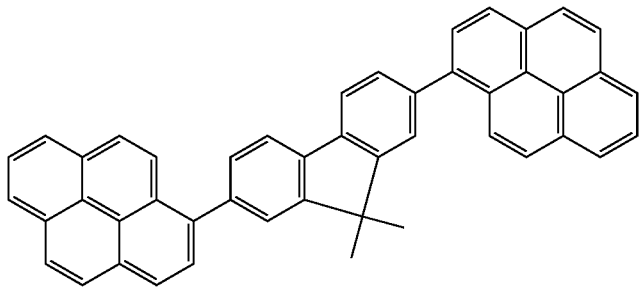
2b-10
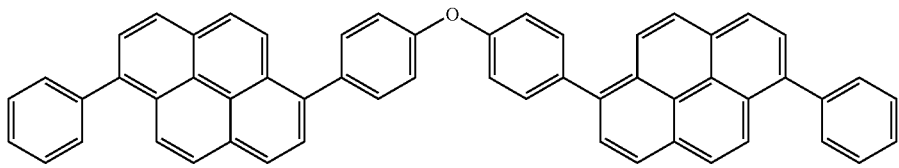
2b-11
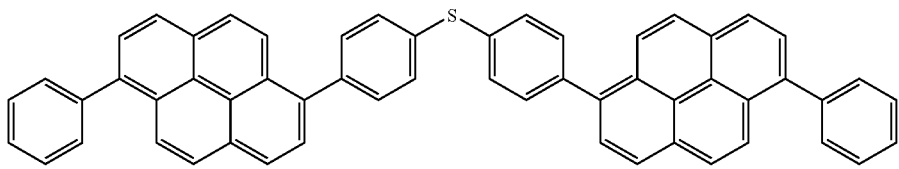
2b-12
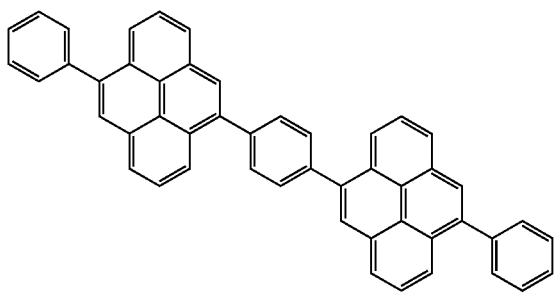
2b-13
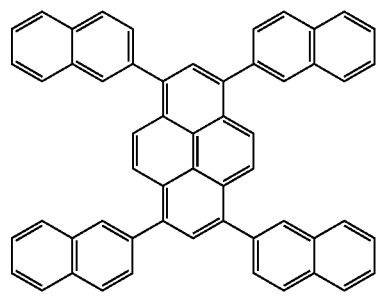

-continued
2b-14
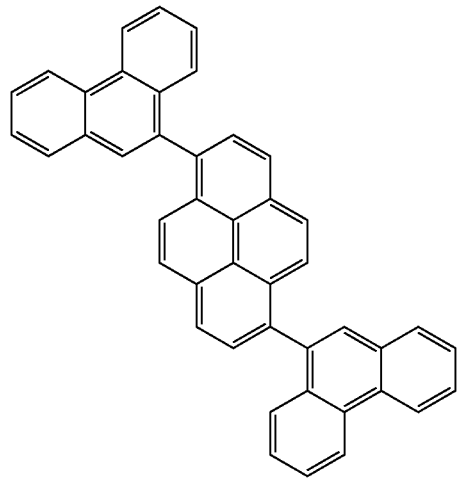
2b-15
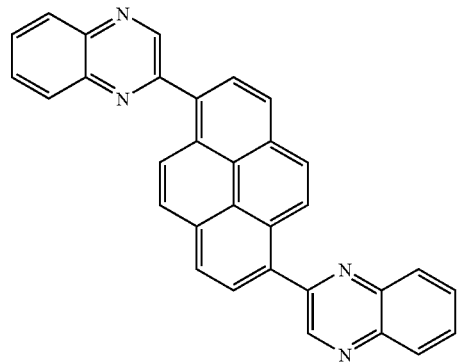
2b-16
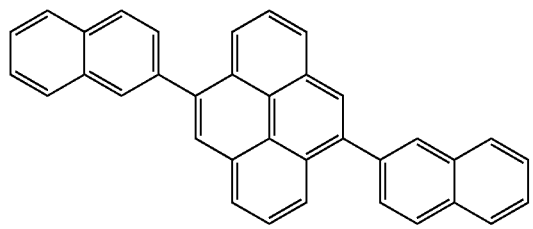
2b-17
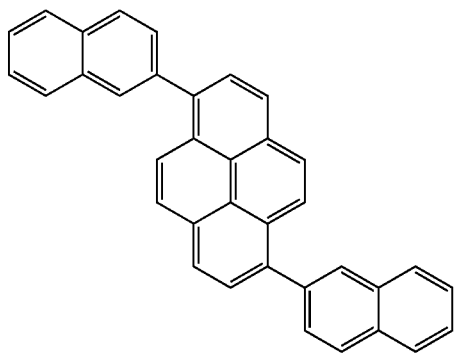
2b-18
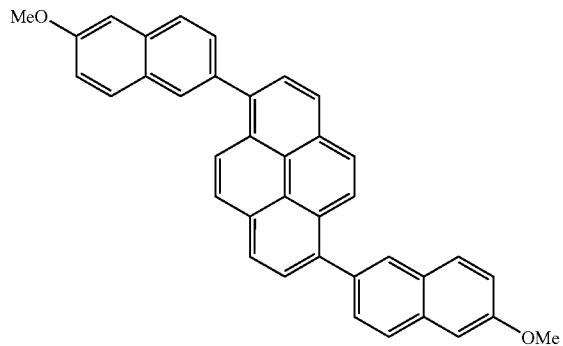
2b-19
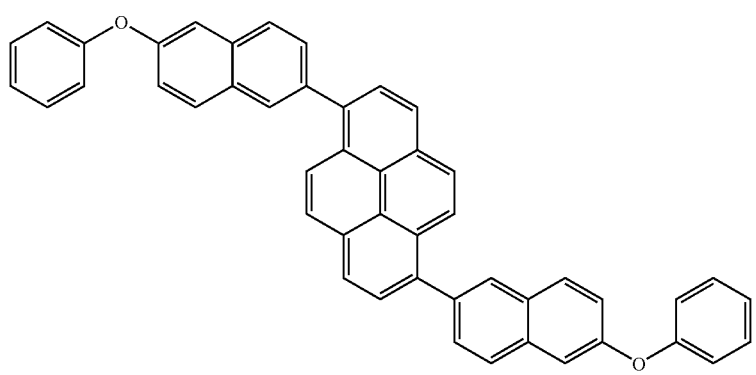

-continued
2b-20
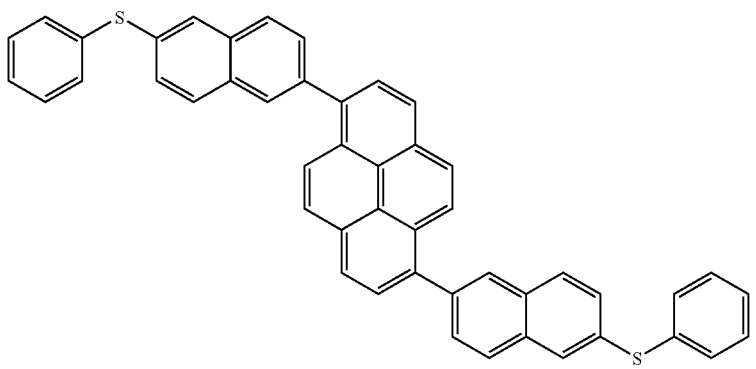
2b-21
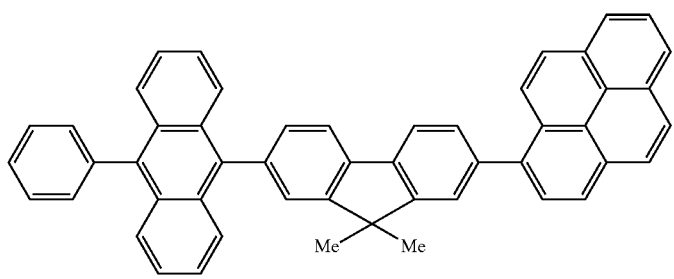
2b-22
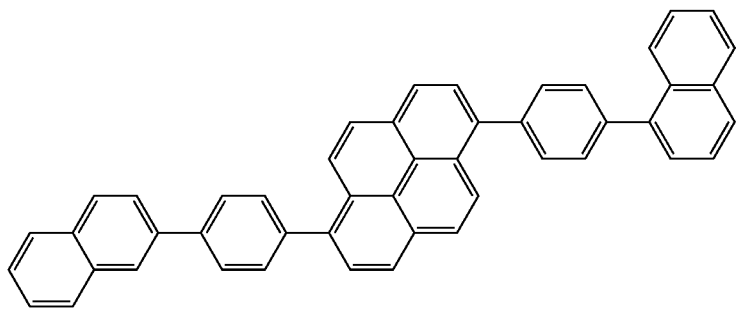
2b-23
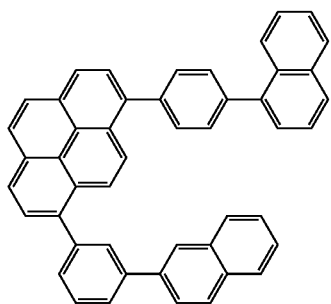
2b-24
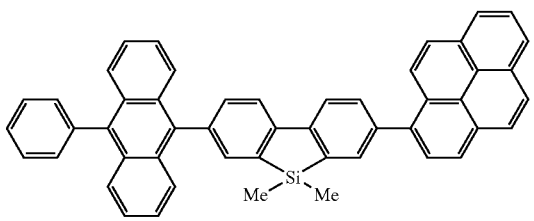
2b-25
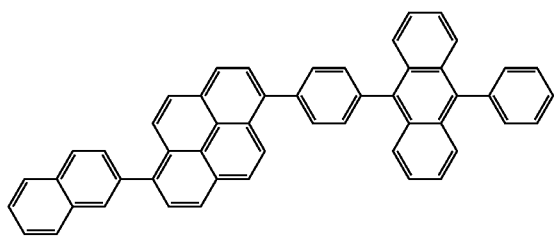
2b-26
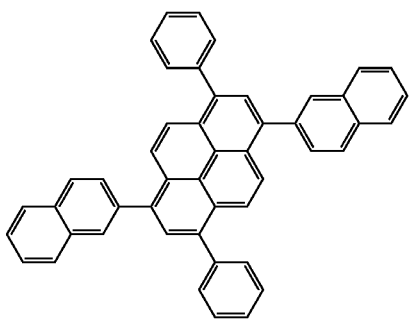

-continued
2b-27
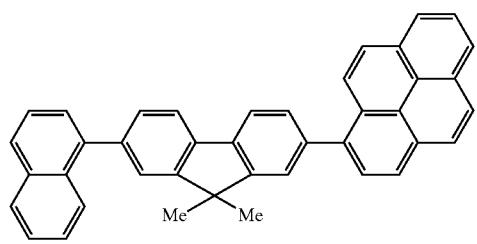
2b-28
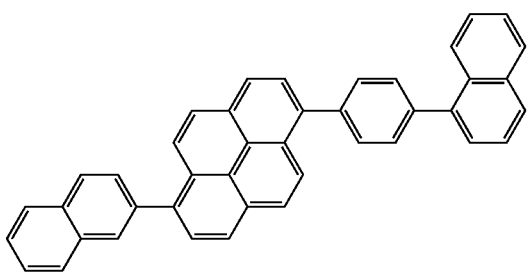
2b-29
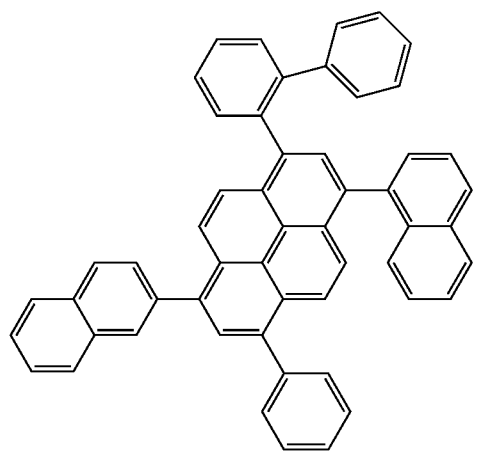
2b-30
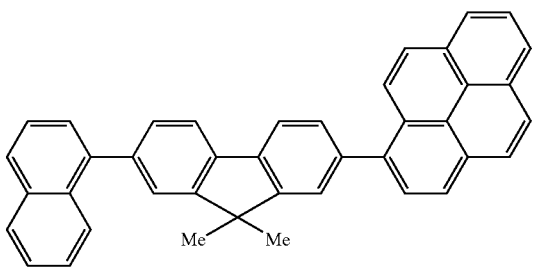
2b-31
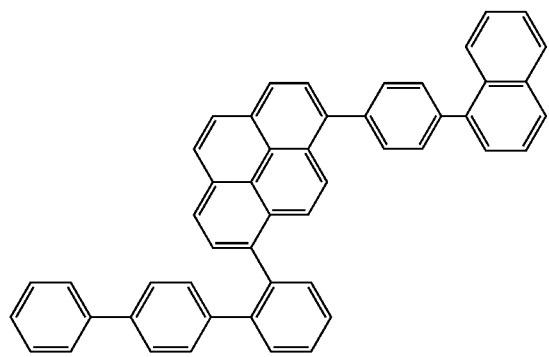
2b-32
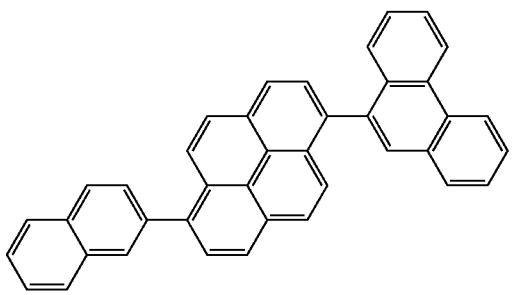
2b-33
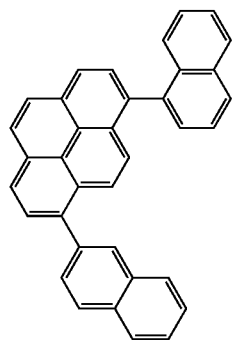
2b-34
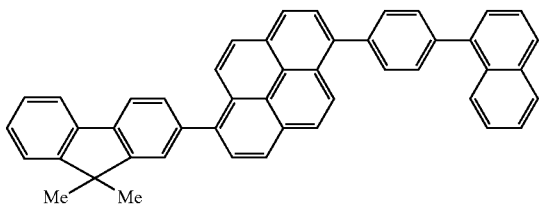

-continued 2b-35
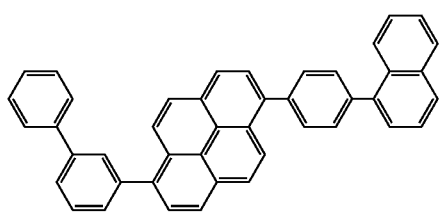

2b-36
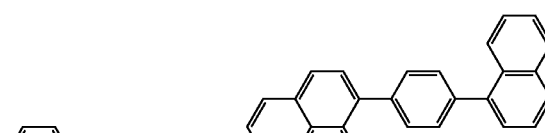

2b-37
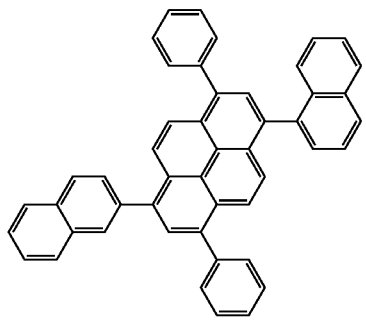

2b-38
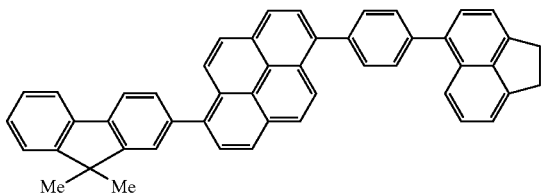

2b-39
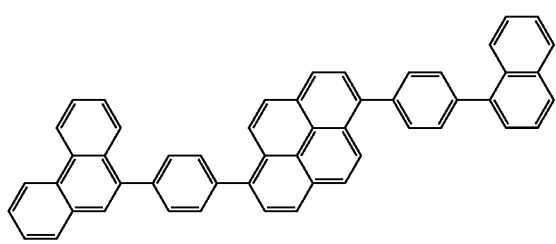

2b-40
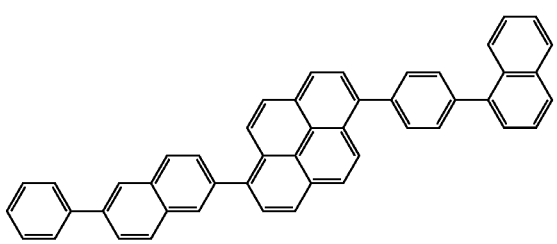

2b-41
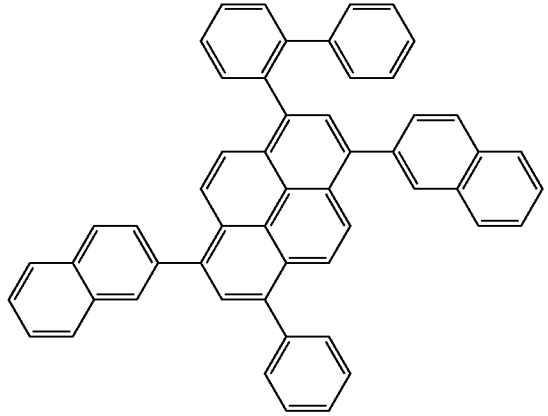

2b-42
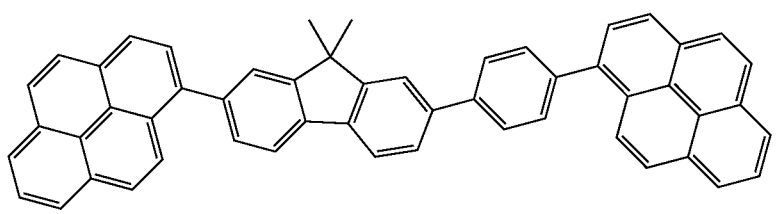

A known specific example of the amine derivative as $G^2$ represented by the general formula (3c) to be used in the organic EL device of the present invention is an amine derivative described in paragraphs [0079] to [0083] of JP-A-2002-32468. In addition to the derivative, an amine derivative as described below except that can also be used as a material for the organic EL device of the present invention.

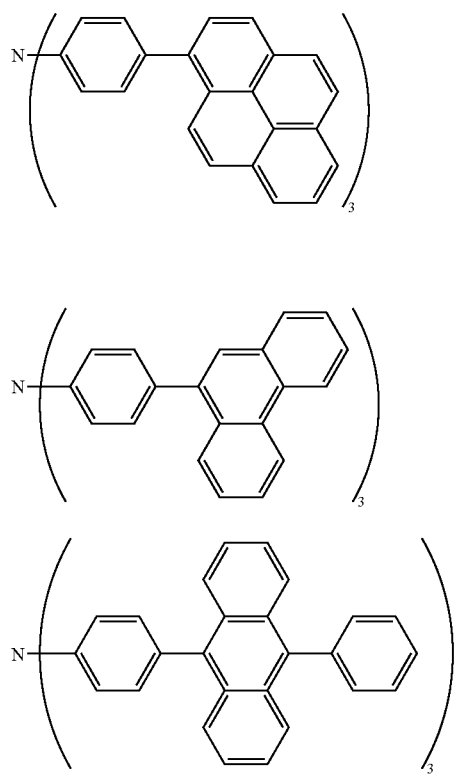
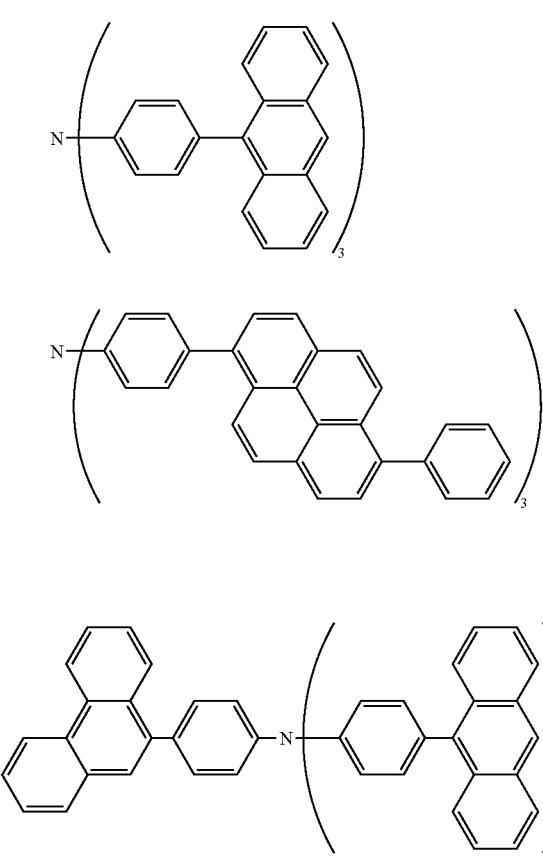
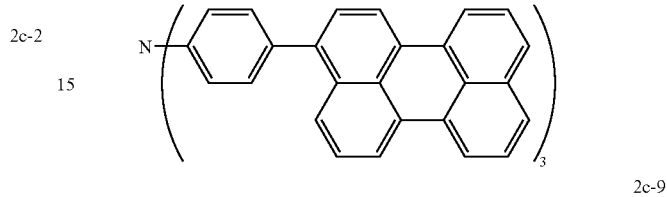

2c-12

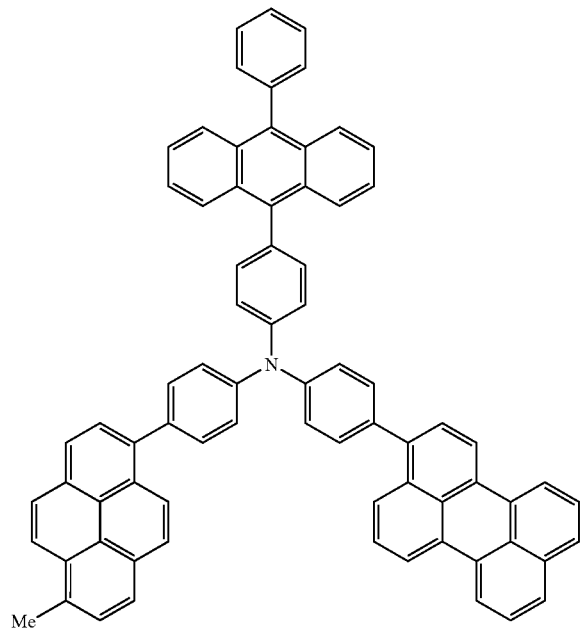

2c-13

2c-14

2c-15

2c-16

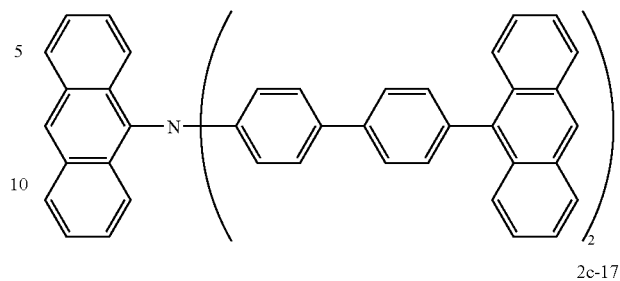

2c-17

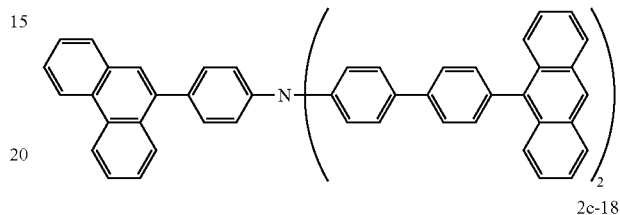

2c-18

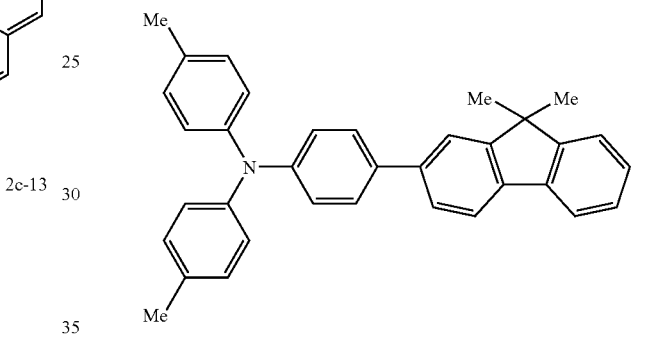

2c-19

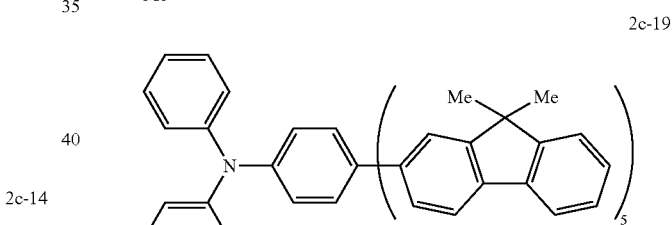

2c-20

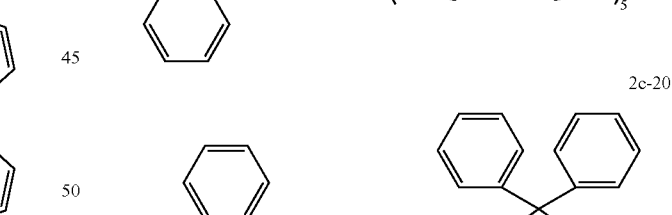

A known specific example of the benzene derivative as $G^2$ represented by the general formula (3d) to be used in the organic EL device of the present invention is described in paragraphs [0079] to [0083] of Japanese Patent Application Laid-Open No. 2002-324678. Specific examples of a benzene derivative to be used in the organic EL device of the present invention include the following.

2d-1
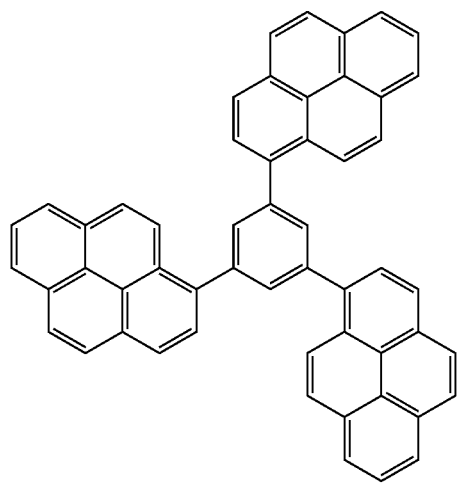
2d-2
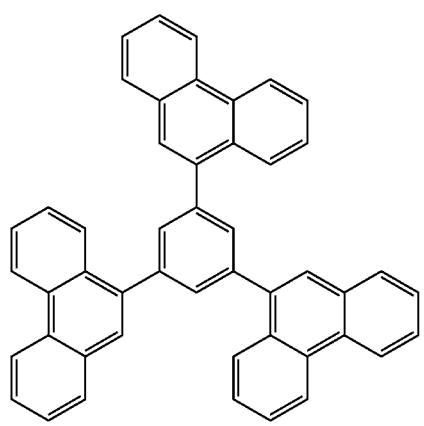
2d-3
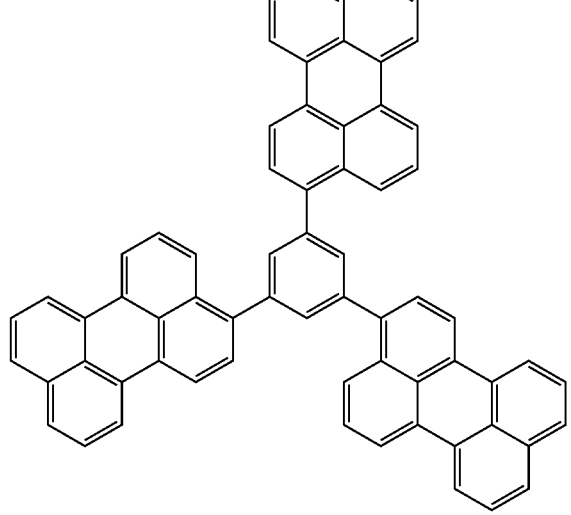
-continued
2d-4
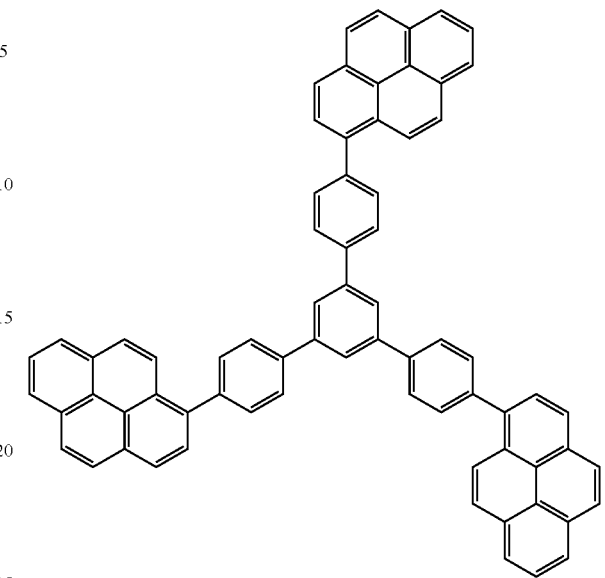
2d-5
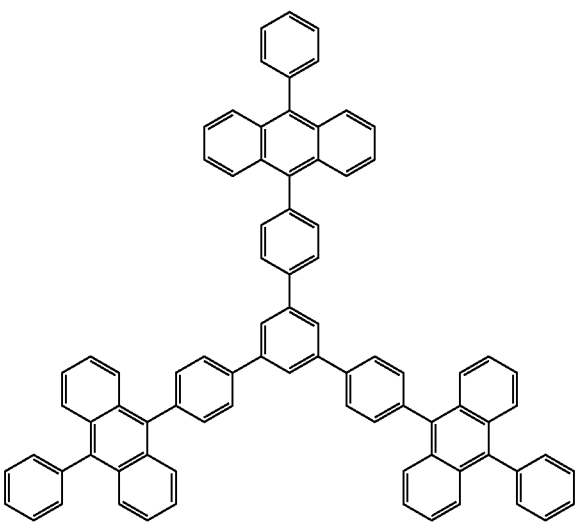

-continued
2d-6
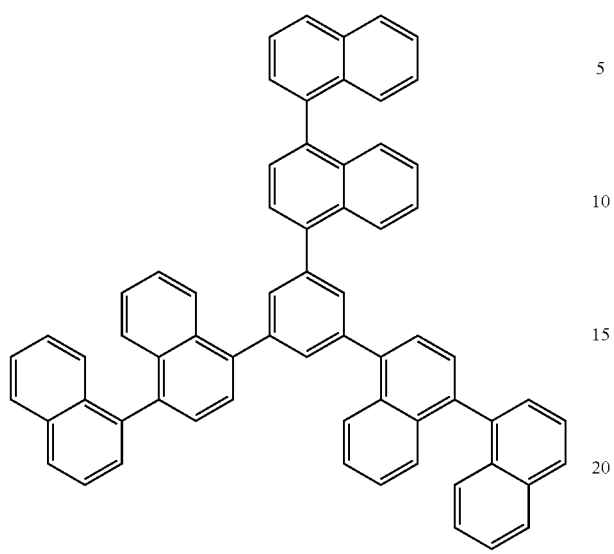
2d-7
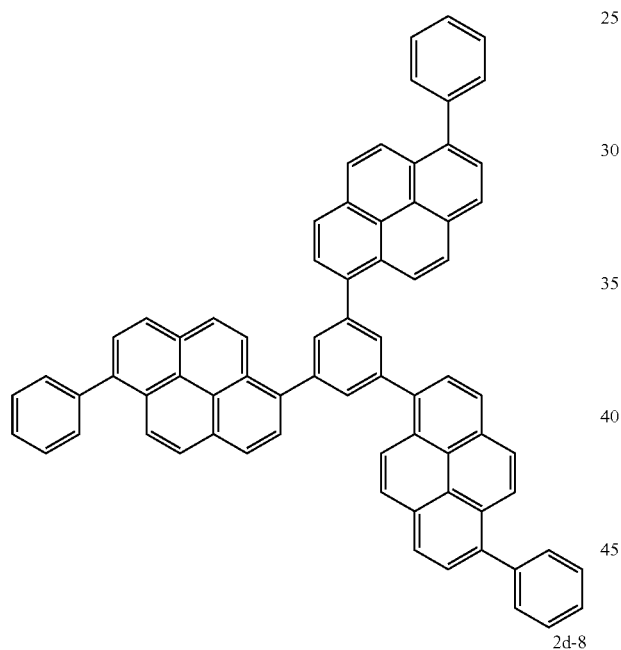
2d-8
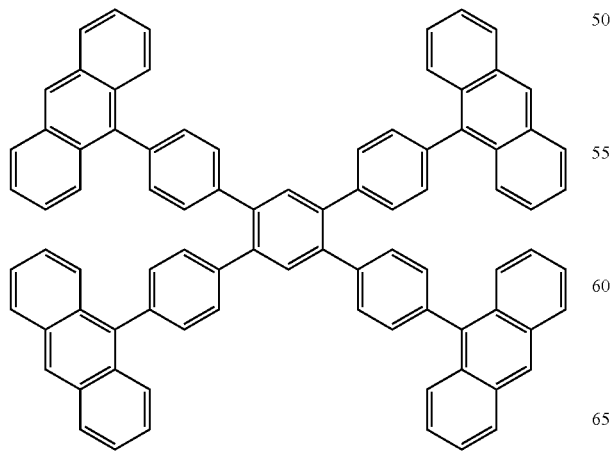
-continued
2d-9
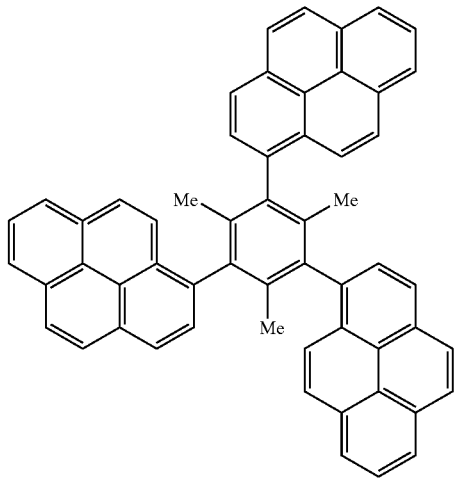
2d-10
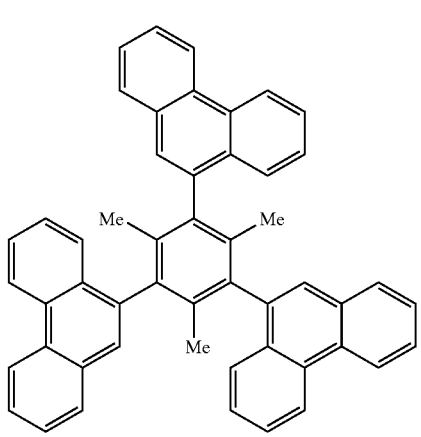
2d-11
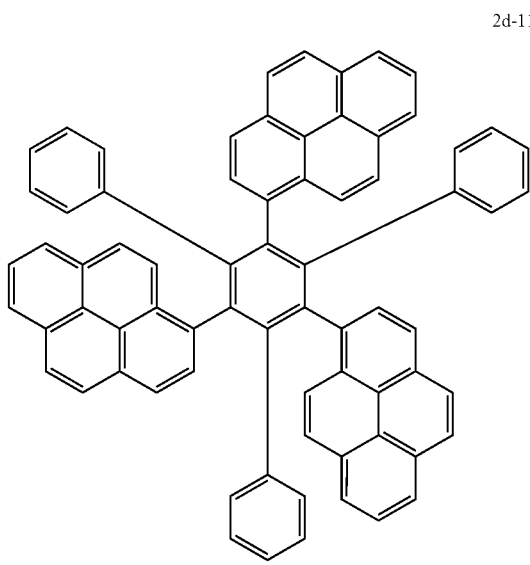

2d-12
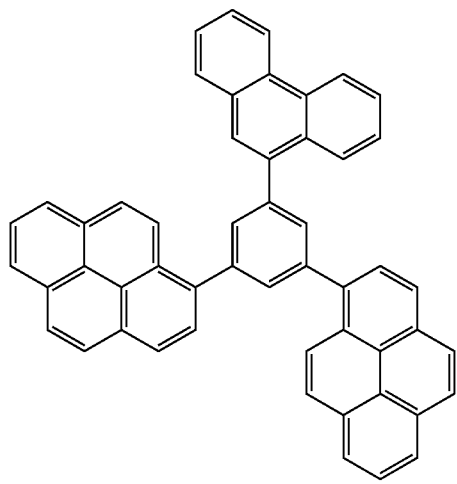
2d-15
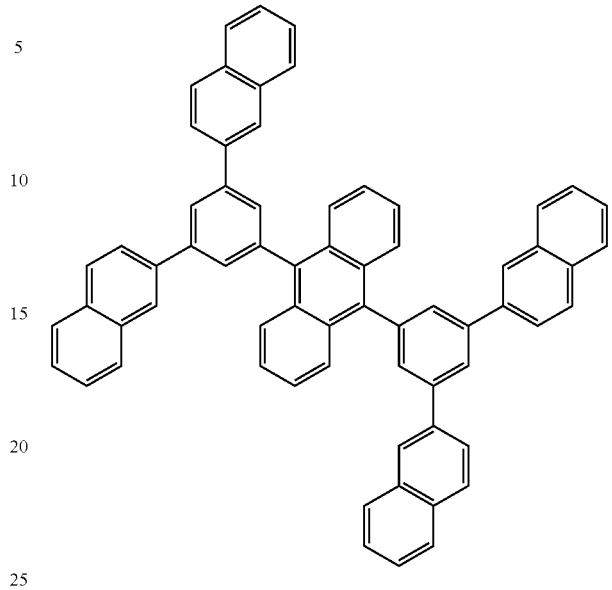
2d-13
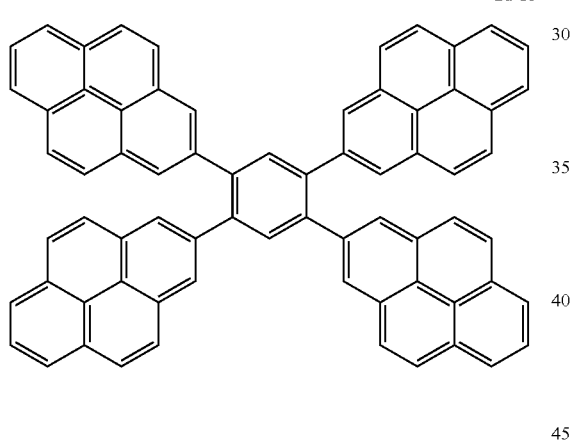
2d-16
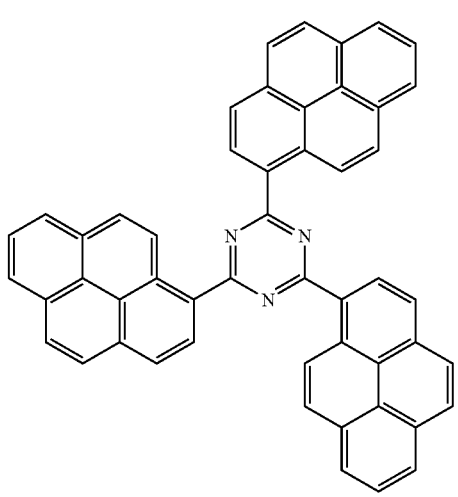
2d-14
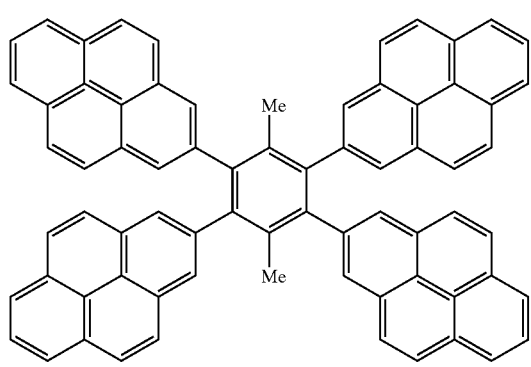
2d-17
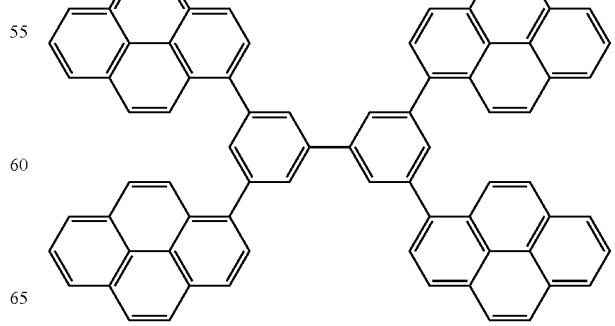

-continued 2d-18

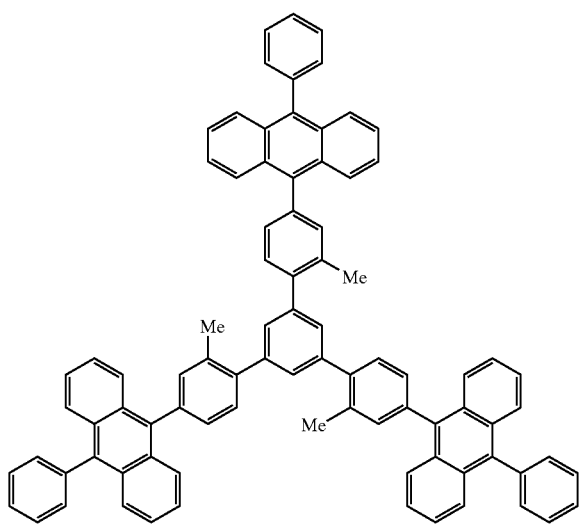

The light emitting layer of the organic EL device of the present invention contains 0.01 to 20 wt %, or preferably 0.5 to 20 wt %, of the compound having a fluoranthene structure.

In the organic EL device of the present invention, the surface of at least one of the pair of electrodes is provided with a chalcogenide layer, a metal halide layer, or a metal oxide layer.

An organic electroluminescence material-containing solution of the present invention is composed of organic electroluminescence materials and a solvent, and is characterized in that: the organic electroluminescence materials are composed of a host material and a dopant material; the dopant material is at least one kind of a compound having a fluoranthene structure represented by the general formula (2); and the host material is at least one kind selected from fused ring-containing compounds represented by the general formulae (3a), (3a'), (3b) to (3d), and (3'a) to (3'd), and the general formula (1).

The constitution of the organic EL device of the present invention will be described in the following.

(1) Organic EL Device Constitution

Typical examples of the constitution of the organic EL device of the present invention include the following:

(1) an anode light emitting layer/cathode;

(2) an anode/hole injecting layer/light emitting layer/cathode;

(3) an anode/light emitting layer/electron injecting layer/cathode;

(4) an anode/hole injecting layer/light emitting layer/electron injecting layer/cathode;

(5) an anode/organic semiconductor layer/light emitting layer/cathode;

(6) an anode/organic semiconductor layer/electron barrier layer/light emitting layer/cathode;

(7) an anode/organic semiconductor layer/light emitting layer/adhesion improving layer/cathode;

(8) an anode/hole injecting layer/hole transporting layer/light emitting layer/electron injecting layer/cathode;

(9) an anode/insulating layer/light emitting layer/insulating layer/cathode;

(10) an anode/inorganic semiconductor layer/insulating layer/light emitting layer/insulating layer/cathode;

(11) an anode/organic semiconductor layer/insulating layer/light emitting layer/insulating layer/cathode;

(12) an anode/insulating layer/hole injecting layer/hole transporting layer/light emitting layer/insulating layer/cathode; and

(13) an anode/insulating layer/hole Injecting layer/hole transporting layer/light emitting layer/electron injecting layer/cathode.

Of those, the constitution (8) is preferably used.

The compound of the present invention may be used in any one of the above organic layers. However, it is preferable that the compound is incorporated in a light emitting zone among those components.

(2) Transparent Substrate

The organic EL device of the present invention is prepared on a transparent substrate. Here, the transparent substrate is the substrate which supports the organic EL device. It is preferable that the transparent substrate have a transmittance of light of 50% or greater in the visible region of 400 to 700 nm and be flat and smooth.

Examples of the transparent substrate include glass plates and polymer plates. Specific examples of the glass plate include plates made of soda-lime glass, glass containing barium and strontium lead glass, aluminosilicate glass, borosilicate glass, barium borosilicate glass, and quartz. Specific examples of the polymer plate include plates made of polycarbonate resins, acrylic resins, polyethylene terephthalate, polyether sulfide, and polysulfone.

(3) Anode

The anode in the organic EL device of the present invention has the function of injecting holes into the hole transporting layer or the light emitting layer. It is effective that the anode has a work function of 4.5 eV or greater. Specific examples of the material for the anode used in the present invention include indium tin oxide alloys (ITO), tin oxide (NESA), gold, silver, platinum, and copper. Further, the anode preferably has a material having a small work function for injecting electrons into the electron transporting layer or the light emitting layer.

The anode can be prepared by forming a thin film of the electrode material described above in accordance with a process such as the vapor deposition process and the sputtering process.

When the light emitted from the light emitting layer is obtained through the anode, it is preferable that the anode has a transmittance of the emitted light greater than 10%. It is also preferable that the sheet resistivity of the anode be several hundred Ω/☐ or smaller. The thickness of the anode is, in general, selected in the range of 10 nm to 1 μm and preferably in the range of 10 to 200 nm although the preferable range may be different depending on the used material.

(4) Light Emitting Layer

The light emitting layer in the organic EL device has a combination of the following functions:

(1) the injecting function: the function of injecting holes from the anode or the hole injecting layer and injecting electrons from the cathode or the electron injecting layer when an electric field is applied;

(2) the transporting function: the function of transporting injected charges (i.e., electrons and holes) by the force of the electric field; and (3) the light emitting function: the function of providing the field for recombination of electrons and holes and leading to the emission of light. However, the easiness of injection may be different between holes and electrons and the ability of transportation expressed by the mobility may be different between holes and electrons. It is preferable that either one of the charges be transferred.

For the process for forming the light emitting layer, a known process such as the vapor deposition process, the spin coating process, and the LB process can be used. It is particularly preferable that the light emitting layer be a molecular deposit film.

The molecular deposit film is a thin film formed by deposition of a material compound in the gas phase or a film formed by solidification of a material compound in a solution or in the liquid phase. In general, the molecular deposit film can be distinguished from the thin film formed in accordance with the LB process (i.e., molecular accumulation film) based on the differences in aggregation structure and higher order structure and functional differences caused by those structural differences.

Further, as disclosed in JP-A 57-51781, the light emitting layer can also be formed by dissolving a binder such as a resin and the material compounds into a solvent to prepare a solution, followed by forming a thin film from the prepared solution by the spin coating process or the like.

In the present invention, where desired, the light emitting layer may include other known light emitting materials other than the light emitting material composed of the compound having a fluoroanthene structure and the fused ring-containing compound of the present invention, or a light emitting layer including other known light emitting material may be laminated to the light emitting layer including the light emitting material of the present invention as long as the object of the present invention is not adversely affected.

Further, the thickness of the light emitting layer is preferably 5 to 50 nm, more preferably 7 to 50 nm, or most preferably 10 to 50 nm. When the thickness is less than 5 nm, it becomes difficult to form the light emitting layer, so the adjustment of chromaticity may be difficult. When the thickness exceeds 50 nm, the voltage at which the device is driven may increase.

(5) Hole Injecting/Transporting Layer (Hole Transporting Zone)

The hole injecting/transporting layer is a layer which helps injection of holes into the light emitting layer and transports the holes to the light emitting region. The layer exhibits a great mobility of holes and, in general, has an ionization energy as small as 5.5 eV or smaller. For such the hole injecting/transporting layer, a material which transports holes to the light emitting layer under an electric field of a smaller strength is preferable. A material which exhibits, for example, a mobility of holes of at least $10^{-4}$ cm$^2$/V·sec under application of an electric field of $10^4$ to $10^6$ V/cm is preferable.

When the aromatic amine derivative of the present invention is used in the hole transporting zone, the aromatic amine derivative of the present invention may be used alone or as a mixture with other materials for forming the hole injecting/transporting layer.

The material which can be used for forming the hole injecting/transporting layer as a mixture with the aromatic amine derivative of the present invention is not particularly limited as long as the material has a preferable property described above. The material can be arbitrarily selected from materials which are conventionally used as the charge transporting material of holes in photoconductive materials and known materials which are used for the hole injecting/transporting layer in organic EL devices.

Specific examples include: a triazole derivative (see, for example, U.S. Pat. No. 3,112,197); an oxadiazole derivative (see, for example, U.S. Pat. No. 3,189,447); an imidazole derivative (see, for example, JP-B 37-16096); a polyarylalkane derivative (see, for example, U.S. Pat. No. 3,615,402, U.S. Pat. No. 3,820,989, U.S. Pat. No. 3,542,544, JP-B 45-555, JP-B 51-10983, JP-A 51-93224, JP-A 55-17105, JP-A 56-4148, JP-A 55-108667, JP-A 55-156953, and JP-A 56-36656); a pyrazoline derivative and a pyrazolone derivative (see, for example, U.S. Pat. No. 3,180,729, U.S. Pat. No. 4,278,746, JP-A 55-88064, JP-A 55-88065, JP-A 49-105537, JP-A 55-51086, JP-A 56-80051, JP-A 56-88141, JP-A 57-45545, JP-A 54-112637, and JP-A 55-74546); a phenylenediamine derivative (see, for example, U.S. Pat. No. 3,615,404, JP-B 51-10105, JP-B 46-3712, JP-B 47-25336, JP-A 54-53435, JP-A 54-110536, and JP-A 54-119925); an arylamine derivative (see, for example, U.S. Pat. No. 3,567,450, U.S. Pat. No. 3,180,703, U.S. Pat. No. 3,240,597, U.S. Pat. No. 3,658,520, U.S. Pat. No. 4,232,103, U.S. Pat. No. 4,175,961, U.S. Pat. No. 4,012,376, JP-B 49-35702, JP-B 39-27577, JP-A 55-144250, JP-A 56-119132, JP-A 56-22437, and DE 1,110,518); an amino-substituted chalcone derivative (see, for example, U.S. Pat. No. 3,526,501); an oxazole derivative (those disclosed in U.S. Pat. No. 3,257,203); a styrylanthracene derivative (see, for example, JP-A 56-46234); a fluorenone derivative (see, for example, JP-A 54-110837); a hydrazone derivative (see, for example, U.S. Pat. No. 3,717,462, JP-A 54-59143, JP-A 55-52063, JP-A 55-52064, JP-A 55-46760, JP-A 55-85495, JP-A 57-11350, JP-A 57-148749, and JP-A 2-311591); a stilbene derivative (see, for example, JP-A 61-210363, JP-A 61-228451, JP-A 61-14642, JP-A 61-72255, JP-A 62-47646, JP-A 62-36674, JP-A 62-10652, JP-A 62-30255, JP-A 60-93445, JP-A 60-94462, JP-A 60-174749, and JP-A 60-175052); a silazane derivative (U.S. Pat. No. 4,950,950); a polysilane-based copolymer (JP-A 2-204996); an aniline-based copolymer (JP-A 2-282263); and a conductive high molecular weight oligomer (particularly a thiophene oligomer) disclosed in JP-A 1-211399.

In addition to the above-mentioned materials which can be used as the material for the hole injecting/transporting layer, a porphyrin compound (those disclosed in, for example, JP-A 63-295695); an aromatic tertiary amine compound and a styrylamine compound (see, for example, U.S. Pat. No. 4,127,412, JP-A 53-27033, JP-A 54-58445, JP-A 54-149634, JP-A 54-64299, JP-A 55-79450, JP-A 55-144250, JP-A 56-119132, JP-A 61-295558, JP-A 61-98353, and JP-A 63-295695) are preferable, and aromatic tertiary amine compounds are particularly preferable.

Further the material for the hole injecting/transporting layer include compounds having two fused aromatic rings in the molecule such as 4,4'-bis(N-(1-naphthyl)-N-phenylamino)biphenyl (hereinafter referred to as "NPD") as disclosed in U.S. Pat. No. 5,061,569, and a compound in which three triphenylamine units are bonded together in a star-burst shape, such as 4,4',4"-tris(N-(3-methylphenyl)-N-phenylamino)triphenylamine (hereinafter referred to as "MTDATA") as disclosed in JP-A 4-308688.

Further, in addition to the aromatic dimethylidene-based compounds described above as the material for the light emitting layer, inorganic compounds such as Si of the p-type and SiC of the p-type can also be used as the material for the hole injecting layer.

The hole injecting/transporting layer can be formed by forming a thin layer from the compound described above in accordance with a known process such as the vacuum vapor deposition process, the spin coating process, the casting process, and the LB process. The thickness of the hole injecting/transporting layer is not particularly limited. In general, the thickness is 5 nm to 5 µm. The hole injecting/transporting layer may be constituted of a single layer containing one or more materials described above or may be a laminate constituted of hole injecting/transporting layers containing materials different from the materials of the hole injecting/transporting layer described above as long as the compound of the present invention is incorporated in the hole injecting/transporting zone.

Further, the layer is disposed for helping the injection of holes or electrons into the light emitting layer, and a layer having a conductivity of $10^{-10}$ S/cm or greater is preferable. As the material for the organic semiconductor layer, oligomers containing thiophene, and conductive oligomers such as oligomers containing arylamine and conductive dendrimers such as dendrimers containing arylamine which are disclosed in JP-A 08-193191, can be used.

(6) Electron Injecting Layer

The electron injecting layer is a layer which helps injection of electrons into the light emitting layer and exhibits a great mobility of electrons. The adhesion improving layer is an electron injecting layer comprising a material exhibiting particularly improved adhesion with the cathode. A metal complex of 8-hydroxyquinoline or of a derivative of 8-hydroxyquinoline is suitable as a material to be used in an electron injecting layer.

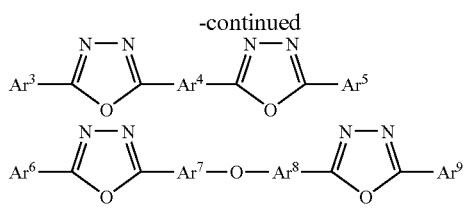

-continued where: $Ar^1$, $Ar^2$, $Ar^3$, $Ar^5$, $Ar^6$ and $Ar^9$ each represent a substituted or unsubstituted aryl group and may represent the same group or different groups. $Ar^4$, $Ar^7$ and $Ar^8$ each represent a substituted or unsubstituted arylene group and may represent the same group or different groups.

Examples of the aryl group include a phenyl group, a biphenyl group, an anthranyl group, a perylenyl group, and a pyrenyl group. Examples of the arylene group include a phenylene group, a naphthylene group, a biphenylene group, an anthranylene group, a perylenylene group, and a pyrenylene group. Examples of the substituent include alkyl groups having 1 to 10 carbon atoms, alkoxyl groups having 1 to 10 carbon atoms, and a cyano group. As the electron transfer compound, compounds which can form thin films are preferable.

Examples of the electron transfer compounds described above include the following.

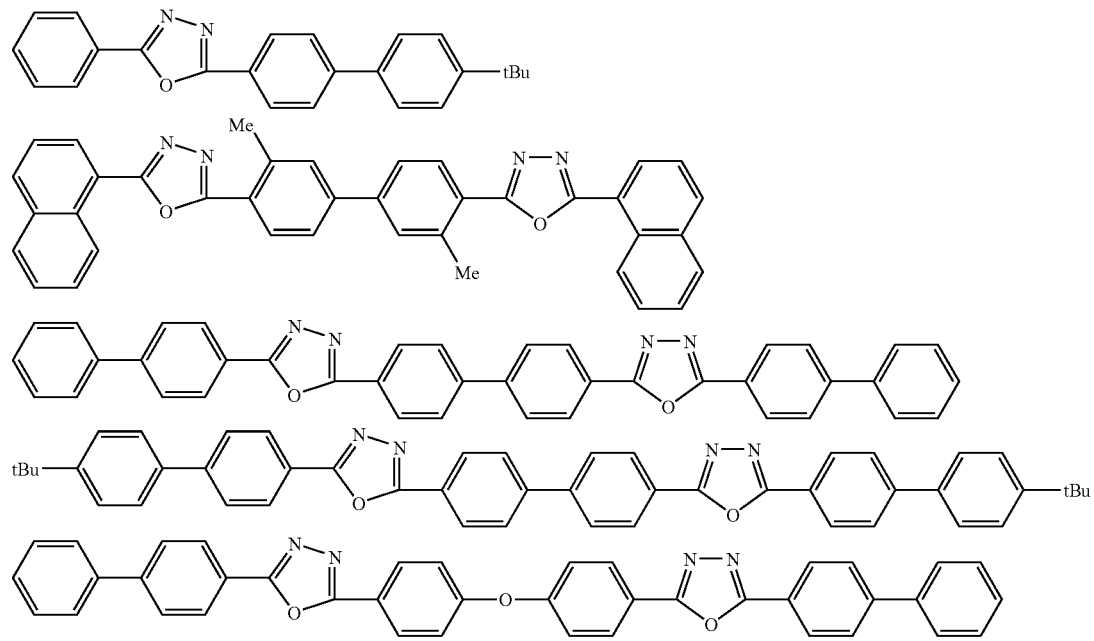

Specific examples of the metal complex of 8-hydroxyquinoline or of a derivative of 8-hydroxyquinoline include metal chelate oxynoid compounds each containing a chelate of oxine (generally 8-quinolinol or 8-hydroxyquinoline).

For example, the Alq described in the light emitting material can be used as an electron injecting layer.

On the other hand, examples of the oxadiazole derivative include electron transfer compounds represented by the following general formulae:

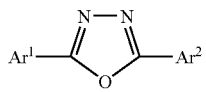

A preferable embodiment of the organic EL device of the present invention includes an element including a reducing dopant in the region of electron transport or in the interfacial region of the cathode and the organic layer. The reducing dopant is defined as a substance which can reduce a compound having the electron transporting property. Various compounds can be used as the reducing dopant as long as the compounds have a definite reductive property. For example, at least one substance selected from the group consisting of alkali metals, alkaline earth metals, rare earth metals, alkali metal oxides, alkali metal halides, alkaline earth metal oxides, alkaline earth metal halides, rare earth metal oxides, rare earth metal halides, organic complexes of alkali metals, organic complexes of alkaline earth metals, and organic complexes of rare earth metals can be preferably used.

More specifically, preferable examples of the reducing dopant include substances having a work function of 2.9 eV or smaller, specific examples of which include at least one alkali metal selected from the group consisting of Na (the work function: 2.36 eV), K (the work function: 2.28 eV), Rb (the work function: 2.16 eV), and Cs (the work function: 1.95 eV) and at least one alkaline earth metal selected from the group consisting of Ca (the work function: 2.9 eV), Sr (the work function: 2.0 to 2.5 eV), and Ba (the work function: 2.52 eV). Among the above-mentioned substances, at least one alkali metal selected from the group consisting of K, Rb, and Cs is more preferable, Rb and Cs are still more preferable, and Cs is most preferable as the reducing dopant. Those alkali metals have great reducing ability, and the luminance of the emitted light and the life time of the organic EL device can be increased by addition of a relatively small amount of the alkali metal into the electron injecting zone. As the reducing dopant having a work function of 2.9 eV or smaller, combinations of two or more alkali metals thereof are also preferable. Combinations having Cs such as the combinations of Cs and Na, Cs and K, Cs and Rb, and Cs, Na, and K are more preferable. The reducing ability can be efficiently exhibited by the combination having Cs. The luminance of emitted light and the life time of the organic EL device can be increased by adding the combination having Cs into the electron injecting zone.

The present invention may further include an electron injecting layer which is composed of an insulating material or a semiconductor and disposed between the cathode and the organic layer. At this time, leak of electric current can be effectively prevented by the electron injecting layer and the electron injecting property can be improved. As the insulating material, at least one metal compound selected from the group consisting of alkali metal chalcogenides, alkaline earth metal chalcogenides, alkali metal halides, and alkaline earth metal halides is preferable. It is preferable that the electron injecting layer be composed of the above-mentioned substance such as the alkali metal chalcogenide since the electron injecting property can be further improved. Preferable examples of the alkali metal chalcogenide include $Li_2O$, $K_2O$, $Na_2S$, $Na_2Se$, and $Na_2O$. To be specific, preferable examples of the alkaline earth metal chalcogenide include CaO, BaO, SrO, BeO, BaS, and CaSe. Preferable examples of the alkali metal halide include LiF, NaF, KF, LiCl, KCl, and NaCl. Preferable examples of the alkaline earth metal halide include fluorides such as $CaF_2$, $BaF_2$, $SrF_2$, $MgF_2$, and $BeF_2$ and halides other than the fluorides.

Examples of the semiconductor composing the electron transporting layer include oxides, nitrides, and oxide nitrides of at least one element selected from Ba, Ca, Sr, Yb, Al, Ga, In, Li, Na, Cd, Mg, Si, Ta, Sb, and Zn used alone or in combination of two or more. It is preferable that the inorganic compound composing the electron transporting layer forms a crystallite or amorphous insulating thin film. When the electron transporting layer is composed of the insulating thin film described above, a more uniform thin film can be formed, and defects of pixels such as dark spots can be decreased. Examples of the inorganic compound include alkali metal chalcogenides, alkaline earth metal chalcogenides, alkali metal halides, and alkaline earth metal halides which are described above.

(7) Cathode

As the cathode, a material such as a metal, an alloy, a conductive compound, or a mixture of those materials which has a small work function (4 eV or smaller) is used because the cathode is used for injecting electrons to the electron injecting and transporting layer or the light emitting layer. Specific examples of the electrode material include sodium, sodium-potassium alloys, magnesium, lithium, magnesium-silver alloys, aluminum/aluminum oxide, aluminum-lithium alloys, indium, and rare earth metals.

The cathode can be prepared by forming a thin film of the electrode material described above in accordance with a process such as the vapor deposition process and the sputtering process.

When the light emitted from the light emitting layer is obtained through the cathode, it is preferable that the cathode has a transmittance of the emitted light greater than 10%.

It is also preferable that the sheet resistivity of the cathode is several hundred $\Omega/\square$ or smaller. The thickness of the cathode is, in general, selected in the range of 10 nm to 1 μm and preferably in the range of 50 to 200 nm.

(8) Insulating Layer

Defects in pixels tend to be formed in organic EL device due to leak and short circuit since an electric field is applied to ultra-thin films. To prevent the formation of the defects, a layer of a thin film having an insulating property may be inserted between the pair of electrodes.

Examples of the material used for the insulating layer include aluminum oxide, lithium fluoride, lithium oxide, cesium fluoride, cesium oxide, magnesium oxide, magnesium fluoride, calcium oxide, calcium fluoride, aluminum nitride, titanium oxide, silicon oxide, germanium oxide, silicon nitride, boron nitride, molybdenum oxide, ruthenium oxide, and vanadium oxide.

Mixtures and laminates of the above-mentioned compounds may also be used.

(9) Method of Producing the Organic EL Device

To prepare the organic EL device, the anode and the light emitting layer, and, where necessary, the hole injecting layer and the electron injecting layer are formed in accordance with the illustrated process using the illustrated materials, and the cathode is formed in the last step. The organic EL device may also be prepared by forming the above-mentioned layers in the order reverse to that described above, i.e., the cathode being formed in the first step and the anode in the last step.

Hereinafter, an embodiment of the process for preparing an organic EL device having a construction in which an anode, a hole injecting layer, a light emitting layer, an electron injecting layer, and a cathode are disposed successively on a substrate transmitting light will be described.

On a suitable transparent substrate, a thin film made of a material for the anode is formed in accordance with the vapor deposition process or the sputtering process so that the thickness of the formed thin film is 1 μm or smaller and preferably in the range of 10 to 200 nm. The formed thin film is used as the anode. Then, a hole injecting layer is formed on the anode. The hole injecting layer can be formed in accordance with the vacuum vapor deposition process, the spin coating process, the casting process, or the LB process, as described above. The vacuum vapor deposition process is preferable since a uniform film can be easily obtained and the possibility of formation of pinholes is small. When the hole injecting layer is formed in accordance with the vacuum vapor deposition process, in general, it is preferable that the conditions be suitably selected in the following ranges: the temperature of the source of the deposition: 50 to 450° C.; the vacuum: $10^{-7}$ to $10^{-3}$ Torr; the rate of deposition: 0.01 to 50 nm/second; the temperature of the substrate: −50 to 300° C. and the thickness of the film: 5 nm to 5 μm; although the conditions of the vacuum vapor deposition are different depending on the compound to be used (i.e., the material for the hole injecting layer) and the crystal structure and the recombination structure of the target hole injecting layer.

Then, the light emitting layer is formed on the hole injecting layer formed above. A thin film of the organic light emitting material can be formed by using a desired organic light emitting material in accordance with a process such as the vacuum vapor deposition process, the sputtering process, the spin coating process, or the casting process. The vacuum vapor deposition process is preferable since a uniform film can be easily obtained and the possibility of formation of pinholes is small. When the light emitting layer is formed in accordance with the vacuum vapor deposition process, in general, the conditions of the vacuum vapor deposition process can be selected in the same ranges as those described for the vacuum vapor deposition of the hole injecting layer, although the conditions are different depending on the used compound.

The light emitting layer of the EL device of the present invention can be formed by not only the vapor deposition of the above light emitting material but also a wet film formation method. Examples of a method applicable to the formation of each organic layer of the light emitting layer include: dry film formation methods such as vacuum vapor deposition, sputtering, plasma, and ion plating; and coating methods such as spin coating, dipping, casting, bar coating, roll coating, flow coating, and inkjet.

In the case of a wet film formation method, a material of which each layer is formed is dissolved or dispersed in a proper solvent so that a luminous organic solution is prepared, and then a thin film is formed from the solution. The solvent may be any one. Examples of the solvent include: a halogen-based hydrocarbon-based solvent such as dichloromethane, dichloroethane, chloroform, carbon tetrachloride, tetrachloroethane, trichloroethane, chlorobenzene, dichlorobenzene, chlorotoluene, or trifluorotoluene; an ether-based solvent such as dibutyl ether, tetrahydrofuran, tetrahydropyran, dioxane, anisole, or dimethoxyethane; an alcohol-based solvent such as methanol, ethanol, propanol, isopropanol, butanol, pentanol, hexanol, cyclohexanol, methyl cellosolve, ethyl cellosolve, or ethylene glycol; a ketone-based solvent such as acetone, methyl ethyl ketone, diethyl ketone, 2-hexanone, methyl isobutyl ketone, 2-heptanone, 4-heptanone, diisobutyl ketone, acetonylacetone, isophorone, cyclohexanone, methylhexanone, or acetophenone; a hydrocarbon-based solvent such as benzene, toluene, xylene, ethylbenzene, hexane, cyclohexane, octane, decane, or tetralin; an ester-based solvent such as ethyl acetate, butyl acetate, or amyl acetate; a chain carbonate-based solvent such as dimethyl carbonate, methyl ethyl carbonate, or diethyl carbonate; and a cyclic carbonate-based solvent such as ethylene carbonate or propylene carbonate. Of those, a hydrocarbon-based solvent or an ether-based solvent such as toluene or dioxane is preferable. In addition, one kind of those solvents may be used alone, or two or more kinds of them may be used as a mixture. It should be noted that solvents that can be used are not limited to those described above.

Next, an electron injecting layer is formed on the light emitting layer formed above. Similarly to the hole injecting layer and the light emitting layer, it is preferable that the electron injecting layer be formed in accordance with the vacuum vapor deposition process since a uniform film must be obtained. The conditions of the vacuum vapor deposition can be selected in the same ranges as those described for the vacuum vapor deposition of the hole injecting layer and the light emitting layer.

When the vapor deposition process is used, the compound of the present invention can be deposited by vapor in combination with other materials, although the situation may be different depending on which layer in the light emitting zone or in the hole transporting zone incorporates the compound. When the spin coating process is used, the compound can be incorporated into the formed layer by using a mixture of the compound with other materials.

A cathode is laminated in the last step, and an organic EL device can be obtained.

The cathode is made of a metal and can be formed in accordance with the vacuum vapor deposition process or the sputtering process. It is preferable that the vacuum vapor deposition process be used in order to prevent formation of damages on the lower organic layers during the formation of the film.

In the above-mentioned preparation of the organic EL device, it is preferable that the above-mentioned layers from the anode to the cathode be formed successively while the preparation system is kept in a vacuum after being evacuated once.

The method of forming the layers in the organic EL device of the present invention is not particularly limited. A conventionally known process such as the vacuum vapor deposition process and the spin coating process can be used. The organic thin film layer which is used in the organic EL device of the present invention can be formed in accordance with a known process such as the vacuum vapor deposition process and the molecular beam epitaxy process (the MBE process) or, using a solution prepared by dissolving the compounds into a solvent, in accordance with a known coating process such as the dipping process, the spin coating process, the casting process, the bar coating process, or the roll coating process.

In addition, a proper resin or additive may be used in each organic thin film layer for the purposes of, for example, improving film formability and preventing a pinhole in a film. Examples of a usable resin include: insulating resins such as polystyrene, polycarbonate, polyallylate, polyester, polyamide, polyurethane, polysulfone, polymethyl methacrylate, polymethyl acrylate, and cellulose, and copolymers of the resins; photoconductive resins such as poly-N-vinylcarbazole and polysilane; and conductive resins such as polyaniline, polythiophene, and polypyrrole. In addition, examples of the additive include an antioxidant, a UV absorber, and a plasticizer.

The thickness of each organic layer of the organic EL device of the present invention is not particularly limited, but must be set to a proper thickness. In general, when the thickness of an organic layer is excessively small, a pinhole or the like occurs, with the result that the application of an electric field may be unable to provide sufficient emission luminance. In contrast, when the thickness of an organic layer is excessively large, the efficiency with which a certain optical output is obtained deteriorates because a high applied voltage is needed for obtaining the optical output. Accordingly, in ordinary cases, the thickness of each organic layer is in the range of suitably 5 nm to 10 µm, or more suitably 10 nm to 0.2 µm.

In order that the stability of the organic EL device obtained by the present invention against, for example, temperature, humidity, or an atmosphere may be improved, the surface of the device can be provided with a protective layer, or the entirety of the device can be protected with, for example, silicone oil or a resin.

In the case where a DC voltage is applied to the organic EL device, the device is observed to emit light by the application of a voltage of 5 to 40 V while the anode and cathode of the device have positive polarity and negative polarity, respectively. In addition, when a voltage is applied with each of the anode and the cathode set to be opposite in polarity to that described above, no current flows, and no light emission occurs. Further, in the case where an AC voltage is applied, uniform light emission is observed only when the anode has positive polarity and the cathode has negative polarity. An AC voltage to be applied may have an arbitrary wave form.

EXAMPLES

Hereinafter, the present invention will be described in detail by way of examples. However, the present invention is not limited to the following examples without departing from the gist of the present invention.

Example 1

(1) Production of Organic EL Device

A transparent electrode composed of an indium tin oxide and having a thickness of 120 nm was provided on a glass substrate measuring 25 mm wide by 75 mm long by 1.1 mm thick. The glass substrate was subjected to ultrasonic cleaning with isopropyl alcohol, and was then washed by being irradiated with ultraviolet light and ozone.

Next, the glass substrate provided with the transparent electrode was mounted on a substrate holder in the deposition tank of a vacuum deposition device, and the degree of vacuum in the vacuum tank was reduced to $1 \times 10^{-3}$ Pa.

First, N',N'''-bis[4-(diphenylamino)phenyl]-N',N'''-diphenylbiphenyl-4,4'-diamine was formed into a film having a thickness of 60 nm at a deposition rate of 2 nm/sec on the surface on the side where the transparent electrode was formed so as to cover the transparent electrode. The film functions as a hole injecting layer.

Next, N,N-bis[4'-{N-(naphthyl-1-yl)-N-phenyl}aminobiphenyl-4-yl]-N-phenylamine was formed into a film having a thickness of 20 nm at a deposition rate of 2 nm/sec on the hole injecting layer. The film functions as a hole transporting layer.

Compound (2a'-55) and Compound (1-3) were simultaneously deposited from the vapor at a deposition rate of 2 nm/sec and a deposition rate of 0.2 nm/sec, respectively to form a film having a thickness of 40 nm and containing the compounds at a weight ratio (2a'-55):(1-3) of 40:2 on the hole transporting layer. The film functions as a light emitting layer.

Tris(8-hydroxyquinolino)aluminum was deposited from the vapor at a deposition rate of 2 nm/sec to form an electron transporting layer having a thickness of 20 nm on the resultant.

Further, lithium fluoride was formed into an electron injecting layer having a thickness of 1 nm at a deposition rate of 0.1 nm/sec.

Finally, aluminum was formed into a cathode layer having a thickness of 200 nm at a deposition rate of 2 nm/sec.

(2) Evaluation of Organic EL Device

Next, the device was subjected to a current test. As a result, the device showed an emission luminance of 750 cd/m$^2$ at a voltage of 6.5 V, and it was confirmed that the luminescent color of the device was blue. In addition, the device was driven at a constant current with its initial emission luminance set to 100 cd/m$^2$. As a result, the device had a half lifetime of 10,000 hours or longer. The result confirmed that the device was sufficient for practical use. Table 1 shows the obtained results.

Examples 2 to 5

In each of Examples 2 to 5, an organic EL device was produced in the same manner as in Example 1 except the following: Compound (2a'-59) and Compound (1-3) were used in a light emitting layer at a weight ratio of 40:2 in Example 2, Compound (2a'-59) and Compound (1-7) were used in a light emitting layer at a weight ratio of 40:2 in Example 3, Compound (2a'-101) and Compound (1-79) were used in a light emitting layer at a weight ratio of 40:2 in Example 4, and Compound (2a-7) and Compound (1-27) were used in a light emitting layer at a weight ratio of 40:2 in Example 5 instead of Compound (2a'-55) and Compound (1-3) in Example 1.

As a result, as shown in Table 1, all the devices were each observed to emit blue light, and each had an emission luminance of 670 to 760 cd/m$^2$ and a half lifetime of 10,000 hours or longer. The result means that all the devices were sufficient for practical use.

Examples 6 to 10

In each of Examples 6 to 10, an organic EL device was produced in the same manner as in Example 1 except the following: Compound (2a'-57) and Compound (1-36) were used in a light emitting layer at a weight ratio of 40:2 in Example 6, Compound (2b-9) and Compound (1-5) were used in a light emitting layer at a weight ratio of 40:2 in Example 7, Compound (2b-26) and Compound (1-97) were used in a light emitting layer at a weight ratio of 40:2 in Example 8, Compound (2c-1) and Compound (1-8) were used in a light emitting layer at a weight ratio of 40:2 in Example 9, and Compound (2d-1) and Compound (1-3) were used in a light emitting layer at a weight ratio of 40:2 in Example 10 instead of Compound (2a'-55) and Compound (1-3) in Example 1.

As a result, as shown in Table 2, all the devices were each observed to emit blue light, and each had an emission luminance of 675 to 710 cd/m$^2$ and a half lifetime of 10,000 hours or longer. The result means that all the devices were sufficient for practical use.

TABLE 1

|  | Example 1 | Example 2 | Example 3 | Example 4 | Example 5 |
| --- | --- | --- | --- | --- | --- |
| Light emitting material 1 | 2a'-55 | 2a'-59 | 2a'-59 | 2a'-101 | 2a'-7 |
| Light emitting material 2 | 1-3 | 1-3 | 1-7 | 1-79 | 1-29 |
| Voltage at which device is driven (V) | 6.5 | 6.5 | 6 | 7 | 7 |
| Luminescent color | Blue | Blue | Blue | Blue | Blue |
| Emission luminance (cd/m$^2$) | 750 | 720 | 760 | 700 | 670 |
| Half lifetime (hours) | 10,000 or longer | 10,000 or longer | 10,000 or longer | 10,000 or longer | 10,000 or longer |

TABLE 2

|  | Example 6 | Example 7 | Example 8 | Example 9 | Example 10 |
| --- | --- | --- | --- | --- | --- |
| Light emitting material 1 | 2a'-57 | 2b-9 | 2b-26 | 2c-1 | 2d-1 |
| Light emitting material 2 | 1-36 | 1-5 | 1-97 | 1-8 | 1-3 |

TABLE 2-continued

|  | Example 6 | Example 7 | Example 8 | Example 9 | Example 10 |
|---|---|---|---|---|---|
| Voltage at which device is driven (V) | 6.5 | 6.5 | 6 | 7 | 7 |
| Luminescent color | Blue | Blue | Blue | Blue | Blue |
| Emission luminance (cd/m$^2$) | 700 | 680 | 675 | 690 | 695 |
| Half lifetime (hours) | 10,000 or longer | 10,000 or longer | 10,000 or longer | 10,000 or longer | 10,000 or longer |

Comparative Examples 1 to 3

In each of Comparative Examples 1 to 3, an organic EL device was produced in the same manner as in Example 1 except the following: a light emitting layer composed only of Compound (2a'-59) and having a thickness of 40 nm was used in Comparative Example 1, a light emitting layer composed of Compound (A) described below and Compound (1-3) and having a thickness of 40 nm (A:1-3=40:2) was used in Comparative Example 2, and a light emitting layer composed of Compound (2a'-59) and Compound (B) described below and having a thickness of 40 nm (weight ratio (2a'-59):B=40:2) was used in Comparative Example 3 instead of the light emitting layer composed of Compound (2a'-55) and Compound (1-3) in Example 1.

Here, Compound (A) is bis(2-methyl-8-quinolinolato)aluminum-μ-oxo-bis(2-methyl-8-quinolinolato)aluminum, and Compound (B) is 2,5,8,11-tetra-t-butylperylene.

As a result, as shown in Table 3, all the devices were each observed to emit blue light, but each had an emission luminance of 100 to 300 cd/m$^2$ and a half lifetime as short as 3,000 to 5,000 hours.

TABLE 3

|  | Comparative example 1 | Comparative example 2 | Comparative example 3 |
|---|---|---|---|
| Light emitting material 1 | 2a'-59 | Compound A | 2a'-59 |
| Light emitting material 2 | None | 1-3 | Compound B |
| Voltage at which device is driven (V) | 7 | 6.5 | 6 |
| Luminescent color | Blue | Blue | Blue |
| Emission luminance (cd/m$^2$) | 100 | 250 | 160 |
| Half lifetime (hours) | 3000 | 4000 | 5000 |

Example 11

(1) Production of Organic EL Device

A transparent electrode composed of an indium tin oxide and having a thickness of 120 nm was provided on a glass substrate measuring 25 mm wide by 75 mm long by 1.1 mm thick. The glass substrate was subjected to ultrasonic cleaning with isopropyl alcohol, and was then washed by being irradiated with ultraviolet light and ozone.

Next, the glass substrate provided with the transparent electrode was mounted on a substrate holder in the deposition tank of a vacuum deposition device, and the degree of vacuum in the vacuum tank was reduced to $1\times10^{-3}$ Pa.

First, N',N'''-bis[4-(diphenylamino)phenyl]-N',N'''-diphenylbiphenyl-4,4'-diamine was formed into a film having a thickness of 60 nm at a deposition rate of 2 nm/sec on the surface on the side where the transparent electrode was formed so as to cover the transparent electrode. The film functions as a hole injecting layer.

Next, N,N,N',N'-tetra(4-biphenylyl)benzidine was formed into a film having a thickness of 20 nm at a deposition rate of 2 nm/sec on the hole injecting layer. The film functions as a hole transporting layer.

The above-mentioned Compound (2a'-55) (luminance material 1) and the above-mentioned Compound (2-21) (luminance material 2) were simultaneously deposited from the vapor at a deposition rate of 2 nm/sec and a deposition rate of 0.2 nm/sec, respectively to form a film having a thickness of 40 nm and containing the compounds at a weight ratio (2a'-55):(2-21) of 40:2 on the hole transporting layer. The film functions as a light emitting layer.

Tris(8-hydroxyquinolino)aluminum was deposited from the vapor at a deposition rate of 2 nm/sec to form an electron transporting layer having a thickness of 20 nm on the resultant.

Further, lithium fluoride was formed into an electron injecting layer having a thickness of 1 nm at a deposition rate of 0.1 nm/sec.

Finally, aluminum was formed into a cathode layer having a thickness of 200 nm at a deposition rate of 2 nm/sec to produce an organic EL device.

(2) Evaluation of Organic EL Device

Next, the device was subjected to a current test. As a result, the device showed an emission luminance of 445 cd/m$^2$ at a voltage of 6.3 V. The emission peak wavelength (EL $\lambda_{max}$) and chromaticity of the device were measured. As a result, it was confirmed that the luminescent color of the device was blue. In addition, the device was driven at a constant current with its initial emission luminance set to 100 cd/m$^2$. As a result, the device had a half lifetime of 10,000 hours or longer. The result confirmed that the device was sufficient for practical use. Table 4-1 shows the obtained results.

Examples 12 to 20

Organic EL devices were each produced in the same manner as in Example 11 except that the light emitting materials 1 and 2 were changed as shown in each of Table 4-1 and Table 4-2.

Next, each of the devices was subjected to a current test. As a result, each of the devices showed an emission luminance of 180 to 550 cd/m$^2$ at a voltage of 6.3 V. The emission peak wavelength (EL $\lambda_{max}$) and chromaticity of each of the devices were measured. As a result, it was confirmed that the luminescent color of each of the devices was blue. In addition, each of the devices was driven at a constant current with its initial emission luminance set to 100 cd/m$^2$. As a result, each of the devices had a half lifetime of 5,500 hours or longer. The result confirmed that the devices were sufficient for practical use. Table 4-1 and Table 4-2 show the obtained results.

TABLE 4-1

|  | Example 11 | Example 12 | Example 13 | Example 14 | Example 15 |
|---|---|---|---|---|---|
| Light emitting material 1 | 2a'-55 | 2a'-55 | 2a'-55 | 2a'-59 | 2b-42 |

TABLE 4-1-continued

|  | Example 11 | Example 12 | Example 13 | Example 14 | Example 15 |
|---|---|---|---|---|---|
| Light emitting material 2 | 2-21 | 2-24 | 2-29 | 2-44 | 2-32 |
| Voltage at which device is driven (V) | 6.3 | 6.3 | 6.3 | 6.3 | 6.3 |
| EL λ max | 445 | 445 | 449 | 458 | 455 |
| Emission luminance (cd/m$^2$) | 313 | 318 | 409 | 550 | 320 |
| Half lifetime (hr) | >10,000 | >10,000 | >10,000 | >10,000 | >10,000 |

TABLE 4-2

|  | Example 16 | Example 17 | Example 18 | Example 19 | Example 20 |
|---|---|---|---|---|---|
| Light emitting material 1 | 2a-7 | 2c-1 | 2d-1 | 2a-17 | 2b-42 |
| Light emitting material 2 | 2-66 | 2-32 | 2-32 | 2-7 | 2-7 |
| Voltage at which device is driven (V) | 6.3 | 6.3 | 6.3 | 6.3 | 6.3 |
| EL λ max | 443 | 445 | 446 | 446 | 453 |
| Emission luminance (cd/m$^2$) | 275 | 180 | 240 | 305 | 315 |
| Half lifetime (hr) | >10,000 | 5,500 | 6,500 | >10,000 | >10,000 |

As can be seen from the results of evaluation of Examples 1 to 20 shown in Table 1, Table 2, Table 4-1, and Table 4-2, the organic EL device of the present invention can emit blue light, and can achieve excellent emission luminance and a half lifetime that can be put into practical use. In particular, the use of an anthracene structure as the fused ring-containing compound G$^2$ and a compound having a structure represented by the formula (1b) as a fluoranthene structure provides the most excellent current efficiency and the most excellent half lifetime.

Comparative Example 4

In Comparative Example 4, an organic EL device was produced in the same manner as in Example 11 except that a light emitting layer composed of Compound (2a'-55) and Compound (C) described below and having a thickness of 40 nm (weight ratio (2a'-55):C=40:2) was used instead of the light emitting layer composed of Compound (2a'-55) and Compound (2-21) in Example 11.

Here, Compound (C) is benzo[k]fluoranthene.

As a result, the device was observed to emit light the luminescent color of which was blue, but had an emission luminance of 105 cd/m$^2$ and a half lifetime as short as 3,000 hours.

Example 21

A glass substrate measuring 25 mm wide by 75 mm long by 1.1 mm thick and provided with an ITO transparent electrode (manufactured by GEOMATEC Co., Ltd.) was subjected to ultrasonic cleaning in isopropyl alcohol for 5 minutes. After that, the resultant was subjected to UV ozone cleaning for 30 minutes.

Hole injecting/transporting layers having a laminate structure were formed on the substrate. First, polyethylenedioxythiophene polystyrene sulfonate (PEDOT•PSS) was formed into a film having a thickness of 100 nm by a spin coating method. Next, a solution of Polymer 1 shown below (molecular weight (Mw): 145,000) in toluene (0.6 wt %) was formed into a film having a thickness of 20 nm by a spin coating method, and was dried at 170° C. for 30 minutes.

Next, a toluene solution containing 1 wt % of Compound (2a'-55) described above and Compound (2-21) described above obtained ((2a'-55):(2-21)=20:2 (weight ratio)) as light emitting materials was formed into a light emitting layer by a spin coating method. The light emitting layer had a thickness of 50 nm.

A tris(8-quinolinol)aluminum film having a thickness of 10 nm (hereinafter abbreviated as "Alq film") was formed on the light emitting layer. The Alq film functions as an electron transporting layer.

After that, Li as a reducing dopant (Li source: manufactured by SAES Getters) and Alq were co-deposited to form an Alq:Li film as an electron injecting layer (cathode). Metal Al was deposited from the vapor onto the Alq:Li film to form a metal cathode, whereby an organic EL device was formed.

The device emitted blue light, and had a uniform light emitting surface. A current efficiency at this time was 2.9 cd/A.

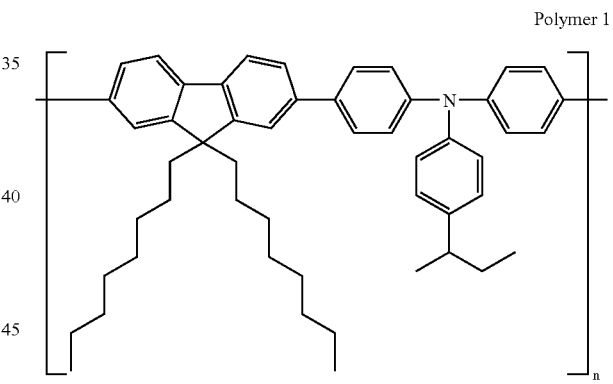

Polymer 1

Example 22

A transparent electrode composed of an indium tin oxide and having a thickness of 120 nm was provided on a glass substrate measuring 25 mm wide by 75 mm long by 1.1 mm thick. The glass substrate was subjected to ultrasonic cleaning with isopropyl alcohol, and was then washed by being irradiated with ultraviolet light and ozone. Next, the glass substrate provided with the transparent electrode was mounted on a substrate holder in the deposition tank of a vacuum deposition device, and the degree of vacuum in the vacuum tank was reduced to 1×10$^{-3}$ Pa.

First, N',N'''-bis[4-(diphenylamino)phenyl]-N',N'''-diphenylbiphenyl-4,4'-diamine was formed into a film having a thickness of 60 nm at a deposition rate of 2 nm/sec on the surface on the side where the transparent electrode was formed so as to cover the transparent electrode. The film functions as a hole injecting layer. Next, N,N,N',N'-tetra(4- biphenylyl)benzidine was formed into a film having a thickness of 20 nm at a deposition rate of 2 nm/sec on the hole injecting layer. The film functions as a hole transporting layer.

The above-mentioned Compound (2a-2) (luminance material 1) and the above-mentioned Compound (2-28) (luminance material 2) were simultaneously deposited from the vapor at a deposition rate of 2 nm/sec and a deposition rate of 0.2 nm/sec, respectively to form a film having a thickness of 40 nm and containing the compounds at a weight ratio (2a-2):(2-28) of 40:2 on the hole transporting layer. The film functions as a light emitting layer. Tris(8-hydroxyquinolino) aluminum was deposited from the vapor at a deposition rate of 2 nm/sec to form an electron transporting layer having a thickness of 20 nm on the resultant. Further, lithium fluoride was formed into an electron injecting layer having a thickness of 1 nm at a deposition rate of 0.1 nm/sec. Finally, aluminum was formed into a cathode layer having a thickness of 200 nm at a deposition rate of 2 nm/sec to produce an organic EL device.

Next, the device was subjected to a current test. As a result, the device showed an emission luminance of 250 cd/m² at a voltage of 6.5 V. The emission peak wavelength (EL $\lambda_{max}$) was 446. The device was driven at a constant current with its initial emission luminance set to 100 cd/m². As a result, the device had a half lifetime of 10,000 hours or longer. The result confirmed that the device was sufficient for practical use.

INDUSTRIAL APPLICABILITY

As described above in detail, the organic electroluminescence device of the present invention the light emitting layer of which contains at least one kind selected from compounds each having a fluoranthene structure and each represented by the general formula (1) and at least one kind selected from fused ring-containing compounds each represented by the general formula (2) has high emission luminance and a long lifetime. Further, in order that the stability of the organic EL device obtained by the present invention against, for example, temperature, humidity, or an atmosphere may be improved, the surface of the device can be provided with a protective layer, or the entirety of the device can be protected with, for example, silicone oil or a resin. Therefore, the organic EL device of the present invention has high practicability, and is useful as a light source such as a flat luminous body of a wall television or a back light for a display. Such compound as described above can be used for an organic EL device, a hole infecting/transporting material or a charge transporting material for an electrophotographic photosensitive member or for an organic semiconductor.

The invention claimed is:

1. An organic electroluminescence device which emits blue fluoresence, comprising:
   a cathode;
   an anode; and
   an organic thin film layer interposed between the cathode and the anode;
   wherein:
   the organic thin film layer comprises at least one layer comprising at least one light emitting layer;
   the light emitting layer comprises:
   (A) at least one fused ring-containing compound represented by formula (3'a):

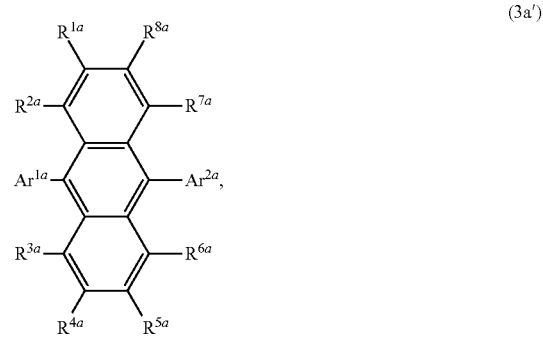

(3a')

wherein
Ar$^{1a}$ and Ar$^{2a}$ each independently represent a group derived from a substituted or unsubstituted aromatic ring having 6 to 20 ring carbon atoms, the aromatic ring is substituted by at least one substituent selected from the group consisting of a 1-naphthyl group, a 2-naphthyl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, an o-tolyl group, an m-tolyl group, a p-tolyl group, and a p-t-butylphenyl group, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group, and, when the aromatic ring is substituted by two or more substituents, the substituents may be identical to or different from each other; and adjacent substituents may be bonded to each other to form a saturated or unsaturated cyclic structure provided that Ar$^{1a}$ and Ar$^{2a}$ are different from each other in structure; and R$^{1a}$ to R$^{8a}$ are each independently selected from a hydrogen atom, a substituted or unsubstituted aryl group having 6 to 50 ring carbon atoms, a substituted or unsubstituted heteroaryl group having 5 to 50 ring atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group;

and (B) 0.01 to 20 wt % of at least one compound selected from group represented by formula (1b):

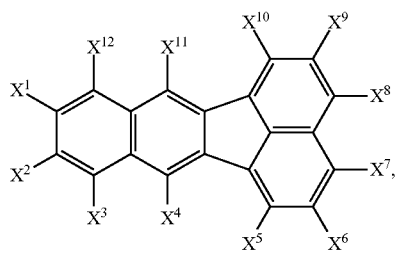

(1b)

wherein

X¹-X³, X⁵-X⁶, X⁹-X¹⁰ and X¹² each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted heterocyclic group having 5 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —COOR$^{1e}$ group where R$^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —COR$^{2e}$ group where R$^{2e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —OCOR$^{3e}$ group where R$^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms;

X⁷ and X⁸ each independently represent a hydrogen or a substituted or unsubstituted aryl group having 6 to 20 carbon atoms;

provided that:

the substituted or unsubstituted aryl group having 6 to 20 carbon atoms is not represented by formula (1 b); and wherein X⁴ and X¹¹ each independently represent a substituted or unsubstituted aryl group having 6 to 20 carbon atoms and a substituted or unsubstituted heterocyclic group having 5 to 20 carbon atoms and a case where both X⁴ and X¹¹ represent hydrogen atoms is excluded; and wherein adjacent X¹ to X¹² groups are not bonded to each other to form a substituted or unsubstituted carbon ring, and wherein X⁷ and X⁸ are not represented by a monovalent group derived from a compound having a structure represented by formula (1a):

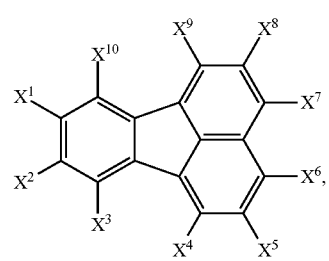

(1a)

wherein X¹ to X¹⁰ each independently represent a hydrogen atom, a halogen atom, a substituted or unsubstituted, linear, branched, or cyclic alkyl group having 1 to 30 carbon atoms, a substituted or unsubstituted, linear, branched, or cyclic alkoxy group having 1 to 30 carbon atoms, a substituted or unsubstituted, linear, branched, or cyclic alkylthio group having 1 to 30 carbon atoms, a substituted or unsubstituted, linear, branched, or cyclic alkenyl group having 2 to 30 carbon atoms, a substituted or unsubstituted, linear, branched, or cyclic alkenyloxy group having 2 to 30 carbon atoms, a substituted or unsubstituted, linear, branched, or cyclic alkenylthio group having 2 to 30 carbon atoms, a substituted or unsubstituted aralkyl group having 7 to 30 carbon atoms, a substituted or unsubstituted aralkyloxy group having 7 to 30 carbon atoms, a substituted or unsubstituted aralkylthio group having 7 to 30 carbon atoms, a substituted or unsubstituted aryl group having 6 to 20 carbon atoms, a substituted or unsubstituted aryloxy group having 6 to 20 carbon atoms, a substituted or unsubstituted arylthio group having 6 to 20 carbon atoms, a substituted or unsubstituted amino group having 2 to 30 carbon atoms, a cyano group, a silyl group, a hydroxy group, a —COOR$^{1e}$ group where R$^{1e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, a —COR$^{2e}$ group where R$^{2e}$ represents a hydrogen atom, a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, a substituted or unsubstituted aryl group having 6 to 30 carbon atoms, or an amino group, or a —OCOR$^{3e}$ group where R$^{3e}$ represents a substituted or unsubstituted, linear, branched, or cyclic alkyl group having 1 to 30 carbon atoms, a substituted or unsubstituted, linear, branched, or cyclic alkenyl group having 2 to 30 carbon atoms, a substituted or unsubstituted aralkyl group having 7 to 30 carbon atoms, or a substituted or unsubstituted aryl group having 6 to 30 carbon atoms, and adjacent groups or substituents of groups out of X$^1$ to X$^{16}$ may be bonded to each other to form a substituted or unsubstituted carbon ring.

2. An organic electroluminescence device according to claim 1, wherein a surface of at least one of the pair of electrodes is provided with a chalcogenide layer, a metal halide layer, or a metal oxide layer.

3. The organic electroluminescence device according to claim 1, wherein X$^7$ and X$^8$ each independently represent a hydrogen or a substituted or unsubstituted selected from the group consisting of a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, a p-terphenyl-4-yl group, a p-terphenyl-3-yl group, a p-terphenyl-2-yl group, an m-terphenyl-4-yl group, an m-terphenyl-3-yl group or an m-terphenyl-2-yl group.

4. The organic electroluminescence device according to claim 1, wherein X$^7$ is a hydrogen and X$^8$ is a substituted or unsubstituted aryl group having 6 to 20 carbon atoms.

5. The organic electroluminescence device according to claim 1, wherein X$^4$ and X$^{11}$ each independently represent a substituted or unsubstituted aryl group having 6 to 20 carbon atoms.

6. The organic electroluminescence device according to claim 1, wherein X$^1$ to X$^6$ and X$^9$ to X$^{12}$ each independently represent a hydrogen atom or a substituted or unsubstituted aryl group having 6 to 20 carbon atoms.

7. The organic electroluminescence device according to claim 3, wherein the at least one compound according to general formula (1b) is selected from the group consisting of: compound 2-50, compound 5-3, compound 5-7, compound 5-9 compound 5-12, compound 5-14, compound 5-16 and compound 7-1:

2-50

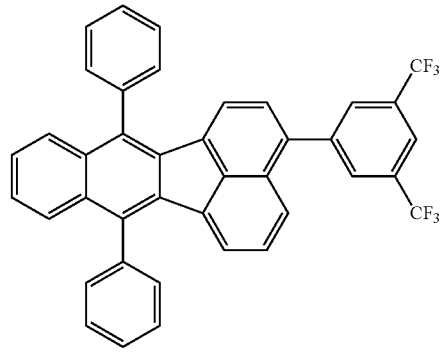

5-3

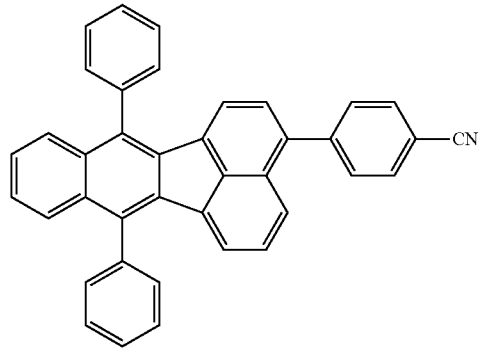

5-7

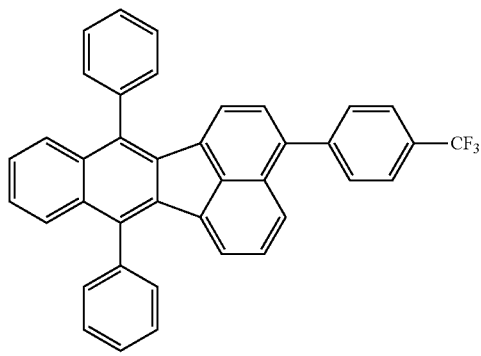

5-9

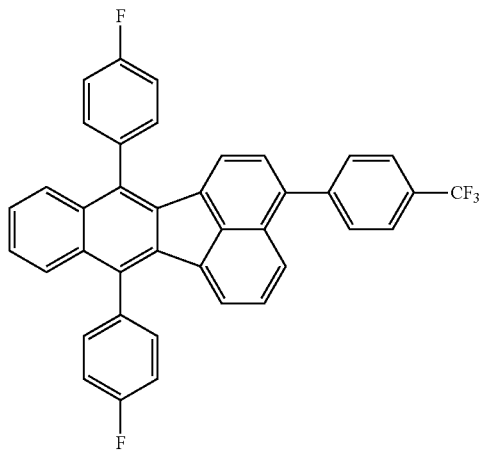

201
-continued
5-12
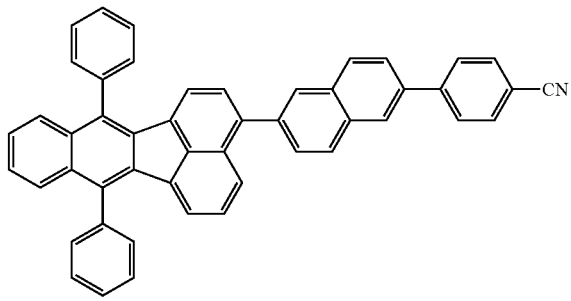
5-14
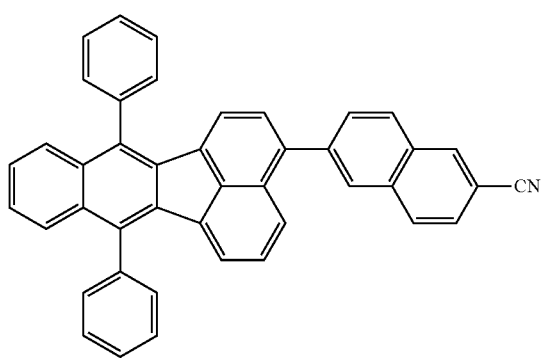
202
-continued
5-16
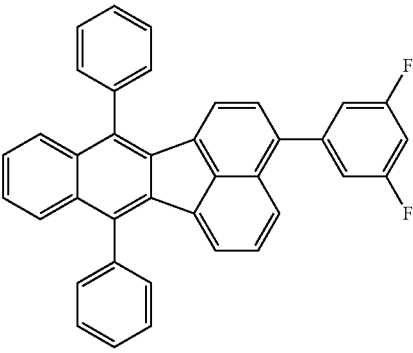
7-1
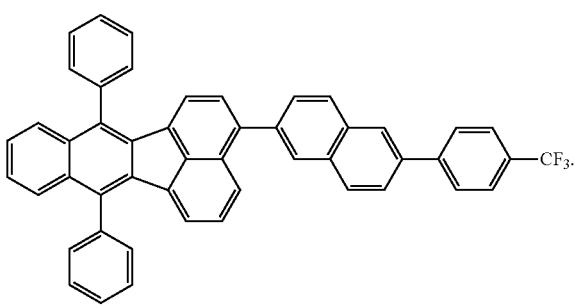
8. The organic electroluminescence device according to claim 1, wherein the at least one compound according to general formula (1b) is selected from the group consisting of:
2-6
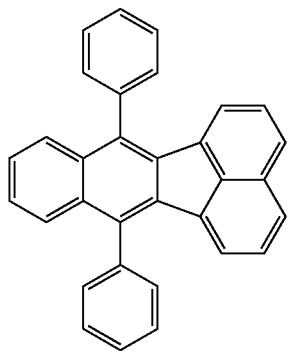
2-7
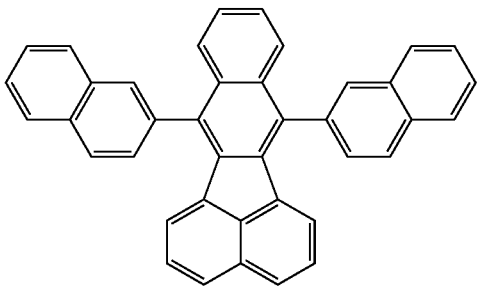
2-8
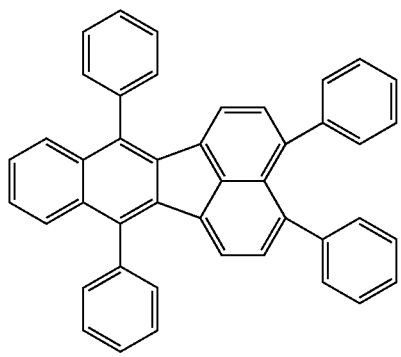
2-20
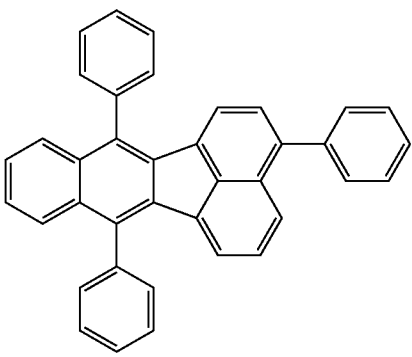

-continued
2-21
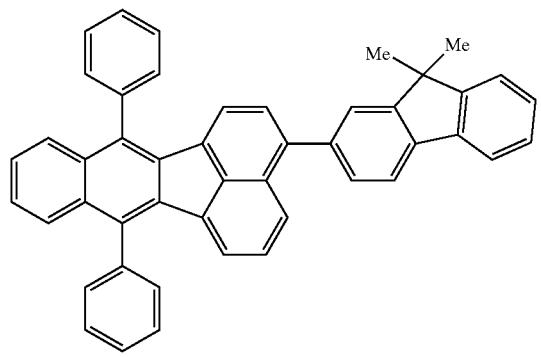
2-22
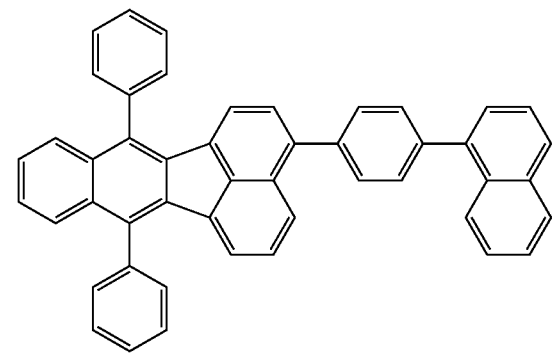
2-23
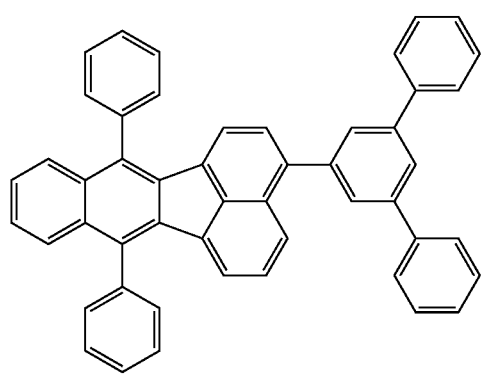
2-24
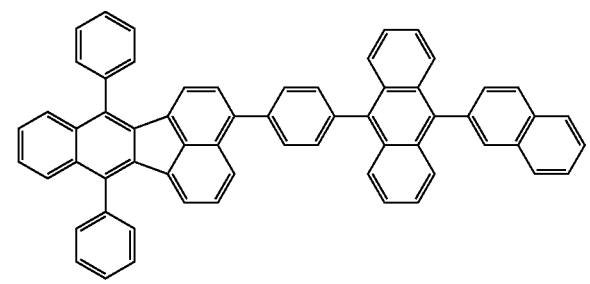
2-25
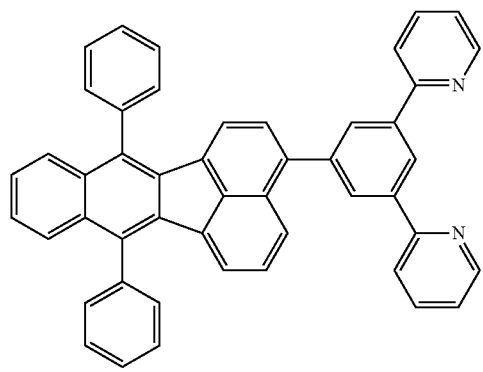
2-26
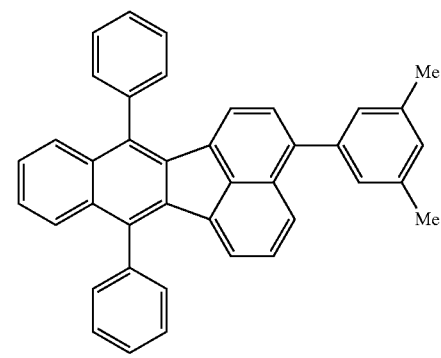
2-27
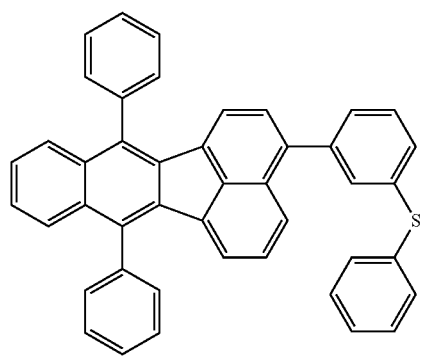
2-28
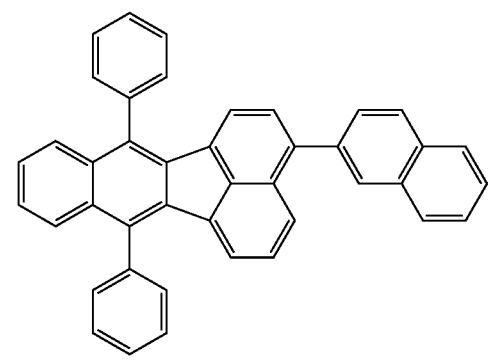

-continued
2-29
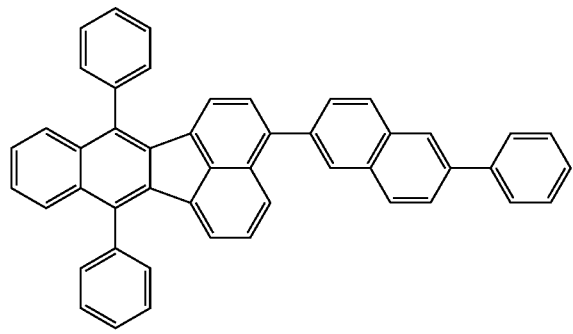
2-30
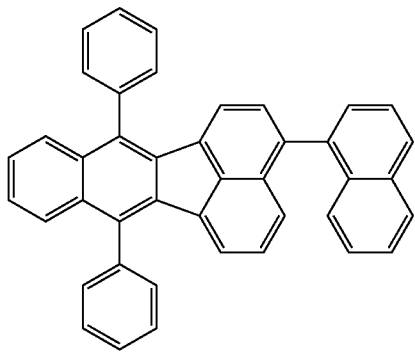
2-31
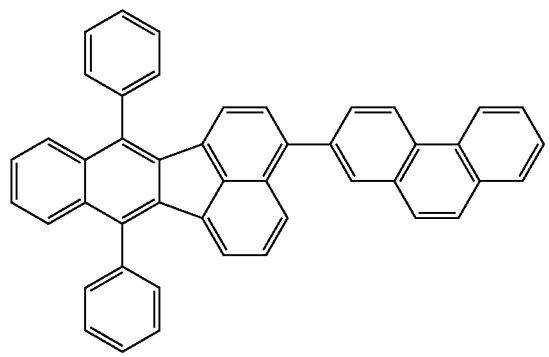
2-32
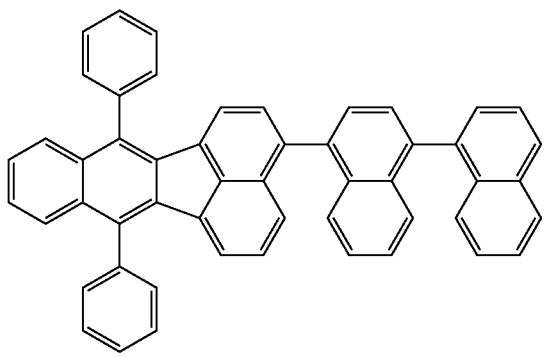
2-33
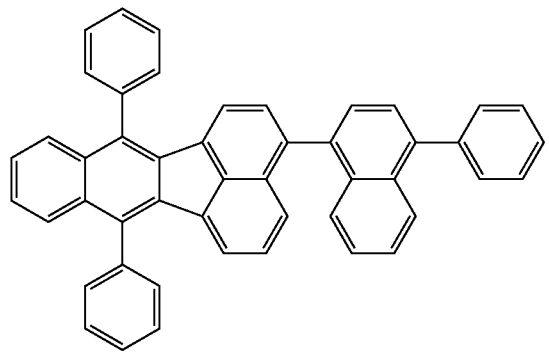
2-34
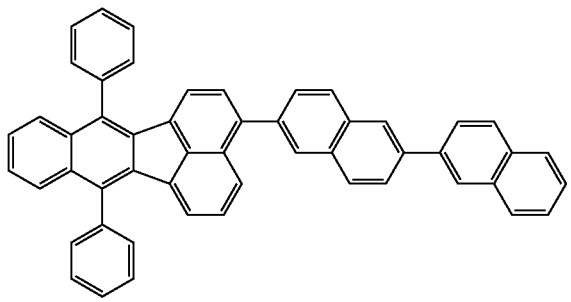
2-35
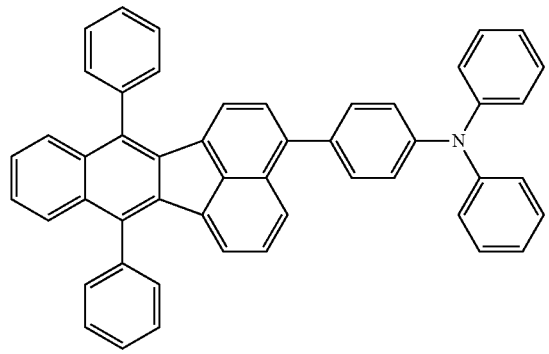
2-36
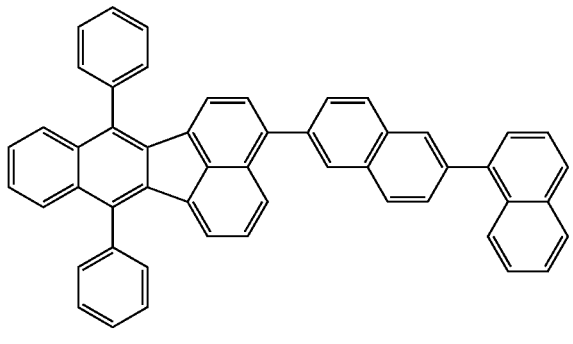

2-37
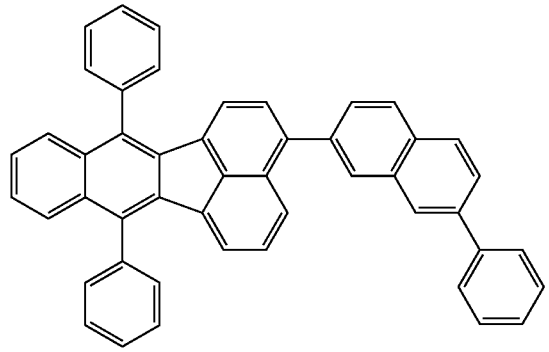
2-38
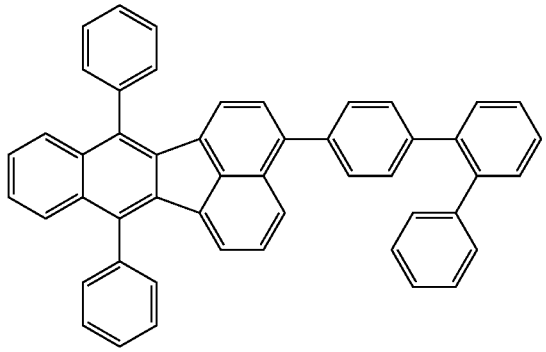
2-39
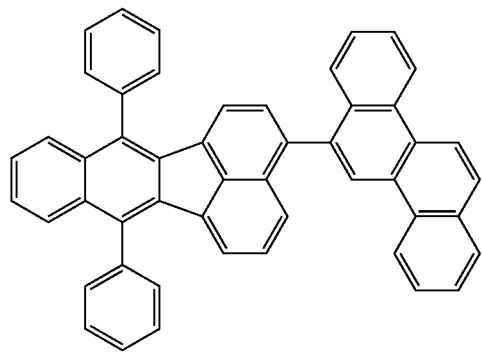
2-40
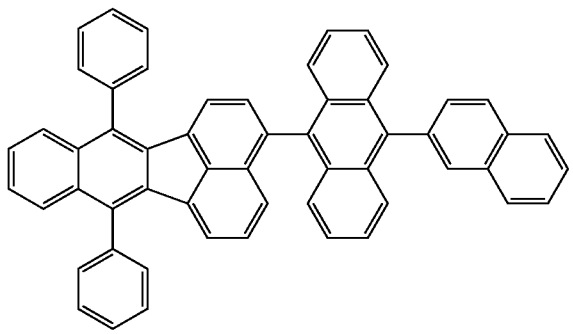
2-41
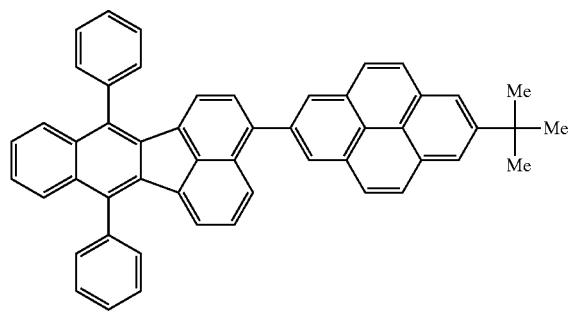
2-42
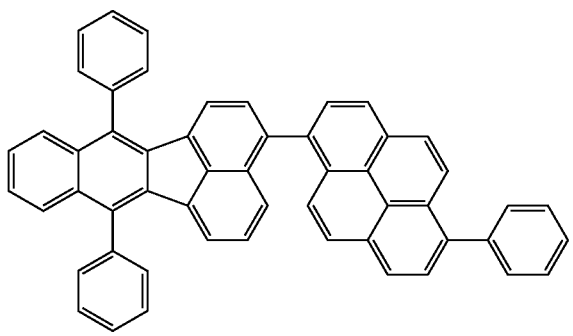
2-43
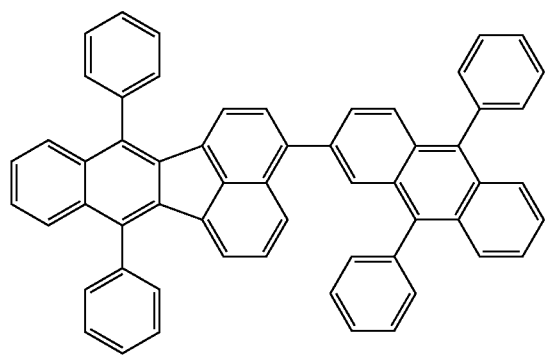
2-44
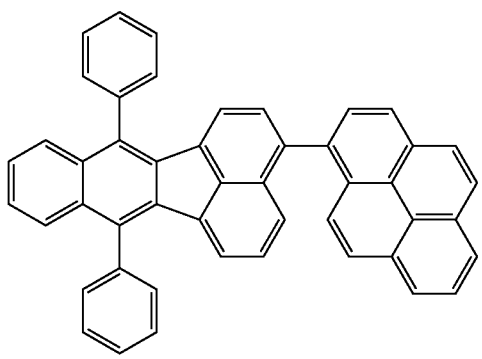

-continued
2-45
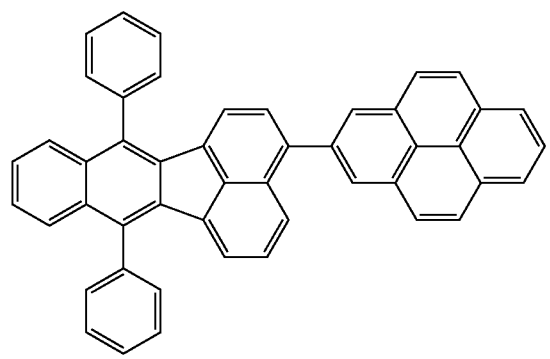
2-46
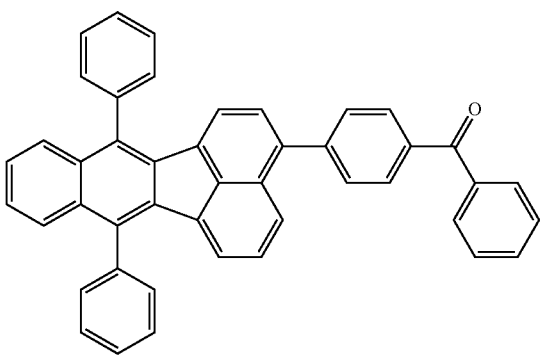
2-47
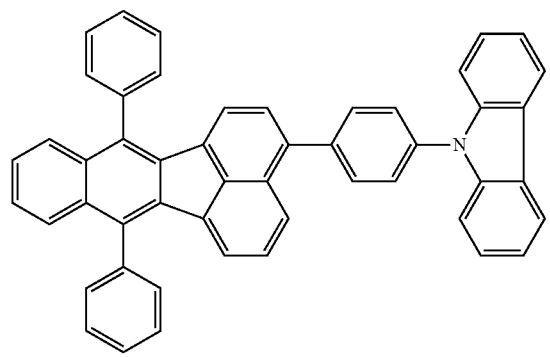
2-48
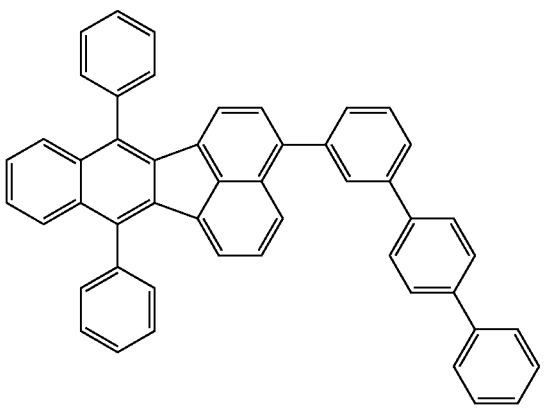
2-50
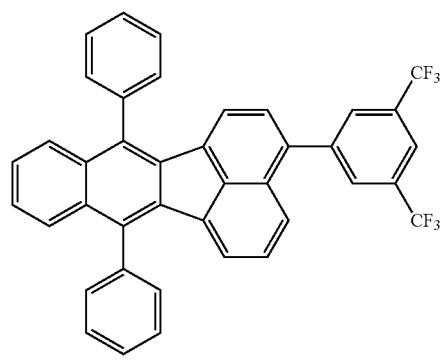
2-51
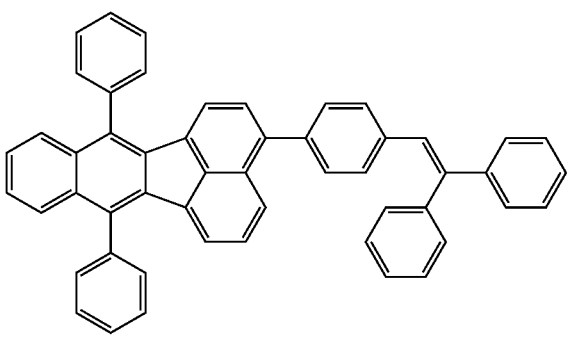
2-52
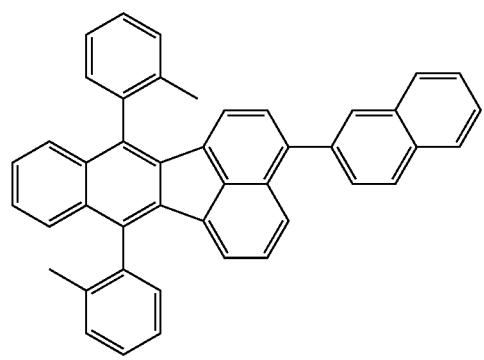
2-54
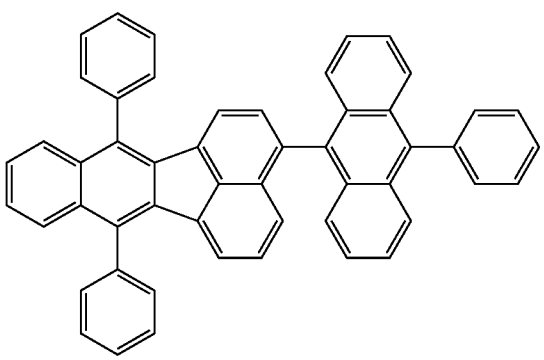

-continued
2-58
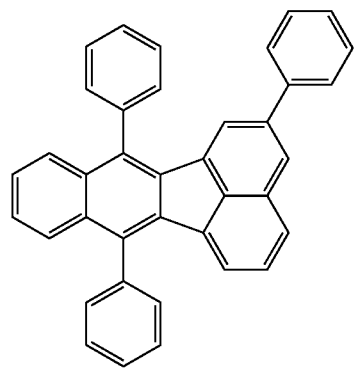
2-59
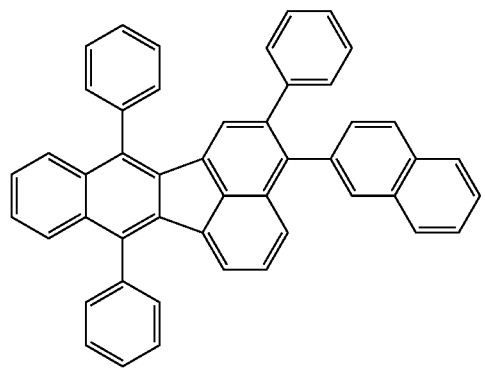
2-60
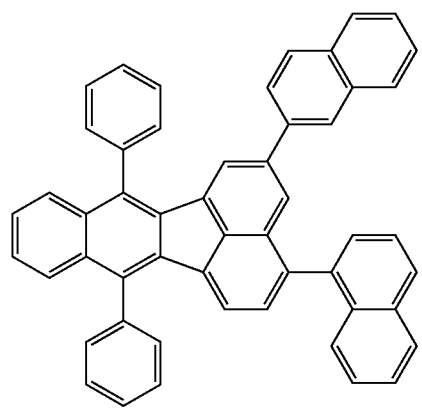
2-61
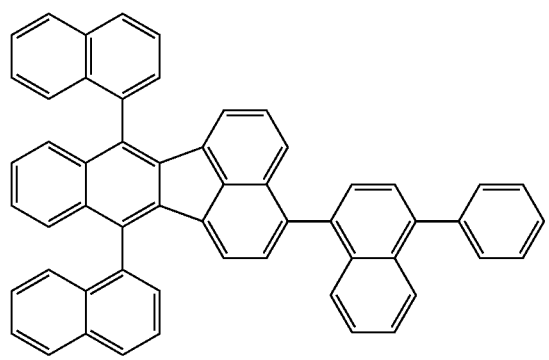
2-62
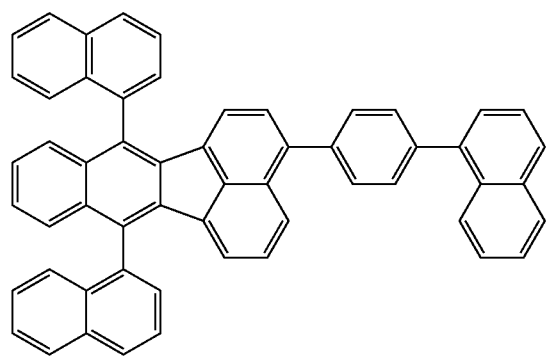
2-63
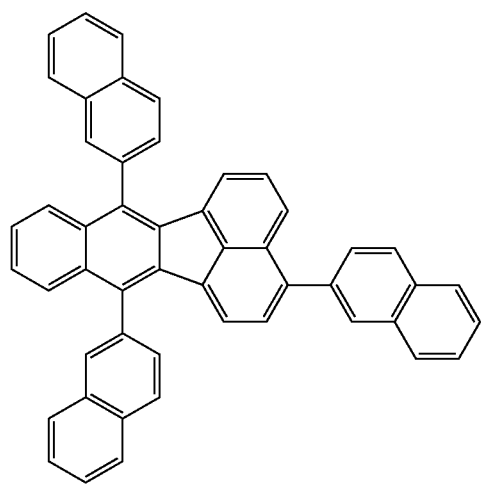

-continued
2-64
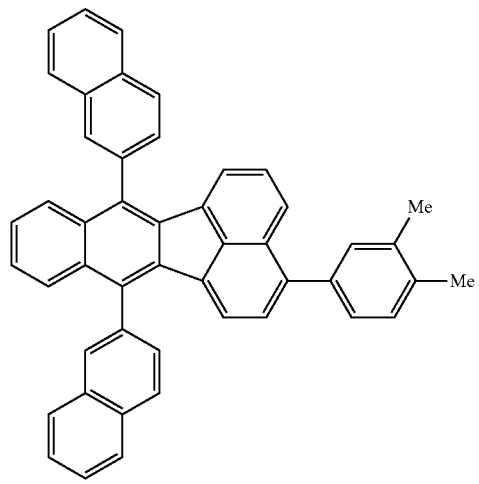
2-65
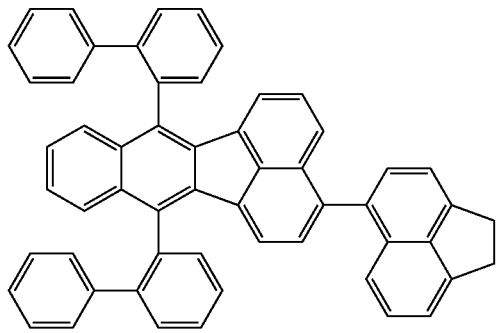
2-66
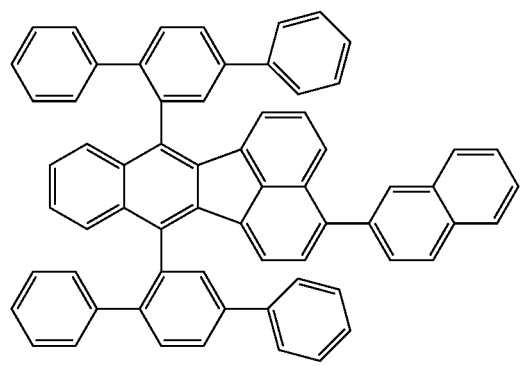
2-68
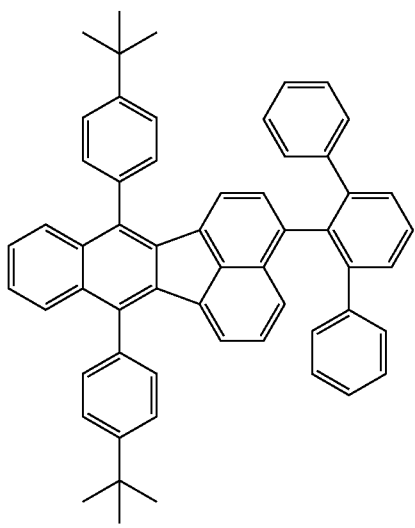
2-69
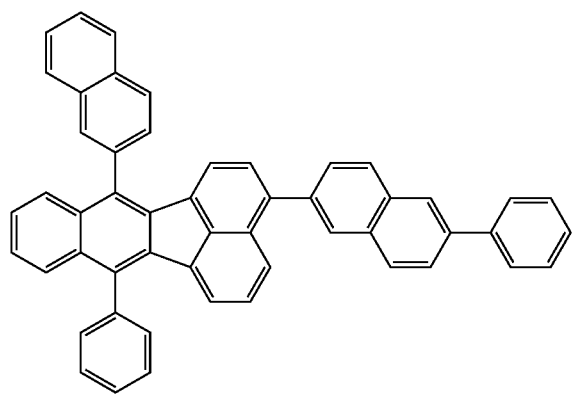
2-70
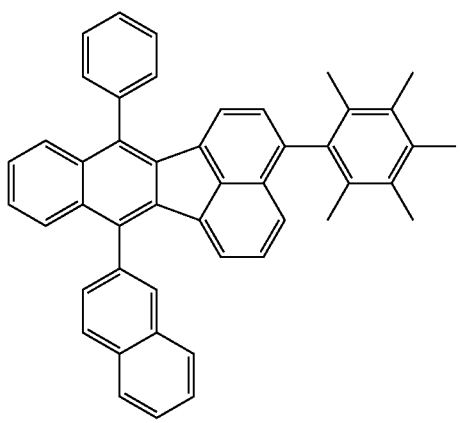

-continued
2-71
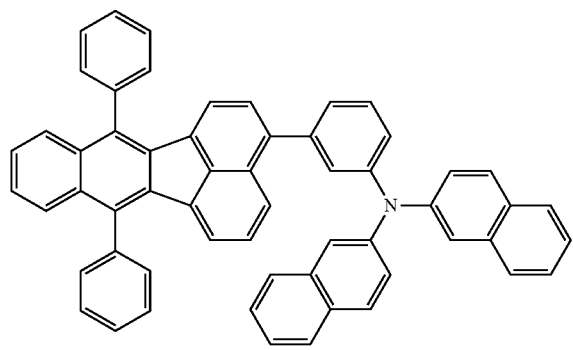
2-72
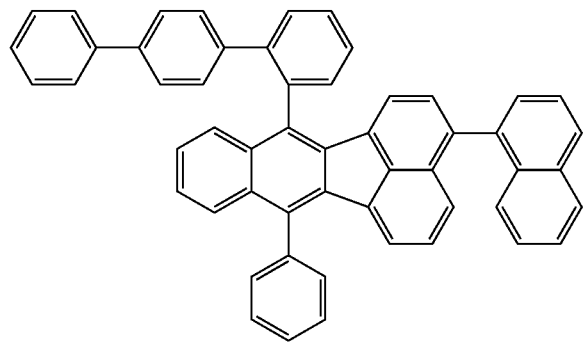
2-73
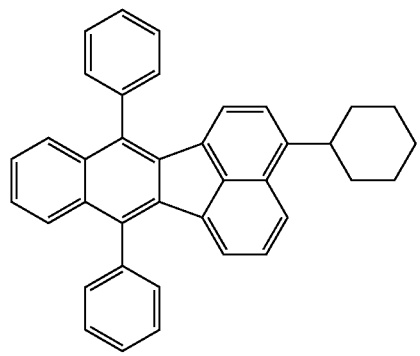
2-74
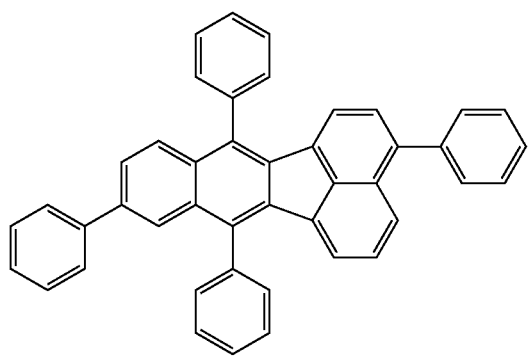
2-75
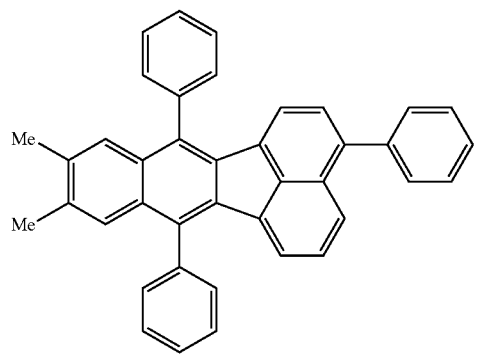
2-76
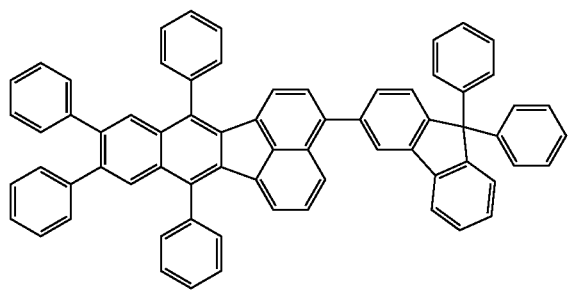
2-80
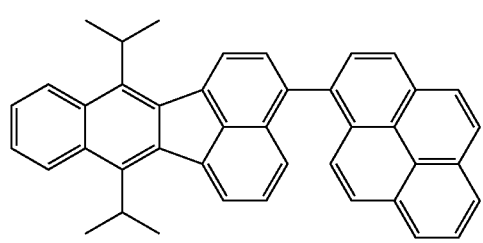
2-81
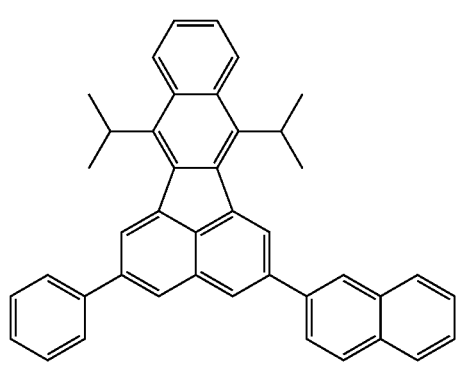

217 218
-continued
2-82 2-84
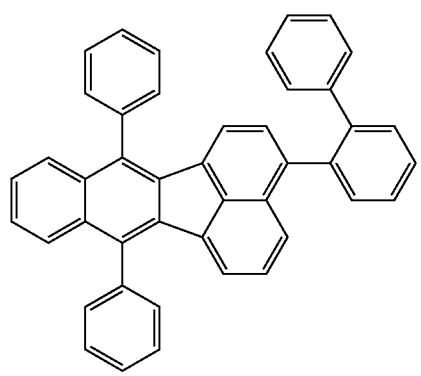 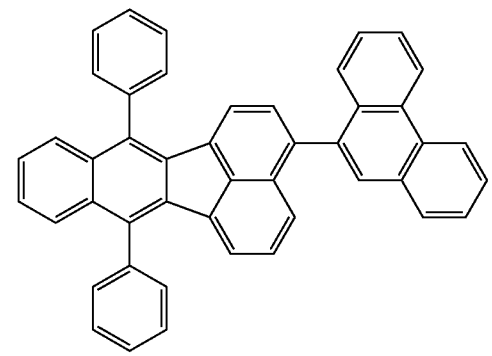
2-85 5-1
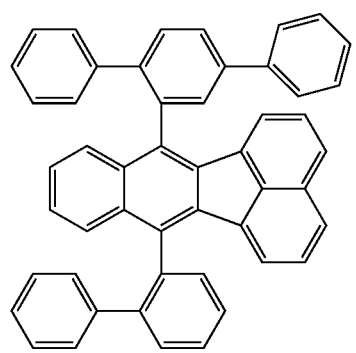 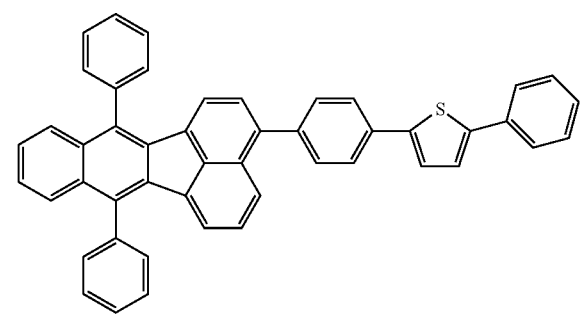
5-2 5-3
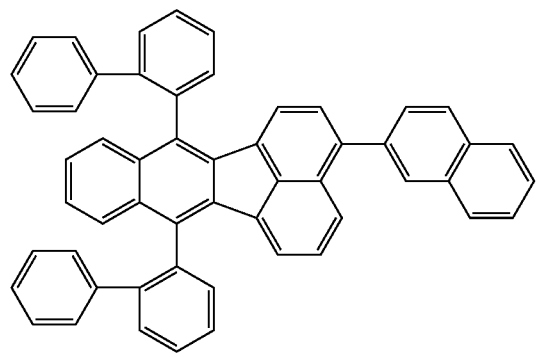 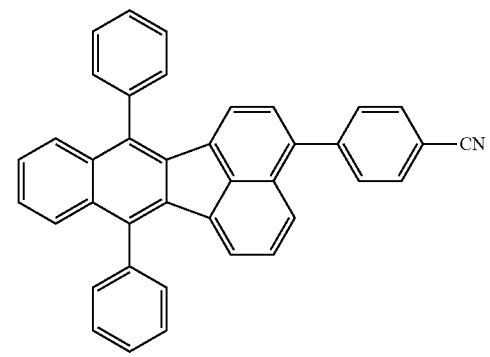
5-6 5-7
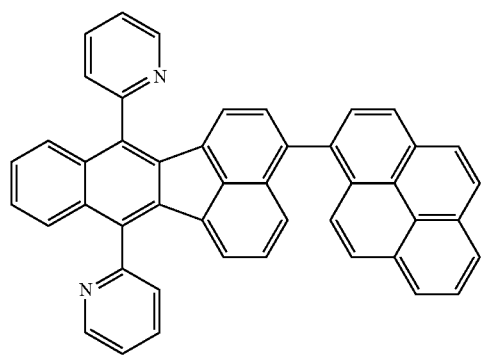 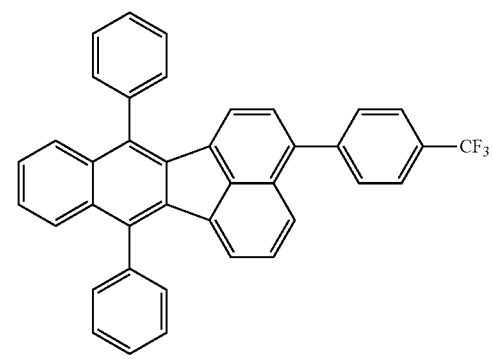

-continued
5-8
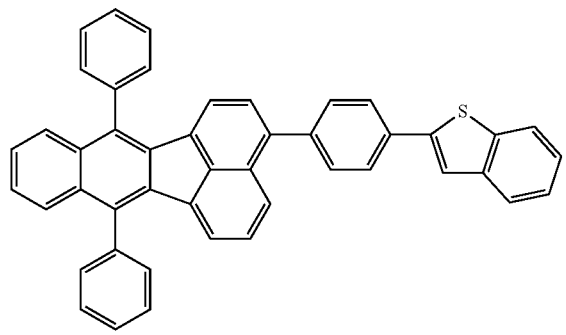
5-9
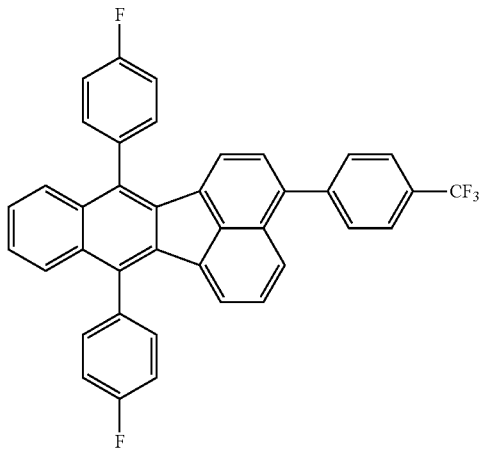
5-10
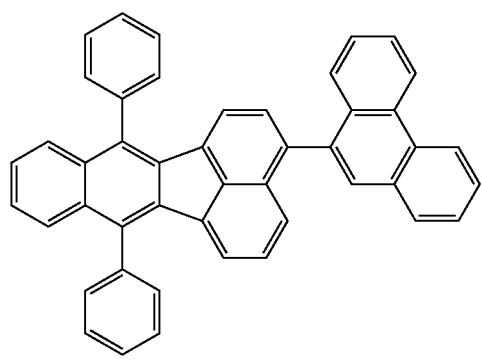
5-11
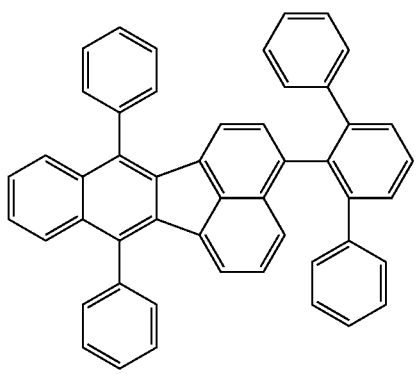
5-12
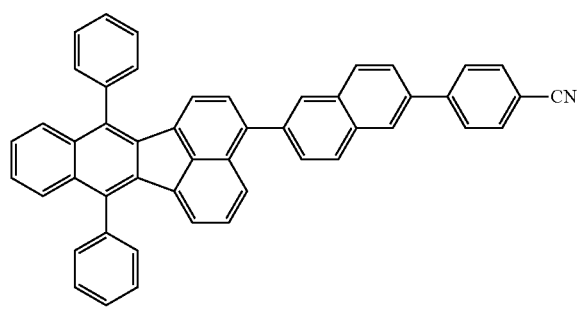
5-13
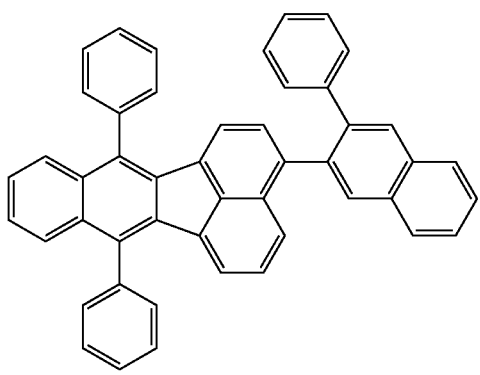
5-14
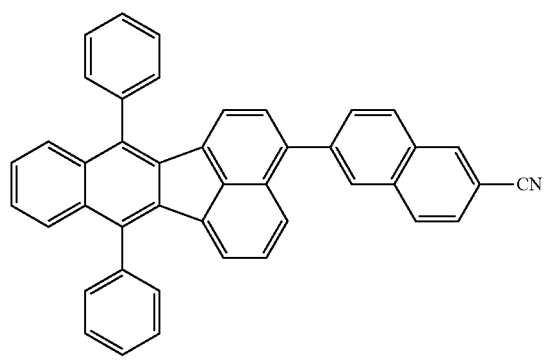
5-16
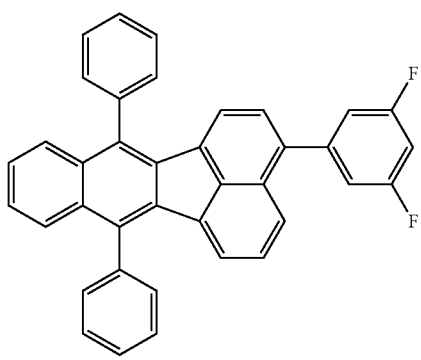

-continued
6-4
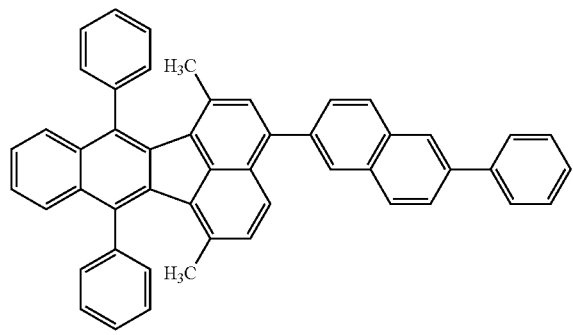
6-5
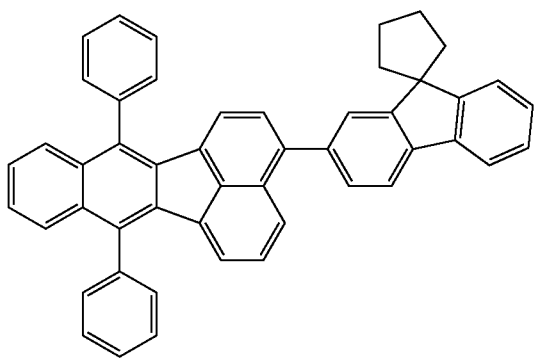
6-6
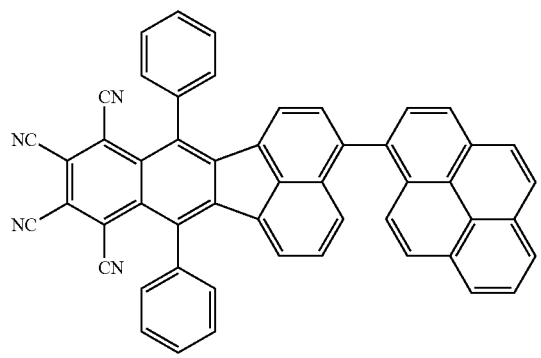
6-7
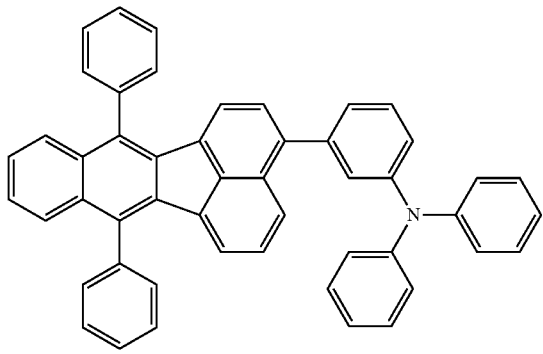
6-8
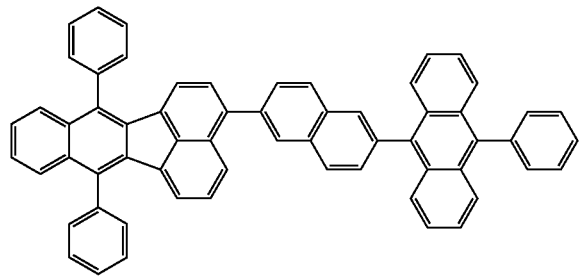
6-9
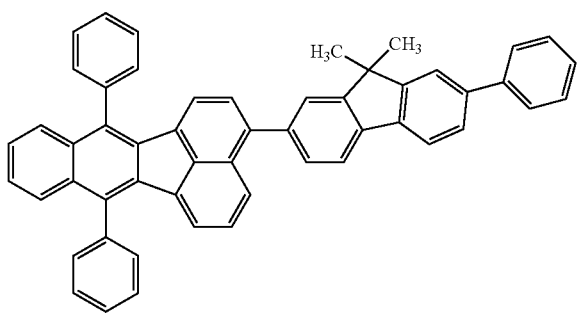
6-10
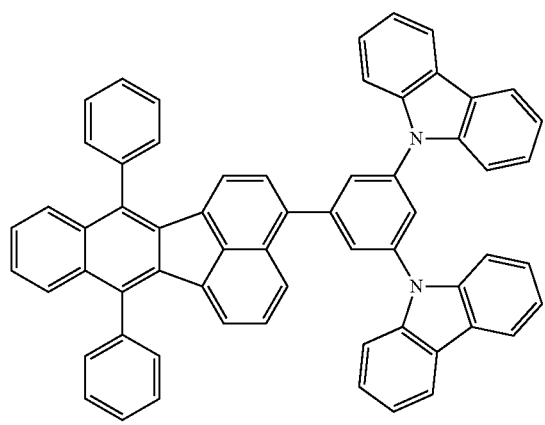
6-11

-continued
6-12
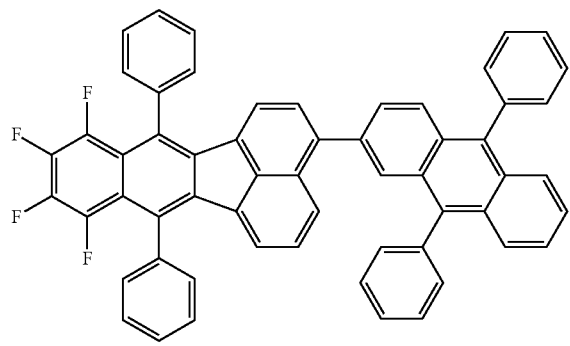
7-1
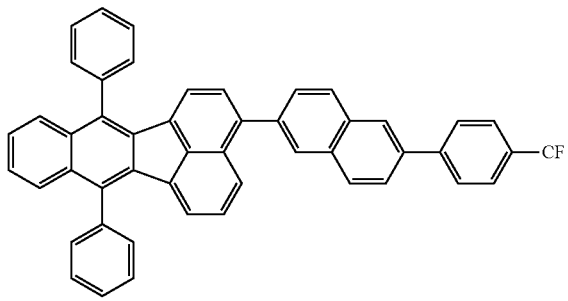
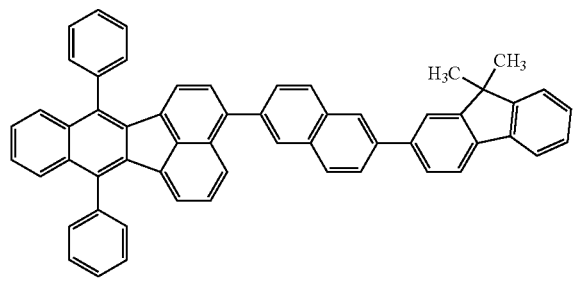
7-2
7-3
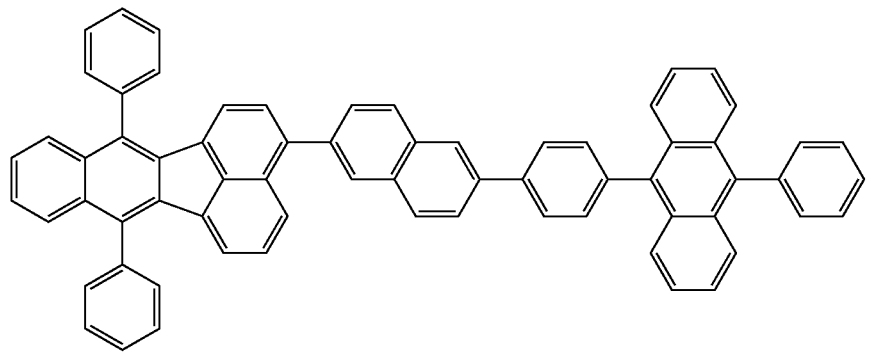
7-4
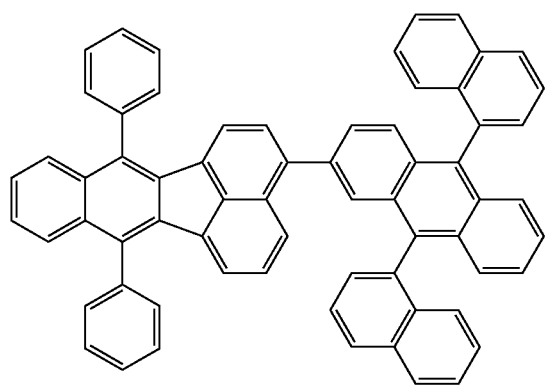
7-5
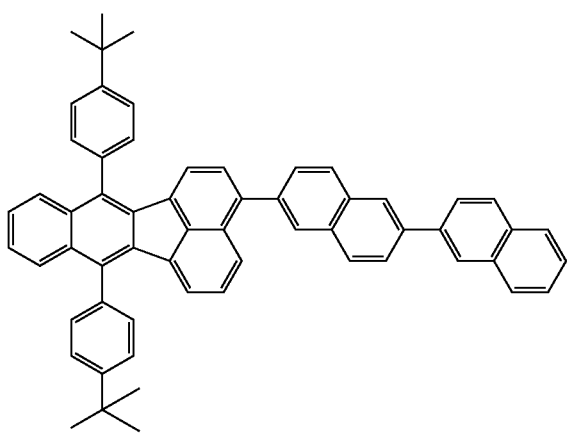

-continued 7-6
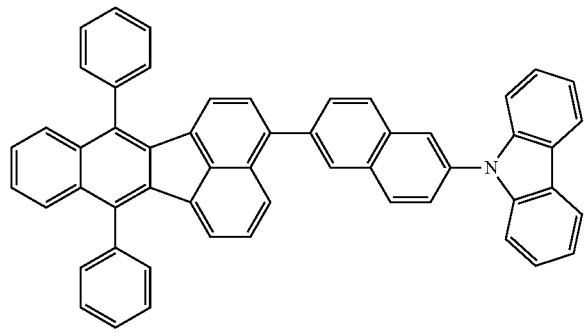

7-8
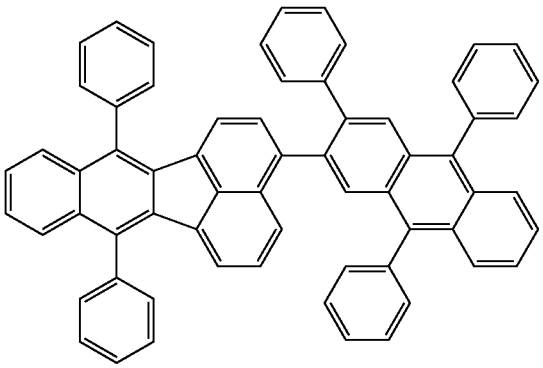

7-9
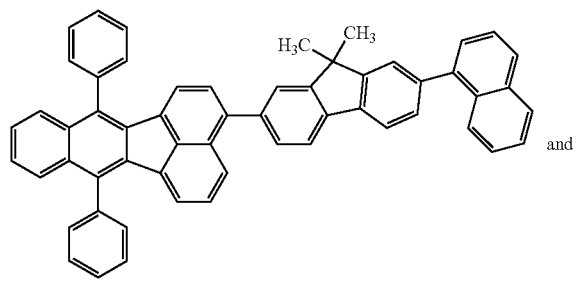
and 7-10
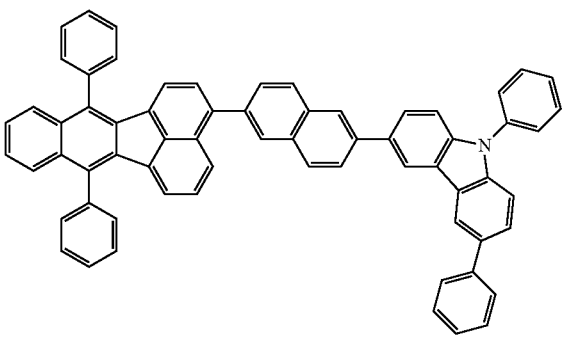

9. An organic electroluminescence device which emits blue fluoresence, comprising:
a cathode;
an anode; and
an organic thin film layer interposed between the cathode and the anode;
wherein:
the organic thin film layer comprises at least one layer comprising at least one light emitting layer;
the light emitting layer comprises:
(A) at least one fused ring-containing compound represented by formula (3'a):

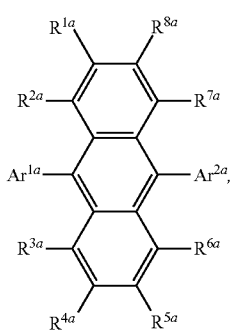

wherein
$Ar^{1a}$ and $Ar^{2a}$ each independently represent a group derived from a substituted or unsubstituted aromatic ring having 6 to 20 ring carbon atoms, the aromatic ring is substituted by at least one substituent selected from the group consisting of a 1-naphthyl group, a 2-naphthyl group, a 9-phenanthryl group, a 1-naphthacenyl group, a 2-naphthacenyl group, a 9-naphthacenyl group, a 1-pyrenyl group, a 2-pyrenyl group, a 4-pyrenyl group, a 2-biphenylyl group, a 3-biphenylyl group, a 4-biphenylyl group, an o-tolyl group, an m-tolyl group, a p-tolyl group, and a p-t-butylphenyl group, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group, and, when the aromatic ring is substituted by two or more substituents, the substituents may be identical to or different from each other; and adjacent substituents may be bonded to each other to form a saturated or unsaturated cyclic structure
provided that $Ar^{1a}$ and $Ar^{2a}$ are different from each other in structure; and
$R^{1a}$ to $R^{8a}$ are each independently selected from a hydrogen atom, a substituted or unsubstituted aryl group having 6 to 50 ring carbon atoms, a substituted or unsubstituted heteroaryl group having 5 to 50 ring atoms, a substituted or unsubstituted alkyl group having 1 to 50 carbon atoms, a substituted or unsubstituted cycloalkyl group having 3 to 50 carbon atoms, a substituted or unsubstituted alkoxy group having 1 to 50 carbon atoms, a substituted or unsubstituted aralkyl group having 6 to 50 carbon atoms, a substituted or unsubstituted aryloxy group having 5 to 50 ring atoms, a substituted or unsubstituted arylthio group having 5 to 50 ring atoms, a substituted or unsubstituted alkoxycarbonyl group having 1 to 50 carbon atoms, a substituted or unsubstituted silyl group, a carboxyl group, a halogen atom, a cyano group, a nitro group, or a hydroxy group;

and (B) 0.01 to 20 wt % of at least one compound selected from the group consisting of compound 2-50, compound 5-3, compound 5-7, compound 5-9 compound 5-12, compound 5-14, compound 5-16 and compound 7-1:

2-50

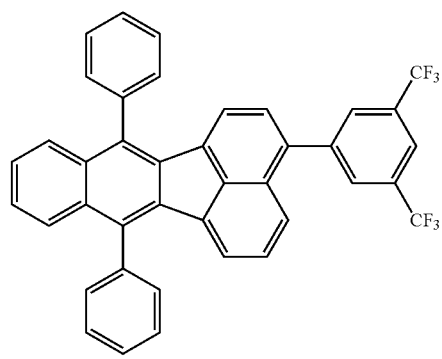

5-3

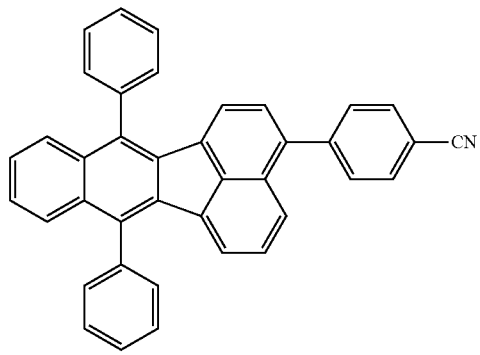

5-7

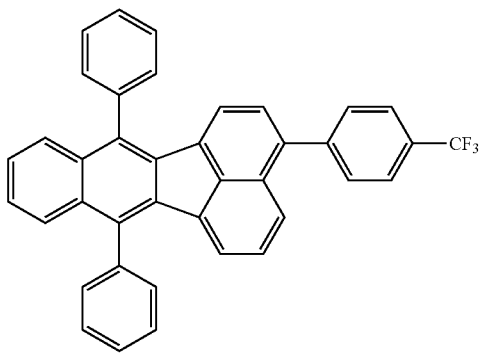

5-9

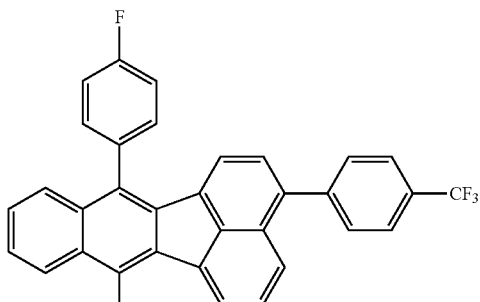

5-12

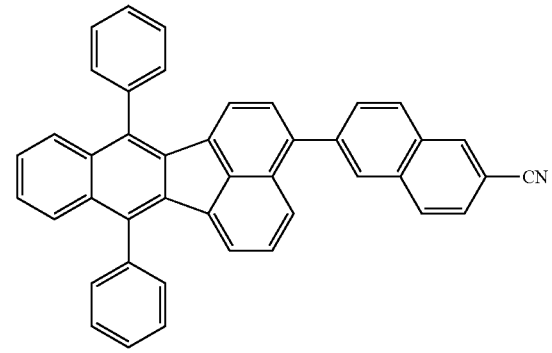

5-14

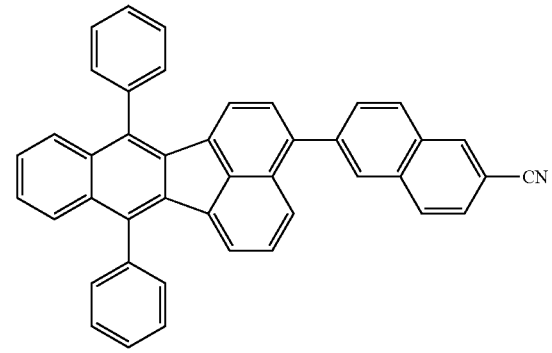

5-16

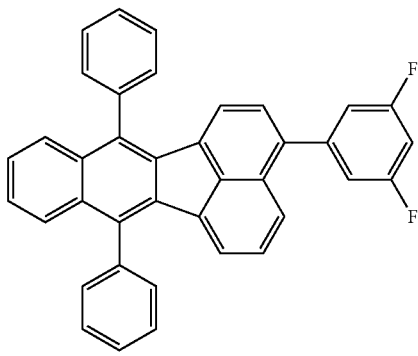

7-1
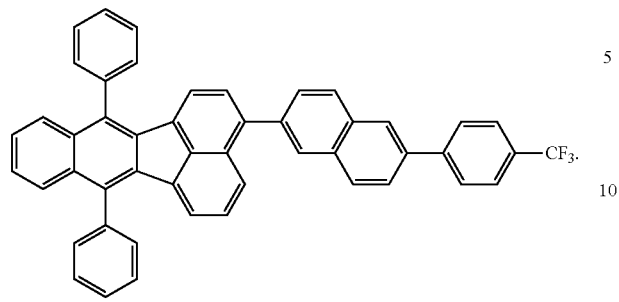
10. An organic electroluminescence device according to claim 9, wherein a surface of at least one of the pair of electrodes is provided with a chalcogenide layer, a metal halide layer, or a metal oxide layer.
* * * * *